United States Patent
Sassa

(10) Patent No.: US 9,006,008 B2
(45) Date of Patent: Apr. 14, 2015

(54) METHOD FOR MANUFACTURING ORGANIC ELECTROLUMINESCENT ELEMENT

(75) Inventor: Shuichi Sassa, Ibaraki (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 14/000,327

(22) PCT Filed: Feb. 14, 2012

(86) PCT No.: PCT/JP2012/053366
§ 371 (c)(1),
(2), (4) Date: Aug. 19, 2013

(87) PCT Pub. No.: WO2012/114936
PCT Pub. Date: Aug. 30, 2012

(65) Prior Publication Data
US 2013/0323871 A1      Dec. 5, 2013

(30) Foreign Application Priority Data
Feb. 21, 2011   (JP) ................... 2011-034209

(51) Int. Cl.
*H01L 21/00*   (2006.01)
*H01L 51/56*   (2006.01)
*H01L 51/00*   (2006.01)
*H05B 33/10*   (2006.01)
*H01L 51/50*   (2006.01)

(52) U.S. Cl.
CPC ............ *H01L 51/56* (2013.01); *H01L 51/0026* (2013.01); *H01L 51/5092* (2013.01); *H01L 51/003* (2013.01); *H01L 51/0039* (2013.01); *H05B 33/10* (2013.01)

(58) Field of Classification Search
USPC ........................ 257/E31.095; 438/32, 34, 46
See application file for complete search history.

(56) References Cited

U.S. PATENT DOCUMENTS

2011/0006294 A1   1/2011   Tanaka et al.

FOREIGN PATENT DOCUMENTS

| JP | 2005-79064 A | 3/2005 |
| JP | 2009-239279 A | 10/2009 |
| JP | 2009-245878 A | 10/2009 |

*Primary Examiner* — Asok K Sarkar
(74) *Attorney, Agent, or Firm* — Sughrue Mion, PLLC

(57) ABSTRACT

A method for manufacturing an organic electroluminescent element including, in the following order, an anode, a light-emitting layer, an electron injection layer, and a cathode, the method including the steps of: (A) forming the anode; (B) forming the light-emitting layer; (C) forming the electron injection layer; and (D) forming the cathode, in which the step (C) includes (i) applying an application liquid containing an ionic polymer to form a thin film, (ii) heating the thin film formed, (iii) storing a partially finished organic electroluminescent element obtained in (ii), and thereafter, (iv) heating the thin film again.

4 Claims, 1 Drawing Sheet

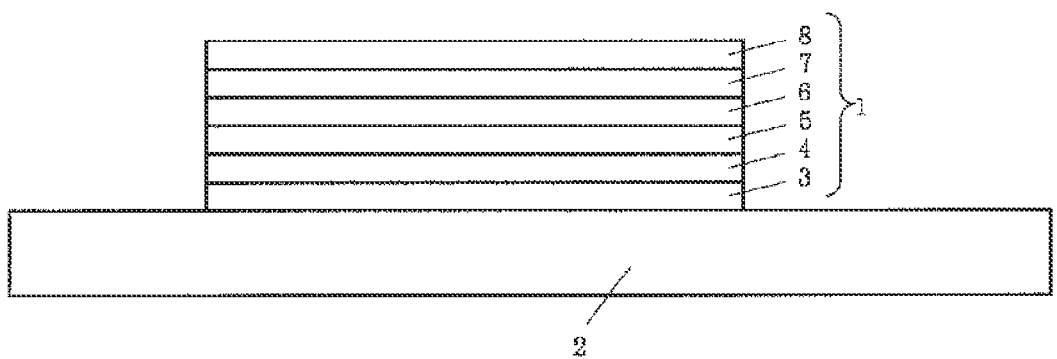

METHOD FOR MANUFACTURING ORGANIC ELECTROLUMINESCENT ELEMENT

CROSS REFERENCE TO RELATED APPLICATIONS

This application is a National Stage of International Application No. PCT/JP2012/053366, filed on Feb. 14, 2012, which claims priority from Japanese Patent Application No. 2011-034209, field on Feb. 21, 2011, the contents of all of which are incorporated herein by refernce in their entirety.

TECHNICAL FIELD

The present invention relates to a method for manufacturing an organic electroluminescent element.

BACKGROUND ART

An organic electroluminescent element (also referred to as an organic EL element below) is configured to include a pair of electrodes, an anode and a cathode, and a light-emitting layer provided between the electrodes. When a voltage is applied across the electrodes, holes are injected from the anode, and electrons are injected from the cathode. These holes and electrons are combined in the light-emitting layer, thereby emitting light.

In addition to the light-emitting layer, certain layers may be provided between the pair of electrodes. For example, in order to improve electron injection efficiency from the cathode, an electron injection layer may be provided.

The electron injection layer is generally formed of a material that is unstable in air, such as Ba, BaO, NaF, and LiF. Then, the electron injection layer is generally formed in an environment isolated from air and, for example, formed by a vacuum deposition method in a vacuum atmosphere.

However, the vacuum deposition method and similar methods have, among various thin film forming methods, relatively complicated thin film forming processes. For this reason, for the purpose of simplifying the forming process of the electron injection layer, a method for forming the electron injection layer by an application method is under study. In order to form the electron injection layer by the application method, a material that is relatively stable in air is required to be developed. As such a material for the electron injection layer, for example, a complex material is developed, and a method for manufacturing an organic EL element is developed that forms a film of the complex material by the application method to form an electron injection layer (for example, see Patent Document 1).

RELATED ART DOCUMENT

Patent Document

Patent Document 1: JP 2005-79064 A

SUMMARY OF THE INVENTION

Problem to be Solved by the Invention

To date, materials for the electron injection layer to which the application method can be applied are limited. Relating to this, the present inventors have found that, in addition to the above complex material, an ionic polymer can be used as the material for the electron injection layer.

The ionic polymer is indeed a stable material in air. However, it was confirmed that when after forming an electron injection layer containing the ionic polymer, a partially finished organic EL element is left for a given period of time without forming a layer covering the electron injection layer (for example, a cathode), the life of a finished organic EL element shortened. For example, when an organic EL element is manufactured by a roll-to-roll processing, in some cases, after forming an electron injection layer, a partially finished organic EL element is once wound around a roll to be stored, and thereafter, a cathode is formed. During this storage, the life of the organic EL element shortens.

Hence, an object of the present invention is to provide a method for manufacturing an organic EL element that can prevent a decrease in the element life of a finished organic EL element even when a partially finished organic EL element in which an electron injection layer is formed is stored.

Means for Solving Problem

The present invention provides the following [1] to [4].

[1] A method for manufacturing an organic electroluminescent element comprising, in the following order, an anode, a light-emitting layer, an electron injection layer, and a cathode, the method comprising the steps of:
(A) forming the anode;
(B) forming the light-emitting layer;
(C) forming the electron injection layer; and
(D) forming the cathode,
wherein the step (C) comprises (i) applying an application liquid comprising an ionic polymer to form a thin film, (ii) heating the thin film formed, (iii) storing a partially finished organic electroluminescent element obtained in (ii), and thereafter, (iv) heating the thin film again.

[2] The method for manufacturing an organic electroluminescent element according to [1], wherein, in the step (C), at least one of the two heatings (ii) and (iv) is conducted in an atmosphere in which the volume proportion of nitrogen is 90% or less.

[3] The method for manufacturing an organic electroluminescent element according to [1], wherein, in the step (C), at least one of the two heatings (ii) and (iv) is conducted in an atmosphere in which the volume proportion of nitrogen is 90% or less and the volume proportion of oxygen is from 10% to 30%.

[4] The method for manufacturing an organic electroluminescent element according to any one of [1] to [4], wherein, in the step (C), the storing in (iii) is conducted in an atmosphere in which the volume proportion of nitrogen is 90% or less.

Effect of Invention

The present invention can prevent a decrease in the element life of a finished organic EL element by, after storing a partially finished organic EL element in which an electron injection layer is formed, heating the electron injection layer again.

BRIEF DESCRIPTION OF DRAWING

FIG. 1 is a diagram schematically illustrating the configuration of an organic EL element according to an embodiment of the present invention.

EXPLANATIONS OF LETTERS OR NUMERALS

1 Organic EL element
2 Supporting substrate
3 Anode
4 Hole injection layer
5 Hole transport layer
6 Light-emitting layer
7 Electron injection layer
8 Cathode

EMBODIMENTS FOR CARRYING OUT THE INVENTION

The present invention is a method for manufacturing an organic EL element comprising, in the following order, an anode, a light-emitting layer, an electron injection layer, and a cathode, the method comprising the steps of: (A) forming the anode; (B) forming the light-emitting layer; (C) forming the electron injection layer; and (D) forming the cathode, wherein the step (C) comprises (i) applying an application liquid comprising an ionic polymer to form a thin film, (ii) heating the thin film formed, (iii) storing a partially finished organic EL element obtained in (ii) for a given period of time, and thereafter, (iv) heating the thin film again.

An organic EL element includes a pair of electrodes, an anode and a cathode, and a light-emitting layer provided between the electrodes and further includes an electron injection layer between the light-emitting layer and the cathode. In addition to the light-emitting layer and the electron injection layer, the organic EL element may include certain layers between the pair of electrodes as needed. In other words, in the organic EL element including, in the following order, the anode, the light-emitting layer, the electron injection layer, and the cathode, these layers may be provided adjacent to each other, or certain layers may be interposed between the layers. Examples of the certain layers may include an organic layer formed of an organic substance, an inorganic layer formed of an inorganic substance, and a layer formed of an organic substance and an inorganic substance.

Examples of a layer provided between the anode and the light-emitting layer may include a hole injection layer, a hole transport layer, and an electron block layer. Examples of a layer provided between the light-emitting layer and the cathode may include an electron injection layer, an electron transport layer, and a hole block layer.

The organic EL element is formed by, for example, stacking the components in order on a supporting substrate. The stacking order is not particularly limited, and examples thereof may include a stacking order in which the anode is stacked first and the components are stacked to the cathode in order and a stacking order in which the cathode is stacked first and the components are stacked to the anode in order. In other words, in the method for manufacturing an organic EL element according to the present invention including the steps of: (A) forming the anode; (B) forming the light-emitting layer; (c) forming the electron injection layer; and (D) forming the cathode, these steps may be conducted by starting from the step (A), and then the step (B), the step (C), and the step (D) in this order, or on the contrary, these steps may be conducted by starting from the step (D), and then the step (C), the step (B), and the step (A) in this order. In addition, the organic EL element may be formed by a laminating method. Specifically, when an organic EL element is divided into two members at an imaginary plane perpendicular to the thickness direction, the first member in which layers from the anode to a cut plane (the "imaginary plane") are formed may be prepared in advance, and the second member in which layers form the cathode to the cut plane (the "imaginary plane") are formed may be prepared in advance, and then the first member and the second member may be laminated at the cut plane (the "imaginary plane"), thus forming the organic EL element.

FIG. 1 is a diagram schematically illustrating the configuration of an organic EL element according to an embodiment of the present invention. This organic EL element 1 illustrated in FIG. 1 includes an anode 3, a hole injection layer 4, a hole transport layer 5, a light-emitting layer 6, an electron injection layer 7, and a cathode 8. The organic EL element 1 may be formed by stacking the anode 3, the hole injection layer 4, the hole transport layer 5, the light-emitting layer 6, the electron injection layer 7, and the cathode 8 on a supporting substrate 2 in order.

A method for manufacturing an organic EL element according to the present embodiment will be described below in accordance with a method for manufacturing the organic EL element illustrated in FIG. 1.

First, the supporting substrate 2 is prepared. Subsequently, the anode 3, the hole injection layer 4, the hole transport layer 5, and the light-emitting layer 6 are stacked in order on the supporting substrate 2. Specifically, in the step of forming the anode ("the step (A)"), the anode 3 is formed. Subsequently, the hole injection layer 4 and the hole transport layer 5 are stacked in order on the anode 3. Furthermore, in the step of forming the light-emitting layer ("the step (B)"), the light-emitting layer 6 is formed on the hole transport layer 5. Materials for constituting these members and their forming methods will be described later.

Next, the electron injection layer 7 is formed. In the step of forming the electron injection layer 7 ("the step (C)"), (i) an application liquid containing an ionic polymer is applied to form a thin film, (ii) the formed thin film is heated, (iii) a partially finished organic EL element obtained in (ii) is stored for a given period of time, and thereafter, (iv) the thin film is heated again.

In other words, first, the application liquid containing the ionic polymer is applied onto the light-emitting layer 6 to form a film ("(i)"). The ionic polymer and liquid for dissolving or dispersing the polymer will be described later.

For the application of the application liquid containing the ionic polymer, any optimum method may be appropriately selected from known application methods in view of the shape of an organic EL element and process simplicity and may be conducted by the method. Examples of the application method may include a spin coating method, a casting method, a microgravure coating method, a gravure coating method, a bar coating method, a roll coating method, a wire bar coating method, a dip coating method, a spray coating method, a screen printing method, a flexo printing method, an offset printing method, and an inkjet printing method.

After applying the application liquid containing the ionic polymer and forming the thin film, in the present embodiment, the formed thin film is heated ("ii"). This removes a solvent and a dispersing medium, forming a solidified thin film. Heating conducted first after applying the application liquid containing the ionic polymer and forming the thin film may be described as the first heating below.

In a general method for manufacturing an organic EL element, after conducting the first heating, a layer covering the electron injection layer 7 (for example, the cathode 8) is formed. In contrast, in the present embodiment, after conducting the first heating, a partially finished organic EL element in which the thin film is formed is stored for a given period of time ("iii"). The "storing" in the present invention refers to "leaving" or "keeping" of the partially finished organic EL element for a given period of time in predetermined conditions. For example, when manufacturing an organic EL element by the roll-to-roll processing, in some cases, without forming the layer covering the electron injection layer 7 (the cathode 8 in the present embodiment) subsequently after conducting the first heating, after conducting the first heating, the partially finished organic EL element is once wound around a winding roll to be stored, and thereafter, the layer covering the electron injection layer 7 (the cathode 8 in the present embodiment) may be formed by the roll-to-roll processing. The present invention can be applied to above-described method for manufacturing an organic EL element including a step of storing a partially finished organic EL element in which a thin film is formed for a given period of time after conducting the first heating. The method for manufacturing an organic EL element including a step of storing a partially finished organic EL element for a given period of time after conducting the first heating is not limited to a method for manufacturing an organic EL element using the roll-to-roll processing.

The partially finished organic EL element may be stored in any atmosphere and may be stored in, for example, a vacuum atmosphere or an inert gas atmosphere.

When storing in the vacuum atmosphere, its pressure is usually 0.01 Pa or less and preferably 0.001 Pa or less. The lower limit of the pressure is not particularly required to be set and is set, in view of process simplicity or the like, to, for example, 0.00001 Pa.

When storing in the inert gas atmosphere, examples of the inert gas may include nitrogen gas and argon gas.

When thus storing the partially finished organic EL element in the vacuum atmosphere or the inert gas atmosphere, the deterioration of the thin film occurring during the storage can be reduced.

When storing the partially finished organic EL element in the vacuum atmosphere or the inert gas atmosphere, apparatuses used for the storage become complicated, making the manufacturing process for the organic EL element complicated. Then, because the manufacturing process is simplified, the partially finished organic EL element is preferably stored in an atmosphere in which the volume proportion of nitrogen is 90% or less.

Because the manufacturing process is simplified, it is preferable that the partially finished organic EL element is stored in an atmosphere in which the volume proportion of nitrogen is 60% to 90%, the volume proportion of oxygen is 10% to 40%, the volume proportion of water vapor is 0.0001% to 0.01%, the pressure is 10 kPa to 1000 kPa, and the temperature is 5° C. to 100° C., and it is further preferable that the partially finished organic EL element is stored in an atmosphere in which the volume proportion of nitrogen is 70% to 90%, the volume proportion of oxygen is 10% to 30%, the volume proportion of water vapor is 0.002% to 0.005%, the pressure is 80 kPa to 120 kPa, and the temperature is 20° C. to 30° C.

Because the manufacturing process is simplified, in particular, the partially finished organic EL element is preferably stored in air.

A period of time during which the partially finished organic EL element is stored may be set in view of the process, the degree of deterioration of the thin film, and the like. The period of time during which the partially finished organic EL element is stored is, for example, 10 minutes to 60 minutes and preferably 5 minutes to 20 minutes.

When the partially finished organic EL element is stored in the above conditions, the deterioration of the thin film occurring during the storage can be facilitated as compared to the case where it is stored in the vacuum atmosphere or the inert gas atmosphere. However, owing to the second heating, which will be described later, a decrease in the element life of a finished organic EL element can be reduced even when the thin film deteriorates during the storage.

After storing the partially finished organic EL element, in the present embodiment, the thin film is heated again ("iv").

Heating conducted first after storing the organic EL element may be described as the second heating below.

By thus conducting the second heating, the element life of the organic EL element can be prolonged as compared to a case where the cathode is formed without conducting the second heating after the storage.

A heating temperature at the first heating and the second heating is, depending on a heating period of time, around 50° C. to 250° C. and preferably 60° C. to 200° C. The heating period of time is, depending on the heating temperature, around 5 minutes to 120 minutes and preferably 10 minutes to 60 minutes.

The first heating and/or the second heating can be conducted in any atmosphere and can be conducted in, for example, a vacuum atmosphere or an inert gas atmosphere.

When conducting heating in the vacuum atmosphere, the pressure is generally 0.01 Pa or less and preferably 0.001 Pa or less. The lower limit of the pressure is not particularly required to be set and is set, in view of process simplicity or the like, to, for example, $10^{-5}$ Pa.

When conducting heating in the inert gas atmosphere, examples of the inert gas may include nitrogen gas and argon gas.

When conducting the first heating and/or the second heating in the vacuum atmosphere or the inert gas atmosphere, apparatuses used for the heating become complicated, making the manufacturing process for the organic EL element complicated. Then, because the manufacturing process is simplified, in the step of forming the electron injection layer, it is preferable that at least one of the two heatings conducted before and after the storage of the partially finished organic EL element (that is, the heating "(ii)" and "(iv)") is conducted in an atmosphere in which the volume proportion of nitrogen in 90% or less.

It is preferable that at least one of the two heatings conducted before and after the storage of the partially finished organic EL element is conducted in an atmosphere in which the volume proportion of nitrogen in 90% or less and the volume proportion of oxygen is from 10% to 30%.

Because the manufacturing process is simplified, it is preferable that the first heating and/or the second heating are conducted in an atmosphere in which the volume proportion of nitrogen is 60% to 90%, the volume proportion of oxygen is 10% to 30%, the volume proportion of water vapor is 0.0001% to 0.01%, the pressure is 10 kPa to 1000 kPa, and the temperature is 60° C. to 200° C. It is more preferable that the first heating and/or the second heating are conducted in an atmosphere in which the volume proportion of nitrogen is 70% to 90%, the volume proportion of oxygen is 10% to 30%, the volume proportion of water vapor is 0.002% to 0.005%, the pressure is 80 kPa to 120 kPa, and the temperature is 50° C. to 250° C. Because the manufacturing process is simplified, it is further preferable that both the first heating and the second heating are conducted in these conditions.

Because the manufacturing process is simplified, furthermore, it is preferable that the first heating and/or the second heating are conducted in an air atmosphere, and it is more preferable that both the first heating and the second heating are conducted in an air atmosphere.

In view of element life, it has been considered that the heating of a thin film is preferably conducted in an inert gas atmosphere. However, when forming the electron injection layer containing the ionic polymer, as shown in Examples below, element life with nearly the same extent as a case where the thin film is heated in the inert gas atmosphere can be achieved so long as the second heating is conducted even when the thin film is heated in air.

After conducting the second heating, in the present embodiment, in the step of forming the cathode ("the step (D)"), the cathode 8 is formed on the electron injection layer 7. The step of forming the layer covering the electron injection layer 7 (the cathode 8 in the present embodiment) after conducting the second heating is preferably conducted as soon as possible after conducting the second heating. A period of time until the step of forming the layer covering the electron injection layer 7 (the cathode 8 in the present embodiment) is started after conducting the second heating is, for example, 60 minutes or less, preferably 10 minutes or less, and more preferably 5 minutes or less.

When a long period of time is elapsed until the layer covering the electron injection layer 7 (the cathode 8 in the present embodiment) is formed after conducting the second heating, it is preferable that the third heating is further conducted, and then, the layer covering the electron injection layer 7 (the cathode 8 in the present embodiment) is formed as soon as possible.

By thus stacking the components of the organic EL element in order, the organic EL element can be formed.

After being formed, the organic EL element is usually sealed. For example, the sealing can be conducted by laminating the supporting substrate 2 and a sealing member with the organic EL element 1 interposed therebetween with a certain adhesive. This sealing can be conducted in, for example, the same atmosphere as the atmosphere when the partially finished organic EL element is stored.

The method for manufacturing an organic EL element according to the present invention can be applied to, for example, a method for forming one or more organic EL element(s) on a given supporting substrate in single wafer processing, a method for forming one or more organic EL element(s) on a given supporting substrate by the roll-to-roll processing, or a method for forming a part of layers on a supporting substrate by the roll-to-roll processing and then cutting the supporting substrate to form the residual layers in single wafer processing, and further, can be applied to a laminating method using these methods.

The layer configuration of, the materials of the layers of, and methods for forming the layers of an organic EL element will be described below.

As described above, not only the light-emitting layer and the electron injection layer, but also certain layers different from the light-emitting layer and the electron injection layer may be further provided between the anode and the cathode. Examples of the layer provided between the cathode and the light-emitting layer may include the electron injection layer, the electron transport layer, and the hole block layer. When both the electron injection layer and the electron transport layer are provided between the cathode and the light-emitting layer, the layer being in contact with the cathode is referred to as the electron injection layer, and the layer excluding this electron injection layer is referred to as the electron transport layer.

The electron injection layer has a function of improving the efficiency of electron injection from the cathode. The electron transport layer has a function of improving electron injection from the layer being in contact with the surface of the electron transport layer on the cathode side. The hole block layer has a function of blocking the transport of holes. When the electron injection layer and/or the electron transport layer have the function of blocking the transport of holes, these layers may also serve as the hole block layer.

Examples of the layer provided between the anode and the light-emitting layer may include the hole injection layer, the hole transport layer, and the electron block layer. When both the hole injection layer and the hole transport layer are provided between the anode and the light-emitting layer, the layer being in contact with the anode is referred to as the hole injection layer, and the layer excluding this hole injection layer is referred to as the hole transport layer.

The hole injection layer has a function of improving the efficiency of hole injection from the anode. The hole transport layer has a function of improving hole injection from the layer being in contact with the surface of the hole transport layer on the anode side. The electron block layer has a function of blocking the transport of electrons. When the hole injection layer and/or the hole transport layer have the function of blocking the transport of electrons, these layers may also serve as the electron block layer.

It is noted that the electron injection layer and the hole injection layer may collectively be referred to as a charge injection layer, and the electron transport layer and the hole transport layer may collectively be referred to as a charge transport layer.

Examples of the layer configuration that can be employed by the organic EL element according to the present embodiment are shown below:

a) anode/hole injection layer/light-emitting layer/electron injection layer/cathode
b) anode/hole injection layer/light-emitting layer/electron transport layer/electron injection layer/cathode
c) anode/hole injection layer/hole transport layer/light-emitting layer/electron injection layer/cathode
d) anode/hole injection layer/hole transport layer/light-emitting layer/electron transport layer/electron injection layer/cathode
e) anode/light-emitting layer/electron injection layer/cathode
f) anode/light-emitting layer/electron transport layer/electron injection layer/cathode (where the symbol "forward slash (/)" indicates that the layers crossing the symbol "/" are adjacently stacked. The same shall apply hereinafter).

The organic EL element according to the present embodiment may have two or more light-emitting layers. When the stacked body held between the anode and the cathode is defined as a "configuration unit A" in any one of the above layer configurations a) to f), a configuration of an organic EL element having two light-emitting layers may include a layer configuration shown by g) below. The layer configurations of the two (configuration units A) may be the same as or different from each other.

g) anode/(configuration unit A)/charge generation layer/(configuration unit A)/cathode When "(configuration unit A)/charge generation layer" is defined as a "configuration unit B," a configuration of an organic EL element having three or more light-emitting layers may include a layer configuration shown by f) below.

h) anode/(configuration unit B)x/(configuration unit A)/cathode

It is noted that the symbol "x" represents an integer of two or more, and (configuration unit B)x represents a stacked body in which configuration unit B is stacked x times. The layer configurations of a plurality of (configuration units B) may be the same as or different from each other.

The charge generation layer is a layer that generates holes and electrons by the application of an electric field. Examples of the charge generation layer may include a thin film formed of vanadium oxide, indium tin oxide (ITO), or molybdenum oxide.

The organic EL element may be covered with a sealing member such as a sealing film and a sealing plate for sealing the element in an airtight manner.

The configurations of the organic EL element include (1) the bottom emission type, (2) the top emission type, and (3) the dual-sided emission type. The bottom emission type organic EL element emits light to the outside through the supporting substrate. The top emission type organic EL element emits light to the outside from the side opposite to the supporting substrate. The dual-sided emission type organic EL element emits light to the outside from both of the supporting substrate side and the side opposite to the supporting substrate. The present invention can be applied to any of the bottom emission type, top emission type, and dual-sided emission type organic EL elements.

Because the bottom emission type organic EL element emits light to the outside through an electrode arranged closer to the supporting substrate out of the anode and the cathode, the electrode arranged closer to the supporting substrate is formed of an electrode showing optical transparency, and in contrast, the electrode arranged apart from the supporting substrate is usually formed of an electrode that reflects light. Because the top emission type organic EL element emits light to the outside through an electrode arranged apart from the supporting substrate out of the anode and the cathode, the electrode arranged apart from the supporting substrate is formed of an electrode showing optical transparency, and in contrast, the electrode arranged closer to the supporting substrate is usually formed of an electrode that reflects light. In the dual-sided emission type organic EL element, both the anode and the cathode are formed of electrodes showing optical transparency.

<Supporting Substrate>

The supporting substrate suitably used is a supporting substrate that does not change chemically in the process of manufacturing an organic EL element and is, for example, glass, plastic, a polymer film, a silicon plate, and a stacked body of them. A driving substrate in which a driving circuit that drives the organic EL element is formed in advance may be used as the supporting substrate. When the bottom emission type or dual-sided emission type organic EL element, which emits light through the supporting substrate, is mounted on the supporting substrate, a substrate showing optical transparency is used as the supporting substrate.

<Anode>

For an organic EL element configured to allow light radiated from the light-emitting layer to be emitted through the anode to the outside, an electrode showing optical transparency is used as the anode. As the electrode showing optical transparency, for example, a thin film formed of metallic oxides, metallic sulfides, metals, or the like may be used. Among them, a thin film having high electric conductivity and high optical transmittance is suitably used. Specifically, a thin film formed of indium oxide, zinc oxide, tin oxide, ITO, indium zinc oxide (IZO), gold, platinum, silver, or copper may be used. Among these, a thin film formed of ITO, IZO, or tin oxide is suitably used. Examples of a method for manufacturing the anode may include a vacuum deposition method, a sputtering method, an ion plating method, and a plating method. As the anode, an organic transparent conductive film such as polyaniline or derivatives thereof and polythiophene or derivatives thereof may be used. The organic transparent conductive film can be manufactured by an application method using an organic conductive material such as polythiophene.

The film thickness of the anode is appropriately set in view of required characteristics, process simplicity, and the like and is, for example, 10 nm to 10 µm, preferably 20 nm to 1 µm, and more preferably 50 nm to 500 nm.

<Hole Injection Layer>

Examples of a hole injection material that forms the hole injection layer may include metallic oxides such as vanadium oxide, molybdenum oxide, ruthenium oxide, and aluminum oxide, phenylamine-based compounds, starburst type amine-based compounds, phthalocyanine-based compounds, amorphous carbon, polyaniline, and polythiophene derivatives.

Examples of a film forming method for the hole injection layer may include film formation from a solution containing the hole injection material. For example, the hole injection layer can be formed by applying a solution containing the hole injection material with a certain application method to form a film, and then, solidifying the applied film. The solidification of the applied film may be conducted by natural drying, drying by heating, vacuum drying, or the like, and further, may be conducted through irradiation with certain light.

Examples of a solvent used for the film formation from a solution may include chlorine-based solvents such as chloroform, methylene chloride, and dichloroethane, ether-based solvents such as tetrahydrofuran, aromatic hydrocarbon-based solvents such as toluene and xylene, ketone-based solvents such as acetone and methyl ethyl ketone, ester-based solvents such as ethyl acetate, butyl acetate, and ethyl cellosolve acetate, and water.

The film thickness of the hole injection layer is appropriately set in view of required characteristics, process simplicity, and the like and is, for example, 1 nm to 1 µm, preferably 2 nm to 500 nm, and more preferably 5 nm to 200 nm.

<Hole Transport Layer>

Examples of a hole transport material that forms the hole transport layer may include polyvinylcarbazole or derivatives thereof, polysilane or derivatives thereof, polysiloxane derivatives having an aromatic amine in their side chain or main chain, pyrazoline derivatives, arylamine derivatives, stilbene derivatives, triphenyldiamine derivatives, polyaniline or derivatives thereof, polythiophene or derivatives thereof, polyarylamine or derivatives thereof, polypyrrole or derivatives thereof, poly(p-phenylene vinylene) or derivatives thereof, or poly(2,5-thienylene vinylene) or derivatives thereof.

Among these, preferred as the hole transport material are polymer hole transport materials such as polyvinylcarbazole or derivatives thereof, polysilane or derivatives thereof, polysiloxane derivatives having an aromatic amine compound group in their side chain or main chain, polyaniline or derivatives thereof, polythiophene or derivatives thereof, polyarylamine or derivatives thereof, poly(p-phenylene vinylene) or derivatives thereof, or poly(2,5-thienylene vinylene) or derivatives thereof. More preferred are polyvinylcarbazole or derivatives thereof, polysilane or derivatives thereof, or polysiloxane derivatives having an aromatic amine in their side chain or main chain. When a low molecular-weight hole transport material is used, it is preferable to disperse the transport material in a polymer binder.

Examples of a film forming method for the hole transport layer may include film formation from a solution containing the hole transport material. For example, the hole transport layer can be formed by applying a solution containing the hole transport material with a certain application method to form a film, and then, solidifying the applied film. When a low molecular-weight hole transport material is used, a solution to which a polymer binder is further added may be used to form a film.

Examples of a solvent used for film formation from a solution may include chlorine-based solvents such as chloroform, methylene chloride, and dichloroethane, ether-based solvents such as tetrahydrofuran, aromatic hydrocarbon-based solvents such as toluene and xylene, ketone-based solvents such as acetone and methyl ethyl ketone, and ester-based solvents such as ethyl acetate, butyl acetate, and ethyl cellosolve acetate.

As the polymer binder to be added, a binder that does not exceedingly inhibit charge transport is preferred, and a binder having low absorbance to visible light is suitably used. Examples of the polymer binder may include polycarbonate, polyacrylate, polymethylacrylate, polymethylmethacrylate, polystyrene, polyvinylchloride, and polysiloxane.

The film thickness of the hole transport layer is set to an optimal value in view of required characteristics, process simplicity, and the like and is, for example, 1 nm to 1 μm, preferably 2 nm to 500 nm, and more preferably 5 nm to 200 mm.

<Light-Emitting Layer>

The light-emitting layer is generally formed of an organic substance that mainly emits fluorescence and/or phosphorescence or formed of the organic substance and a dopant that assists the organic substance. For example, the dopant is added for the purpose of improving the light-emission efficiency and changing the wavelength of emitted light. The organic substance contained in the light-emitting layer may be either a low molecular compound or a high molecular compound. The high molecular compound, which has generally higher solubility in the solvent than that of the low molecular compound, is suitably used for the application method. Hence, the light-emitting layer preferably contains a high molecular compound. The light-emitting layer preferably contains a high molecular compound having a number-average molecular weight of $10^3$ to $10^8$ in terms of polystyrene. Examples of a light-emitting material that forms the light-emitting layer may include the following dye-based materials, metal complex-based materials, polymer-based materials, and dopant materials.

(Dye-Based Materials)

Examples of the dye-based materials may include cyclopentamine derivatives, tetraphenyl butadiene derivative compounds, triphenylamine derivatives, oxadiazole derivatives, pyrazoloquinoline derivatives, distyrylbenzene derivatives, distyrylarylene derivatives, pyrrole derivatives, thiophene ring compounds, pyridine ring compounds, perinone derivatives, perylene derivatives, oligothiophene derivatives, oxadiazole dimers, pyrazoline dimers, quinacridone derivatives, and coumarin derivatives.

(Metal Complex-Based Materials)

Examples of the metal complex-based materials may include metal complexes having a central metal such as a rare earth metal (Tb, Eu, Dy, or the like), Al, Zn, Be, Ir, or Pt and a ligand such as oxadiazole, thiadiazole, phenylpyridine, phenylbenzimidazole, or a quinoline structure. Examples of the metal complex-based materials may include metal complexes such as iridium complexes and platinum complexes that emit light from a triplet excited state, aluminum quinolinol complexes, benzoquinolinol beryllium complexes, benzoxazolyl zinc complexes, benzothiazole zinc complexes, azomethyl zinc complexes, porphyrin zinc complexes, and phenanthroline europium complexes.

(Polymer-Based Materials)

Examples of the polymer-based materials may include polyparaphenylene vinylene derivatives, polythiophene derivatives, polyparaphenylene derivatives, polysilane derivatives, polyacetylene derivatives, polyfluorene derivatives, polyvinylcarbazole derivatives, and polymerized products of the above dye-based materials or metal complex-based light-emitting materials.

Among the above light-emitting materials, examples of materials that emit blue light may include distyrylarylene derivatives, oxadiazole derivatives, polymers of them, polyvinylcarbazole derivatives, polyparaphenylene derivatives, and polyfluorene derivatives. Among these, polymer materials such as polyvinylcarbazole derivatives, polyparaphenylene derivatives, and polyfluorene derivatives are preferred.

Examples of materials that emit green light may include quinacridone derivatives, coumarin derivatives, polymers of them, polyparaphenylene vinylene derivatives, and polyfluorene derivatives. Among these, polymer materials such as polyparaphenylene vinylene derivatives and polyfluorene derivatives are preferred.

Examples of materials that emit red light may include coumarin derivatives, thiophene ring compounds, polymers of them, polyparaphenylene vinylene derivatives, polythiophene derivatives, and polyfluorene derivatives. Among these, polymer materials such as polyparaphenylene vinylene derivatives, polythiophene derivatives, and polyfluorene derivatives are preferred.

(Dopant Materials)

Examples of the dopant materials may include perylene derivatives, coumarin derivatives, rubrene derivatives, quinacridone derivatives, squarylium derivatives, porphyrin derivatives, styryl-based dyes, tetracene derivatives, pyrazolone derivatives, decacyclene, and phenoxazone.

The thickness of such a light-emitting layer is generally about 2 nm to 200 nm.

The light-emitting layer is formed, for example, by film formation from a solution. The light-emitting layer is formed by applying a solution containing a light-emitting material with a certain application method to form a film, and then, solidifying the applied film. Examples of a solvent used for the film formation from a solution may include the same solvent as the solvent used when the hole injection layer is formed into a film from a solution described above.

<Electron Transport Layer>

Examples of an electron transport material that forms the electron transport layer may include oxadiazole derivatives, anthraquinodimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives, metal complexes of 8-hydroxyquinoline or of derivatives of 8-hydroxyquinoline, polyquinoline or derivatives thereof, polyquinoxaline or derivatives thereof, and polyfluorene or derivatives thereof.

Examples of a method for forming a film of the electron transport layer may include a vacuum deposition method and a film forming method from a solution. When the film is formed from a solution, a polymer binder may be used in combination.

The film thickness of the electron transport layer is appropriately set in view of required characteristics, process simplicity, and the like and is, for example, 1 nm to 1 μm, preferably 2 nm to 500 nm, and more preferably 5 nm to 200 nm.

<Electron Injection Layer>

The electron injection layer contains an ionic polymer. Examples of the ionic polymer that forms the electron injection layer may include a polymer having a structural unit containing one or more group(s) selected from the group consisting of a group represented by Formula (1) below and a group represented by Formula (2) below. Examples of the ionic polymer may include a polymer having a structural unit containing one or more group(s) selected from the group consisting of the group represented by Formula (1) and the group represented by Formula (2) in a content of 15% by mole to 100% by mole, based on all structural units.

$$-(Q^1)_{n1}-Y^1(M^1)_{a1}(Z^1)_{b1} \quad (1)$$

In Formula (1), $Q^1$ represents a divalent organic group; $Y^1$ represents $-CO_2^-$, $-SO_3^-$, $-SO_2^-$, $-PO_3^{2-}$ or $-B(R^a)_3^-$; $M^1$ represents a metal cation or an ammonium cation optionally having a substituent; $Z^1$ represents $F^-$, $Cl^-$, $Br^-$, $I^-$, $OH^-$, $R^aSO_3^-$, $R^aCOO^-$, $ClO^-$, $ClO_2^-$, $ClO_3^-$, $ClO_4^-$, $SCN^-$, $CN^-$, $NO_3^-$, $SO_4^{2-}$, $HSO_4^-$, $PO_4^{3-}$, $HPO_4^{2-}$, $H_2PO_4^-$, $BF_4^-$ or $PF_6^-$; n1 represents an integer of 0 or more; a1 represents an integer of 1 or more and b1 represents an integer of 0 or more, with the proviso that a1 and b1 are selected so that the electric charge of the group represented by Formula (1) becomes 0; $R^a$ represents a $C_{1-30}$ alkyl group optionally having a substituent or a $C_{6-50}$ aryl group optionally having a substituent; when $Q^1$ is present in plurality, they may be the same as or different from each other; and when each of $M^1$ and $Z^1$ is present in plurality, they may be the same as or different from each other.

It is noted that "when each of $M^1$ and $Z^1$ is present in plurality, they may be the same as or different from each other" means that "when $M^1$ is present in plurality, they may be the same as or different from each other, and when $Z^1$ is present in plurality, they may be the same as or different from each other."

$$-(Q^2)_{n2}-Y^2(M^2)_{a2}(Z^2)_{b2} \quad (2)$$

In Formula (2), $Q^2$ represents a divalent organic group; $Y^2$ represents a carbocation, an ammonium cation, a phosphonium cation, a sulfonium cation, or an iodonium cation; $M^2$ represents $F^-$, $Cl^-$, $Br^-$, $I^-$, $OH^-$, $R^bSO_3^-$, $R^bCOO^-$, $ClO^-$, $ClO_2^-$, $ClO_3^-$, $ClO_4^-$, $SCN^-$, $CN^-$, $NO_3^-$, $SO_4^{2-}$, $HSO_4^-$, $PO_4^{3-}$, $HPO_4^{2-}$, $H_2PO_4^-$, $BF_4^-$ or $PF_6^-$; $Z^2$ represents a metal cation or an ammonium cation optionally having a substituent; n2 represents an integer of 0 or more; a2 represents an integer of 1 or more, and b2 represents an integer of 0 or more, with the proviso that a2 and b2 are selected so that the electric charge of the group represented by Formula (2) becomes 0; $R^b$ represents a $C_{1-30}$ alkyl group optionally having a substituent or a $C_{6-50}$ aryl group optionally having a substituent; and when each of $Q^2$, $M^2$, and $Z^2$ is present in plurality, they may be the same as or different from each other.

Examples of the ionic polymer used in the present invention may further include a polymer having a group represented by Formula (3) below. When the ionic polymer has the group represented by Formula (3), the group represented by Formula (3) may be contained in a structural unit of the ionic polymer, may be contained in the same structural unit as the structural unit including one or more type(s) of group selected from the group consisting of the group represented by Formula (1) and the group represented by Formula (2), or may be contained in other different structural units. Examples of the ionic polymer may include a polymer having a structural unit including at least one type selected from the group represented by Formula (1), the group represented by Formula (2), and the group represented by Formula (3) in a content of 15% by mole to 100% by mole, based on all structural units.

$$-(Q^3)_{n3}-Y^3 \quad (3)$$

In Formula (3), $Q^3$ represents a divalent organic group; $Y^3$ represents $-CN$ or a group represented by any one of Formulae (4) to (12); and n3 represents an integer of 0 or more.

$$-O-(R'O)_{a3}-R'' \quad (4)$$

[Chem. 1]

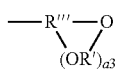  (5)

$$-S-(R'S)_{a4}-R'' \quad (6)$$

$$-C(=O)-(R'-C(=O))_{a4}-R'' \quad (7)$$

$$-C(=S)-(R'-C(=S))_{a4}-R'' \quad (8)$$

$$-N\{(R')_{a4}R''\}_2 \quad (9)$$

$$-C(=O)O-(R'-C(=O)O)_{a4}-R'' \quad (10)$$

$$-C(=O)O-(R'O)_{a4}-R'' \quad (11)$$

$$-NHC(=O)-(R'NHC(=O))_{a4}-R'' \quad (12)$$

In Formulae (4) to (12), R' represents a divalent hydrocarbon group optionally having a substituent; R" represents a hydrogen atom, a monovalent hydrocarbon group optionally having a substituent, $-COOH$, $-SO_3H$, $-OH$, $-SH$, $-NR^c_2$, $-CN$, or $-C(=O)NR^c_2$; R''' represents a trivalent hydrocarbon group optionally having a substituent; a3 represents an integer of 1 or more; a4 represents an integer of 0 or more; $R^c$ represents a $C_{1-30}$ alkyl group optionally having a substituent or a $C_{6-50}$ aryl group optionally having a substituent; and when each of R', R", and R''' is present in plurality, they may be the same as or different from each other.

The ionic polymer preferably includes one or more type(s) of structural unit selected from the group consisting of a structural unit represented by Formula (13), a structural unit represented by Formula (15), a structural unit represented by Formula (17), and a structural unit represented by Formula (20) in a content of 15% by mole to 100% by mole, based on all structural units.

[Chem. 2]

  (13)

In Formula (13), $R^1$ is a monovalent group including a group represented by Formula (14); $Ar^1$ represents a (2+n4) valent aromatic group optionally having a substituent other than $R^1$; n4 represents an integer of 1 or more; and when $R^1$ is present in plurality, they may be the same as or different from each other.

[Chem. 3]

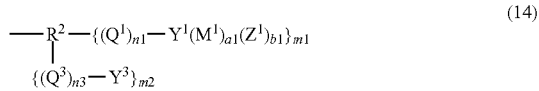
(14)

In Formula (14), $R^2$ represents a (1+m1+m2) valent organic group; $Q^1$, $Q^3$, $Y^1$, $M^1$, $Z^1$, $Y^3$, n1, a1, b1, and n3 represent the same as defined above; m1 and m2 each independently represent an integer of 1 or more; and when each of $Q^1$, $Q^3$, $Y^1$, $M^1$, $Z^1$, $Y^3$, n1, a1, b1, and n3 is present in plurality, they may be the same as or different from each other.

[Chem. 4]

(15)

In Formula (15), $R^3$ is a monovalent group including a group represented by Formula (16); $Ar^2$ represents a (2+n5) valent aromatic group optionally having a substituent other than $R^3$; n5 represents an integer of 1 or more; and when $R^3$ is present in plurality, they may be the same as or different from each other.

[Chem. 5]

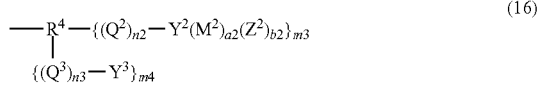
(16)

In Formula (16), $R^4$ represents a (1+m3+m4) valent organic group; $Q^2$, $Q^3$, $Y^2$, $M^2$, $Z^2$, $Y^3$, n2, a2, b2, and n3 represent the same as defined above; m3 and m4 each independently represent an integer of 1 or more; and when each of $Q^2$, $Q^3$, $Y^2$, $M^2$, $Z^2$, $Y^3$, n2, a2, b2, and n3 is present in plurality, they may be the same as or different from each other.

[Chem. 6]

(17)

In Formula (17), $R^5$ is a monovalent group including a group represented by Formula (18); $R^6$ is a monovalent group including a group represented by Formula (19); $Ar^3$ represents a (2+n6+n7) valent aromatic group optionally having a substituent other than $R^5$ or $R^6$; n6 and n7 each independently represent an integer of 1 or more; and when each of $R^5$ and $R^6$ is present in plurality, they may be the same as or different from each other.

$$—R^7—\{(Q^1)_{n1}-Y^1(M^1)_{a1}(Z^1)_{b1}\}_{m5} \quad (18)$$

In Formula (18), $R^7$ represents a direct bond or a (1+m5) valent organic group; $Q^1$, $Y^1$, $M^1$, $Z^1$, n1, a1, and b1 represent the same as defined above; m5 represents an integer of 1 or more; and when each of $Q^1$, $Y^1$, $M^1$, $Z^1$, n1, a1, and b1 is present in plurality, they may be the same as or different from each other.

$$—R^8-\{(Q^3)_{n3}-Y^3\}_{m6} \quad (19)$$

In Formula (19), $R^8$ represents a single bond or a (1+m6) valent organic group; $Y^3$ and n3 represent the same as defined above; m6 represents an integer of 1 or more, with the proviso that when $R^8$ is a single bond, m6 represents 1; and when each of $Q^3$, $Y^3$, and n3 is present in plurality, they may be the same as or different from each other.

[Chem. 7]

(20)

In Formula (20), $R^9$ is a monovalent group including a group represented by Formula (21); $R^{10}$ is a monovalent group including a group represented by Formula (22); $Ar^4$ represents a (2+n8+n9) valent aromatic group optionally having a substituent other than $R^9$ or $R^{10}$; n8 and n9 each independently represent an integer of 1 or more; and when each of $R^9$ and $R^{10}$ is present in plurality, they may be the same as or different from each other.

$$—R^{11}-\{(Q^2)_{n2}-Y^2(M^2)_{a2}(Z^2)_{b2}\}_{m7} \quad (21)$$

In Formula (21), $R^{11}$ represents a single bond or a (1+m7) valent organic group; $Q^2$, $Y^2$, $M^2$, $Z^2$, n2, a2, and b2 represent the same as defined above; m7 represents an integer of 1 or more, with the proviso that when $R^{11}$ is a single bond, m7 represents 1; and when each of $Q^2$, $Y^2$, $M^2$, $Z^2$, n2, a2, and b2 is present in plurality, they may be the same as or different from each other.

$$—R^{12}-\{(Q^3)_{n3}-Y^3\}_{m8} \quad (22)$$

In Formula (22), $R^{12}$ represents a single bond or a (1+m8) valent organic group; $Y^3$ and n3 represent the same as defined above; m8 represents an integer of 1 or more, with the proviso that when $R^{12}$ is a single bond, m8 represents 1; and when each of $Q^3$, $Y^3$, and $n^3$ is present in plurality, they may be the same as or different from each other.

The structural unit in the ionic polymer may include two or more types of group represented by Formula (1), two or more types of group represented by Formula (2), or two or more types of group represented by Formula (3).

Group Represented by Formula (1)

In Formula (1), examples of the divalent organic group represented by $Q^1$ may include: a $C_{1-50}$ divalent saturated hydrocarbon group optionally having a substituent such as a methylene group, an ethylene group, a 1,2-propylene group, a 1,3-propylene group, a 1,2-butylene group, a 1,3-butylene group, a 1,4-butylene group, a 1,5-pentylene group, a 1,6-hexylene group, a 1,9-nonylene group, a 1,12-dodecylene group, and a group in which at least one hydrogen atom in these groups is substituted with a substituent; a $C_{2-50}$ alkenylene group optionally having a substituent such as an ethenylene group, a propenylene group, a 3-butenylene group, a 2-butenylene group, a 2-pentenylene group, a 2-hexenylene group, a 2-nonenylene group, a 2-dodecenylene group, and a group in which at least one hydrogen atom in these groups is substituted with a substituent, and a $C_{2-50}$ divalent unsaturated hydrocarbon group optionally having a substituent including an ethynylene group; a $C_{3-50}$ divalent saturated cyclic hydrocarbon group optionally having a substituent such as a cyclopropylene group, a cyclobutylene group, a cyclopentylene group, a cyclohexylene group, a cyclononylene group, a cyclododecylene group, a norbornylene group, an adamantylene group, and a group in which at least one hydrogen atom in these groups is substituted with a substituent; a $C_{6-50}$ arylene group optionally having a substituent such as a 1,3-phenylene group, a 1,4-phenylene group, a 1,4-naphthylene group, a 1,5-naphthylene group, a 2,6-naphthylene group, a biphenyl-4,4'-diyl group, and a group in which at least one hydrogen atom in these groups is substituted with a substituent; a $C_{1-50}$ alkyleneoxy group optionally having a substituent such as a methyleneoxy group, an ethyleneoxy group, a propyleneoxy group, a butyleneoxy group, a pentyleneoxy group, a hexyleneoxy group, and a group in which at least one hydrogen atom in these groups is substituted with a substituent; an imino group having a substituent containing a carbon atom; and a silylene group having a substituent containing a carbon atom. Because the synthesis of a monomer to be a raw material for the ionic polymer (hereinafter referred to as a "raw material monomer") is simplified, the divalent organic group represented by $Q^1$ is preferably a divalent saturated hydrocarbon group, an arylene group, and an alkyleneoxy group.

Examples of the above substituent may include an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amido group, an acid imido group, a monovalent heterocyclic group, a hydroxy group, a carboxyl group, a substituted carboxyl group, a cyano group, and a nitro group. When the substituent is present in plurality, they may be the same as or different from each other. Among these substituents, substituents other than an amino group, a silyl group, a halogen atom, a hydroxy group, or a nitro group contain a carbon atom.

The substituent will be described below. The term "$C_m$ to $C_n$" (m and n are positive integers satisfying m<n) represents that the organic group described immediately after this term has m to n carbon atoms. For example, a $C_m$ to $C_n$ alkyl group represents that the alkyl group has m to n carbon atoms; a $C_m$ to $C_n$ alkylaryl group represents that the alkyl group has m to n carbon atoms; and an aryl-$C_m$ to $C_n$ alkyl group represents that the alkyl group has m to n carbon atoms.

The alkyl group may be linear or branched. The alkyl group may also be a cycloalkyl group. The alkyl group has usually 1 to 20 carbon atoms and preferably 1 to 10 carbon atoms. Examples of the alkyl group may include a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, and a lauryl group. A hydrogen atom in the alkyl group may be substituted with a fluorine atom. Examples of such a fluorine atom-substituted alkyl group may include a trifluoromethyl group, a pentafluoroethyl group, a perfluorobutyl group, a perfluorohexyl group, and a perfluorooctyl group. Examples of the $C_1$ to $C_{12}$ alkyl group may include a methyl group, an ethyl group, a propyl group, an isopropyl group, a butyl group, an isobutyl group, a sec-butyl group, a tert-butyl group, a pentyl group, an isoamyl group, a hexyl group, a cyclohexyl group, a heptyl group, an octyl group, a nonyl group, a decyl group, and a lauryl group.

The alkoxy group may be linear or branched. The alkoxy group may also be a cycloalkyloxy group and may have a substituent. The alkoxy group has usually 1 to 20 carbon atoms and preferably 1 to 10 carbon atoms. Examples of the alkoxy group may include a methoxy group, an ethoxy group, a propyloxy group, an isopropyloxy group, a butoxy group, an isobutoxy group, a sec-butoxy group, a tert-butoxy group, a pentyloxy group, a hexyloxy group, a cyclohexyloxy group, a heptyloxy group, an octyloxy group, a nonyloxy group, a decyloxy group, and a lauryloxy group. A hydrogen atom in the alkoxy group may be substituted with a fluorine atom. Examples of such a fluorine atom-substituted alkoxy group may include a trifluoromethoxy group, a pentafluoroethoxy group, a perfluorobutoxy group, a perfluorohexyloxy group, and a perfluorooctyloxy group. Examples of the alkoxy group may also include a methoxymethyloxy group and a 2-methoxyethyloxy group. Examples of the $C_1$ to $C_{12}$ alkoxy group may include a methoxy group, an ethoxy group, a propyloxy group, an isopropyloxy group, a butoxy group, an isobutoxy group, a sec-butoxy group, a tert-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group, and a lauryloxy group.

The alkylthio group may be linear or branched. The alkylthio group may also be a cycloalkylthio group and may have a substituent. The alkylthio group has usually 1 to 20 carbon atoms and preferably 1 to 10 carbon atoms. Examples of the alkylthio group may include a methylthio group, an ethylthio group, a propylthio group, an isopropylthio group, a butylthio group, an isobutylthio group, a sec-butylthio group, a tert-butylthio group, a pentylthio group, a hexylthio group, a cyclohexylthio group, a heptylthio group, an octylthio group, a nonylthio group, a decylthio group, and a laurylthio group. A hydrogen atom in the alkylthio group may be substituted with a fluorine atom. Examples of such a fluorine atom-substituted alkylthio group may include a trifluoromethylthio group.

The aryl group is an atomic group remaining after removing one hydrogen atom that is bonded to a carbon atom constituting an aromatic ring from an aromatic hydrocarbon. The aryl group also includes a group having a benzene ring, a group having a fused ring, and a group in which two or more independent benzene rings or fused rings are bonded through a single bond or a divalent organic group (for example, an alkenylene group such as a vinylene group). The aryl group has usually 6 to 60 carbon atoms and preferably 7 to 48 carbon atoms. Examples of the aryl group may include a phenyl group, a $C_1$ to $C_{12}$ alkoxyphenyl group, a $C_1$ to $C_{12}$ alkylphenyl group, a 1-naphthyl group, a 2-naphthyl group, a 1-anthracenyl group, a 2-anthracenyl group, and a 9-anthracenyl group. A hydrogen atom in the aryl group may be substituted with a fluorine atom. Examples of such a fluorine atom-substituted aryl group may include a pentafluorophenyl group. Among the aryl groups, a $C_1$ to $C_{12}$ alkoxyphenyl group and a $C_1$ to $C_{12}$ alkylphenyl group are preferred.

Among the aryl groups, examples of the $C_1$ to $C_{12}$ alkoxyphenyl group may include a methoxyphenyl group, an ethoxyphenyl group, a propyloxyphenyl group, an isopropyloxyphenyl group, a butoxyphenyl group, an isobutoxyphenyl group, a sec-butoxyphenyl group, a tert-butoxyphenyl group, a pentyloxyphenyl group, a hexyloxyphenyl group, a cyclohexyloxyphenyl group, a heptyloxyphenyl group, an octyloxyphenyl group, a 2-ethylhexyloxyphenyl group, a nonyloxyphenyl group, a decyloxyphenyl group, a 3,7-dimethyloctyloxyphenyl group, and a lauryloxyphenyl group.

Among the aryl groups, examples of the $C_1$ to $C_{12}$ alkylphenyl group may include a methylphenyl group, an ethylphenyl group, a dimethylphenyl group, a propylphenyl group, a mesityl group, a methylethylphenyl group, an isopropylphenyl group, a butylphenyl group, an isobutylphenyl group, a t-butylphenyl group, a pentylphenyl group, an isoamylphenyl group, a hexylphenyl group, a heptylphenyl group, an octylphenyl group, a nonylphenyl group, a decylphenyl group, and a dodecylphenyl group.

The aryloxy group has usually 6 to 60 carbon atoms and preferably 7 to 48 carbon atoms. Examples of the aryloxy group may include a phenoxy group, a $C_1$ to $C_{12}$ alkoxyphenoxy group, a $C_1$ to $C_{12}$ alkylphenoxy group, a 1-naphthyloxy group, a 2-naphthyloxy group, and a pentafluorophenyloxy group. Among the aryloxy groups, a $C_1$ to $C_{12}$ alkoxyphenoxy group and a $C_1$ to $C_{12}$ alkylphenoxy group are preferred.

Among the aryloxy groups, examples of the $C_1$ to $C_{12}$ alkoxyphenoxy group may include a methoxyphenoxy group, an ethoxyphenoxy group, a propyloxyphenoxy group, an isopropyloxyphenoxy group, a butoxyphenoxy group, an isobutoxyphenoxy group, a sec-butoxyphenoxy group, a tert-butoxyphenoxy group, a pentyloxyphenoxy group, a hexyloxyphenoxy group, a cyclohexyloxyphenoxy group, a heptyloxyphenoxy group, an octyloxyphenoxy group, a 2-ethylhexyloxyphenoxy group, a nonyloxyphenoxy group, a decyloxyphenoxy group, a 3,7-dimethyloctyloxyphenoxy group, and a lauryloxyphenoxy group.

Among the aryloxy groups, examples of the $C_1$ to $C_{12}$ alkylphenoxy group may include a methylphenoxy group, an ethylphenoxy group, a dimethylphenoxy group, a propylphenoxy group, a 1,3,5-trimethylphenoxy group, a methylethylphenoxy group, an isopropylphenoxy group, a butylphenoxy group, an isobutylphenoxy group, a sec-butylphenoxy group, a tert-butylphenoxy group, a pentylphenoxy group, an isoamylphenoxy group, a hexylphenoxy group, a heptylphenoxy group, an octylphenoxy group, a nonylphenoxy group, a decylphenoxy group, and a dodecylphenoxy group.

The arylthio group is, for example, a group in which a sulfur atom is bonded to the above aryl group. The arylthio group may have a substituent on an aromatic ring of the aryl group. The arylthio group has usually 6 to 60 carbon atoms and preferably 6 to 30 carbon atoms. Examples of the arylthio group may include a phenylthio group, a $C_1$ to $C_{12}$ alkoxyphenylthio group, a $C_1$ to $C_{12}$ alkylphenylthio group, a 1-naphthylthio group, a 2-naphthylthio group, and a pentafluorophenylthio group.

The arylalkyl group is, for example, a group in which the above alkyl group is bonded to the above aryl group. The arylalkyl group may have a substituent. The arylalkyl group has usually 7 to 60 carbon atoms and preferably 7 to 30 carbon atoms. Examples of the arylalkyl group may include a phenyl-$C_1$ to $C_{12}$ alkyl group, a $C_1$ to $C_{12}$ alkoxyphenyl-$C_1$ to $C_{12}$ alkyl group, a $C_1$ to $C_{12}$ alkylphenyl-$C_1$ to $C_{12}$ alkyl group, a 1-naphthyl-$C_1$ to $C_{12}$ alkyl group, and a 2-naphthyl-$C_1$ to $C_{12}$ alkyl group.

The arylalkoxy group is, for example, a group in which the above alkoxy group is bonded to the above aryl group. The arylalkoxy group may have a substituent. The arylalkoxy group has usually 7 to 60 carbon atoms and preferably 7 to 30 carbon atoms. Examples of the arylalkoxy group may include a phenyl-$C_1$ to $C_{12}$ alkoxy group, a $C_1$ to $C_{12}$ alkoxyphenyl-$C_1$ to $C_{12}$ alkoxy group, a $C_1$ to $C_{12}$ alkylphenyl-$C_1$ to $C_{12}$ alkoxy group, a 1-naphthyl-$C_1$ to $C_{12}$ alkoxy group, and a 2-naphthyl-$C_1$ to $C_{12}$ alkoxy group.

The arylalkylthio group is, for example, a group in which the above alkylthio group is bonded to the above aryl group. The arylalkylthio group may have a substituent. The arylalkylthio group has usually 7 to 60 carbon atoms and preferably 7 to 30 carbon atoms. Examples of the arylalkylthio group may include a phenyl-$C_1$ to $C_{12}$ alkylthio group, a $C_1$ to $C_{12}$ alkoxyphenyl-$C_1$ to $C_{12}$ alkylthio group, a $C_1$ to $C_{12}$ alkylphenyl-$C_1$ to $C_{12}$ alkylthio group, a 1-naphthyl-$C_1$ to $C_{12}$ alkylthio group, and a 2-naphthyl-$C_1$ to $C_{12}$ alkylthio group.

The arylalkenyl group is, for example, a group in which an alkenyl group is bonded to the above aryl group. The arylalkenyl group has usually 8 to 60 carbon atoms and preferably 8 to 30 carbon atoms. Examples of the arylalkenyl group may include a phenyl-$C_2$ to $C_{12}$ alkenyl group, a $C_1$ to $C_{12}$ alkoxyphenyl-$C_2$ to $C_{12}$ alkenyl group, a $C_1$ to $C_{12}$ alkylphenyl-$C_2$ to $C_{12}$ alkenyl group, a 1-naphthyl-$C_2$ to $C_{12}$ alkenyl group, and a 2-naphthyl-$C_2$ to $C_{12}$ alkenyl group, and a $C_1$ to $C_{12}$ alkoxyphenyl-$C_2$ to $C_{12}$ alkenyl group and a $C_1$ to $C_{12}$ alkylphenyl-$C_2$ to $C_{12}$ alkenyl group are preferred. Examples of the $C_2$ to $C_{12}$ alkenyl group may include a vinyl group, a 1-propenyl group, a 2-propenyl group, a 1-butenyl group, a 2-butenyl group, a 1-pentenyl group, a 2-pentenyl group, a 1-hexenyl group, a 2-hexenyl group, and a 1-octenyl group.

The arylalkynyl group is, for example, a group in which an alkynyl group is bonded to the above aryl group. The arylalkynyl group has usually 8 to 60 carbon atoms and preferably 8 to 30 carbon atoms. Examples of the arylalkynyl group may include a phenyl-$C_2$ to $C_{12}$ alkynyl group, a $C_1$ to $C_{12}$ alkoxyphenyl-$C_2$ to $C_{12}$ alkynyl group, a $C_1$ to $C_{12}$ alkylphenyl-$C_2$ to $C_{12}$ alkynyl group, a 1-naphthyl-$C_2$ to $C_{12}$ alkynyl group, and a 2-naphthyl-$C_2$ to $C_{12}$ alkynyl group, and a $C_1$ to $C_{12}$ alkoxyphenyl-$C_2$ to $C_{12}$ alkynyl group and a $C_1$ to $C_{12}$ alkylphenyl-$C_2$ to $C_{12}$ alkynyl group are preferred. Examples of the $C_2$ to $C_{12}$ alkynyl group may include an ethynyl group, a 1-propynyl group, a 2-propynyl group, a 1-butynyl group, a 2-butynyl group, a 1-pentynyl group, a 2-pentynyl group, a 1-hexynyl group, a 2-hexynyl group, and a 1-octynyl group.

The substituted amino group is preferably an amino group in which at least one hydrogen atom in an amino group is substituted with one or two group(s) selected from the group consisting of an alkyl group, an aryl group, an arylalkyl group, and a monovalent heterocyclic group. The alkyl group, the aryl group, the arylalkyl group, and the monovalent heterocyclic group may further have a substituent. The substituted amino group has usually 1 to 60 carbon atoms and preferably 2 to 48 carbon atoms, without including the number of carbon atoms of the substituent that the alkyl group, the aryl group, the arylalkyl group, or the monovalent heterocyclic group may have. Examples of the substituted amino group may include a methylamino group, a dimethylamino group, an ethylamino group, a diethylamino group, a propylamino group, a dipropylamino group, an isopropylamino group, a diisopropylamino group, a butylamino group, an isobutylamino group, a sec-butylamino group, a tert-butylamino group, a pentylamino group, a hexylamino group, a cyclohexylamino group, a heptylamino group, an octylamino group, a 2-ethylhexylamino group, a nonylamino group, a decylamino group, a 3,7-dimethyloctylamino group, a laurylamino group, a cyclopentylamino group, a dicyclopentylamino group, a cyclohexylamino group, a dicyclohexylamino group, a ditrifluoromethylamino group, a phenylamino group, a diphenylamino group, a ($C_1$ to $C_{12}$ alkoxyphenyl)amino group, a di($C_1$ to $C_{12}$ alkoxyphenyl) amino group, a di($C_1$ to $C_{12}$ alkylphenyl)amino group, a 1-naphthylamino group, a 2-naphthylamino group, a pentafluorophenylamino group, a pyridylamino group, a pyridazinylamino group, a pyrimidylamino group, a pyrazinylamino group, a triazinylamino group, a (phenyl-$C_1$ to $C_{12}$ alkyl)amino group, a ($C_1$ to $C_{12}$ alkoxyphenyl-$C_1$ to $C_{12}$ alkyl)amino group, a ($C_1$ to $C_{12}$ alkylphenyl-$C_1$ to $C_{12}$ alkyl)

amino group, a di(C₁ to C₁₂ alkoxyphenyl-C₁ to C₁₂ alkyl) amino group, a di(C₁ to C₁₂ alkylphenyl-C₁ to C₁₂ alkyl) amino group, a 1-naphthyl-C₁ to C₁₂ alkylamino group, and a 2-naphthyl-C₁ to C₁₂ alkylamino group.

The substituted silyl group may be a silyl group in which at least one hydrogen atom in a silyl group is substituted with one to three group(s) selected from the group consisting of an alkyl group, an aryl group, an arylalkyl group, and a monovalent heterocyclic group. The alkyl group, the aryl group, the arylalkyl group, and the monovalent heterocyclic group may further have a substituent. The substituted silyl group has usually 1 to 60 carbon atoms and preferably 3 to 48 carbon atoms, without including the number of carbon atoms of the substituent that the alkyl group, the aryl group, the arylalkyl group, or the monovalent heterocyclic group may have. Examples of the substituted silyl group may include a trimethylsilyl group, a triethylsilyl group, a tripropylsilyl group, a triisopropylsilyl group, an isopropyldimethylsilyl group, an isopropyldiethylsilyl group, a tert-butyldimethylsilyl group, a pentyldimethylsilyl group, a hexyldimethylsilyl group, a heptyldimethylsilyl group, an octyldimethylsilyl group, a 2-ethylhexyldimethylsilyl group, a nonyldimethylsilyl group, a decyldimethylsilyl group, a 3,7-dimethyloctyldimethylsilyl group, a lauryldimethylsilyl group, a (phenyl-C₁ to C₁₂ alkyl)silyl group, a (C₁ to C₁₂ alkoxyphenyl-C₁ to C₁₂ alkyl)silyl group, a (C₁ to C₁₂ alkylphenyl-C₁ to C₁₂ alkyl)silyl group, a (1-naphthyl-C₁ to C₁₂ alkyl)silyl group, a (2-naphthyl-C₁ to C₁₂ alkyl)silyl group, a (phenyl-C₁ to C₁₂ alkyl)dimethylsilyl group, a triphenylsilyl group, a tri(p-xylyl)silyl group, a tribenzylsilyl group, a diphenylmethylsilyl group, a tert-butyldiphenylsilyl group, and a dimethylphenylsilyl group.

Examples of the halogen atom may include a fluorine atom, a chlorine atom, a bromine atom, and an iodine atom.

The acyl group has usually 2 to 20 carbon atoms and preferably 2 to 18 carbon atoms. Examples of the acyl group may include an acetyl group, a propionyl group, a butyryl group, an isobutyryl group, a pivaloyl group, a benzoyl group, a trifluoroacetyl group, and a pentafluorobenzoyl group.

The acyloxy group has usually 2 to 20 carbon atoms and preferably 2 to 18 carbon atoms. Examples of the acyloxy group may include an acetoxy group, a propionyloxy group, a butyryloxy group, an isobutyryloxy group, a pivaloyloxy group, a benzoyloxy group, a trifluoroacetyloxy group, and a pentafluorobenzoyloxy group.

The imine residue means a residue remaining after removing one hydrogen atom from an imine compound having a structure represented by at least any one of a formula: H—N=C< and a formula: —N=CH—. Examples of such an imine compound may include aldimine, ketimine, and a compound in which a hydrogen atom bonded to a nitrogen atom in aldimine is substituted with a group such as an alkyl group, an aryl group, an arylalkyl group, an arylalkenyl group, and an arylalkynyl group. The imine residue has usually 2 to 20 carbon atoms and preferably 2 to 18 carbon atoms. Examples of the imine residue may include a group represented by a general formula: —CR$^β$=NR$^γ$ or a general formula: —N=C(R$^γ$)₂, (where R$^β$ represents a hydrogen atom, an alkyl group, an aryl group, an arylalkyl group, an arylalkenyl group, or an arylalkynyl group; R$^γ$ independently represents an alkyl group, an aryl group, an arylalkyl group, an arylalkenyl group, or an arylalkynyl group, with the proviso that when two R$^γ$ are present, the two R$^γ$ may be bonded to each other to form a ring as a divalent group, for example, a C$_{2-18}$ alkylene group such as an ethylene group, a trimethylene group, a tetramethylene group, a pentamethylene group, and a hexamethylene group). Examples of the imine residue may include the following groups.

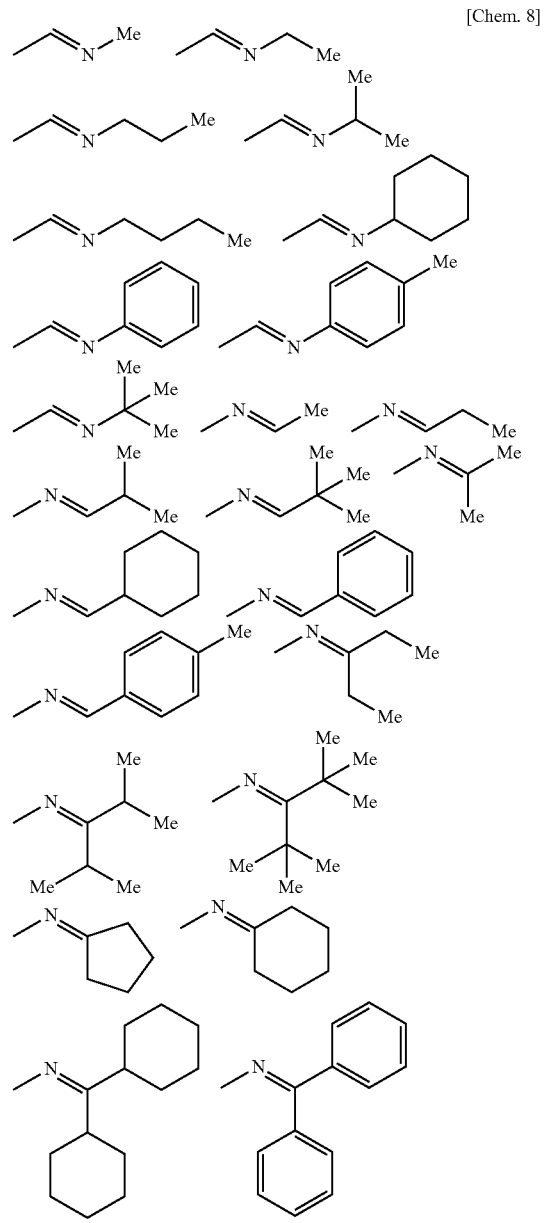

[Chem. 8]

In the formulae, Me indicates a methyl group, and the same shall apply hereinafter.

The amido group has usually 1 to 20 carbon atoms and preferably 2 to 18 carbon atoms. Examples of the amido group may include a formamido group, an acetamido group, a propioamido group, a butyramido group, a benzamido group, a trifluoroacetamido group, a pentafluorobenzamido group, a diformamido group, a diacetamido group, a dipropioamido group, a dibutyramido group, a dibenzamido group, a ditrifluoroacetamido group, and a dipentafluorobenzamido group.

The acid imido group is a residue obtained by removing a hydrogen atom that is bonded to a nitrogen atom from an acid imide. The acid imido group has usually 4 to 20 carbon atoms and preferably 4 to 18 carbon atoms. Examples of the acid imido group may include the following groups.

[Chem. 9]

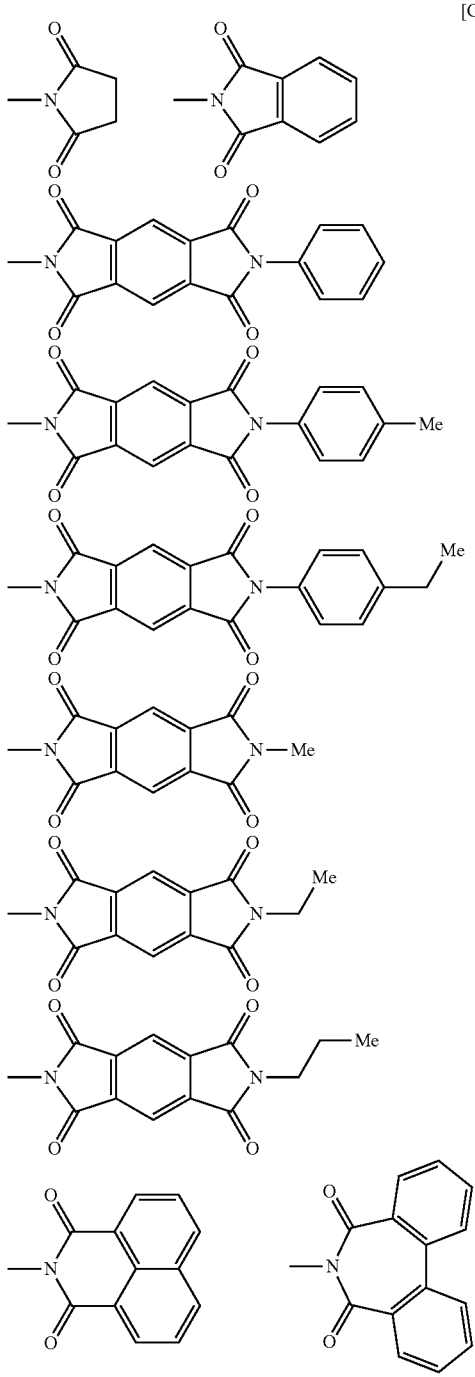

The monovalent heterocyclic group refers to an atomic group remaining after removing one hydrogen atom from a heterocyclic compound. Here, the heterocyclic compound refers to an organic compound containing not only a carbon atom, but also a hetero atom such as an oxygen atom, a sulfur atom, a nitrogen atom, a phosphorus atom, a boron atom, a silicon atom, a selenium atom, a tellurium atom, and an arsenic atom as an element constituting the ring, among organic compounds having a cyclic structure. The monovalent heterocyclic group may have a substituent. The monovalent heterocyclic group has usually 3 to 60 carbon atoms and preferably 3 to 20 carbon atoms. The number of carbon atoms of the monovalent heterocyclic group does not include the number of carbon atoms of the substituent. Examples of such a monovalent heterocyclic group may include a thienyl group, a $C_1$ to $C_{12}$ alkylthienyl group, a pyrrolyl group, a furyl group, a pyridyl group, a $C_1$ to $C_{12}$ alkylpyridyl group, a pyridazinyl group, a pyrimidyl group, a pyrazinyl group, a triazinyl group, a pyrrolidyl group, a piperidyl group, a quinolyl group, and an isoquinolyl group. Among them, a thienyl group, a $C_1$ to $C_{12}$ alkylthienyl group, a pyridyl group, and a $C_1$ to $C_{12}$ alkylpyridyl group are preferred. The monovalent heterocyclic group is preferably a monovalent aromatic heterocyclic group.

The substituted carboxyl group refers to a group in which a hydrogen atom in a carboxyl group is substituted with an alkyl group, an aryl group, an arylalkyl group, or a monovalent heterocyclic group, that is, a group represented by a formula: —C(=O)OR* (where R* is an alkyl group, an aryl group, an arylalkyl group, or a monovalent heterocyclic group). The substituted carboxyl group has usually 2 to 60 carbon atoms and preferably 2 to 48 carbon atoms. The alkyl group, the aryl group, the arylalkyl group, and the monovalent heterocyclic group may have a substituent. Here, the above number of carbon atoms does not include the number of carbon atoms of the substituent that the above alkyl group, aryl group, arylalkyl group, or monovalent heterocyclic group may have. Examples of the substituted carboxyl group may include a methoxycarbonyl group, an ethoxycarbonyl group, a propoxycarbonyl group, an isopropoxycarbonyl group, a butoxycarbonyl group, an isobutoxycarbonyl group, a sec-butoxycarbonyl group, a tert-butoxycarbonyl group, a pentyloxycarbonyl group, a hexyloxycarbonyl group, a cyclohexyloxycarbonyl group, a heptyloxycarbonyl group, an octyloxycarbonyl group, a 2-ethylhexyloxycarbonyl group, a nonyloxycarbonyl group, a decyloxycarbonyl group, a 3,7-dimethyloctyloxycarbonyl group, a dodecyloxycarbonyl group, a trifluoromethoxycarbonyl group, a pentafluoroethoxycarbonyl group, a perfluorobutoxycarbonyl group, a perfluorohexyloxycarbonyl group, a perfluorooctyloxycarbonyl group, a phenoxycarbonyl group, a naphthoxycarbonyl group, and a pyridyloxycarbonyl group.

In Formula (1), $Y^1$ represents a monovalent group such as —$CO_2^-$, —$SO_3^-$, —$SO_2^-$, —$PO_3^-$, or —$B(R^a)_3^-$. In view of the acidity of the ionic polymer, $Y^1$ is preferably —$CO_2^-$, —$SO_2^-$, or —$PO_3^-$ and more preferably —$CO_2^-$. Because the ionic polymer is stabilized, $Y^1$ is preferably —$CO_2^-$, —$SO_3^-$, —$SO_2^-$, or —$PO_3^-$.

In Formula (1), $M^1$ represents a metal cation or an ammonium cation optionally having a substituent. The metal cation is preferably a monovalent, divalent, or trivalent ion, and examples of the metal cation may include an ion of Li, Na, K, Cs, Be, Mg, Ca, Ba, Ag, Al, Bi, Cu, Fe, Ga, Mn, Pb, Sn, Ti, V, W, Y, Yb, Zn, Zr, or the like. Among them, $Li^+$, $Na^+$, $K^+$, $Cs^+$, $Ag^+$, $Mg^{2+}$, and $Ca^{2+}$ are preferred. Examples of the substituent that the ammonium ion may have may include a $C_{1-10}$ alkyl group such as a methyl group, an ethyl group, a propyl group, an isopropyl group, a n-butyl group, an i-butyl group, and a tert-butyl group.

In Formula (1), $Z^1$ represents $F^-$, $Cl^-$, $Br^-$, $I^-$, $OH^-$, $R^aSO_3^-$, $R^aCOO^-$, $ClO^-$, $ClO_2^-$, $ClO_3^-$, $ClO_4^-$, $SCN^-$, $CN^-$, $NO_3^-$, $SO_4^{2-}$, $HSO_4^-$, $PO_4^{3-}$, $HPO_4^{2-}$, $H_2PO_4^-$, $BF_4^-$ or $PF_6^-$.

In Formula (1), n1 represents an integer of 0 or more. In view of the synthesis of the raw material monomer, n1 is preferably an integer of 0 to 8 and more preferably an integer of 0 to 2.

In Formula (1), a1 represents an integer of 1 or more, and b1 represents an integer of 0 or more.

The above a1 and b1 are selected so that the electric charge of the group represented by Formula (1) becomes 0. For example, when $Y^1$ is $-CO_2^-$, $-SO_3^-$, $-SO_2^-$, $-PO_3^-$, or $-B(R^a)_3^-$; $M^1$ is a monovalent metal cation or an ammonium cation optionally having a substituent; and $Z^1$ is $F^-$, $Cl^-$, $Br^-$, $I^-$, $OH^-$, $R^aSO_3^-$, $R^aCOO^-$, $ClO^-$, $ClO_2^-$, $ClO_3^-$, $ClO_4^-$, $SCN^-$, $CN^-$, $NO_3^-$, $HSO_4^-$, $H_2PO_4^-$, $BF_4^-$, or $PF_6^-$, a1 and b1 are selected so as to satisfy a1=b1+1. When $Y^1$ is $-CO_2^-$, $-SO_3^-$, $-SO_2^-$, $-PO_3^-$, or $-B(R^a)_3^-$; $M^1$ is a divalent metal cation; and $Z^1$ is $F^-$, $Cl^-$, $Br^-$, $I^-$, $OH^-$, $R^aSO_3^-$, $R^aCOO^-$, $ClO^-$, $ClO_2^-$, $ClO_3^-$, $ClO_4^-$, $SCN^-$, $CN^-$, $NO_3^-$, $HSO_4^-$, $H_2PO_4^-$, $BF_4^-$, or $PF_6^-$, a1 and b1 are selected so as to satisfy b1=2×a1−1. When $Y^1$ is $-CO_2^-$, $-SO_3^-$, $-SO_2^-$, $-PO_3^-$, or $-B(R^a)_3^-$; $M^1$ is a trivalent metal cation; and $Z^1$ is $F^-$, $Cl^-$, $Br^-$, $I^-$, $OH^-$, $R^aSO_3^-$, $R^aCOO^-$, $ClO^-$, $ClO_2^-$, $ClO_3^-$, $ClO_4^-$, $SCN^-$, $CN^-$, $NO_3^-$, $HSO_4^-$, $H_2PO_4^-$, $BF_4^-$, or $PF_6^-$, a1 and b1 are selected so as to satisfy b1=3×a1−1. When $Y^1$ is $-CO_2^-$, $-SO_3^-$, $-SO_2^-$, $-PO_3^-$, or $-B(R^a)_3^-$; $M^1$ is a monovalent metal cation or an ammonium cation optionally having a substituent; and $Z^1$ is $SO_4^{2-}$ or $HPO_4^{2-}$, a1 and b1 are selected so as to satisfy a1=2×b1+1. In any one of the above numerical formulae expressing the relation between a1 and b1, a1 is preferably an integer of 1 to 5 and more preferably 1 or 2.

$R^a$ represents a $C_{1-30}$ alkyl group optionally having a substituent or a $C_{6-50}$ aryl group optionally having a substituent. Examples of the substituent that these groups may have may include the same substituent as the substituent shown as examples in the description with respect to $Q^1$. When the substituent is present in plurality, they may be the same as or different from each other. Examples of $R^a$ may include a $C_{1-20}$ alkyl group such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, and a lauryl group, and a $C_{6-30}$ aryl group such as a phenyl group, a 1-naphthyl group, a 2-naphthyl group, a 1-anthracenyl group, a 2-anthracenyl group, and a 9-anthracenyl group.

Examples of the group represented by Formula (1) may include the following groups.

[Chem. 10]

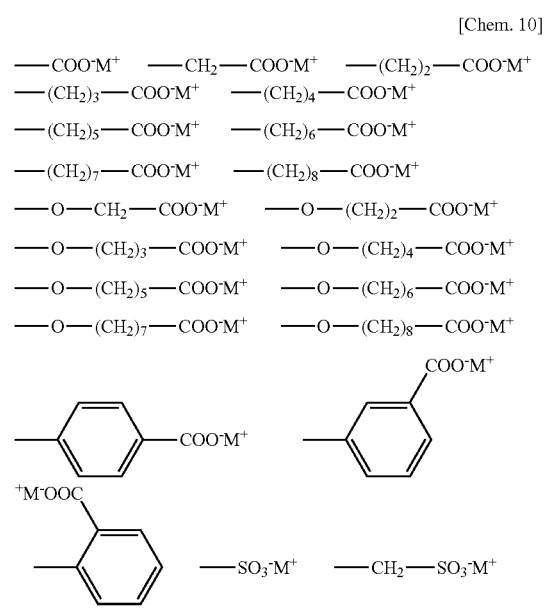

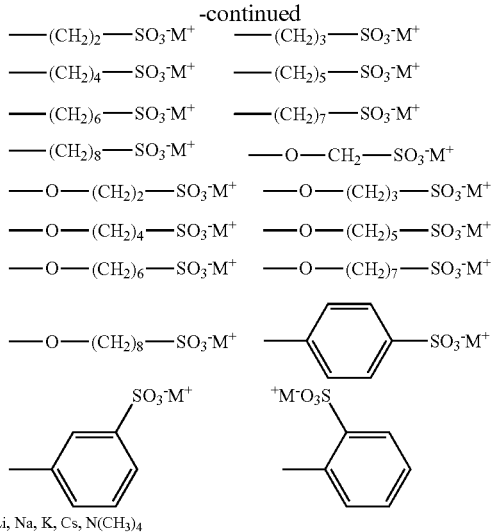

$M = Li, Na, K, Cs, N(CH_3)_4$

Group Represented by Formula (2)

In Formula (2), examples of the divalent organic group represented by $Q^2$ may include the same group as the group shown as examples with respect to the divalent organic group represented by $Q^1$. Because the synthesis of the raw material monomer is simplified, the divalent organic group represented by $Q^2$ is preferably a divalent saturated hydrocarbon group, an arylene group, and an alkyleneoxy group.

The group shown as examples for the divalent organic group represented by $Q^2$ may have a substituent. Examples of the substituent may include the same substituent as the substituent shown as examples in the description with respect to $Q^1$. When the substituent is present in plurality, they may be the same as or different from each other.

In Formula (2), $Y^2$ represents a carbocation, an ammonium cation, a phosphonium cation, a sulfonium cation, or an iodonium cation.

Examples of the carbocation may include a group represented by $-C^+R_2$ wherein two R may be the same as or different from each other and represent independently an alkyl group or an aryl group.

Examples of the ammonium cation may include a group represented by $-N^+R_3$ wherein three R may be the same as or different from each other and represent independently an alkyl group or an aryl group.

Examples of the phosphonium cation may include a group represented by $-P^+R_3$ wherein three R may be the same as or different from each other and represent independently an alkyl group or an aryl group.

Examples of the sulfonium cation may include a group represented by $-S^+R_2$ wherein two R may be the same as or different from each other and represent independently an alkyl group or an aryl group.

Examples of the iodonium cation may include a group represented by

—I$^+$R$_2$ wherein two R may be the same as or different from each other and represent independently an alkyl group or an aryl group.

In Formula (2), $Y^2$ is preferably a carbocation, an ammonium cation, a phosphonium cation, or a sulfonium cation, and more preferably an ammonium cation, because the synthesis of the raw material monomer is simplified and the raw material monomer and the ionic polymer are stabilized against air, moisture, and heat.

In Formula (2), $Z^2$ represents a metal cation or an ammonium cation optionally having a substituent. The metal cation is preferably a monovalent, divalent, or trivalent ion. Examples of the metal cation may include an ion of Li, Na, K, Cs, Be, Mg, Ca, Ba, Ag, Al, Bi, Cu, Fe, Ga, Mn, Pb, Sn, Ti, V, W, Y, Yb, Zn, Zr, or the like. Examples of the substituent that the ammonium cation may have may include a $C_{1-10}$ alkyl group such as a methyl group, an ethyl group, a propyl group, an isopropyl group, a n-butyl group, an isobutyl group, and a tert-butyl group.

In Formula (2), $M^2$ represents F$^-$, Cl$^-$, Br$^-$, I$^-$, OH$^-$, $R^bSO_3^-$, $R^bCOO^-$, ClO$^-$, ClO$_2^-$, ClO$_3^-$, ClO$_4^-$, SCN$^-$, CN$^-$, NO$_3^-$, SO$_4^{2-}$, HSO$_4^-$, PO$_4^{3-}$, HPO$_4^{2-}$, H$_2$PO$_4^-$, BF$_4^-$, or PF$_6^-$.

In Formula (2), n2 represents an integer of 0 or more, preferably an integer of 0 to 6, and more preferably an integer of 0 to 2.

In Formula (2), a2 represents an integer of 1 or more, and b2 represents an integer of 0 or more.

The above a2 and b2 are selected so that the electric charge of the group represented by Formula (2) becomes 0. For example, in the case of $M^2$ being F$^-$, Cl$^-$, Br$^-$, I$^-$, OH$^-$, $R^bSO_3^-$, $R^bCOO^-$, ClO$^-$, ClO$_2^-$, ClO$_3^-$, ClO$_4^-$, SCN$^-$, CN$^-$, NO$_3^-$, HSO$_4^-$, H$_2$PO$_4^-$, BF$_4^-$, or PF$_6^-$, when $Z^2$ is a monovalent metal ion or an ammonium ion optionally having a substituent, a2 and b2 are selected so as to satisfy a2=b2+1; when $Z^2$ is a divalent metal ion, a2 and b2 are selected so as to satisfy a2=2×b2+1; and when $Z^2$ is a trivalent metal ion, a2 and b2 are selected so as to satisfy a2=3×b2+1. In the case of $M^2$ being SO$_4^{2-}$ or HPO$_4^{2-}$, when $Z^2$ is a monovalent metal ion or an ammonium ion optionally having a substituent, a2 and b2 are selected so as to satisfy b2=2×a2−1; and when $Z^2$ is a trivalent metal ion, a2 and b2 are selected so as to satisfy the relationship of 2×a2=3×b2+1. In any one of the above numerical formulae expressing the relation between a2 and b2, a2 is preferably an integer of 1 to 3 and more preferably 1 or 2.

$R^b$ represents a $C_{1-30}$ alkyl group optionally having a substituent or a $C_{6-50}$ aryl group optionally having a substituent. Examples of the substituent that these groups may have may include the same substituent as the substituent shown as examples in the description with respect to $Q^1$. When the substituent is present in plurality, they may be the same as or different from each other. Examples of $R^b$ may include a $C_{1-20}$ alkyl group such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, and a lauryl group, and a $C_{6-30}$ aryl group such as a phenyl group, a 1-naphthyl group, a 2-naphthyl group, a 1-anthracenyl group, a 2-anthracenyl group, and a 9-anthracenyl group.

Examples of the group represented by Formula (2) may include the following groups.

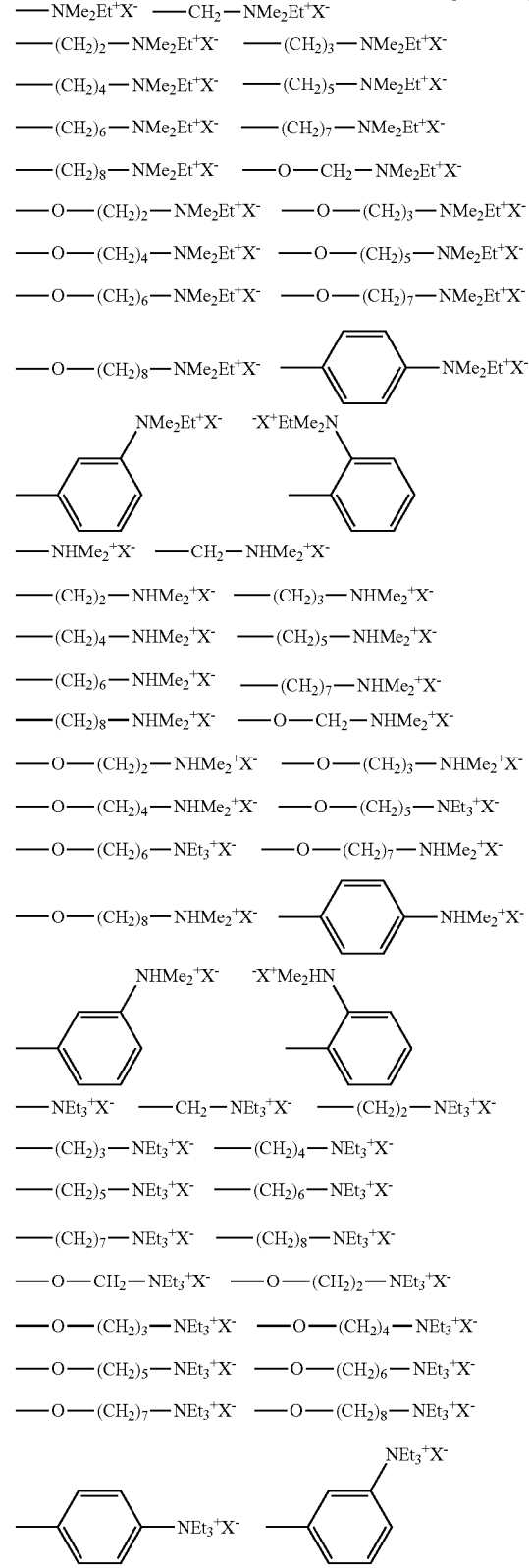

[Chem. 11]

-continued

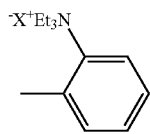

Me = CH₃
Et = CH₂CH₃
X = F, Cl, Br, I, BPh₄, CH₃COO, CF₃SO₃,

[Chem. 12]

—NHEt₂⁺X⁻   —CH₂—NHEt₂⁺X⁻   —(CH₂)₂—NHEt₂⁺X⁻
—(CH₂)₃—NHEt₂⁺X⁻   —(CH₂)₄—NHEt₂⁺X⁻
—(CH₂)₅—NHEt₂⁺X⁻   —(CH₂)₆—NHEt₂⁺X⁻
—(CH₂)₇—NHEt₂⁺X⁻   —(CH₂)₈—NHEt₂⁺X⁻
—O—CH₂—NHEt₂⁺X⁻   —O—(CH₂)₂—NHEt₂⁺X⁻
—O—(CH₂)₃—NHEt₂⁺X⁻   —O—(CH₂)₄—NHEt₂⁺X⁻
—O—(CH₂)₅—NHEt₂⁺X⁻   —O—(CH₂)₆—NHEt₂⁺X⁻
—O—(CH₂)₇—NHEt₂⁺X⁻   —O—(CH₂)₈—NHEt₂⁺X⁻

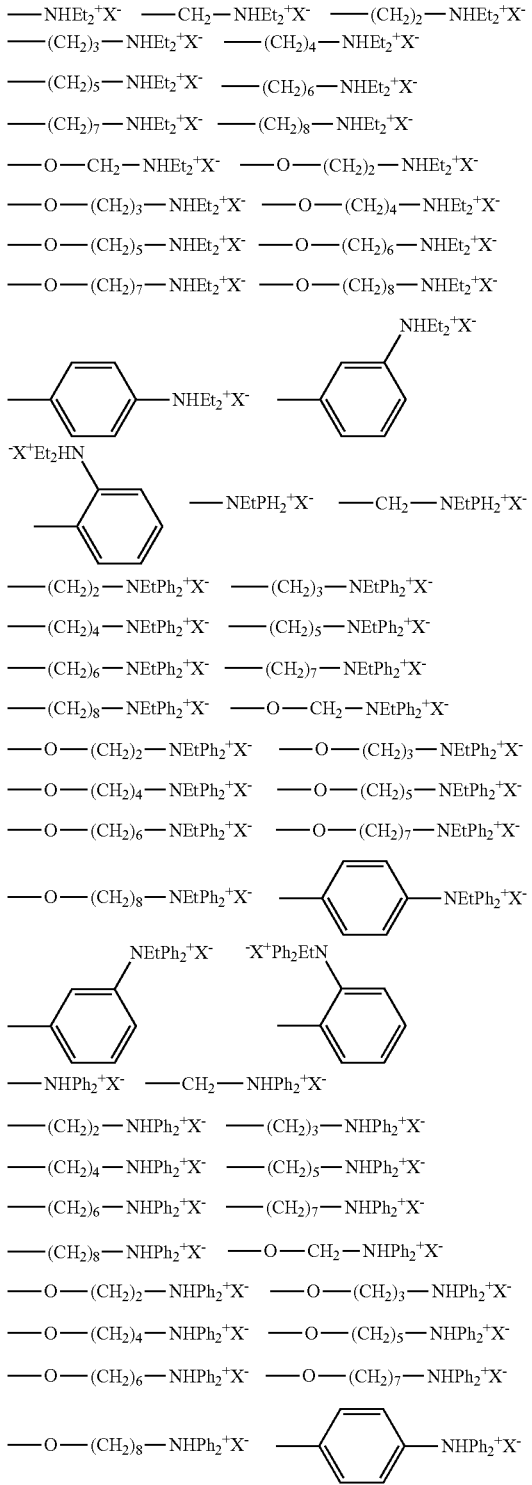

—NEtPh₂⁺X⁻   —CH₂—NEtPh₂⁺X⁻
—(CH₂)₂—NEtPh₂⁺X⁻   —(CH₂)₃—NEtPh₂⁺X⁻
—(CH₂)₄—NEtPh₂⁺X⁻   —(CH₂)₅—NEtPh₂⁺X⁻
—(CH₂)₆—NEtPh₂⁺X⁻   —(CH₂)₇—NEtPh₂⁺X⁻
—(CH₂)₈—NEtPh₂⁺X⁻   —O—CH₂—NEtPh₂⁺X⁻
—O—(CH₂)₂—NEtPh₂⁺X⁻   —O—(CH₂)₃—NEtPh₂⁺X⁻
—O—(CH₂)₄—NEtPh₂⁺X⁻   —O—(CH₂)₅—NEtPh₂⁺X⁻
—O—(CH₂)₆—NEtPh₂⁺X⁻   —O—(CH₂)₇—NEtPh₂⁺X⁻
—O—(CH₂)₈—NEtPh₂⁺X⁻

—NHPh₂⁺X⁻   —CH₂—NHPh₂⁺X⁻
—(CH₂)₂—NHPh₂⁺X⁻   —(CH₂)₃—NHPh₂⁺X⁻
—(CH₂)₄—NHPh₂⁺X⁻   —(CH₂)₅—NHPh₂⁺X⁻
—(CH₂)₆—NHPh₂⁺X⁻   —(CH₂)₇—NHPh₂⁺X⁻
—(CH₂)₈—NHPh₂⁺X⁻   —O—CH₂—NHPh₂⁺X⁻
—O—(CH₂)₂—NHPh₂⁺X⁻   —O—(CH₂)₃—NHPh₂⁺X⁻
—O—(CH₂)₄—NHPh₂⁺X⁻   —O—(CH₂)₅—NHPh₂⁺X⁻
—O—(CH₂)₆—NHPh₂⁺X⁻   —O—(CH₂)₇—NHPh₂⁺X⁻
—O—(CH₂)₈—NHPh₂⁺X⁻

-continued

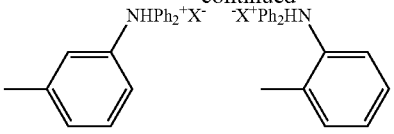

Et = CH₂CH₃
Ph = C₆H₅
X = F, Cl, Br, I, BPh₄, CH₃COO, CF₃SO₃.

Group Represented by Formula (3)

In Formula (3), examples of the divalent organic group represented by $Q^3$ may include the same group as the group shown as examples with respect to the divalent organic group represented by $Q^1$. Because the synthesis of the raw material monomer is simplified, the divalent organic group represented by $Q^3$ is preferably a divalent saturated hydrocarbon group, an arylene group, or an alkyleneoxy group.

The group shown as examples for the divalent organic group represented by $Q^3$ may have a substituent. Examples of the substituent may include the same substituent as the substituent shown as examples in the description with respect to $Q^1$. When the substituent is present in plurality, they may be the same as or different from each other.

The divalent organic group represented by $Q^3$ is preferably a group represented by —$(CH_2)$—.

The above n3 represents an integer of 0 or more, preferably an integer of 0 to 20, and more preferably an integer of 0 to 8.

In Formula (3), $Y^3$ represents —CN or the group represented by any one of Formulae (4) to (12).

In Formulae (4) to (12), examples of the divalent hydrocarbon group represented by R' may include: a $C_{1-50}$ divalent saturated hydrocarbon group optionally having a substituent such as a methylene group, an ethylene group, a 1,2-propylene group, a 1,3-propylene group, a 1,2-butylene group, a 1,3-butylene group, a 1,4-butylene group, a 1,5-pentylene group, a 1,6-hexylene group, a 1,9-nonylene group, a 1,12-dodecylene group, and a group in which at least one hydrogen atom in these groups is substituted with a substituent; a $C_{2-50}$ divalent unsaturated hydrocarbon group optionally having a substituent including a $C_{2-50}$ alkenylene group optionally having a substituent such as an ethenylene group, a propenylene group, a 3-butenylene group, a 2-butenylene group, a 2-pentenylene group, a 2-hexenylene group, a 2-nonenylene group, a 2-dodecenylene group, and a group in which at least one hydrogen atom in these groups is substituted with a substituent, and an ethynylene group; a $C_{3-50}$ divalent saturated cyclic hydrocarbon group optionally having a substituent such as a cyclopropylene group, a cyclobutylene group, a cyclopentylene group, a cyclohexylene group, a cyclononylene group, a cyclododecylene group, a norbornylene group, an adamantylene group, and a group in which at least one hydrogen atom in these groups is substituted with a substituent; a $C_{6-50}$ arylene group optionally having a substituent such as a 1,3-phenylene group, a 1,4-phenylene group, a 1,4-naphthylene group, a 1,5-naphthylene group, a 2,6-naphthylene group, a biphenyl-4,4'-diyl group, and a group in which at least one hydrogen atom in these groups is substituted with a substituent; and a $C_{1-50}$ alkyleneoxy group optionally having a substituent such as a methyleneoxy group, an ethyleneoxy group, a propyleneoxy group, a butyleneoxy group, a pentyleneoxy group, a hexyleneoxy group, and a group in which at least one hydrogen atom in these groups is substituted with a substituent.

Examples of the substituent may include the same substituent as the substituent shown as examples in the description with respect to $Q^1$. When the substituent is present in plurality, they may be the same as or different from each other.

In Formulae (4) to (12), examples of the monovalent hydrocarbon group represented by R" may include: a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; and a $C_{6-30}$ aryl group optionally having a substituent such as a phenyl group, a 1-naphthyl group, a 2-naphthyl group, a 1-anthracenyl group, a 2-anthracenyl group, a 9-anthracenyl group, and a group in which at least one hydrogen atom in these groups is substituted with a substituent. In view of the solubility of the ionic polymer, a methyl group, an ethyl group, a phenyl group, a 1-naphthyl group, and a 2-naphthyl group are preferred. Examples of the substituent may include the same substituent as the substituent shown as examples in the description with respect to $Q^1$. When the substituent is present in plurality, they may be the same as or different from each other.

In Formula (5), examples of the trivalent hydrocarbon group represented by R''' may include: a $C_{1-20}$ alkyltriyl group optionally having a substituent such as a methanetriyl group, an ethanetriyl group, a 1,2,3-propanetriyl group, a 1,2,4-butanetriyl group, a 1,2,5-pentanetriyl group, a 1,3,5-pentanetriyl group, a 1,2,6-hexanetriyl group, a 1,3,6-hexanetriyl group, and a group in which at least one hydrogen atom in these groups is substituted with a substituent; and a $C_{6-30}$ aryl group optionally having a substituent such as a 1,2,3-benzenetriyl group, a 1,2,4-benzenetriyl group, a 1,3,5-benzenetriyl group, and a group in which at least one hydrogen atom in these groups is substituted with a substituent. From the viewpoint of the solubility of the ionic polymer, a methanetriyl group, an ethanetriyl group, a 1,2,4-benzenetriyl group, and a 1,3,5-benzenetriyl group are preferred. Examples of the substituent may include the same substituent as the substituent shown as examples in the description with respect to $Q^1$. When the substituent is present in plurality, they may be the same as or different from each other.

In Formulae (4) to (12), $R^c$ is preferably a methyl group, an ethyl group, a phenyl group, a 1-naphthyl group, or a 2-naphthyl group, in view of the solubility of the ionic polymer.

In Formula (4) and Formula (5), a3 represents an integer of 1 or more and preferably an integer of 3 to 10. In Formulae (6) to (12), a4 represents an integer of 0 or more. In Formula (6), a4 is preferably an integer of 0 to 30 and more preferably an integer of 3 to 20. In Formulae (7) to (10), a4 is preferably an integer of 0 to 10 and more preferably an integer of 0 to 5. In Formula (11), a4 is preferably an integer of 0 to 20 and more preferably an integer of 3 to 20. In Formula (12), a4 is preferably an integer of 0 to 20 and more preferably an integer of 0 to 10.

Because the synthesis of the raw material monomer is simplified, $Y^3$ is preferably —CN, a group represented by Formula (4), a group represented by Formula (6), a group represented by Formula (10), or a group represented by Formula (11), more preferably the group represented by Formula (4), the group represented by Formula (6), or the group represented by Formula (11), and particularly preferably the following groups.

[Chem. 13]

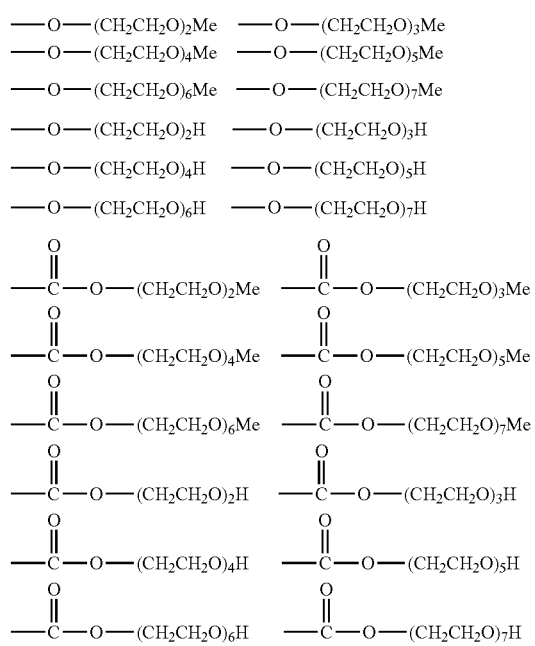

Structural Unit in Ionic Polymer

The ionic polymer used in the present invention preferably includes one or more structural unit(s) selected from the group consisting of the structural unit represented by Formula (13), the structural unit represented by Formula (15), the structural unit represented by Formula (17), and the structural unit represented by Formula (20). The ionic polymer used in the present invention preferably includes these structural units in a content of 15% by mole to 100% by mole, based on all structural units.

Structural Unit Represented by Formula (13)

In Formula (13), $R^1$ is a monovalent group including the group represented by Formula (14); $Ar^1$ represents a (2+n4) valent aromatic group optionally having a substituent other than $R^1$; and n4 represents an integer of 1 or more.

The group represented by Formula (14) may be bonded to $Ar^1$ directly. Alternatively, the group represented by Formula (14) may be bonded to $Ar^1$ through: a $C_{1-50}$ alkylene group optionally having a substituent such as a methylene group, an ethylene group, a propylene group, a butylene group, a pentylene group, a hexylene group, a nonylene group, a dodecylene group, a cyclopropylene group, a cyclobutylene group, a cyclopentylene group, a cyclohexylene group, a cyclononylene group, a cyclododecylene group, a norbornylene group, an adamantylene group, and a group in which at least one hydrogen atom in these groups is substituted with a substituent; a $C_{1-50}$ oxyalkylene group optionally having a substituent such as an oxymethylene group, an oxyethylene group, an oxypropylene group, an oxybutylene group, an oxypentylene group, an oxyhexylene group, an oxynonylene group, an oxydodecylene group, a cyclopropyleneoxy group, a cyclobutyleneoxy group, a cyclopentyleneoxy group, a cyclohexyleneoxy group, a cyclononyleneoxy group, a cyclododecyleneoxy group, a norbornyleneoxy group, an adamantyleneoxy group, and a group in which at least one hydrogen atom in these groups is substituted with a substituent; an imino group optionally having a substituent; a silylene group optionally having a substituent; an ethenylene group optionally having a substituent; an ethynylene group; a methanetriyl group optionally having a substituent; and a hetero atom such as an oxygen atom, a nitrogen atom, and a sulfur atom.

$Ar^1$ may have a substituent other than $R^1$. Examples of the substituent may include the same substituent as the substituent shown as examples in the description with respect to $Q^1$. When the substituent is present in plurality, they may be the same as or different from each other.

Because the synthesis of the raw material monomer is simplified, the substituent other than $R^1$ that $Ar^1$ may have is preferably an alkyl group, an alkoxy group, an aryl group, an aryloxy group, a carboxyl group, or a substituted carboxyl group.

In Formula (13), n4 represents an integer of 1 or more, preferably an integer of 1 to 4, and more preferably an integer of 1 to 3.

Examples of the (2+n4) valent aromatic group represented by $Ar^1$ in Formula (13) may include a (2+n4) valent aromatic hydrocarbon group and a (2+n4) valent aromatic heterocyclic group. The (2+n4) valent aromatic group represented by $Ar^1$ preferably includes a carbon atom alone or a carbon atom and one or more atom(s) selected from the group consisting of a hydrogen atom, a nitrogen atom, and an oxygen atom. Examples of the (2+n4) valent aromatic group may include: a (2+n4) valent group remaining after removing (2+n4) hydrogen atoms from a monocyclic aromatic ring such as a benzene ring, a pyridine ring, a 1,2-diazine ring, a 1,3-diazine ring, a 1,4-diazine ring, a 1,3,5-triazine ring, a furan ring, a pyrrole ring, a pyrazole ring, an imidazole ring, an oxazole ring, and an azadiazole ring; a (2+n4) valent group remaining after removing (2+n4) hydrogen atoms from a fused polycyclic aromatic ring in which two or more rings selected from the group consisting of the above monocyclic aromatic rings are fused; a (2+n4) valent group remaining after removing (2+n4) hydrogen atoms from an aromatic ring assembly in which two or more aromatic rings selected from the group consisting of the above monocyclic aromatic rings and the above fused polycyclic aromatic rings are linked through a single bond, an ethenylene group, or an ethynylene group; and a (2+n4) valent group remaining after removing (2+n4) hydrogen atoms from a bridged polycyclic aromatic ring in which two aromatic rings adjacent to each other of the above fused polycyclic aromatic ring or the above aromatic ring assembly are bridged through a divalent group such as a methylene group, an ethylene group, and a carbonyl group.

Examples of the monocyclic aromatic ring may include the following rings.

[Chem. 14]

1

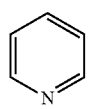
2

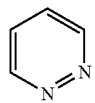
3

4

5

6

7

8

9

10

11

12

Examples of the fused polycyclic aromatic ring may include the following rings.

[Chem. 15]

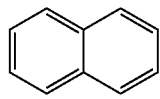
13

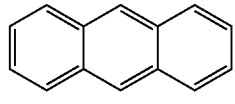
14

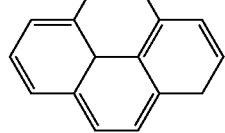
15

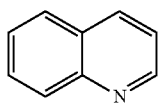
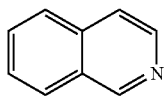
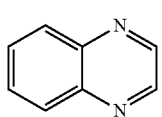
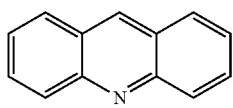
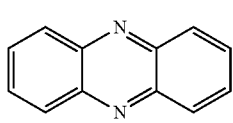
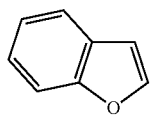
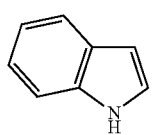
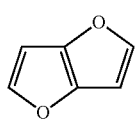
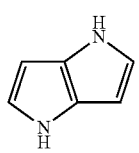
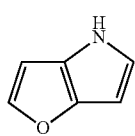
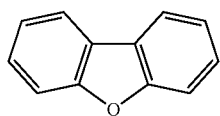
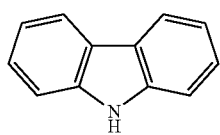
Examples of the aromatic ring assembly may include the following rings.
[Chem. 16]
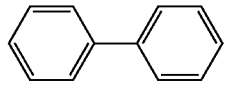
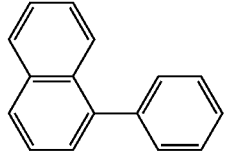
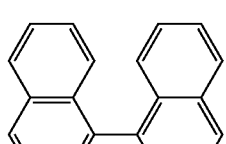
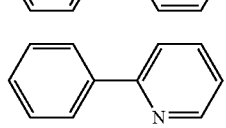
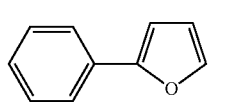
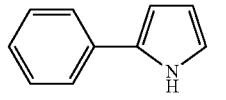
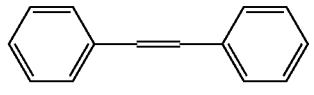
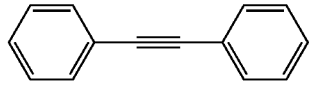
Examples of the bridged polycyclic aromatic ring may include the following rings.
[Chem. 17]
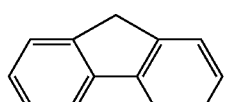
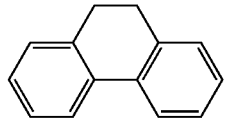

39

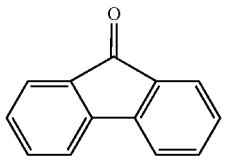

40

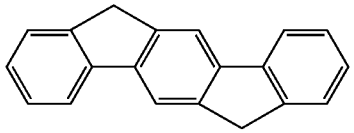

41

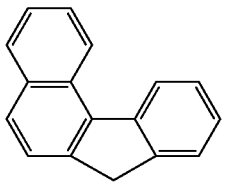

42

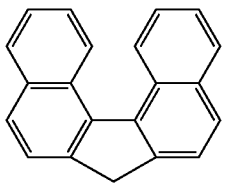

43

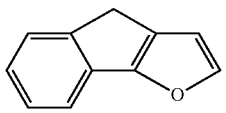

44

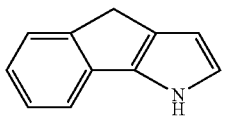

Because the synthesis of the raw material monomer is simplified, the (2+n4) valent aromatic group is preferably a group remaining after removing (2+n4) hydrogen atoms from a ring represented by a Formula from 1 to 14, 26 to 29, 37 to 39, and 41, more preferably a group remaining after removing (2+n4) hydrogen atoms from a ring represented by a Formula from 1 to 6, 8, 13, 26, 27, 37, and 41, and further preferably a group remaining after removing (2+n4) hydrogen atoms from a ring represented by Formula 1, 37, or 41.

In Formula (14), examples of the (1+m1+m2) valent organic group represented by $R^2$ may include: a group remaining after removing (m1+m2) hydrogen atoms from a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after removing (m1+m2) hydrogen atoms from a $C_{6-30}$ aryl group optionally having a substituent such as a phenyl group, a 1-naphthyl group, a 2-naphthyl group, a 1-anthracenyl group, a 2-anthracenyl group, a 9-anthracenyl group, and a group in which at least one hydrogen atom in these groups is substituted with a substituent; a group remaining after removing (m1+m2) hydrogen atoms from a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after removing (m1+m2) hydrogen atoms from an amino group having a substituent containing a carbon atom; and a group remaining after removing (m1+m2) hydrogen atoms from a silyl group having a substituent containing a carbon atom. Because the synthesis of the raw material monomer is simplified, the (1+m1+m2) valent organic group represented by $R^2$ is preferably a group remaining after removing (m1+m2) hydrogen atoms from an alkyl group, a group remaining after removing (m1+m2) hydrogen atoms from an aryl group, and a group remaining after removing (m1+m2) hydrogen atoms from an alkoxy group.

Examples of the substituent may include the same substituent as the substituent shown as examples in the description with respect to $Q^1$. When the substituent is present in plurality, they may be the same as or different from each other.

Structural Unit Represented by Formula (15)

In Formula (15), $R^3$ is a monovalent group including the group represented by Formula (16); $Ar^2$ represents a (2+n5) valent aromatic group optionally having a substituent other than $R^3$; and n5 represents an integer of 1 or more.

The group represented by Formula (16) may be bonded to $Ar^2$ directly. Alternatively, the group represented by Formula (16) may be bonded to $Ar^2$ through: a $C_{1-50}$ alkylene group optionally having a substituent such as a methylene group, an ethylene group, a propylene group, a butylene group, a pentylene group, a hexylene group, a nonylene group, a dodecylene group, a cyclopropylene group, a cyclobutylene group, a cyclopentylene group, a cyclohexylene group, a cyclononylene group, a cyclododecylene group, a norbornylene group, an adamantylene group, and a group in which at least one hydrogen atom in these groups is substituted with a substituent; a $C_{1-50}$ oxyalkylene group optionally having a substituent such as an oxymethylene group, an oxyethylene group, an oxypropylene group, an oxybutylene group, an oxypentylene group, an oxyhexylene group, an oxynonylene group, an oxydodecylene group, a cyclopropyleneoxy group, a cyclobutyleneoxy group, a cyclopentyleneoxy group, a cyclohexyleneoxy group, a cyclononyleneoxy group, a cyclododecyleneoxy group, a norbornyleneoxy group, an adamantyleneoxy group, and a group in which at least one hydrogen atom in these groups is substituted with a substituent; an imino group optionally having a substituent; a silylene group optionally having a substituent; an ethenylene group optionally having a substituent; an ethynylene group; a methanetriyl group optionally having a substituent; and a hetero atom such as an oxygen atom, a nitrogen atom, and a sulfur atom.

$Ar^2$ may have a substituent other than $R^3$. Examples of the substituent may include the same substituent as the substituent shown as examples in the description with respect to $Q^1$. When the substituent is present in plurality, they may be the same as or different from each other.

Because the synthesis of the raw material monomer is simplified, the substituent other than $R^3$ that $Ar^2$ may have is preferably an alkyl group, an alkoxy group, an aryl group, an aryloxy group, a carboxyl group, or a substituted carboxyl group.

In Formula (15), n5 represents an integer of 1 or more, preferably an integer of 1 to 4, and more preferably an integer of 1 to 3.

Examples of the (2+n5) valent aromatic group represented by $Ar^2$ in Formula (15) may include a (2+n5) valent aromatic hydrocarbon group and a (2+n5) valent aromatic heterocyclic group. The (2+n5) valent aromatic group represented by $Ar^2$ preferably includes a carbon atom alone or a carbon atom and one or more atom(s) selected from the group consisting of a hydrogen atom, a nitrogen atom, and an oxygen atom. Examples of the (2+n5) valent aromatic group may include: a (2+n5) valent group remaining after removing (2+n5) hydrogen atoms from a monocyclic aromatic ring such as a benzene ring, a pyridine ring, a 1,2-diazine ring, a 1,3-diazine ring, a 1,4-diazine ring, a 1,3,5-triazine ring, a furan ring, a pyrrole ring, a pyrazole ring, an imidazole ring, an oxazole ring, and an azadiazole ring; a (2+n5) valent group remaining after removing (2+n5) hydrogen atoms from a fused polycyclic aromatic ring in which two or more rings selected from the group consisting of the above monocyclic aromatic rings are fused; a (2+n5) valent group remaining after removing (2+n5) hydrogen atoms from an aromatic ring assembly in which two or more aromatic rings selected from the group consisting of the above monocyclic aromatic rings and the above fused polycyclic aromatic rings are linked through a single bond, an ethenylene group, or an ethynylene group; and a (2+n5) valent group remaining after removing (2+n5) hydrogen atoms from a bridged polycyclic aromatic ring in which two aromatic rings adjacent to each other of the above fused polycyclic aromatic ring or the above aromatic ring assembly are bridged through a divalent group such as a methylene group, an ethylene group, and a carbonyl group.

Examples of the monocyclic aromatic ring may include rings represented by Formulae 1 to 12 shown as examples in the description with respect to the structural unit represented by Formula (13).

Examples of the fused polycyclic aromatic ring may include rings represented by Formulae 13 to 27 shown as examples in the description with respect to the structural unit represented by Formula (13).

Examples of the aromatic ring assembly may include rings represented by Formulae 28 to 36 shown as examples in the description with respect to the structural unit represented by Formula (13).

Examples of the bridged polycyclic aromatic ring may include rings represented by Formulae 37 to 44 shown as examples in the description with respect to the structural unit represented by Formula (13).

Because the synthesis of the raw material monomer is simplified, the (2+n5) valent aromatic group is preferably a group remaining after removing (2+n5) hydrogen atoms from a ring represented by a Formula from 1 to 14, 26 to 29, 37 to 39, and 41, more preferably a group remaining after removing (2+n5) hydrogen atoms from a ring represented by a Formula from 1 to 6, 8, 13, 26, 27, 37, and 41, and further preferably a group remaining after removing (2+n5) hydrogen atoms from a ring represented by Formula 1, 37, or 41.

In Formula (16), m3 and m4 each independently represent an integer of 1 or more.

In Formula (16), examples of the (1+m3+m4) valent organic group represented by $R^4$ may include: a group remaining after removing (m3+m4) hydrogen atoms from a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after removing (m3+m4) hydrogen atoms from a $C_{6-30}$ aryl group optionally having a substituent such as a phenyl group, a 1-naphthyl group, a 2-naphthyl group, a 1-anthracenyl group, a 2-anthracenyl group, a 9-anthracenyl group, and a group in which at least one hydrogen atom in these groups is substituted with a substituent; a group remaining after removing (m3+m4) hydrogen atoms from a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after removing (m3+m4) hydrogen atoms from an amino group having a substituent containing a carbon atom; and a group remaining after removing (m3+m4) hydrogen atoms from a silyl group having a substituent containing a carbon atom. Because the synthesis of the raw material monomer is simplified, the (1+m3+m4) valent organic group represented by $R^4$ is preferably a group remaining after removing (m3+m4) hydrogen atoms from an alkyl group, a group remaining after removing (m3+m4) hydrogen atoms from an aryl group, or a group remaining after removing (m3+m4) hydrogen atoms from an alkoxy group.

Examples of the substituent may include the same substituent as the substituent shown as examples in the description with respect to $Q^1$. When the substituent is present in plurality, they may be the same as or different from each other.

Structural Unit Represented by Formula (17)

In Formula (17), $R^5$ is a monovalent group including the group represented by Formula (18); $R^6$ is a monovalent group including the group represented by Formula (19); $Ar^3$ represents a (2+n6+n7) valent aromatic group optionally having a substituent other than $R^5$ or $R^6$; and n6 and n7 each independently represent an integer of 1 or more.

The group represented by Formula (18) and the group represented by Formula (19) may be bonded to $Ar^3$ directly. Alternatively, the group represented by Formula (18) and the group represented by Formula (19) may be bonded to $Ar^3$ through: a $C_{1-50}$ alkylene group optionally having a substituent such as a methylene group, an ethylene group, a propylene group, a butylene group, a pentylene group, a hexylene group, a nonylene group, a dodecylene group, a cyclopropylene group, a cyclobutylene group, a cyclopentylene group, a cyclohexylene group, a cyclononylene group, a cyclododecylene group, a norbornylene group, an adamantylene group, and a group in which at least one hydrogen atom in these groups is substituted with a substituent; a $C_{1-50}$ oxyalkylene group optionally having a substituent such as an oxymethylene group, an oxyethylene group, an oxypropylene group, an oxybutylene group, an oxypentylene group, an oxyhexylene group, an oxynonylene group, an oxydodecylene group, a cyclopropyleneoxy group, a cyclobutyleneoxy group, a cyclopentyleneoxy group, a cyclohexyleneoxy group, a cyclononyleneoxy group, a cyclododecyleneoxy group, a norbornyleneoxy group, an adamantyleneoxy group, and a group in which at least one hydrogen atom in these groups is substituted with a substituent; an imino group optionally having a substituent; a silylene group optionally having a substituent; an ethenylene group optionally having a substituent; an ethynylene group; a methanetriyl group optionally having a substituent; and a hetero atom such as an oxygen atom, a nitrogen atom, and a sulfur atom.

$Ar^3$ may have a substituent other than $R^5$ or $R^6$. Examples of the substituent may include the same substituent as the substituent shown as examples in the description with respect to $Q^1$. When the substituent is present in plurality, they may be the same as or different from each other.

Because the synthesis of the raw material monomer is simplified, the substituent other than $R^5$ or $R^6$ that $Ar^3$ may have is preferably an alkyl group, an alkoxy group, an aryl group, an aryloxy group, a carboxyl group, or a substituted carboxyl group.

In Formula (17), n6 represents an integer of 1 or more, preferably an integer of 1 to 4, and more preferably an integer of 1 to 3.

In Formula (17), n7 represents an integer of 1 or more, preferably an integer of 1 to 4, and more preferably an integer of 1 to 3.

Examples of the (2+n6+n7) valent aromatic group represented by $Ar^3$ in Formula (17) may include a (2+n6+n7) valent aromatic hydrocarbon group and a (2+n6+n7) valent aromatic heterocyclic group. The (2+n6+n7) valent aromatic group represented by $Ar^3$ in Formula (17) preferably includes a carbon atom alone or a carbon atom and one or more atom(s) selected from the group consisting of a hydrogen atom, a nitrogen atom, and an oxygen atom. Examples of the (2+n6+n7) valent aromatic group may include: a (2+n6+n7) valent group remaining after removing (2+n6+n7) hydrogen atoms from a monocyclic aromatic ring such as a benzene ring, a pyridine ring, a 1,2-diazine ring, a 1,3-diazine ring, a 1,4-diazine ring, a furan ring, a pyrrole ring, a pyrazole ring, an imidazole ring, and an oxazole ring; a (2+n6+n7) valent group remaining after removing (2+n6+n7) hydrogen atoms from a fused polycyclic aromatic ring in which two or more rings selected from the group consisting of the above monocyclic aromatic rings are fused; a (2+n6+n7) valent group remaining after removing (2+n6+n7) hydrogen atoms from an aromatic ring assembly in which two or more aromatic rings selected from the group consisting of the above monocyclic aromatic rings and the above fused polycyclic aromatic rings are linked through a single bond, an ethenylene group, or an ethynylene group; and a (2+n6+n7) valent group remaining after removing (2+n6+n7) hydrogen atoms from a bridged polycyclic aromatic ring in which two aromatic rings adjacent to each other of the above fused polycyclic aromatic ring or the above aromatic ring assembly are bridged through a divalent group such as a methylene group, an ethylene group and a carbonyl group.

Examples of the monocyclic aromatic ring may include rings represented by Formulae 1 to 5 and Formulae 7 to 10 shown as examples in the description with respect to the structural unit represented by Formula (13).

Examples of the fused polycyclic aromatic ring may include rings represented by Formulae 13 to 27 shown as examples in the description with respect to the structural unit represented by Formula (13).

Examples of the aromatic ring assembly may include rings represented by Formulae 28 to 36 shown as examples in the description with respect to the structural unit represented by Formula (13).

Examples of the bridged polycyclic aromatic ring may include rings represented by Formulae 37 to 44 shown as examples in the description with respect to the structural unit represented by Formula (13).

Because the synthesis of the raw material monomer is simplified, the (2+n6+n7) valent aromatic group is preferably a group remaining after removing (2+n6+n7) hydrogen atoms from a ring represented by a Formula from 1 to 5, 7 to 10, 13, 14, 26 to 29, 37 to 39, and 41, more preferably a group remaining after removing (2+n6+n7) hydrogen atoms from a ring represented by Formula 1, 37, or 41, and further preferably a group remaining after removing (2+n6+n7) hydrogen atoms from a ring represented by Formula 1, 38, or 42.

In Formula (18), $R^7$ represents a single bond or a (1+m5) valent organic group and preferably a (1+m5) valent organic group.

In Formula (18), examples of the (1+m5) valent organic group represented by $R^7$ may include: a group remaining after removing m5 hydrogen atoms from a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after removing m5 hydrogen atoms from a $C_{6-30}$ aryl group optionally having a substituent such as a phenyl group, a 1-naphthyl group, a 2-naphthyl group, a 1-anthracenyl group, a 2-anthracenyl group, a 9-anthracenyl group, and a group in which at least one hydrogen atom in these groups is substituted with a substituent; a group remaining after removing m5 hydrogen atoms from a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after removing m5 hydrogen atoms from an amino group having a substituent containing a carbon atom; and a group remaining after removing m5 hydrogen atoms from a silyl group having a substituent containing a carbon atom. Because the synthesis of the raw material monomer is simplified, the (1+m5) valent organic group represented by $R^7$ is preferably a group remaining after removing m5 hydrogen atoms from an alkyl group, a group remaining after removing m5 hydrogen atoms from an aryl group, or a group remaining after removing m5 hydrogen atoms from an alkoxy group.

Examples of the substituent may include the same substituent as the substituent shown as examples in the description with respect to $Q^1$. When the substituent is present in plurality, they may be the same as or different from each other.

In Formula (18), m5 represents an integer of 1 or more, with the proviso that when $R^7$ is a single bond, m5 represents 1.

In Formula (19), $R^8$ represents a single bond or a (1+m6) valent organic group, preferably a (1+m6) organic group.

In Formula (19), examples of the (1+m6) valent organic group represented by $R^8$ may include: a group remaining after removing m6 hydrogen atoms from a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after removing m6 hydrogen atoms from a $C_{6-30}$ aryl group optionally having a substituent such as a phenyl group, a 1-naphthyl group, a 2-naphthyl group, a 1-anthracenyl group, a 2-anthracenyl group, a 9-anthracenyl group, and a group in which at least one hydrogen atom in these groups is substituted with a substituent; a group remaining after removing m6 hydrogen atoms from a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after removing m6 hydrogen atoms from an amino group having a substituent containing a carbon atom; and a group remaining after removing m6 hydrogen atoms from a silyl group having a substituent containing a carbon atom. Because the synthesis of the raw material monomer is simplified, the (1+m6) valent organic group represented by $R^8$ is preferably a group remaining after removing m6 hydrogen atoms from an alkyl group, a group remaining after removing m6 hydrogen atoms from an aryl group, or a group remaining after removing m6 hydrogen atoms from an alkoxy group.

Examples of the substituent may include the same substituent as the substituent shown as examples in the description with respect to $Q^1$. When the substituent is present in plurality, they may be the same as or different from each other.

In Formula (19), m6 represents an integer of 1 or more, with the proviso that when $R^8$ is a single bond, m6 represents 1.

Structural Unit Represented by Formula (20)

In Formula (20), $R^9$ is a monovalent group including the group represented by Formula (21); $R^{10}$ is a monovalent group including the group represented by Formula (22); $Ar^4$ represents a (2+n8+n9) valent aromatic group optionally having a substituent other than $R^9$ or $R^{10}$; and n8 and n9 each independently represent an integer of 1 or more.

The group represented by Formula (21) and the group represented by Formula (22) may be bonded to $Ar^4$ directly. Alternatively, the group represented by Formula (21) and the group represented by Formula (22) may be bonded to $Ar^4$ through: a $C_{1-50}$ alkylene group optionally having a substituent such as a methylene group, an ethylene group, a propylene group, a butylene group, a pentylene group, a hexylene group, a nonylene group, a dodecylene group, a cyclopropylene group, a cyclobutylene group, a cyclopentylene group, a cyclohexylene group, a cyclononylene group, a cyclododecylene group, a norbornylene group, an adamantylene group, and a group in which at least one hydrogen atom in these groups is substituted with a substituent; a $C_{1-50}$ oxyalkylene group optionally having a substituent such as an oxymethylene group, an oxyethylene group, an oxypropylene group, an oxybutylene group, an oxypentylene group, an oxyhexylene group, an oxynonylene group, an oxydodecylene group, a cyclopropyleneoxy group, a cyclobutyleneoxy group, a cyclopentyleneoxy group, a cyclohexyleneoxy group, a cyclononyleneoxy group, a cyclododecyleneoxy group, a norbornyleneoxy group, an adamantyleneoxy group, and a group in which at least one hydrogen atom in these groups is substituted with a substituent; an imino group optionally having a substituent; a silylene group optionally having a substituent; an ethenylene group optionally having a substituent; an ethynylene group; a methanetriyl group optionally having a substituent; and a hetero atom such as an oxygen atom, a nitrogen atom, and a sulfur atom.

$Ar^4$ may have a substituent other than $R^9$ or $R^{10}$. Examples of the substituent may include the same substituent as the substituent shown as examples in the description with respect to $Q^1$. When the substituent is present in plurality, they may be the same as or different from each other.

Because the synthesis of the raw material monomer is simplified, the substituent other than $R^9$ or $R^{10}$ that $Ar^4$ may have is preferably an alkyl group, an alkoxy group, an aryl group, an aryloxy group, a carboxyl group, or a substituted carboxyl group.

In Formula (20), n8 represents an integer of 1 or more, preferably an integer of 1 to 4, and more preferably an integer of 1 to 3.

In Formula (20), n9 represents an integer of 1 or more, preferably an integer of 1 to 4, and more preferably an integer of 1 to 3.

Examples of the (2+n8+n9) valent aromatic group represented by $Ar^4$ in Formula (20) may include a (2+n8+n9) valent aromatic hydrocarbon group and a (2+n8+n9) valent aromatic heterocyclic group. The (2+n8+n9) valent aromatic group represented by $Ar^4$ preferably includes a carbon atom alone or a carbon atom and one or more atom(s) selected from the group consisting of a hydrogen atom, a nitrogen atom, and an oxygen atom. Examples of the (2+n8+n9) valent aromatic group may include: a (2+n8+n9) valent group remaining after removing (2+n8+n9) hydrogen atoms from a monocyclic aromatic ring such as a benzene ring, a pyridine ring, a 1,2-diazine ring, a 1,3-diazine ring, a 1,4-diazine ring, a furan ring, a pyrrole ring, a pyrazole ring, and an imidazole ring; a (2+n8+n9) valent group remaining after removing (2+n8+n9) hydrogen atoms from a fused polycyclic aromatic ring in which two or more rings selected from the group consisting of the above monocyclic aromatic rings are fused; a (2+n8+n9) valent group remaining after removing (2+n8+n9) hydrogen atoms from an aromatic ring assembly in which two or more aromatic rings selected from the group consisting of the above monocyclic aromatic rings and the above fused polycyclic aromatic rings are linked through a single bond, an ethenylene group, or an ethynylene group; and a (2+n8+n9) valent group remaining after removing (2+n8+n9) hydrogen atoms from a bridged polycyclic aromatic ring in which two aromatic rings adjacent to each other of the above fused polycyclic aromatic ring or the above aromatic ring assembly are bridged through a divalent group such as a methylene group, an ethylene group, and a carbonyl group.

Examples of the monocyclic aromatic ring may include rings represented by Formulae 1 to 5 and Formulae 7 to 10 shown as examples in the description with respect to the structural unit represented by Formula (13).

Examples of the fused polycyclic aromatic ring may include rings represented by Formulae 13 to 27 shown as examples in the description with respect to the structural unit represented by Formula (13).

Examples of the aromatic ring assembly may include rings represented by Formulae 28 to 36 shown as examples in the description with respect to the structural unit represented by Formula (13).

Examples of the bridged polycyclic aromatic ring may include rings represented by Formulae 37 to 44 shown as examples in the description with respect to the structural unit represented by Formula (13).

Because the synthesis of the raw material monomer is simplified, the (2+n8+n9) valent aromatic group is preferably a group remaining after removing (2+n8+n9) hydrogen atoms from a ring represented by a Formula from 1 to 5, 7 to 10, 13, 14, 26 to 29, 37 to 39, and 41, more preferably a group remaining after removing (2+n8+n9) hydrogen atoms from a ring represented by a Formula from 1 to 6, 8, 14, 27, 28, 38, and 42, and further preferably a group remaining after removing (2+n8+n9) hydrogen atoms from a ring represented by Formula 1, 37, or 41.

In Formula (21), $R^{11}$ represents a single bond or a (1+m7) valent organic group, preferably a (1+m7) valent organic group.

In Formula (21), examples of the (1+m7) valent organic group represented by $R^{11}$ may include: a group remaining after removing m7 hydrogen atoms from a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after removing m7 hydrogen atoms from a $C_{6-30}$ aryl group optionally having a substituent such as a phenyl group, a 1-naphthyl group, a 2-naphthyl group, a 1-anthracenyl group, a 2-anthracenyl group, a 9-anthracenyl group, and a group in which at least one hydrogen atom in these groups is substituted with a substituent; a group remaining after removing m7 hydrogen atoms from a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after removing m7 hydrogen atoms from an amino group having a substituent containing a carbon atom; and a group remaining after removing m7 hydrogen atoms from a silyl group having a substituent containing a carbon atom. Because the synthesis of the raw material monomer is simplified, the (1+m7) valent organic group represented by $R^{11}$ is preferably a group remaining after removing m7 hydrogen atoms from an alkyl group, a group remaining after removing m7 hydrogen atoms from an aryl group, or a group remaining after removing m7 hydrogen atoms from an alkoxy group.

Examples of the substituent may include the same substituent as the substituent shown as examples in the description with respect to $Q^1$. When the substituent is present in plurality, they may be the same as or different from each other.

In Formula (21), m7 represents an integer of 1 or more, with the proviso that when $R^{11}$ is a single bond, m7 represents 1.

In Formula (22), $R^{12}$ represents a single bond or a (1+m8) valent organic group, preferably a (1+m8) valent organic group.

In Formula (22), examples of the (1+m8) valent organic group represented by $R^{12}$ may include: a group remaining after removing m8 hydrogen atoms from a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after removing m8 hydrogen atoms from a $C_{6-30}$ aryl group optionally having a substituent such as a phenyl group, a 1-naphthyl group, a 2-naphthyl group, a 1-anthracenyl group, a 2-anthracenyl group, a 9-anthracenyl group, and a group in which at least one hydrogen atom in these groups is substituted with a substituent; a group remaining after removing m8 hydrogen atoms from a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after removing m8 hydrogen atoms from an amino group having a substituent containing a carbon atom; and a group remaining after removing m8 hydrogen atoms from a silyl group having a substituent containing a carbon atom. Because the synthesis of the raw material monomer is simplified, the (1+m8) valent organic group represented by $R^{12}$ is preferably a group remaining after removing m8 hydrogen atoms from an alkyl group, a group remaining after removing m8 hydrogen atoms from an aryl group, or a group remaining after removing m8 hydrogen atoms from an alkoxy group.

Examples of the substituent may include the same substituent as the substituent shown as examples in the description with respect to $Q^1$. When the substituent is present in plurality, they may be the same as or different from each other.

In Formula (22), m8 represents an integer of 1 or more, with the proviso that when $R^{12}$ is a single bond, m8 represents 1.

Example of Structural Unit Represented by Formula (13)

In view of the electron transport property of the obtained ionic polymer, the structural unit represented by Formula (13) is preferably a structural unit represented by Formula (23) or a structural unit represented by Formula (24), and more preferably the structural unit represented by Formula (24).

[Chem. 18]

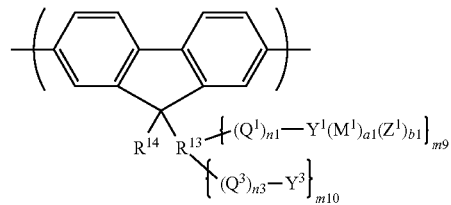

In Formula (23), $R^{13}$ represents a (1+m9+m10) valent organic group; $R^{14}$ represents a monovalent organic group; $Q^1$, $Q^3$, $Y^1$, $M^1$, $Z^1$, $Y^3$, n1, a1, b1, and n3 represent the same as defined above; m9 and m10 each independently represent an integer of 1 or more; and when each of $Q^1$, $Q^3$, $Y^1$, $M^1$, $Z^1$, $Y^3$, n1, a1, b1, and n3 is present in plurality, they may be the same as or different from each other.

In Formula (23), examples of the (1+m9+m10) valent organic group represented by $R^{13}$ may include: a group remaining after removing (m9+m10) hydrogen atoms from a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after removing (m9+m10) hydrogen atoms from a $C_{6-30}$ aryl group optionally having a substituent such as a phenyl group, a 1-naphthyl group, a 2-naphthyl group, a 1-anthracenyl group, a 2-anthracenyl group, a 9-anthracenyl group, and a group in which at least one hydrogen atom in these groups is substituted with a substituent; a group remaining after removing (m9+m10) hydrogen atoms from a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after removing (m9+m10) hydrogen atoms from an amino group having a substituent containing a carbon atom; and a group remaining after removing (m9+m10) hydrogen atoms from a silyl group having a substituent containing a carbon atom. Because the synthesis of the raw material monomer is simplified, the (1+m9+m10) valent organic group represented by $R^{13}$ is preferably a group remaining after removing (m9+m10) hydrogen atoms from an alkyl group, a group remaining after removing (m9+m10) hydrogen atoms from an aryl group, or a group remaining after removing (m9+m10) hydrogen atoms from an alkoxy group.

In Formula (23), examples of the monovalent organic group represented by $R^{14}$ may include: a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a $C_{6-30}$ aryl group optionally having a substituent such as a phenyl group, a 1-naphthyl group, a 2-naphthyl group, a 1-anthracenyl group, a 2-anthracenyl group, a 9-anthracenyl group, and a group in which at least one hydrogen atom in these groups is substituted with a substituent; a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; an amino group having a substituent containing a carbon atom; and a silyl group having a substituent containing a carbon atom. Because the synthesis of the raw material monomer is simplified, the monovalent organic group represented by $R^{14}$ is preferably an alkyl group, an aryl group, or an alkoxy group.

The structural unit represented by Formula (23) may be a structural unit as follows.

[Chem. 19]

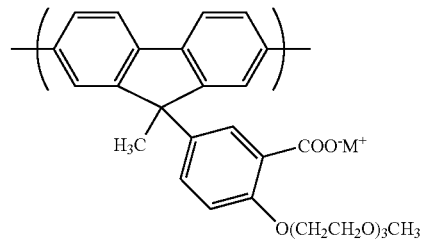

M = Li, Na, K, Cs, N(CH$_3$)$_4$

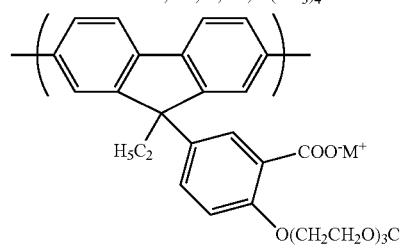

M = Li, Na, K, Cs, N(CH$_3$)$_4$

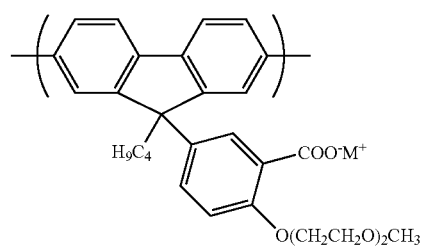

M = Li, Na, K, Cs, N(CH$_3$)$_4$

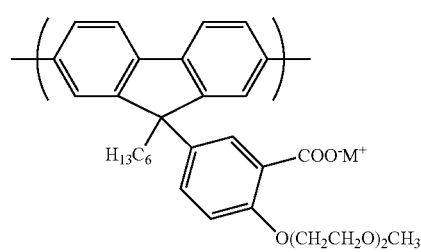

M = Li, Na, K, Cs, N(CH$_3$)$_4$

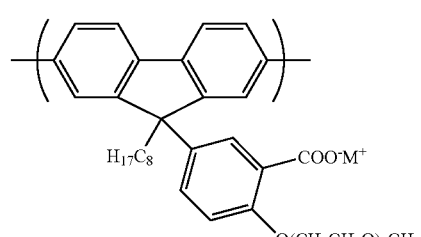

M = Li, Na, K, Cs, N(CH$_3$)$_4$

-continued

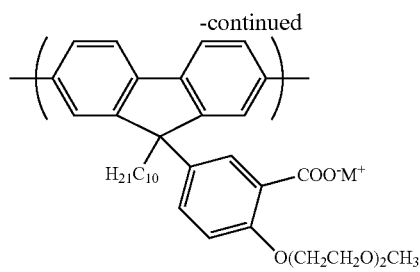

M = Li, Na, K, Cs, N(CH$_3$)$_4$

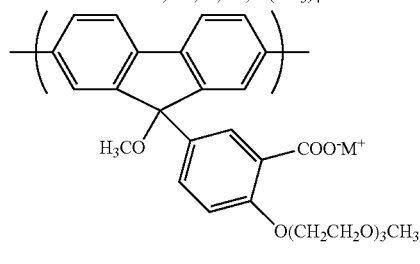

M = Li, Na, K, Cs, N(CH$_3$)$_4$

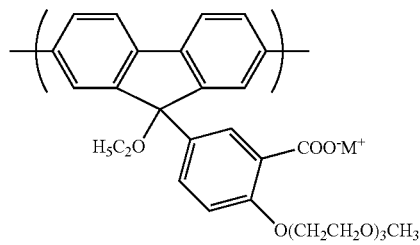

M = Li, Na, K, Cs, N(CH$_3$)$_4$

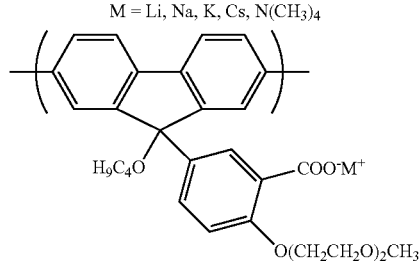

M = Li, Na, K, Cs, N(CH$_3$)$_4$

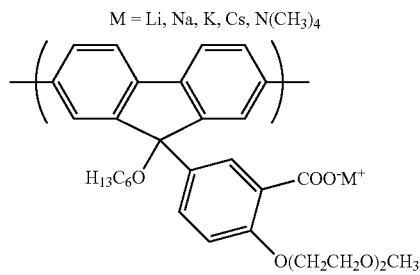

M = Li, Na, K, Cs, N(CH$_3$)$_4$

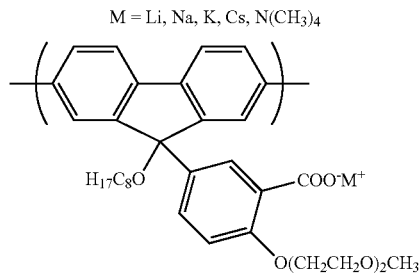

M = Li, Na, K, Cs, N(CH$_3$)$_4$

-continued

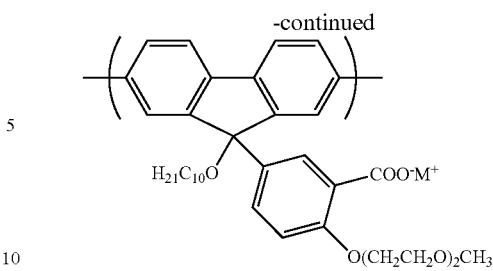

M = Li, Na, K, Cs, N(CH$_3$)$_4$

[Chem. 20]

(24)

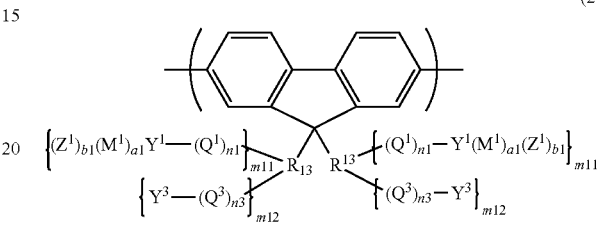

In Formula (24), $R^{13}$ represents a (1+m11+m12) valent organic group; $Q^1$, $Q^3$, $Y^1$, $M^1$, $Z^1$, $Y^3$, n1, a1, b1, and n3 represent the same as defined above; m11 and m12 each independently represent an integer of 1 or more; and when each of $R^{13}$, m11, m12, $Q^1$, $Q^3$, $Y^1$, $M^1$, $Z^1$, $Y^3$, n1, a1, b1, and n3 is present in plurality, they may be the same as or different from each other.

In Formula (24), examples of the (1+m11+m12) valent organic group represented by $R^{13}$ may include: a group remaining after removing (m11+m12) hydrogen atoms from a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after removing (m11+m12) hydrogen atoms from a $C_{6-30}$ aryl group optionally having a substituent such as a phenyl group, a 1-naphthyl group, a 2-naphthyl group, a 1-anthracenyl group, a 2-anthracenyl group, a 9-anthracenyl group, and a group in which at least one hydrogen atom in these groups is substituted with a substituent; a group remaining after removing (m11+m12) hydrogen atoms from a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after removing (m11+m12) hydrogen atoms from an amino group having a substituent containing a carbon atom; and a group remaining after removing (m11+m12) hydrogen atoms from a silyl group having a substituent containing a carbon atom. Because the synthesis of the raw material monomer is simplified, the (1+m11+m12) valent organic group represented by $R^{13}$ is preferably a group remaining after removing (m11+m12) hydrogen atoms from an alkyl group, a group remaining after removing (m11+m12) hydrogen atoms from an aryl group, or a group remaining after removing (m11+m12) hydrogen atoms from an alkoxy group.

The structural unit represented by Formula (24) may be a structural unit as follows.

[Chem. 21]

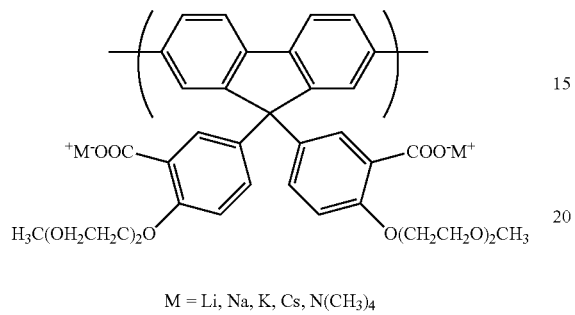

M = Li, Na, K, Cs, N(CH$_3$)$_4$

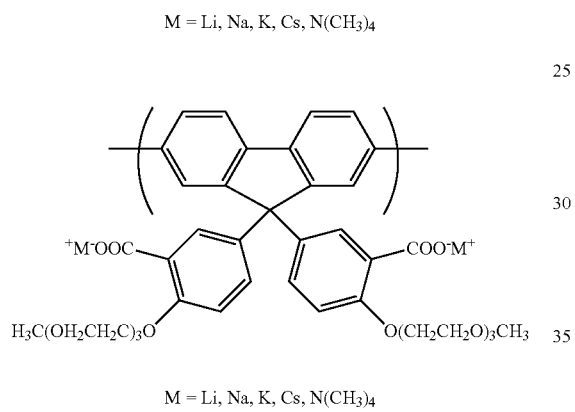

M = Li, Na, K, Cs, N(CH$_3$)$_4$

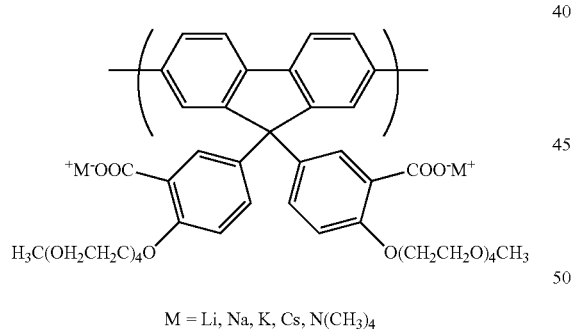

M = Li, Na, K, Cs, N(CH$_3$)$_4$

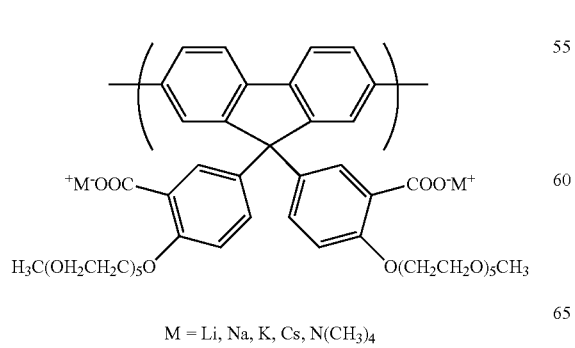

M = Li, Na, K, Cs, N(CH$_3$)$_4$

-continued

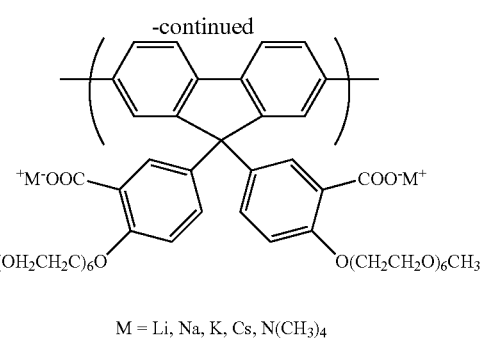

M = Li, Na, K, Cs, N(CH$_3$)$_4$

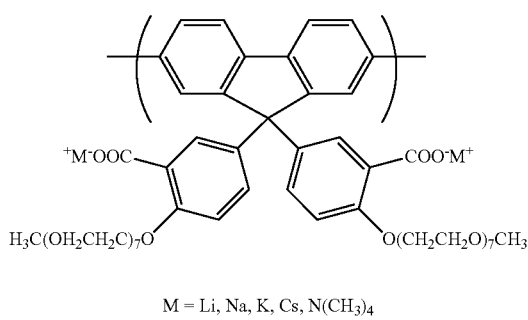

M = Li, Na, K, Cs, N(CH$_3$)$_4$

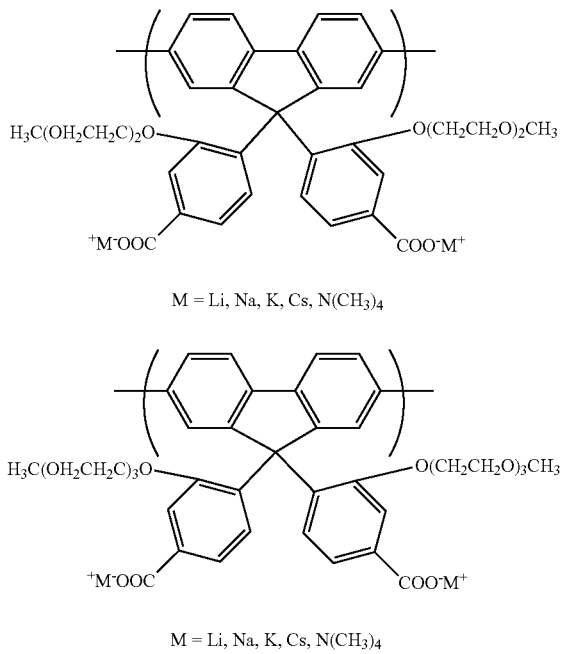

M = Li, Na, K, Cs, N(CH$_3$)$_4$

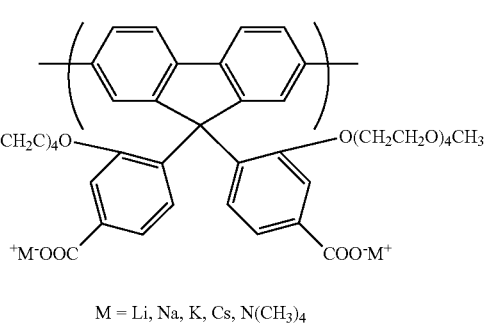

M = Li, Na, K, Cs, N(CH$_3$)$_4$

53
-continued
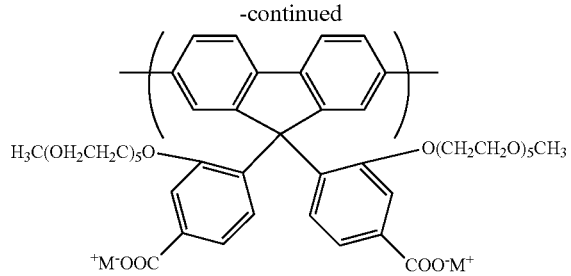
M = Li, Na, K, Cs, N(CH₃)₄
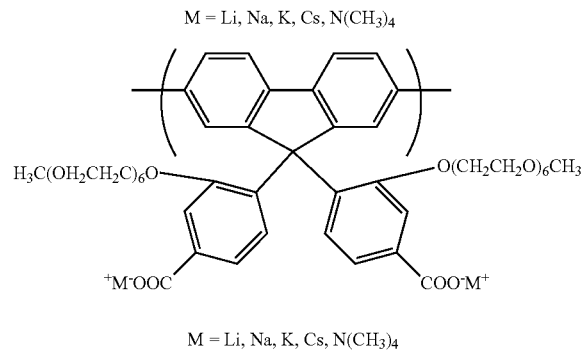
M = Li, Na, K, Cs, N(CH₃)₄
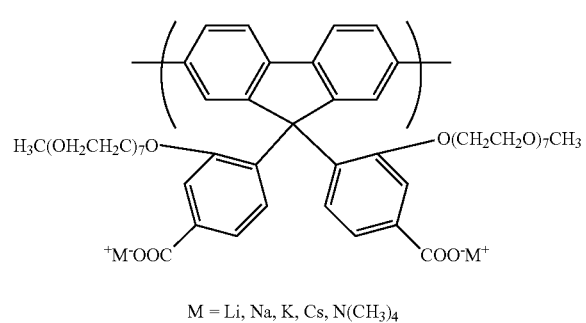
M = Li, Na, K, Cs, N(CH₃)₄
[Chem. 22]
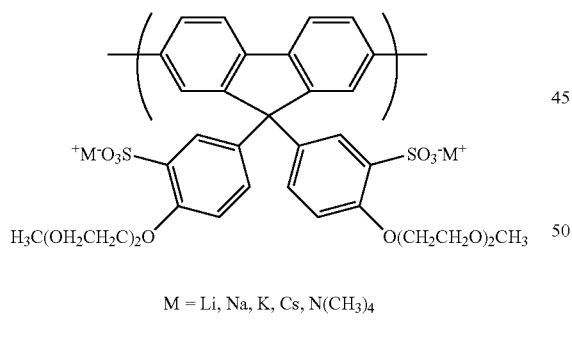
M = Li, Na, K, Cs, N(CH₃)₄
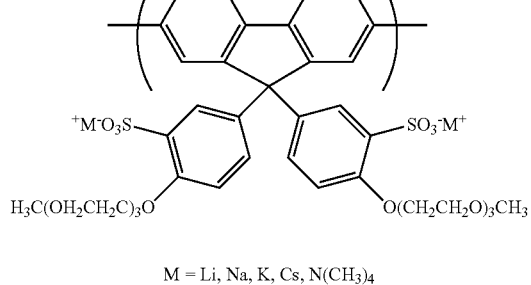
M = Li, Na, K, Cs, N(CH₃)₄
54
-continued
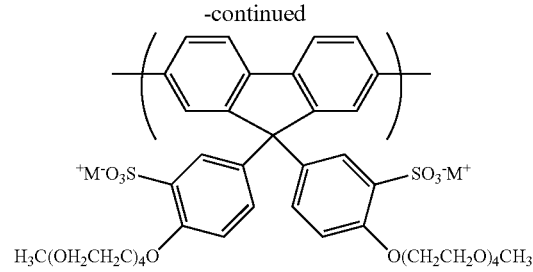
M = Li, Na, K, Cs, N(CH₃)₄
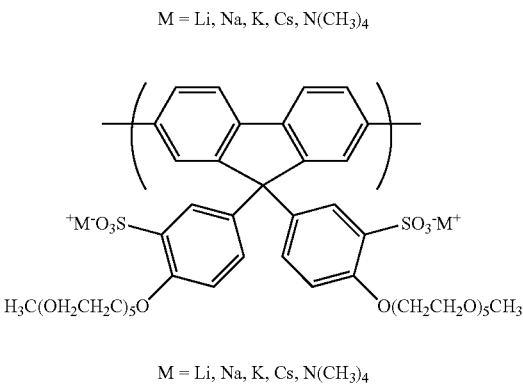
M = Li, Na, K, Cs, N(CH₃)₄
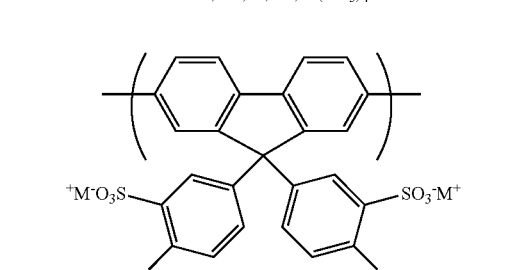
M = Li, Na, K, Cs, N(CH₃)₄
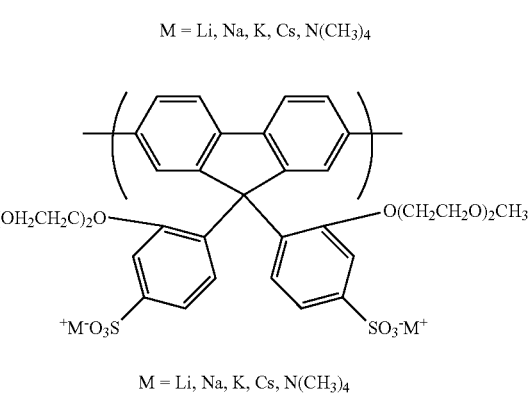
M = Li, Na, K, Cs, N(CH₃)₄

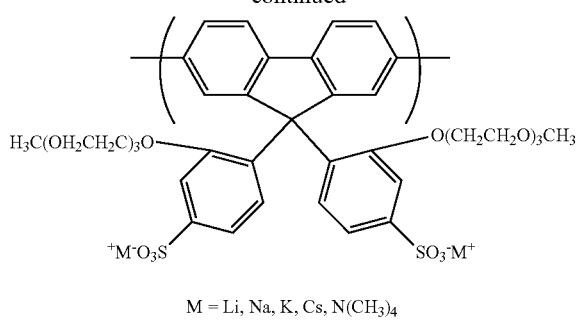
M = Li, Na, K, Cs, N(CH₃)₄
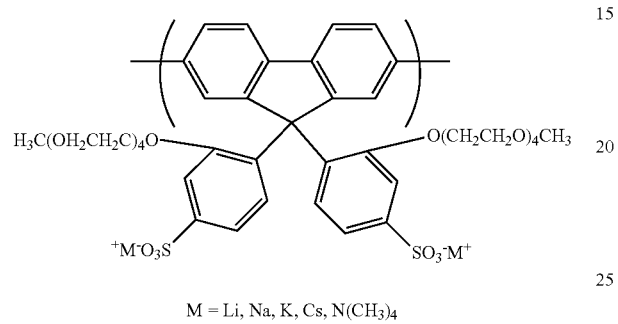
M = Li, Na, K, Cs, N(CH₃)₄
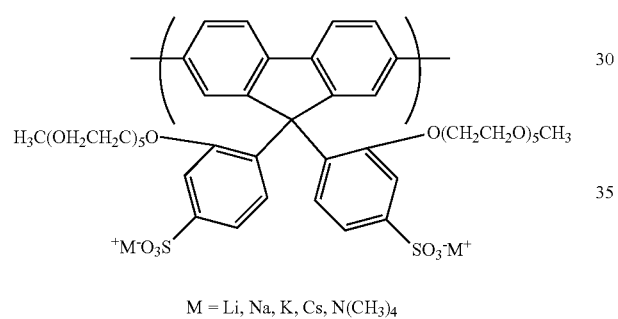
M = Li, Na, K, Cs, N(CH₃)₄
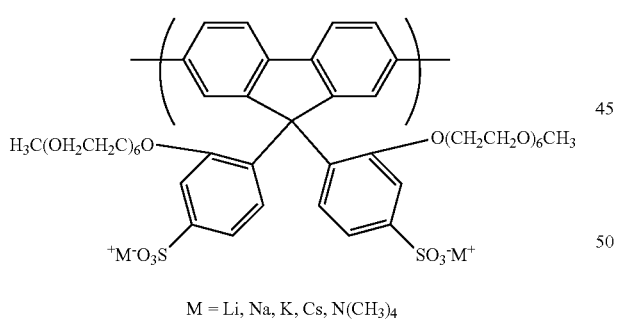
M = Li, Na, K, Cs, N(CH₃)₄
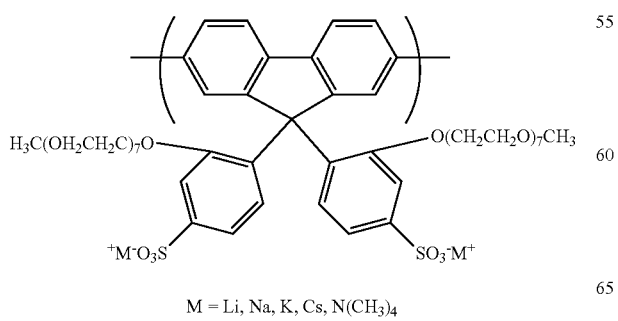
M = Li, Na, K, Cs, N(CH₃)₄
[Chem. 23]
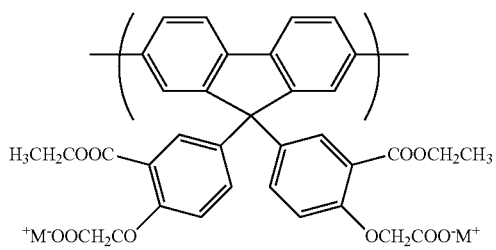
M = Li, Na, K, Cs, N(CH₃)₄
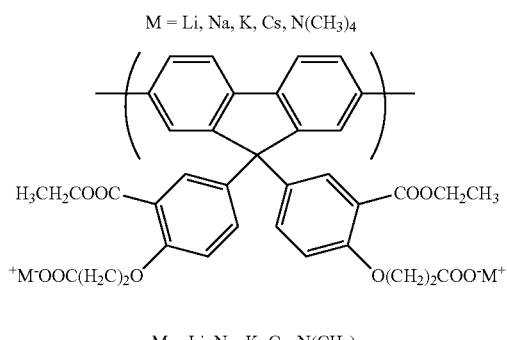
M = Li, Na, K, Cs, N(CH₃)₄
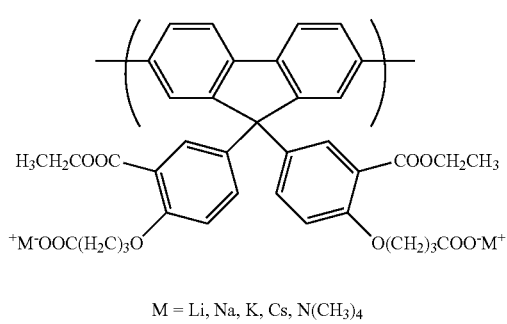
M = Li, Na, K, Cs, N(CH₃)₄
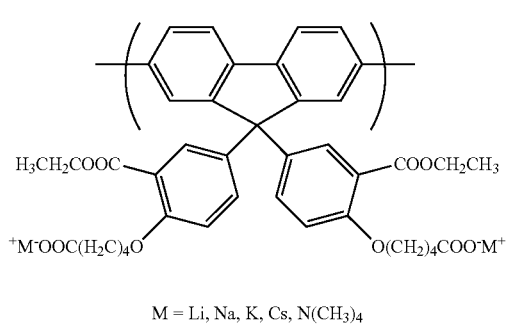
M = Li, Na, K, Cs, N(CH₃)₄
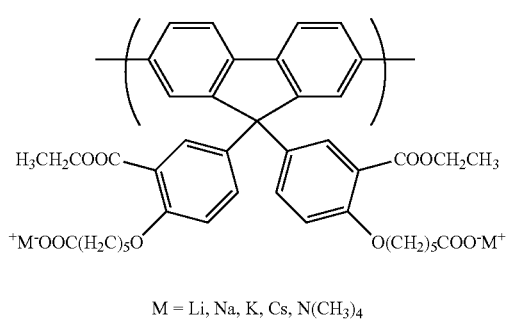
M = Li, Na, K, Cs, N(CH₃)₄

57
-continued
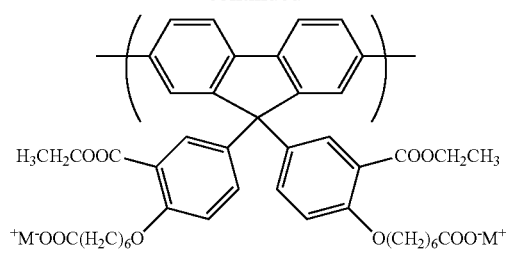
M = Li, Na, K, Cs, N(CH$_3$)$_4$
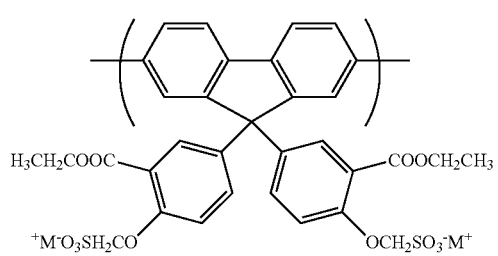
M = Li, Na, K, Cs, N(CH$_3$)$_4$
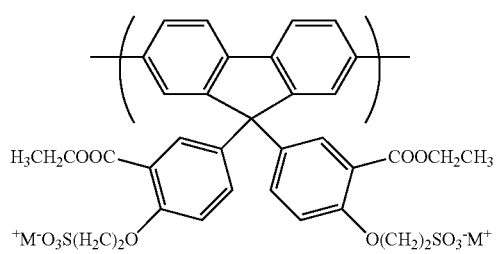
M = Li, Na, K, Cs, N(CH$_3$)$_4$
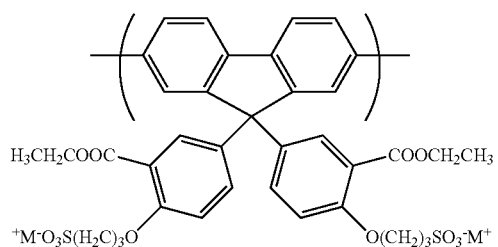
M = Li, Na, K, Cs, N(CH$_3$)$_4$
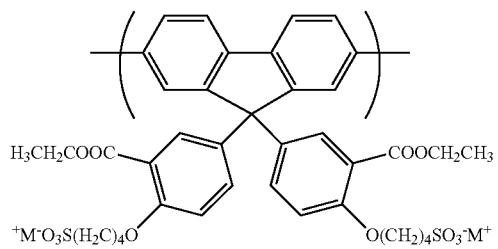
M = Li, Na, K, Cs, N(CH$_3$)$_4$
58
-continued
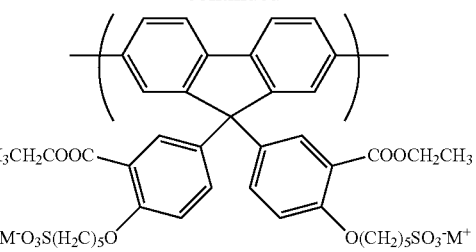
M = Li, Na, K, Cs, N(CH$_3$)$_4$
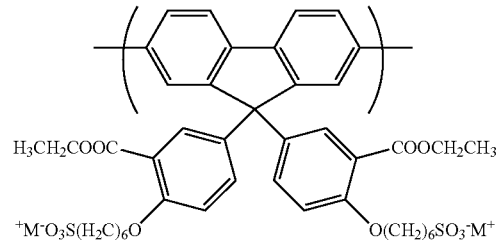
M = Li, Na, K, Cs, N(CH$_3$)$_4$
[Chem. 24]
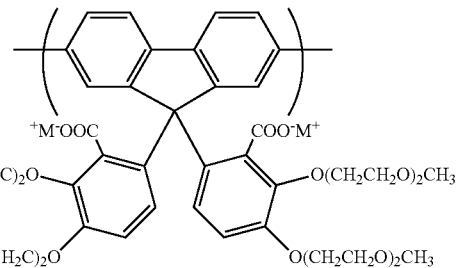
M = Li, Na, K, Cs, N(CH$_3$)$_4$
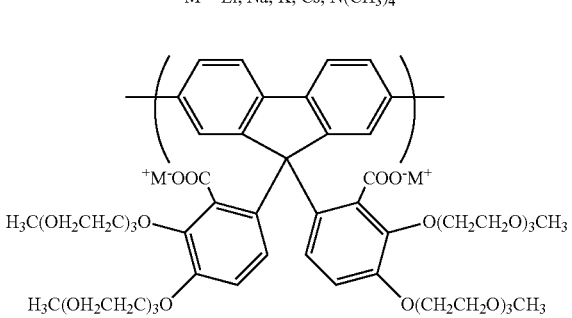
M = Li, Na, K, Cs, N(CH$_3$)$_4$
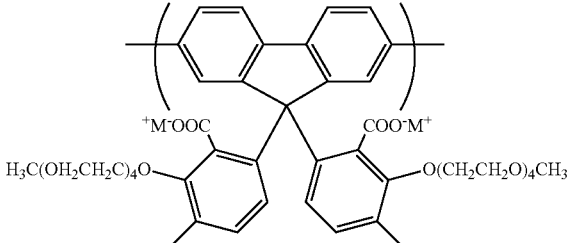
M = Li, Na, K, Cs, N(CH$_3$)$_4$

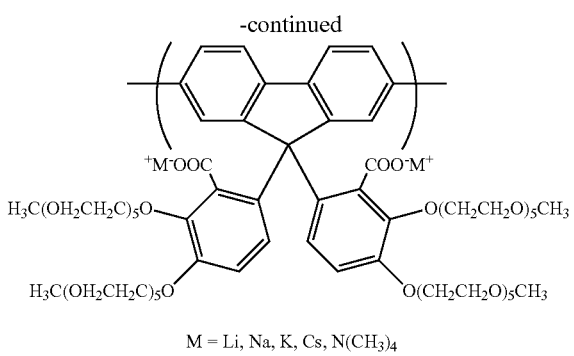

M = Li, Na, K, Cs, N(CH$_3$)$_4$

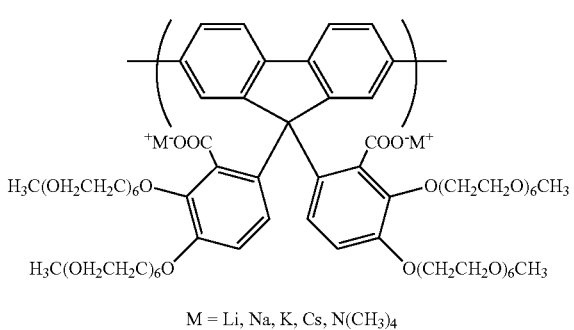

M = Li, Na, K, Cs, N(CH$_3$)$_4$

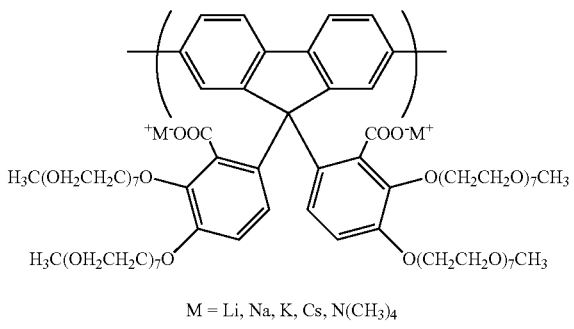

M = Li, Na, K, Cs, N(CH$_3$)$_4$

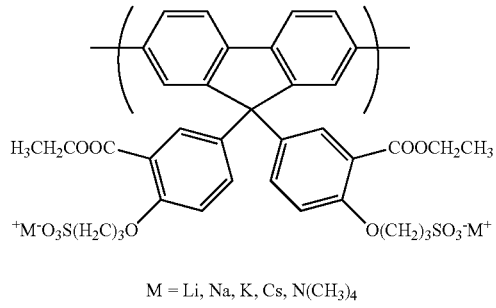

M = Li, Na, K, Cs, N(CH$_3$)$_4$

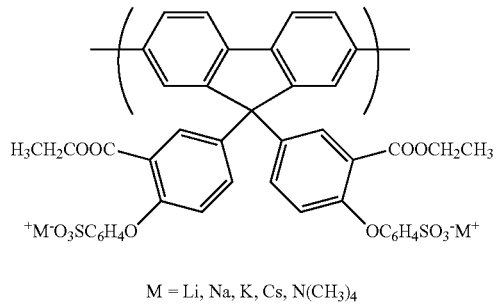

M = Li, Na, K, Cs, N(CH$_3$)$_4$

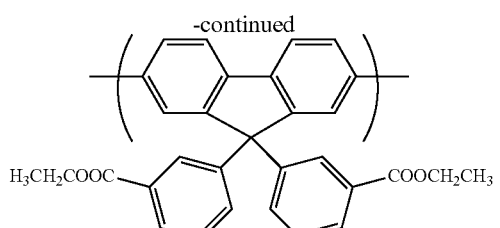

M = Li, Na, K, Cs, N(CH$_3$)$_4$

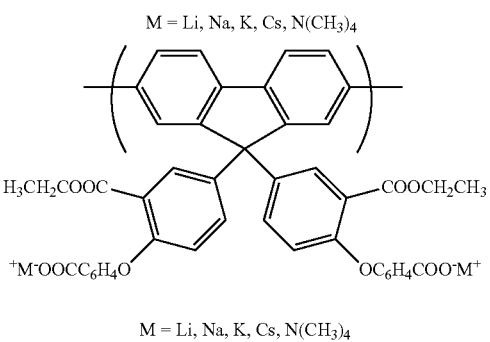

M = Li, Na, K, Cs, N(CH$_3$)$_4$

In view of the durability of the obtained ionic polymer, the structural unit represented by Formula (13) is preferably a structural unit represented by Formula (25).

[Chem. 25]

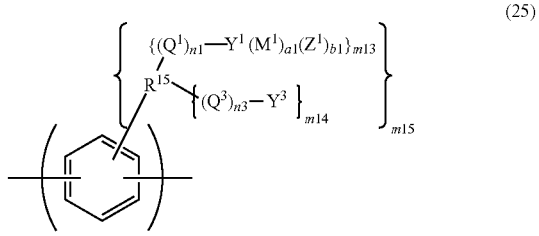

(25)

In Formula (25), R$^{15}$ represents a (1+m13+m14) valent organic group; Q$^1$, Q$^3$, Y$^1$, M$^1$, Z$^1$, Y$^3$, n1, a1, b1, and n3 represent the same as defined above; m13, m14, and m15 each independently represent an integer of 1 or more; and when each of R$^{15}$, m13, m14, Q$^1$, Q$^3$, Y$^1$, M$^1$, Z$^1$, Y$^3$, n1, a1, b1, and n3 is present in plurality, they may be the same as or different from each other.

In Formula (25), examples of the (1+m13+m14) valent organic group represented by R$^{15}$ may include: a group remaining after removing (m13+m14) hydrogen atoms from a C$_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after removing (m13+m14) hydrogen atoms from a C$_{6-30}$ aryl group optionally having a substituent such as a phenyl group, a 1-naphthyl group, a 2-naphthyl group, a 1-anthracenyl group, a 2-anthracenyl group, a 9-anthracenyl group, and a group in which at least one hydrogen atom in these groups is substituted with a substituent; a group remaining after removing (m13+m14) hydrogen atoms from a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after removing (m13+m14) hydrogen atoms from an amino group having a substituent containing a carbon atom; and a group remaining after removing (m13+m14) hydrogen atoms from a silyl group having a substituent containing a carbon atom. Because the synthesis of the raw material monomer is simplified, the (1+m13+m14) valent organic group represented by $R^{15}$ is preferably a group remaining after removing (m13+m14) hydrogen atoms from an alkyl group, a group remaining after removing (m13+m14) hydrogen atoms from an aryl group, or a group remaining after removing (m13+m14) hydrogen atoms from an alkoxy group.

The structural unit represented by Formula (25) may be a structural unit as follows.

[Chem. 26]

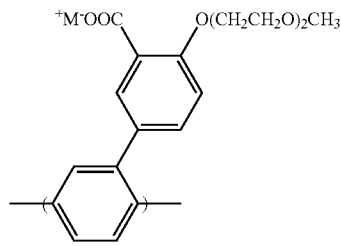

M = Li, Na, K, Cs, NMe$_4$

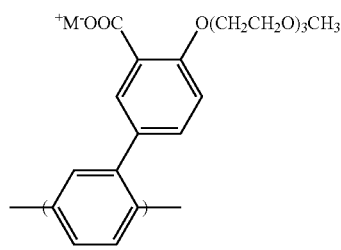

M = Li, Na, K, Cs, NMe$_4$

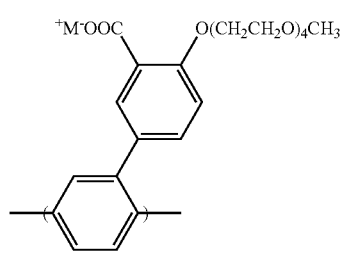

M = Li, Na, K, Cs, NMe$_4$

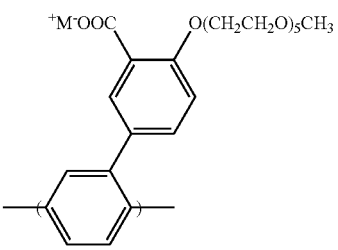

M = Li, Na, K, Cs, NMe$_4$

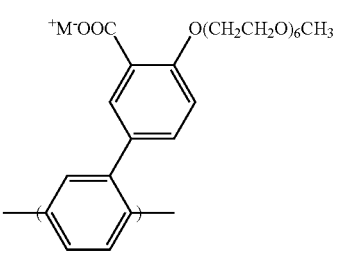

M = Li, Na, K, Cs, NMe$_4$

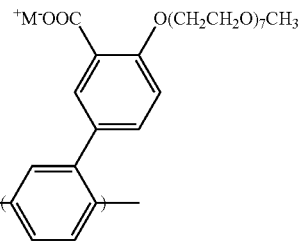

M = Li, Na, K, Cs, NMe$_4$

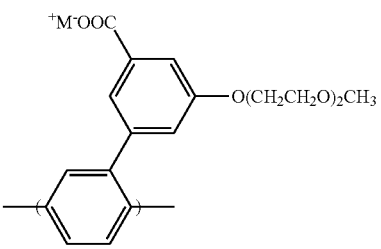

M = Li, Na, K, Cs, NMe$_4$

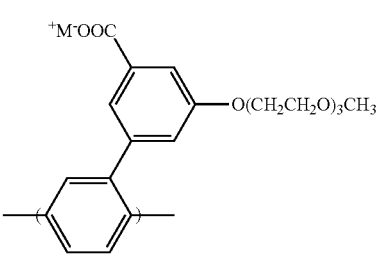

M = Li, Na, K, Cs, NMe$_4$

-continued

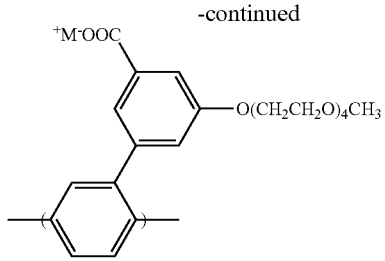

M = Li, Na, K, Cs, NMe₄

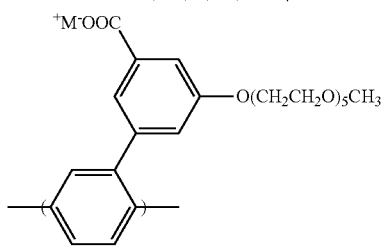

M = Li, Na, K, Cs, NMe₄

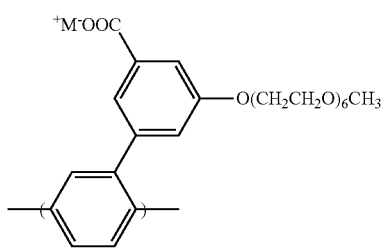

M = Li, Na, K, Cs, NMe₄

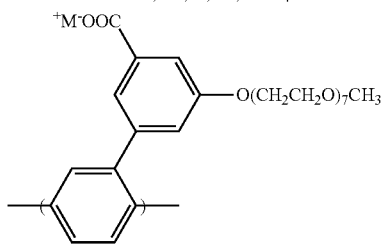

M = Li, Na, K, Cs, NMe₄

Example of Structural Unit Represented by Formula (15)

In view of the electron transport property of the obtained ionic polymer, the structural unit represented by Formula (15) is preferably a structural unit represented by Formula (26) or a structural unit represented by Formula (27), and more preferably the structural unit represented by Formula (27).

[Chem. 27]

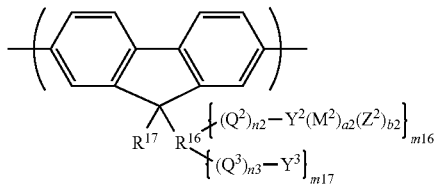
(26)

In Formula (26), $R^{16}$ represents a (1+m16+m17) valent organic group; $R^{17}$ represents a monovalent organic group; $Q^2$, $Q^3$, $Y^2$, $M^2$, $Z^2$, $Y^3$, n2, a2, b2, and n3 represent the same as defined above; m16 and m17 each independently represent an integer of 1 or more; and when each of $Q^2$, $Q^3$, $Y^2$, $M^2$, $Z^2$, $Y^3$, n2, a2, b2, and n3 is present in plurality, they may be the same as or different from each other.

In Formula (26), examples of the (1+m16+m17) valent organic group represented by $R^{16}$ may include: a group remaining after removing (m16+m17) hydrogen atoms from a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after removing (m16+m17) hydrogen atoms from a $C_{6-30}$ aryl group optionally having a substituent such as a phenyl group, a 1-naphthyl group, a 2-naphthyl group, a 1-anthracenyl group, a 2-anthracenyl group, a 9-anthracenyl group, and a group in which at least one hydrogen atom in these groups is substituted with a substituent; a group remaining after removing (m16+m17) hydrogen atoms from a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after removing (m16+m17) hydrogen atoms from an amino group having a substituent containing a carbon atom; and a group remaining after removing (m16+m17) hydrogen atoms from a silyl group having a substituent containing a carbon atom. Because the synthesis of the raw material monomer is simplified, the (1+m16+m17) valent organic group represented by $R^{16}$ is preferably a group remaining after removing (m16+m17) hydrogen atoms from an alkyl group, a group remaining after removing (m16+m17) hydrogen atoms from an aryl group, or a group remaining after removing (m16+m17) hydrogen atoms from an alkoxy group.

In Formula (26), examples of the monovalent organic group represented by $R^{17}$ may include: a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a $C_{6-30}$ aryl group optionally having a substituent such as a phenyl group, a 1-naphthyl group, a 2-naphthyl group, a 1-anthracenyl group, a 2-anthracenyl group, a 9-anthracenyl group, and a group in which at least one hydrogen atom in these groups is substituted with a substituent; a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; an amino group having a substituent containing a carbon atom; and a silyl group having a substituent containing a carbon atom. Because the synthesis of the raw material monomer is simplified, the monovalent organic group represented by $R^{17}$ is preferably an alkyl group, an aryl group, or an alkoxy group.

The structural unit represented by Formula (26) may be a structural unit as follows.

[Chem. 28]

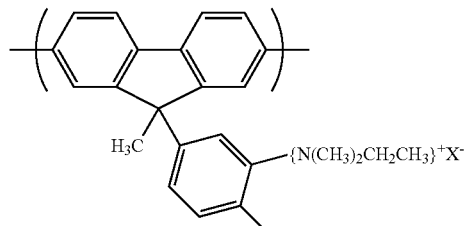

X = F, Cl. Br, I, BPh$_4$, CF$_3$SO$_3$, CH$_3$COO

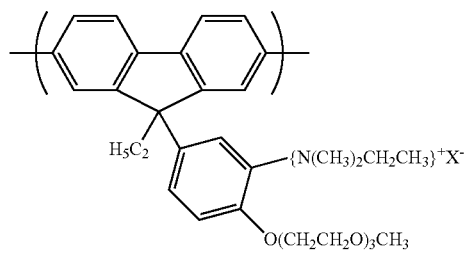

X = F, Cl. Br, I, BPh$_4$, CF$_3$SO$_3$, CH$_3$COO

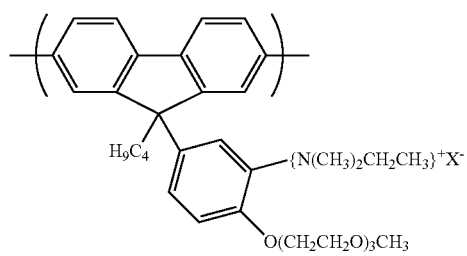

X = F, Cl. Br, I, BPh$_4$, CF$_3$SO$_3$, CH$_3$COO

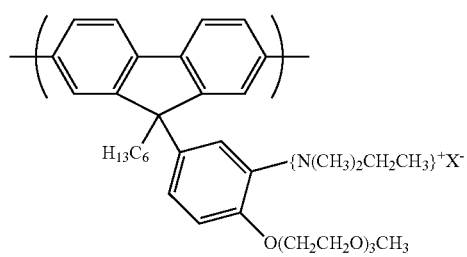

X = F, Cl. Br, I, BPh$_4$, CF$_3$SO$_3$, CH$_3$COO

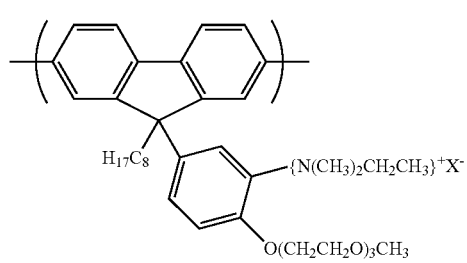

X = F, Cl. Br, I, BPh$_4$, CF$_3$SO$_3$, CH$_3$COO

-continued

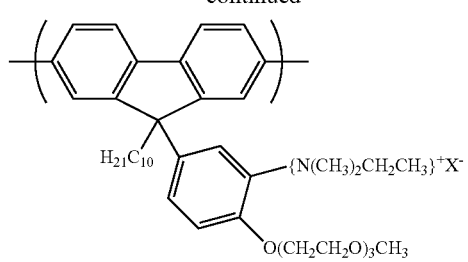

X = F, Cl. Br, I, BPh$_4$, CF$_3$SO$_3$, CH$_3$COO

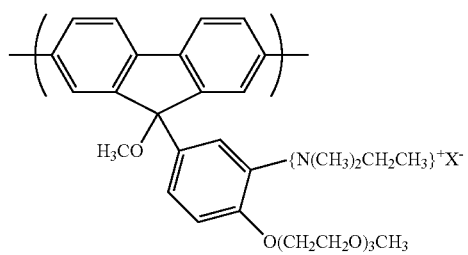

X = F, Cl. Br, I, BPh$_4$, CF$_3$SO$_3$, CH$_3$COO

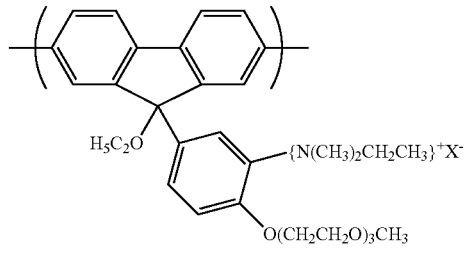

X = F, Cl. Br, I, BPh$_4$, CF$_3$SO$_3$, CH$_3$COO

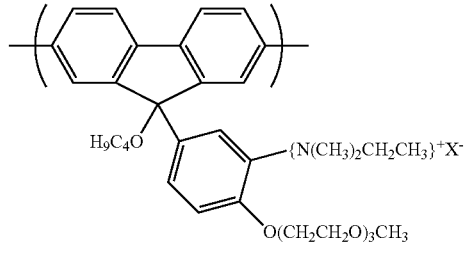

X = F, Cl. Br, I, BPh$_4$, CF$_3$SO$_3$, CH$_3$COO

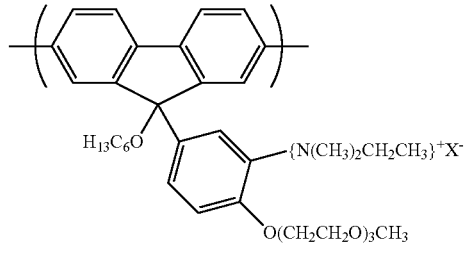

X = F, Cl. Br, I, BPh$_4$, CF$_3$SO$_3$, CH$_3$COO

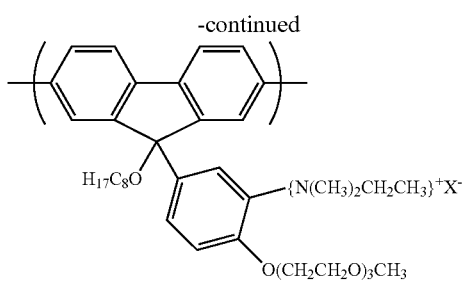

X = F, Cl. Br, I, BPh$_4$, CF$_3$SO$_3$, CH$_3$COO

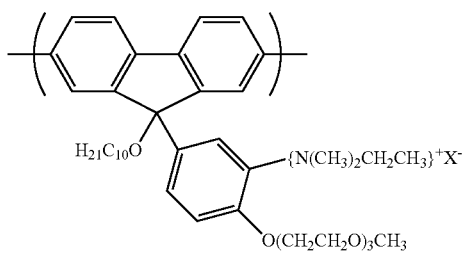

X = F, Cl. Br, I, BPh$_4$, CF$_3$SO$_3$, CH$_3$COO

[Chem. 29]

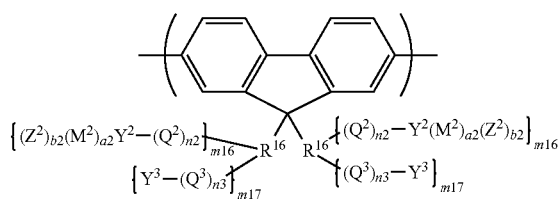

(27)

In Formula (27), $R^{16}$ represents a $(1+m16+m17)$ valent organic group; $Q^2$, $Q^3$, $Y^2$, $M^2$, $Z^2$, $Y^3$, n2, a2, b2, and n3 represent the same as defined above; m16 and m17 each independently represent an integer of 1 or more; and when each of $R^{16}$, m16, m17, $Q^2$, $Q^3$, $Y^2$, $M^2$, $Z^2$, $Y^3$, n2, a2, b2, and n3 is present in plurality, they may be the same as or different from each other.

In Formula (27), examples of the $(1+m16+m17)$ valent organic group represented by $R^{16}$ may include: a group remaining after removing $(m16+m17)$ hydrogen atoms from a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after removing $(m16+m17)$ hydrogen atoms from a $C_{6-30}$ aryl group optionally having a substituent such as a phenyl group, a 1-naphthyl group, a 2-naphthyl group, a 1-anthracenyl group, a 2-anthracenyl group, a 9-anthracenyl group, and a group in which at least one hydrogen atom in these groups is substituted with a substituent; a group remaining after removing $(m16+m17)$ hydrogen atoms from a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after removing $(m16+m17)$ hydrogen atoms from an amino group having a substituent containing a carbon atom; and a group remaining after removing $(m16+m17)$ hydrogen atoms from a silyl group having a substituent containing a carbon atom. Because the synthesis of the raw material monomer is simplified, the $(1+m16+m17)$ valent organic group represented by $R^{16}$ is preferably a group remaining after removing $(m16+m17)$ hydrogen atoms from an alkyl group, a group remaining after removing $(m16+m17)$ hydrogen atoms from an aryl group, or a group remaining after removing $(m16+m17)$ hydrogen atoms from an alkoxy group.

The structural unit represented by Formula (27) may be a structural unit as follows.

[Chem. 30]

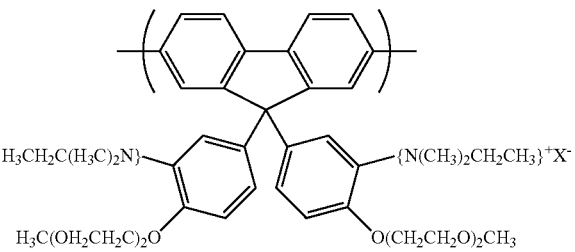

X = F, Cl, Br, I, BPh$_4$, CF$_3$SO$_3$

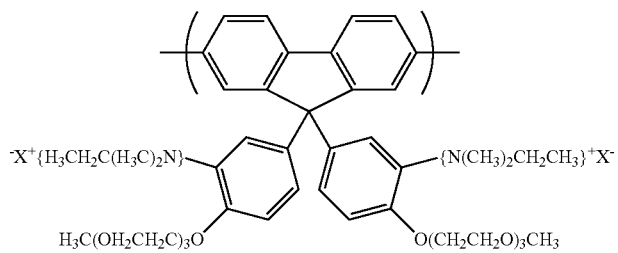

X = F, Cl, Br, I, BPh$_4$, CF$_3$SO$_3$

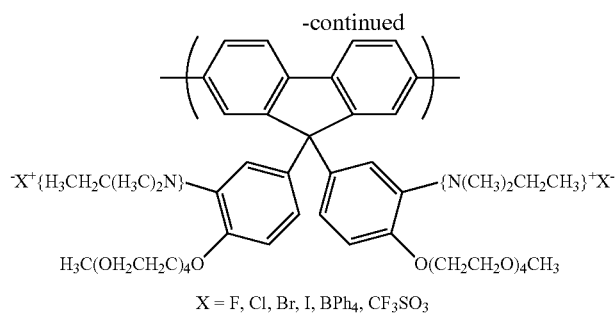
X = F, Cl, Br, I, BPh4, CF3SO3
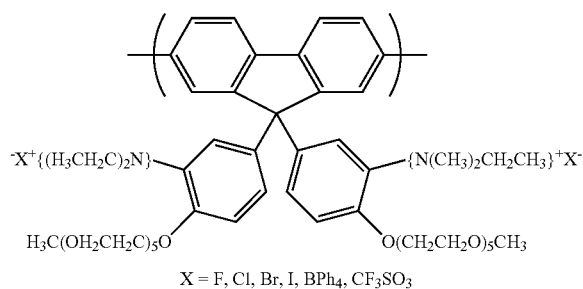
X = F, Cl, Br, I, BPh4, CF3SO3
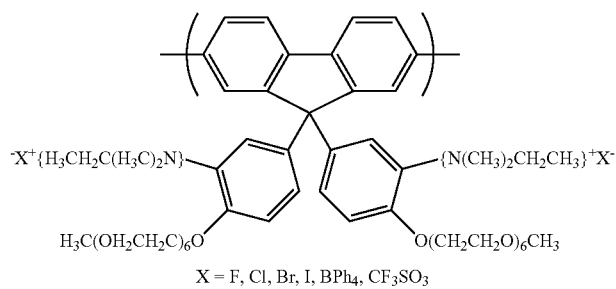
X = F, Cl, Br, I, BPh4, CF3SO3
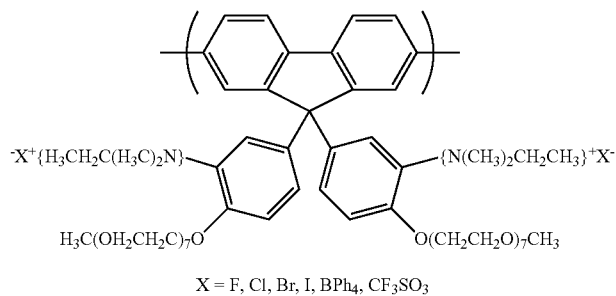
X = F, Cl, Br, I, BPh4, CF3SO3
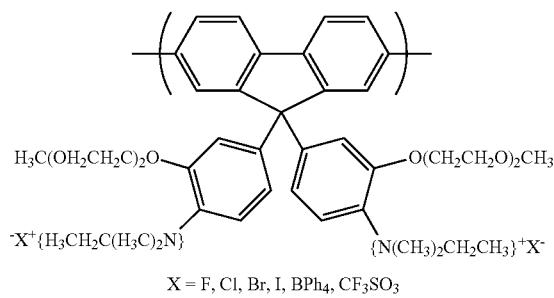
X = F, Cl, Br, I, BPh4, CF3SO3

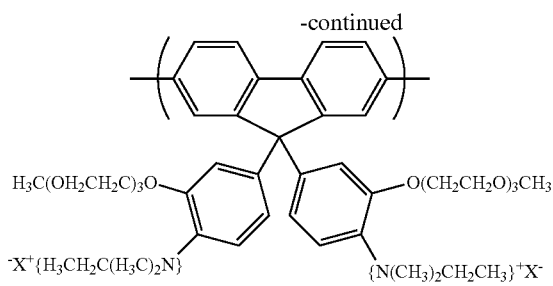
X = F, Cl, Br, I, BPh4, CF3SO3
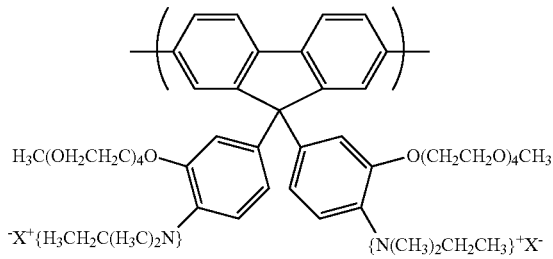
X = F, Cl, Br, I, BPh4, CF3SO3
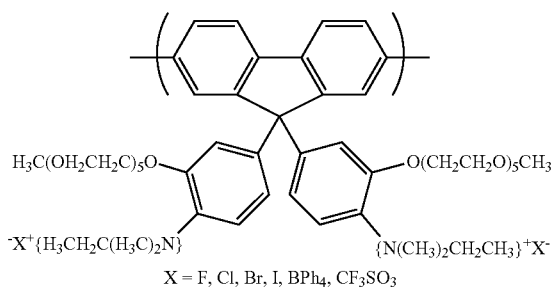
X = F, Cl, Br, I, BPh4, CF3SO3
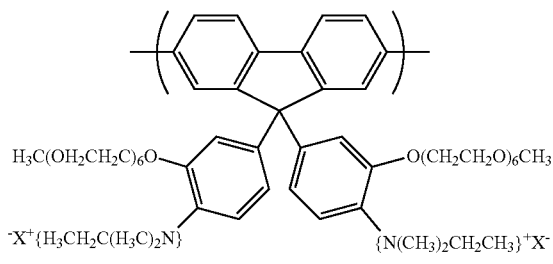
X = F, Cl, Br, I, BPh4, CF3SO3
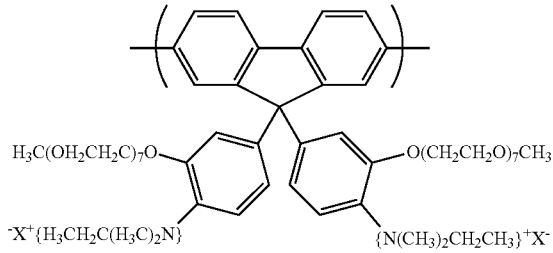
X = F, Cl, Br, I, BPh4, CF3SO3

[Chem. 31]
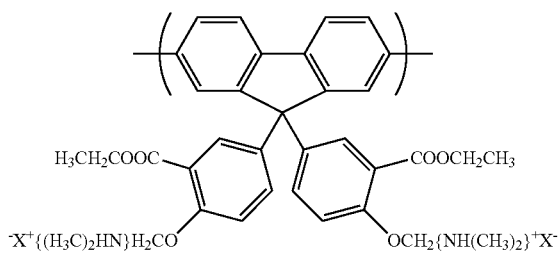
X = F, Cl, Br, I, BPh$_4$, CF$_3$SO$_3$, CH$_3$COO
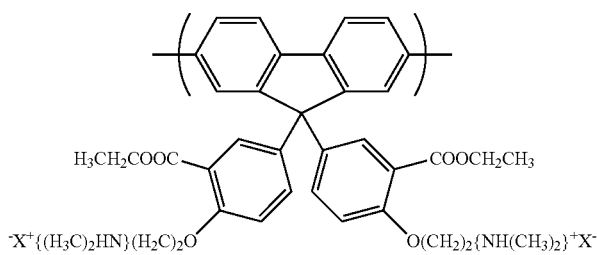
X = F, Cl, Br, I, BPh$_4$, CF$_3$SO$_3$, CH$_3$COO
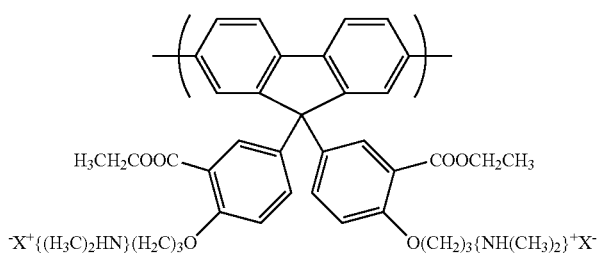
X = F, Cl, Br, I, BPh$_4$, CF$_3$SO$_3$, CH$_3$COO
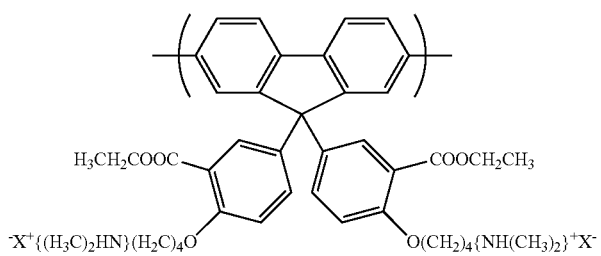
X = F, Cl, Br, I, BPh$_4$, CF$_3$SO$_3$, CH$_3$COO
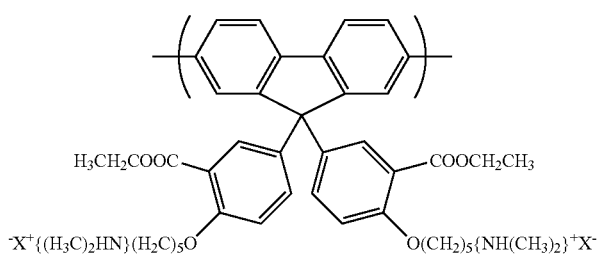
X = F, Cl, Br, I, BPh$_4$, CF$_3$SO$_3$, CH$_3$COO -continued
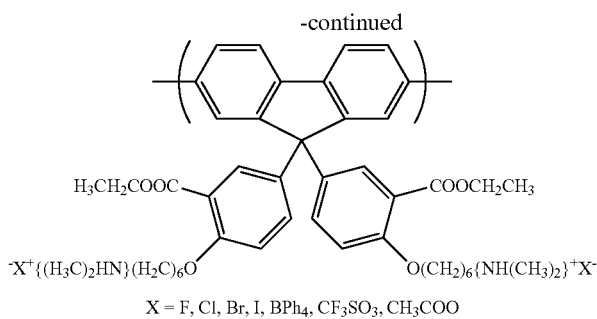
X = F, Cl, Br, I, BPh4, CF3SO3, CH3COO
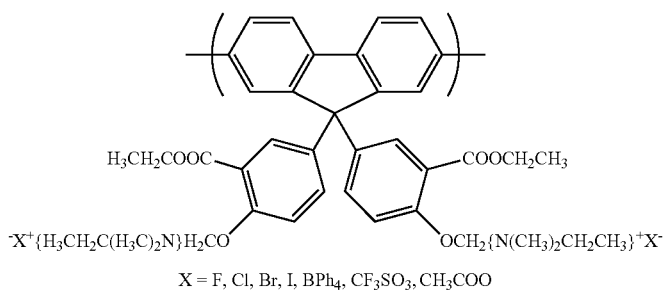
X = F, Cl, Br, I, BPh4, CF3SO3, CH3COO
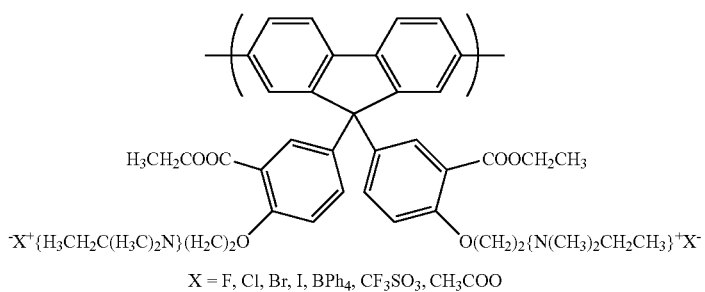
X = F, Cl, Br, I, BPh4, CF3SO3, CH3COO
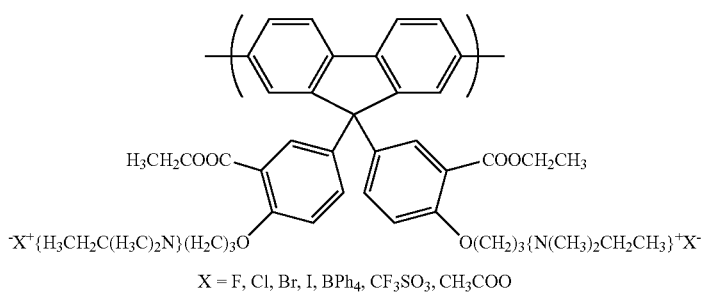
X = F, Cl, Br, I, BPh4, CF3SO3, CH3COO
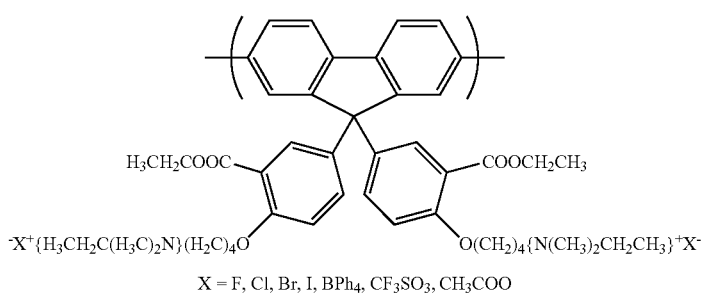
X = F, Cl, Br, I, BPh4, CF3SO3, CH3COO -continued
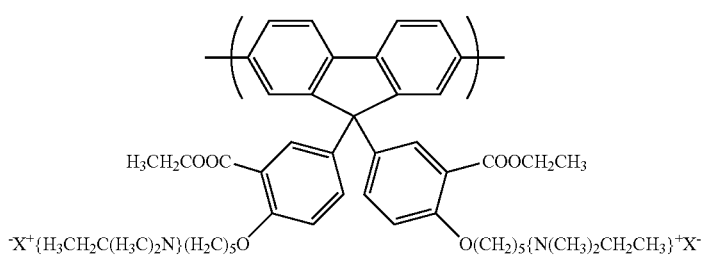
X = F, Cl, Br, I, BPh4, CF3SO3, CH3COO
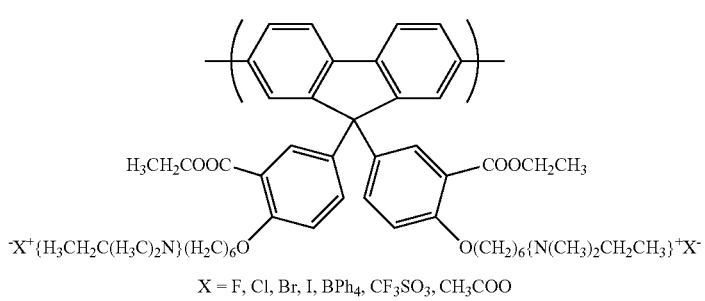
X = F, Cl, Br, I, BPh4, CF3SO3, CH3COO
[Chem. 32]
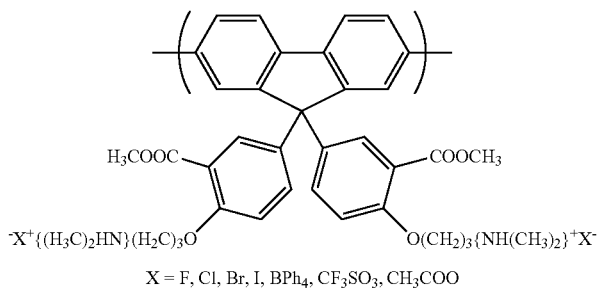
X = F, Cl, Br, I, BPh4, CF3SO3, CH3COO
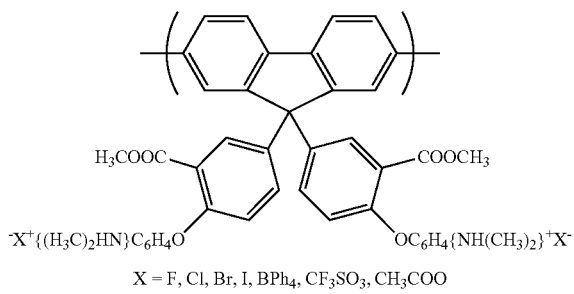
X = F, Cl, Br, I, BPh4, CF3SO3, CH3COO
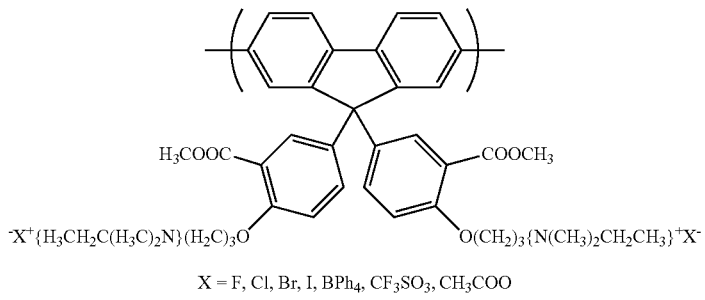
X = F, Cl, Br, I, BPh4, CF3SO3, CH3COO -continued
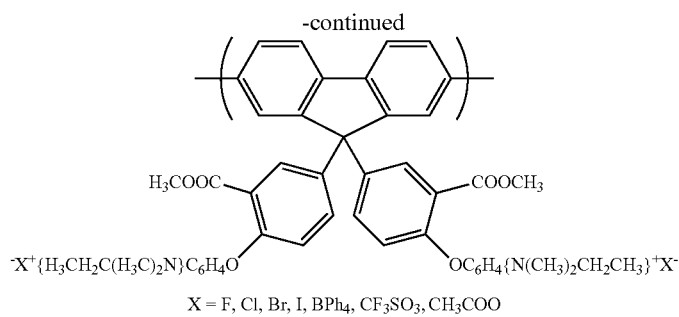
X = F, Cl, Br, I, BPh₄, CF₃SO₃, CH₃COO
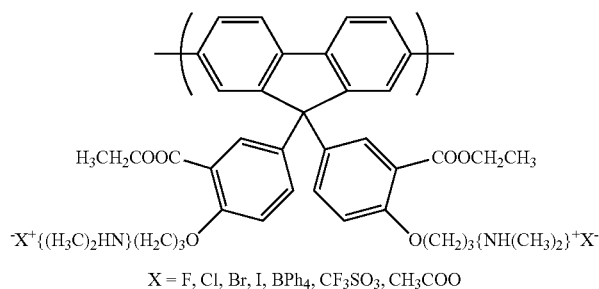
X = F, Cl, Br, I, BPh₄, CF₃SO₃, CH₃COO
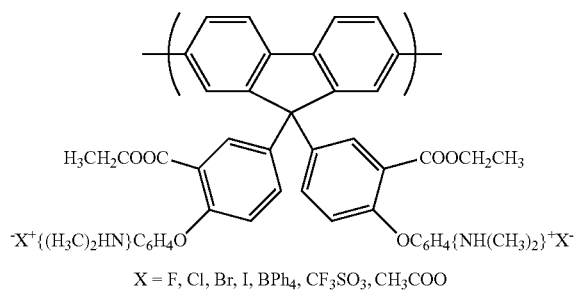
X = F, Cl, Br, I, BPh₄, CF₃SO₃, CH₃COO
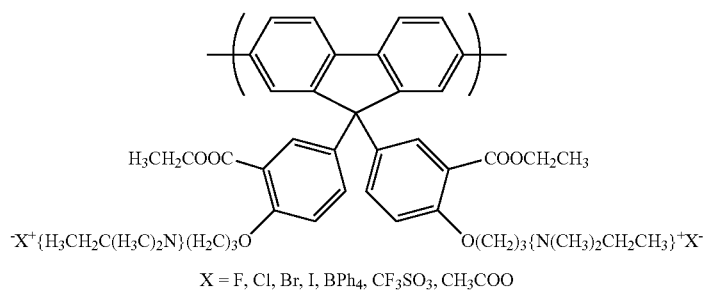
X = F, Cl, Br, I, BPh₄, CF₃SO₃, CH₃COO
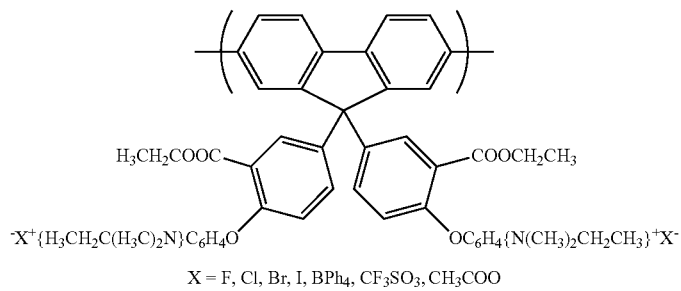
X = F, Cl, Br, I, BPh₄, CF₃SO₃, CH₃COO In view of the durability of the obtained ionic polymer, the structural unit represented by Formula (15) is preferably a structural unit represented by Formula (28).

[Chem. 33]

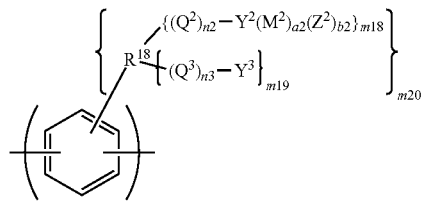
(28)

In Formula (28), $R^{18}$ represents a (1+m18+m19) valent organic group; $Q^2$, $Q^3$, $Y^2$, $M^2$, $Z^2$, $Y^3$, n2, a2, b2, and n3 represent the same as defined above; m18, m19, and m20 each independently represent an integer of 1 or more; and when each of $R^{18}$, m18, m19, $Q^2$, $Q^3$, $Y^2$, $M^2$, $Z^2$, $Y^3$, n2, a2, b2, and n3 is present in plurality, they may be the same as or different from each other.

In Formula (28), examples of the (1+m18+m19) valent organic group represented by $R^{18}$ may include: a group remaining after removing (m18+m19) hydrogen atoms from a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after removing (m18+m19) hydrogen atoms from a $C_{6-30}$ aryl group optionally having a substituent such as a phenyl group, a 1-naphthyl group, a 2-naphthyl group, a 1-anthracenyl group, a 2-anthracenyl group, a 9-anthracenyl group, and a group in which at least one hydrogen atom in these groups is substituted with a substituent; a group remaining after removing (m18+m19) hydrogen atoms from a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after removing (m18+m19) hydrogen atoms from an amino group having a substituent containing a carbon atom; and a group remaining after removing (m18+m19) hydrogen atoms from a silyl group having a substituent containing a carbon atom. Because the synthesis of the raw material monomer is simplified, the (1+m18+m19) valent organic group represented by $R^{18}$ is preferably a group remaining after removing (m18+m19) hydrogen atoms from an alkyl group, a group remaining after removing (m18+m19) hydrogen atoms from an aryl group, or a group remaining after removing (m18+m19) hydrogen atoms from an alkoxy group.

The structural unit represented by Formula (28) may be a structural unit as follows.

[Chem. 34]

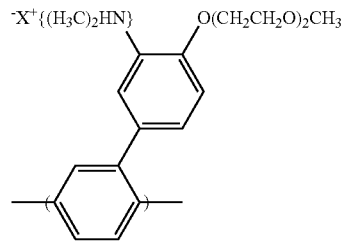

X = F, Cl, Br, I, $BPh_4$, $CF_3SO_3$, $CH_3COO$

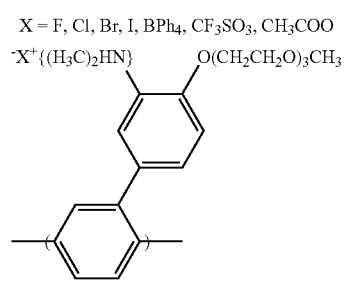

X = F, Cl, Br, I, $BPh_4$, $CF_3SO_3$, $CH_3COO$

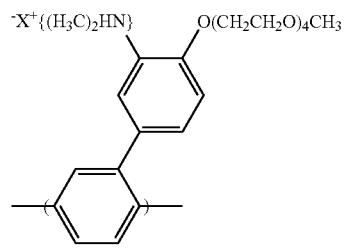

X = F, Cl, Br, I, $BPh_4$, $CF_3SO_3$, $CH_3COO$

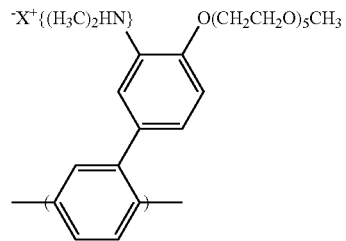

X = F, Cl, Br, I, $BPh_4$, $CF_3SO_3$, $CH_3COO$

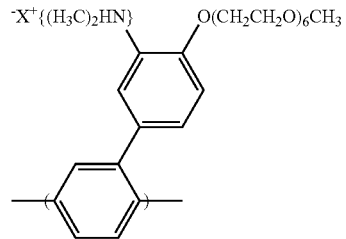

X = F, Cl, Br, I, $BPh_4$, $CF_3SO_3$, $CH_3COO$

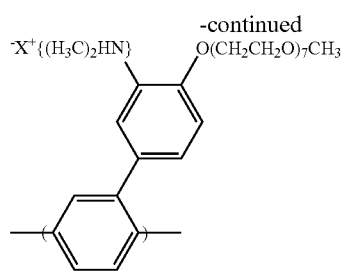
X = F, Cl, Br, I, BPh4, CF3SO3, CH3COO
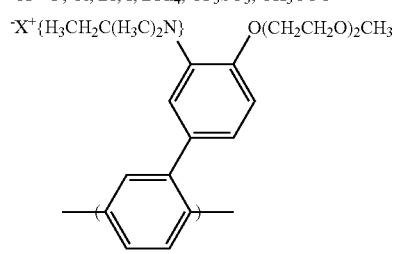
X = F, Cl, Br, I, BPh4, CF3SO3, CH3COO
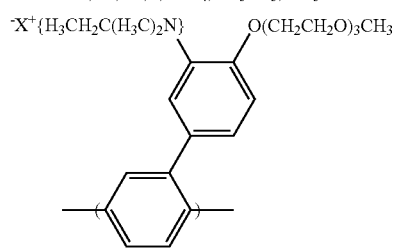
X = F, Cl, Br, I, BPh4, CF3SO3, CH3COO
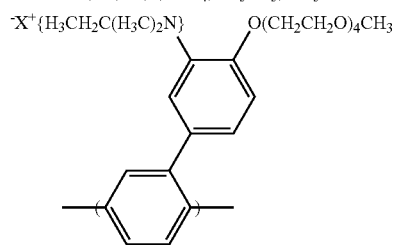
X = F, Cl, Br, I, BPh4, CF3SO3, CH3COO
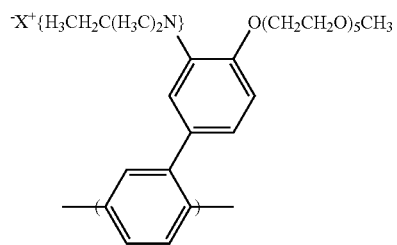
X = F, Cl, Br, I, BPh4, CF3SO3, CH3COO
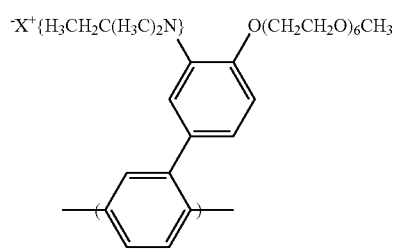
X = F, Cl, Br, I, BPh4, CF3SO3, CH3COO
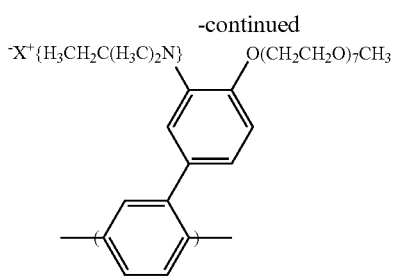
X = F, Cl, Br, I, BPh4, CF3SO3, CH3COO
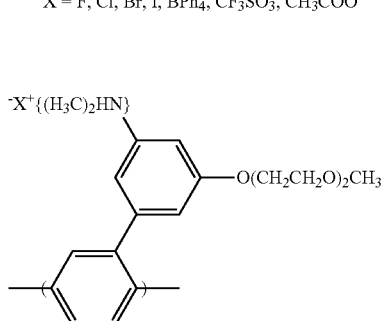
X = F, Cl, Br, I, BPh4, CF3SO3, CH3COO
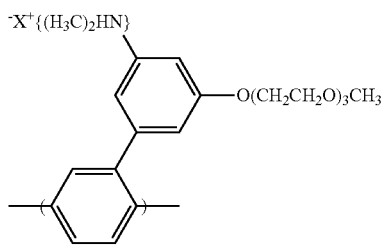
X = F, Cl, Br, I, BPh4, CF3SO3, CH3COO
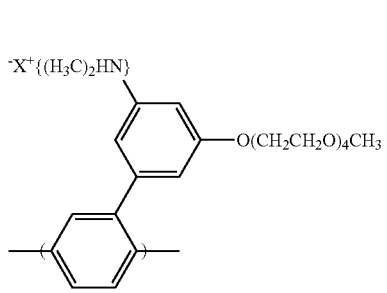
X = F, Cl, Br, I, BPh4, CF3SO3, CH3COO
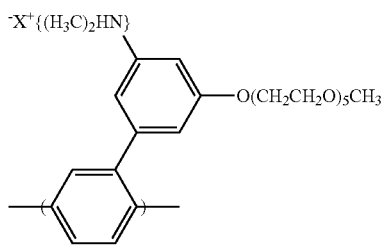
X = F, Cl, Br, I, BPh4, CF3SO3, CH3COO -continued

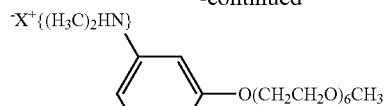

X = F, Cl, Br, I, BPh4, CF3SO3, CH3COO

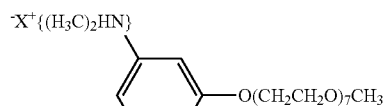

X = F, Cl, Br, I, BPh4, CF3SO3, CH3COO

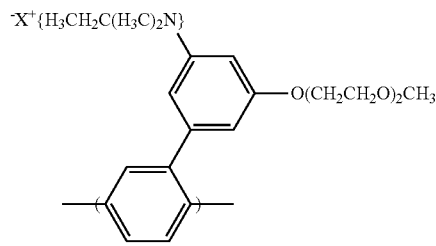

X = F, Cl, Br, I, BPh4, CF3SO3, CH3COO

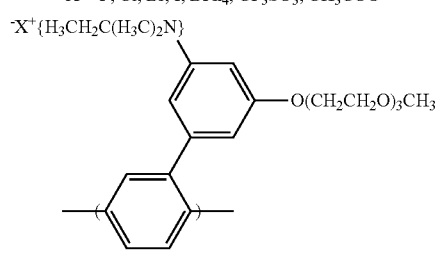

X = F, Cl, Br, I, BPh4, CF3SO3, CH3COO

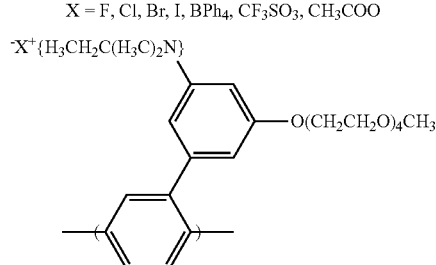

X = F, Cl, Br, I, BPh4, CF3SO3, CH3COO

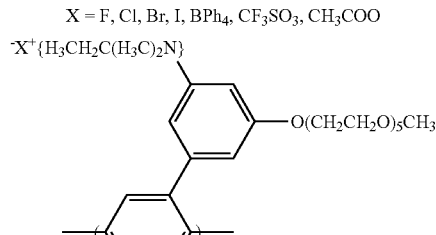

X = F, Cl, Br, I, BPh4, CF3SO3, CH3COO

-continued

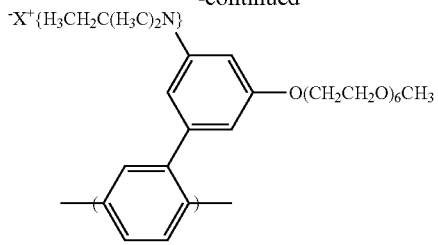

X = F, Cl, Br, I, BPh4, CF3SO3, CH3COO

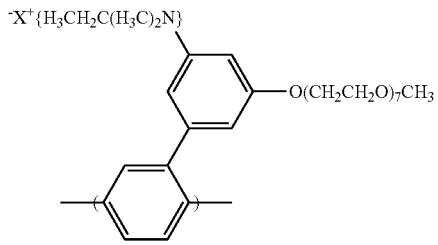

X = F, Cl, Br, I, BPh4, CF3SO3, CH3COO

Example of Structural Unit Represented by Formula (17)

In view of the electron transport property of the obtained ionic polymer, the structural unit represented by Formula (17) is preferably a structural unit represented by Formula (29).

[Chem. 35]

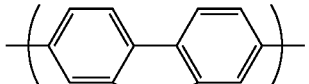

(29)

In Formula (29), $R^{19}$ represents a single bond or a (1+m21) valent organic group; $R^{20}$ represents a single bond or a (1+m22) valent organic group; $Q^1, Q^3, Y^1, M^1, M^1, Z^1, Y^3$, n1, a1, b1, and n3 represent the same as defined above; m21 and m22 each independently represent an integer of 1 or more, with the proviso that when $R^{19}$ is a single bond, m21 represents 1 and when $R^{20}$ is a single bond, m 22 represents 1; and when each of $Q^1, Q^3, Y^1, M^1, M^1, Z^1, Y^3$, n1, a1, b1, and n3 is present in plurality, they may be the same as or different from each other.

In Formula (29), examples of the (1+m21) valent organic group represented by $R^{19}$ may include: a group remaining after removing (m21) hydrogen atoms from a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after removing (m21) hydrogen atoms from a $C_{6-30}$ aryl group optionally having a substituent such as a phenyl group, a 1-naphthyl group, a 2-naphthyl group, a 1-anthracenyl group, a 2-anthracenyl group, a 9-anthracenyl group, and a group in which at least one hydrogen atom in these groups is substituted with a substituent; a group remaining after removing (m21) hydrogen atoms from a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after removing (m21) hydrogen atoms from an amino group having a substituent containing a carbon atom; and a group remaining after removing (m21) hydrogen atoms from a silyl group having a substituent containing a carbon atom. Because the synthesis of the raw material monomer is simplified, the (1+m21) valent organic group represented by $R^{19}$ is preferably a group remaining after removing (m21) hydrogen atoms from an alkyl group, a group remaining after removing (m21) hydrogen atoms from an aryl group, or a group remaining after removing (m21) hydrogen atoms from an alkoxy group.

In Formula (29), examples of the (1+m22) valent organic group represented by $R^{20}$ may include: a group remaining after removing (m22) hydrogen atoms from a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after removing (m22) hydrogen atoms from a $C_{6-30}$ aryl group optionally having a substituent such as a phenyl group, a 1-naphthyl group, a 2-naphthyl group, a 1-anthracenyl group, a 2-anthracenyl group, a 9-anthracenyl group, and a group in which at least one hydrogen atom in these groups is substituted with a substituent; a group remaining after removing (m22) hydrogen atoms from a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after removing (m22) hydrogen atoms from an amino group having a substituent containing a carbon atom; and a group remaining after removing (m22) hydrogen atoms from a silyl group having a substituent containing a carbon atom. Because the synthesis of the raw material monomer is simplified, the (1+m22) valent organic group represented by $R^{20}$ is preferably a group remaining after removing (m22) hydrogen atoms from an alkyl group, a group remaining after removing (m22) hydrogen atoms from an aryl group, or a group remaining after removing (m22) hydrogen atoms from an alkoxy group.

The structural unit represented by Formula (29) may be a structural unit as follows.

[Chem. 36]

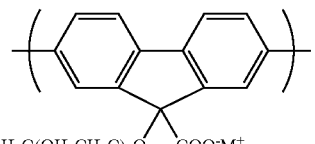

$M = Li, Na, K, Cs, N(CH_3)_4$

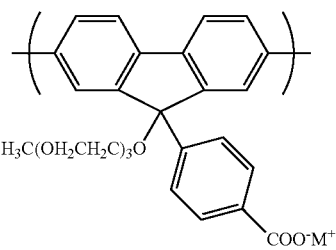

$M = Li, Na, K, Cs, N(CH_3)_4$

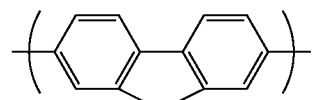

$M = Li, Na, K, Cs, N(CH_3)_4$

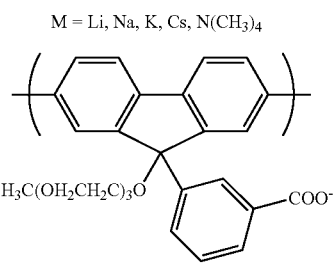

$M = Li, Na, K, Cs, N(CH_3)_4$

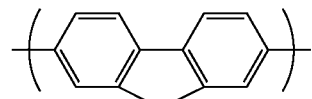

$M = Li, Na, K, Cs, N(CH_3)_4$

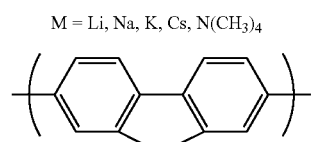

$M = Li, Na, K, Cs, N(CH_3)_4$

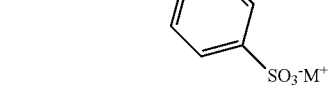

$M = Li, Na, K, Cs, N(CH_3)_4$

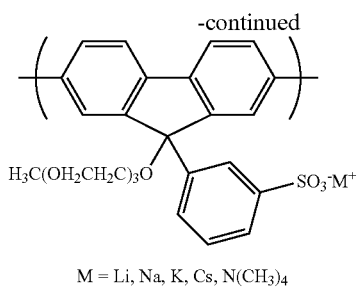

M = Li, Na, K, Cs, N(CH₃)₄

In view of the durability of the obtained ionic polymer, the structural unit represented by Formula (17) is preferably a structural unit represented by Formula (30).

[Chem. 37]

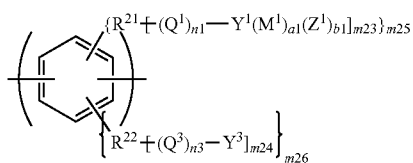

In Formula (30), $R^{21}$ represents a single bond or a (1+m23) valent organic group; $R^{22}$ represents a single bond or a (1+m24) valent organic group; $Q^1$, $Q^3$, $Y^1$, $M^1$, $Z^1$, $Y^3$, n1, a1, b1, and n3 represent the same as defined above; m23 and m24 each independently represent an integer of 1 or more, with the proviso that when $R^{21}$ is a single bond, m23 represents 1 and when $R^{22}$ is a single bond, m24 represents 1; m25 and m26 each independently represent an integer of 1 or more; and when each of m23, m24, $R^{21}$, $R^{22}$, $Q^1$, $Q^3$, $Y^1$, $M^1$, $Z^1$, $Y^3$, n1, a1, b1, and n3 is present in plurality, they may be the same as or different from each other.

In Formula (30), examples of the (1+m23) valent organic group represented by $R^{21}$ may include: a group remaining after removing (m23) hydrogen atoms from a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after removing (m23) hydrogen atoms from a $C_{6-30}$ aryl group optionally having a substituent such as a phenyl group, a 1-naphthyl group, a 2-naphthyl group, a 1-anthracenyl group, a 2-anthracenyl group, a 9-anthracenyl group, and a group in which at least one hydrogen atom in these groups is substituted with a substituent; a group remaining after removing (m23) hydrogen atoms from a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after removing (m23) hydrogen atoms from an amino group having a substituent containing a carbon atom; and a group remaining after removing (m23) hydrogen atoms from a silyl group having a substituent containing a carbon atom. Because the synthesis of the raw material monomer is simplified, the (1+m23) valent organic group represented by $R^{21}$ is preferably a group remaining after removing (m23) hydrogen atoms from an alkyl group, a group remaining after removing (m23) hydrogen atoms from an aryl group, or a group remaining after removing (m23) hydrogen atoms from an alkoxy group.

In Formula (30), examples of the (1+m24) valent organic group represented by $R^{22}$ may include: a group remaining after removing (m24) hydrogen atoms from a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after removing (m24) hydrogen atoms from a $C_{6-30}$ aryl group optionally having a substituent such as a phenyl group, a 1-naphthyl group, a 2-naphthyl group, a 1-anthracenyl group, a 2-anthracenyl group, a 9-anthracenyl group, and a group in which at least one hydrogen atom in these groups is substituted with a substituent; a group remaining after removing (m24) hydrogen atoms from a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after removing (m24) hydrogen atoms from an amino group having a substituent containing a carbon atom; and a group remaining after removing (m24) hydrogen atoms from a silyl group having a substituent containing a carbon atom. Because the synthesis of the raw material monomer is simplified, the (1+m24) valent organic group represented by $R^{22}$ is preferably a group remaining after removing (m24) hydrogen atoms from an alkyl group, a group remaining after removing (m24) hydrogen atoms from an aryl group, or a group remaining after removing (m24) hydrogen atoms from an alkoxy group.

The structural unit represented by Formula (30) may be a structural unit as follows.

[Chem. 38]

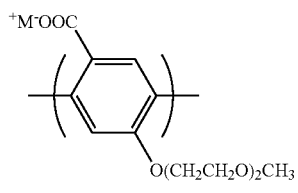

M = Li, Na, K, Cs, NMe₄

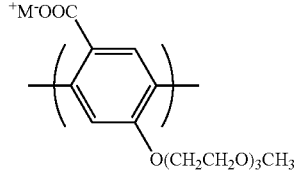

M = Li, Na, K, Cs, NMe₄

91
-continued
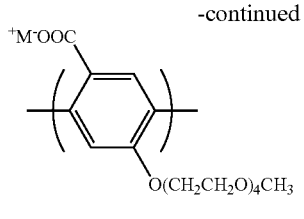
M = Li, Na, K, Cs, NMe₄
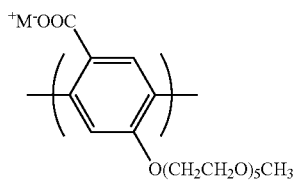
M = Li, Na, K, Cs, NMe₄
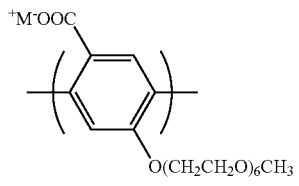
M = Li, Na, K, Cs, NMe₄
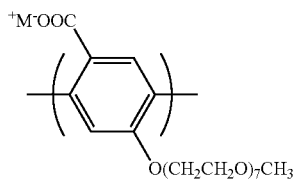
M = Li, Na, K, Cs, NMe₄
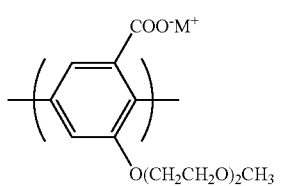
M = Li, Na, K, Cs, NMe₄
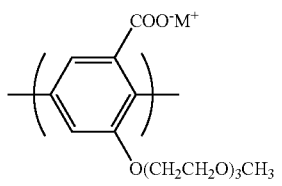
M = Li, Na, K, Cs, NMe₄
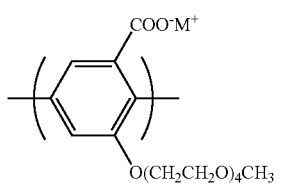
M = Li, Na, K, Cs, NMe₄
92
-continued
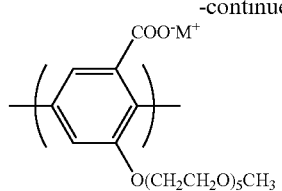
M = Li, Na, K, Cs, NMe₄
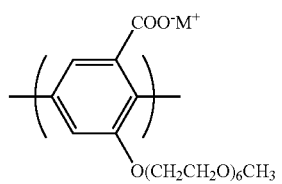
M = Li, Na, K, Cs, NMe₄
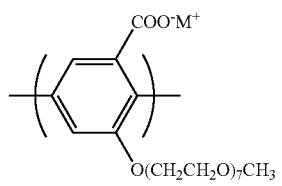
M = Li, Na, K, Cs, NMe₄
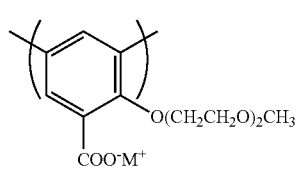
M = Li, Na, K, Cs, NMe₄
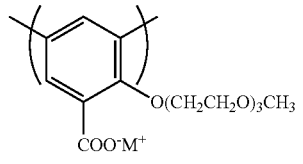
M = Li, Na, K, Cs, NMe₄
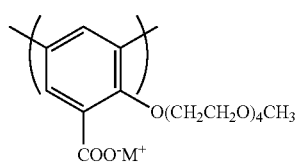
M = Li, Na, K, Cs, NMe₄
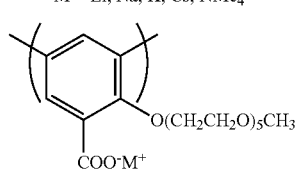
M = Li, Na, K, Cs, NMe₄
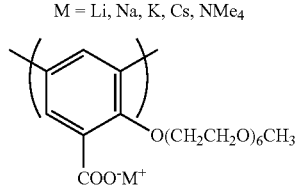
M = Li, Na, K, Cs, NMe₄

-continued

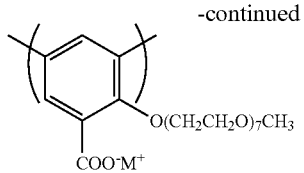

M = Li, Na, K, Cs, NMe4

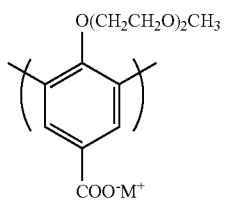

M = Li, Na, K, Cs, NMe4

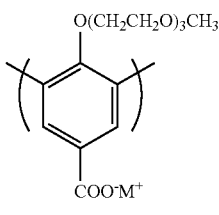

M = Li, Na, K, Cs, NMe4

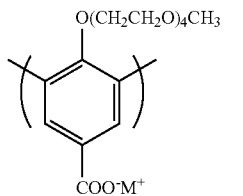

M = Li, Na, K, Cs, NMe4

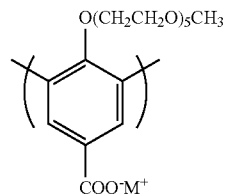

M = Li, Na, K, Cs, NMe4

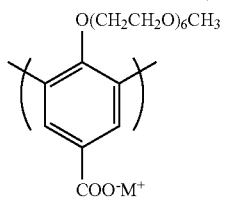

M = Li, Na, K, Cs, NMe4

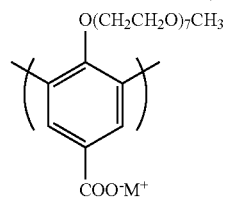

M = Li, Na, K, Cs, NMe4

Example of Structural Unit Represented by Formula (20)

In view of the obtained electron transport property, the structural unit represented by Formula (20) is preferably a structural unit represented by Formula (31).

[Chem. 39]

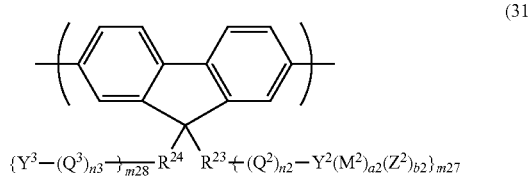

(31)

In Formula (31), $R^{23}$ represents a single bond or a (1+m27) valent organic group; $R^{24}$ represents a single bond or a (1+m28) valent organic group; $Q^2$, $Q^3$, $Y^2$, $M^2$, $Z^2$, $Y^3$, n2, a2, b2, and n3 represent the same as defined above; m27 and m28 each independently represent an integer of 1 or more, with the proviso that when $R^{23}$ is a single bond, m27 represents 1 and when $R^{24}$ is a single bond, m28 represents 1; and when each of $Q^2$, $Q^3$, $Y^2$, $M^2$, $Z^2$, $Y^3$, n2, a2, b2, and n3 is present in plurality, they may be the same as or different from each other.

In Formula (31), examples of the (1+m27) valent organic group represented by $R^{23}$ may include: a group remaining after removing (m27) hydrogen atoms from a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after removing (m27) hydrogen atoms from a $C_{6-30}$ aryl group optionally having a substituent such as a phenyl group, a 1-naphthyl group, a 2-naphthyl group, a 1-anthracenyl group, a 2-anthracenyl group, a 9-anthracenyl group, and a group in which at least one hydrogen atom in these groups is substituted with a substituent; a group remaining after removing (m27) hydrogen atoms from a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after removing (m27) hydrogen atoms from an amino group having a substituent containing a carbon atom; and a group remaining after removing (m27) hydrogen atoms from a silyl group having a substituent containing a carbon atom. Because the synthesis of the raw material monomer is simplified, the (1+m27) valent organic group represented by $R^{23}$ is preferably a group remaining after removing (m27) hydrogen atoms from an alkyl group, a group remaining after removing (m27) hydrogen atoms from an aryl group, or a group remaining after removing (m27) hydrogen atoms from an alkoxy group.

In Formula (31), examples of the (1+m28) valent organic group represented by $R^{24}$ may include: a group remaining after removing (m28) hydrogen atoms from a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after removing (m28) hydrogen atoms from a $C_{6-30}$ aryl group optionally having a substituent such as a phenyl group, a 1-naphthyl group, a 2-naphthyl group, a 1-anthracenyl group, a 2-anthracenyl group, a 9-anthracenyl group, and a group in which at least one hydrogen atom in these groups is substituted with a substituent; a group remaining after removing (m28) hydrogen atoms from a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after removing (m28) hydrogen atoms from an amino group having a substituent containing a carbon atom; and a group remaining after removing (m28) hydrogen atoms from a silyl group having a substituent containing a carbon atom. Because the synthesis of the raw material monomer is simplified, the (1+m28) valent organic group represented by $R^{24}$ is preferably a group remaining after removing (m28) hydrogen atoms from an alkyl group, a group remaining after removing (m28) hydrogen atoms from an aryl group, or a group remaining after removing (m28) hydrogen atoms from an alkoxy group.

The structural unit represented by Formula (31) may be a structural unit as follows.

[Chem. 40]

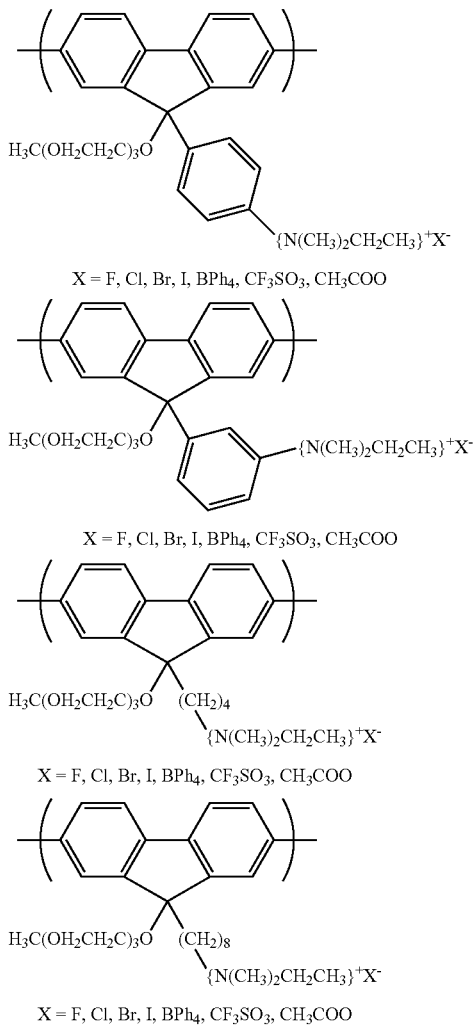

In view of the durability of the obtained ionic polymer, the structural unit represented by Formula (20) is preferably a structural unit represented by Formula (32).

[Chem. 41]

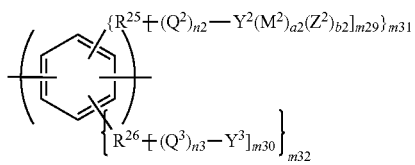

(32)

In Formula (32), $R^{25}$ represents a single bond or a (1+m29) valent organic group; $R^{26}$ represents a single bond or a (1+m30) valent organic group; $Q^2$, $Q^3$, $Y^2$, $M^2$, $Z^2$, $Y^3$, n2, a2, b2, and n3 represent the same as defined above; m29 and m30 each independently represent an integer of 1 or more, with the proviso that when $R^{25}$ is a single bond, m29 represents 1 and when $R^{26}$ is a single bond, m30 represents 1; m31 and m32 each independently represent an integer of 1 or more; and when each of m29, m30, $R^{25}$, $R^{26}$, $Q^2$, $Q^3$, $Y^2$, $M^2$, $Z^2$, $Y^3$, n2, a2, b2, and n3 is present in plurality, they may be the same as or different from each other.

In Formula (32), examples of the (1+m29) valent organic group represented by $R^{25}$ may include: a group remaining after removing (m29) hydrogen atoms from a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after removing (m29) hydrogen atoms from a $C_{6-30}$ aryl group optionally having a substituent such as a phenyl group, a 1-naphthyl group, a 2-naphthyl group, a 1-anthracenyl group, a 2-anthracenyl group, a 9-anthracenyl group, and a group in which at least one hydrogen atom in these groups is substituted with a substituent; a group remaining after removing (m29) hydrogen atoms from a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after removing (m29) hydrogen atoms from an amino group having a substituent containing a carbon atom; and a group remaining after removing (m29) hydrogen atoms from a silyl group having a substituent containing a carbon atom. Because the synthesis of the raw material monomer is simplified, the (1+m29) valent organic group represented by $R^{25}$ is preferably a group remaining after removing (m29) hydrogen atoms from an alkyl group, a group remaining after removing (m29) hydrogen atoms from an aryl group, or a group remaining after removing (m29) hydrogen atoms from an alkoxy group.

In Formula (32), examples of the (1+m30) valent organic group represented by $R^{26}$ may include: a group remaining after removing (m30) hydrogen atoms from a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a lauryl group, and a group in which at least one hydrogen atom in these groups is substituted with a substituent; a group remaining after removing (m30) hydrogen atoms from a $C_{6-30}$ aryl group optionally having a substituent such as a phenyl group, a 1-naphthyl group, a 2-naphthyl group, a 1-anthracenyl group, a 2-anthracenyl group, a 9-anthracenyl group, and a group in which at least one hydrogen atom in these groups is substituted with a substituent; a group remaining after removing (m30) hydrogen atoms from a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group, and a group in which at least one hydrogen atom in these groups is substituted with a substituent; a group remaining after removing (m30) hydrogen atoms from an amino group having a substituent containing a carbon atom; and a group remaining after removing (m30) hydrogen atoms from a silyl group having a substituent containing a carbon atom. Because the synthesis of the raw material monomer is simplified, the (1+m30) valent organic group represented by $R^{26}$ is preferably a group remaining after removing (m30) hydrogen atoms from an alkyl group, a group remaining after removing (m30) hydrogen atoms from an aryl group, or a group remaining after removing (m30) hydrogen atoms from an alkoxy group.

The structural unit represented by Formula (32) may be a structural unit as follows.

[Chem. 42]

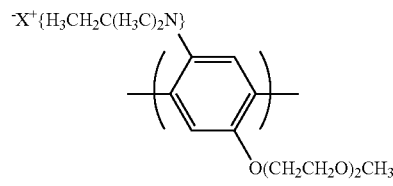

$X = F, Cl, Br, I, BPh_4, CF_3SO_3, CH_3COO$

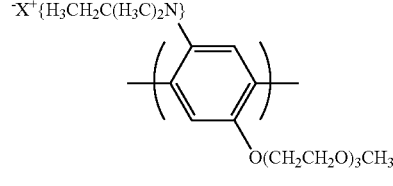

$X = F, Cl, Br, I, BPh_4, CF_3SO_3, CH_3COO$

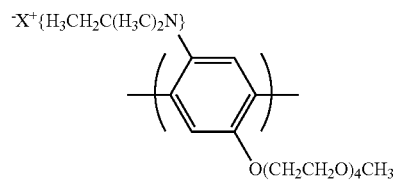

$X = F, Cl, Br, I, BPh_4, CF_3SO_3, CH_3COO$

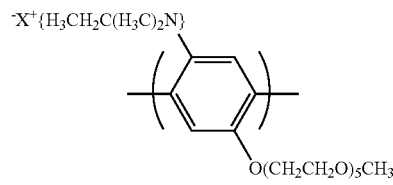

$X = F, Cl, Br, I, BPh_4, CF_3SO_3, CH_3COO$

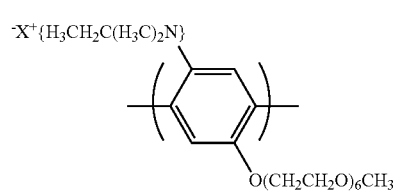

$X = F, Cl, Br, I, BPh_4, CF_3SO_3, CH_3COO$

-continued

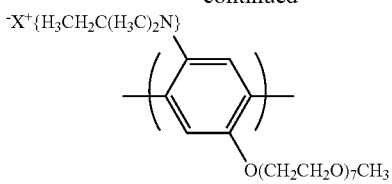

$X = F, Cl, Br, I, BPh_4, CF_3SO_3, CH_3COO$

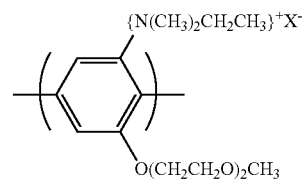

$X = F, Cl, Br, I, BPh_4, CF_3SO_3, CH_3COO$

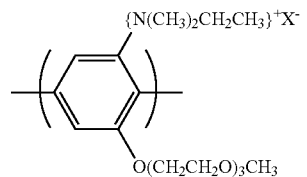

$X = F, Cl, Br, I, BPh_4, CF_3SO_3, CH_3COO$

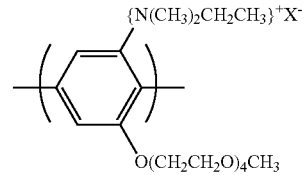

$X = F, Cl, Br, I, BPh_4, CF_3SO_3, CH_3COO$

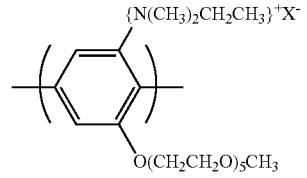

$X = F, Cl, Br, I, BPh_4, CF_3SO_3, CH_3COO$

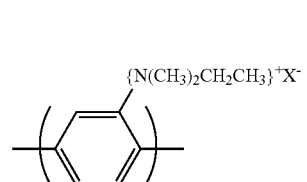

$X = F, Cl, Br, I, BPh_4, CF_3SO_3, CH_3COO$

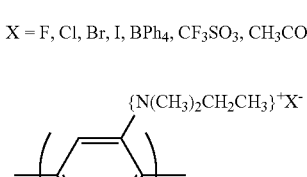

$X = F, Cl, Br, I, BPh_4, CF_3SO_3, CH_3COO$

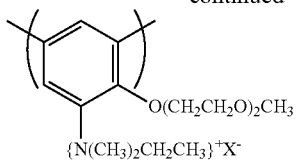

X = F, Cl, Br, I, BPh₄, CF₃SO₃, CH₃COO

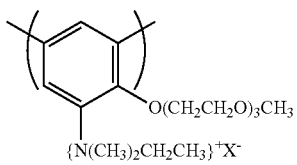

X = F, Cl, Br, I, BPh₄, CF₃SO₃, CH₃COO

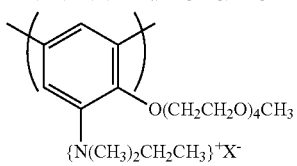

X = F, Cl, Br, I, BPh₄, CF₃SO₃, CH₃COO

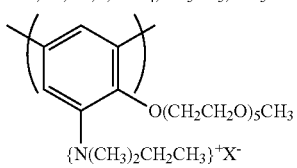

X = F, Cl, Br, I, BPh₄, CF₃SO₃, CH₃COO

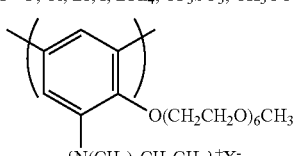

X = F, Cl, Br, I, BPh₄, CF₃SO₃, CH₃COO

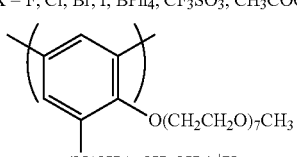

X = F, Cl, Br, I, BPh₄, CF₃SO₃, CH₃COO

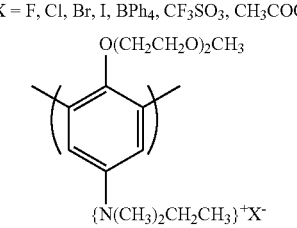

X = F, Cl, Br, I, BPh₄, CF₃SO₃, CH₃COO

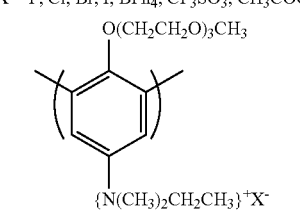

X = F, Cl, Br, I, BPh₄, CF₃SO₃, CH₃COO

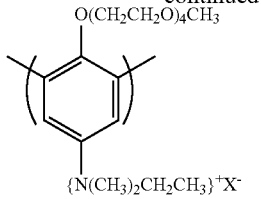

X = F, Cl, Br, I, BPh₄, CF₃SO₃, CH₃COO

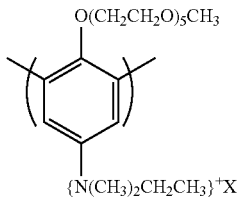

X = F, Cl, Br, I, BPh₄, CF₃SO₃, CH₃COO

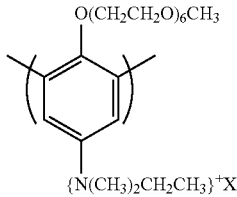

X = F, Cl, Br, I, BPh₄, CF₃SO₃, CH₃COO

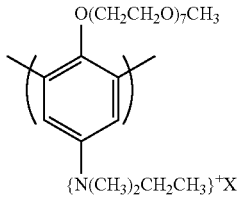

X = F, Cl, Br, I, BPh₄, CF₃SO₃, CH₃COO

Other Structural Units

The ionic polymer used in the present invention may further include one or more type(s) of structural unit represented by Formula (33).

[Chem. 43]

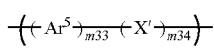

(33)

In Formula (33), Ar⁵ represents a divalent aromatic group optionally having a substituent or a divalent aromatic amine residue optionally having a substituent; X' represents an imino group optionally having a substituent, a silylene group optionally having a substituent, an ethenylene group optionally having a substituent, or an ethynylene group; and m33 and m34 each independently represent 0 or 1, with the proviso that at least one of m33 and m34 is 1.

Examples of the divalent aromatic group represented by Ar⁵ in Formula (33) may include a divalent aromatic hydrocarbon group and a divalent aromatic heterocyclic group. Examples of the divalent aromatic group may include: a divalent group remaining after removing two hydrogen atoms from a monocyclic aromatic ring such as a benzene ring, a pyridine ring, a 1,2-diazine ring, a 1,3-diazine ring, a 1,4-diazine ring, a 1,3,5-triazine ring, a furan ring, a pyrrole ring, a thiophene ring, a pyrazole ring, an imidazole ring, an oxazole ring, an oxadiazole ring, and an azadiazole ring; a divalent group remaining after removing two hydrogen atoms from a fused polycyclic aromatic ring in which two or more rings selected from the group consisting of the above monocyclic aromatic rings are fused; a divalent group remaining after removing two hydrogen atoms from an aromatic ring assembly in which two or more aromatic rings selected from the group consisting of the above monocyclic aromatic rings and the above fused polycyclic aromatic rings are linked through a single bond, an ethenylene group, or an ethynylene group; and a divalent group remaining after removing two hydrogen atoms from a bridged polycyclic aromatic ring in which two aromatic rings adjacent to each other of the above fused polycyclic aromatic ring or the above aromatic ring assembly are bridged through a divalent group such as a methylene group, an ethylene group, a carbonyl group, and an imino group.

In the fused polycyclic aromatic ring, the number of monocyclic aromatic rings to be fused is preferably 2 to 4, more preferably 2 and 3, and further preferably 2, in view of the solubility of the ionic polymer. In the aromatic ring assembly, the number of aromatic rings to be linked is preferably 2 to 4, more preferably 2 and 3, and further preferably 2, in view of the solubility of the ionic polymer. In the bridged polycyclic aromatic ring, the number of aromatic rings to be cross-linked is preferably 2 to 4, more preferably 2 and 3, and further preferably 2, in view of the solubility of the ionic polymer.

Examples of the monocyclic aromatic ring may include the following rings.

[Chem. 44]

45

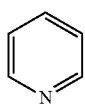
46

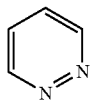
47

48

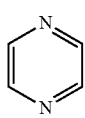
49

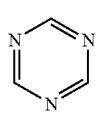
50

51

52

53

54

55

56

57

58

59

60

Examples of the fused polycyclic aromatic ring may include the following rings.

[Chem. 45]

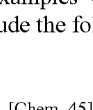
61

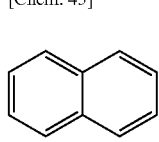
62

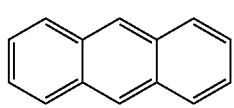
63

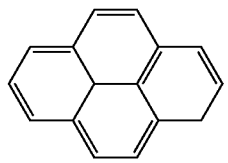

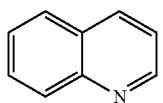 64
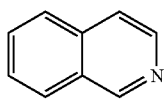 65
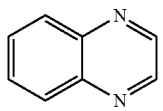 66
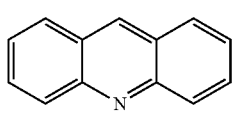 67
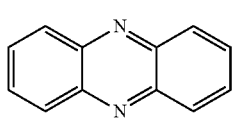 68
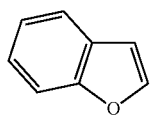 69
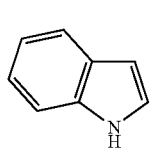 70
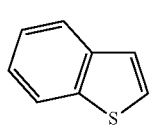 71
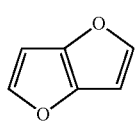 72
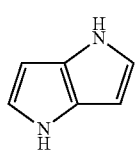 73
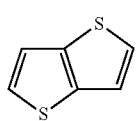 74
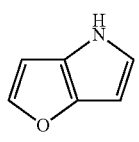 75
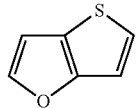 76
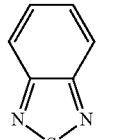 77
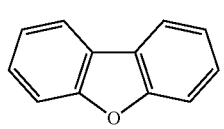 78
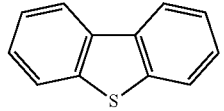 79
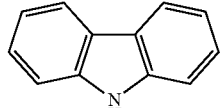 80
Examples of the aromatic ring assembly may include the following rings.
[Chem. 46]
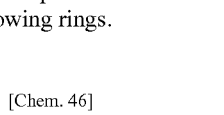 81
82
83
84
85
86

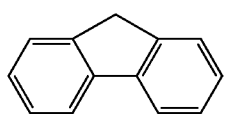

87

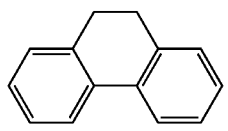

88

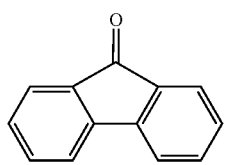

89

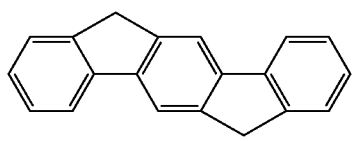

90

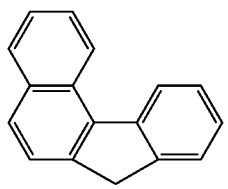

91

Examples of the bridged polycyclic aromatic ring may include the following rings.

[Chem. 47]

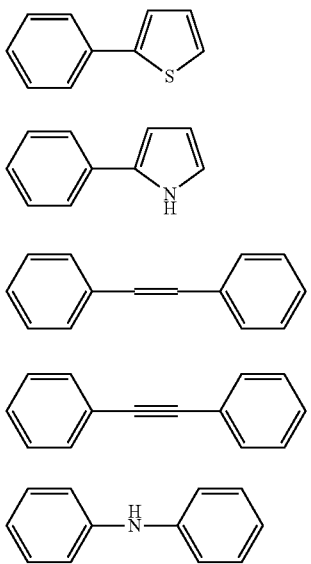

92

93

94

95

96

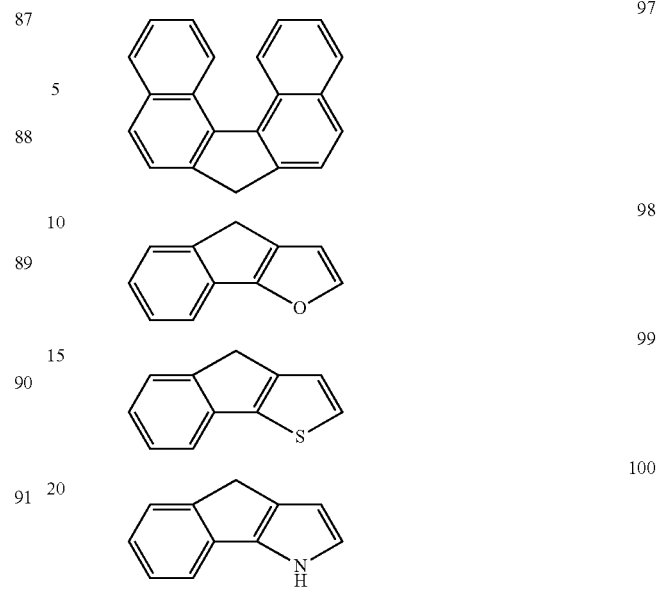

97

98

99

100

In view of any one of or both of the electron acceptability and the hole acceptability of the ionic polymer, the divalent aromatic group represented by $Ar^5$ is preferably a divalent group remaining after removing two hydrogen atoms from a ring represented by a Formula from 45 to 60, 61 to 71, 77 to 80, 91, 92, 93, and 96, and more preferably a divalent group remaining after removing two hydrogen atoms from a ring represented by a Formula from 45 to 50, 59, 60, 77, 80, 91, 92, and 96.

The divalent aromatic group may have a substituent. Examples of the substituent may include the same substituent as the substituent shown as examples in the description with respect to $Q^1$.

The divalent aromatic amine residue represented by $Ar^5$ in Formula (33) may be a group represented by Formula (34).

[Chem. 48]

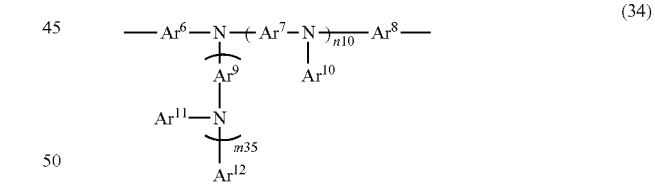

(34)

In Formula (34), $Ar^6$, $Ar^7$, $Ar^8$, and $Ar^9$ each independently represent an arylene group optionally having a substituent or a divalent heterocyclic group optionally having a substituent; $Ar^{10}$, $Ar^{11}$, and $Ar^{12}$ each independently represent an aryl group optionally having a substituent or a monovalent heterocyclic group optionally having a substituent; and n10 and m35 each independently represent 0 or 1.

Examples of the substituent that the arylene group, the aryl group, the divalent heterocyclic group, or the monovalent heterocyclic group may have may include a halogen atom, an alkyl group, an alkyloxy group, an alkylthio group, an aryl group, an aryloxy group, an arylthio group, an arylalkyl group, an arylalkyloxy group, an arylalkylthio group, an alkenyl group, an alkynyl group, an arylalkenyl group, an arylalkynyl group, an acyl group, an acyloxy group, an amido group, an acid imido group, an imine residue, a substituted amino group, a substituted silyl group, a substituted silyloxy group, a substituted silylthio group, a substituted silylamino group, a cyano group, a nitro group, a monovalent heterocyclic group, a heteroaryloxy group, a heteroarylthio group, an alkyloxycarbonyl group, an aryloxycarbonyl group, an arylalkyloxycarbonyl group, a heteroaryloxycarbonyl group, and a carboxyl group. The substituent may also be a cross-linkable group such as a vinyl group, an acetylene group, a butenyl group, an acryl group, an acrylate group, an acrylamido group, a methacryl group, a methacrylate group, a methacrylamido group, a vinyl ether group, a vinyl amino group, a silanol group, a group having a small ring (such as a cyclopropyl group, a cyclobutyl group, an epoxy group, an oxetane group, a diketene group, and an episulfide group), a lactone group, a lactam group, and a group containing a structure of a siloxane derivative.

When n10 is 0, a carbon atom in $Ar^6$ and a carbon atom in $Ar^8$ may be bonded to each other directly or may be bonded to each other through a divalent group such as —O— and —S—.

The aryl group and the monovalent heterocyclic group represented by $Ar^{10}$, $Ar^{11}$, and $Ar^{12}$ is the same as the aryl group and the monovalent heterocyclic group described and shown as examples above as the substituent.

Examples of the arylene group represented by $Ar^6$, $Ar^7$, $Ar^8$, and $Ar^9$ may include an atomic group remaining after removing two hydrogen atoms bonded to a carbon atom constituting an aromatic ring from an aromatic hydrocarbon. Examples of the arylene group may include a group having a benzene ring, a group having a fused ring, and a group in which two or more independent benzene rings or fused rings are bonded with each other through a single bond or a divalent organic group (for example, an alkenylene group such as a vinylene group). The arylene group has usually 6 to 60 carbon atoms and preferably 7 to 48 carbon atoms. Specific examples of the arylene group may include a phenylene group, a biphenylene group, a $C_1$ to $C_{17}$ alkoxyphenylene group, a $C_1$ to $C_{17}$ alkylphenylene group, a 1-naphthylene group, a 2-naphthylene group, a 1-anthracenylene group, a 2-anthracenylene group, and a 9-anthracenylene group. A hydrogen atom in the arylene group may be substituted with a fluorine atom. Examples of such a fluorine atom-substituted arylene group may include a tetrafluorophenylene group. Among the arylene groups, a phenylene group, a biphenylene group, a $C_1$ to $C_{12}$ alkoxyphenylene group, and a $C_1$ to $C_{12}$ alkylphenylene group are preferred.

Examples of the divalent heterocyclic group represented by $Ar^6$, $Ar^7$, $Ar^8$, and $Ar^9$ may include an atomic group remaining after removing two hydrogen atoms from a heterocyclic compound. The heterocyclic compound refers to an organic compound containing not only a carbon atom, but also a hetero atom such as an oxygen atom, a sulfur atom, a nitrogen atom, a phosphorus atom, a boron atom, a silicon atom, a selenium atom, a tellurium atom, and an arsenic atom as an element constituting the ring, among organic compounds having a cyclic structure. The divalent heterocyclic group may have a substituent. The divalent heterocyclic group has usually 4 to 60 carbon atoms and preferably 4 to 20 carbon atoms. The number of carbon atoms of the divalent heterocyclic group does not include the number of carbon atoms of the substituent. Examples of such a divalent heterocyclic group may include a thiophenediyl group, a $C_1$ to $C_{12}$ alkylthiophenediyl group, a pyrroldiyl group, a furandiyl group, a pyridinediyl group, a $C_1$ to $C_{12}$ alkylpyridinediyl group, a pyridazinediyl group, a pyrimidinediyl group, a pyrazinediyl group, a triazinediyl group, a pyrrolidinediyl group, a piperidinediyl group, a quinolinediyl group, and an isoquinolinediyl group. Among them, a thiophenediyl group, a $C_1$ to $C_{12}$ alkylthiophenediyl group, a pyridinediyl group, and a $C_1$ to $C_{12}$ alkylpyridinediyl group are more preferred.

The ionic polymer containing a divalent aromatic amine residue as a structural unit may further include other structural units. Examples of the other structural units may include an arylene group such as a phenylene group and a fluorenediyl group. Among these ionic polymers, those containing a cross-linkable group are preferred.

Examples of the divalent aromatic amine residue represented by Formula (34) may include a group remaining after removing two hydrogen atoms from an aromatic amine represented by Formulae 101 to 110 below.

[Chem. 49]

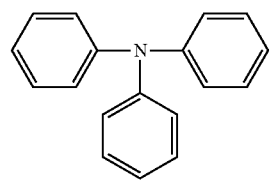

101

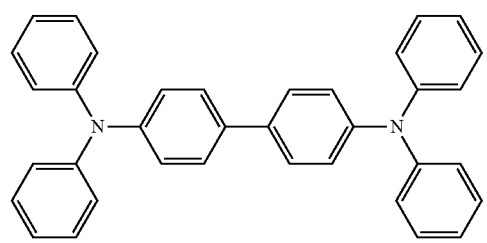

102

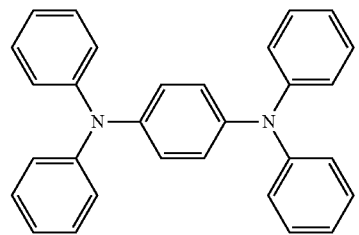

103

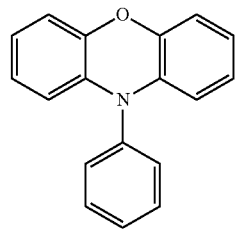

104

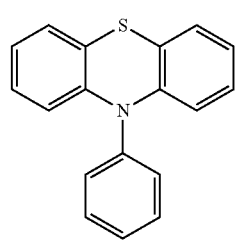

105

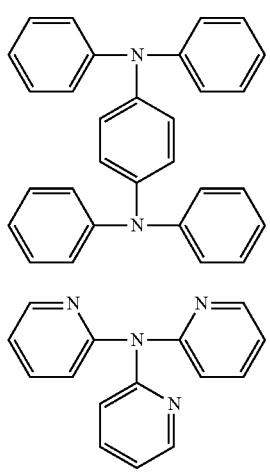

106

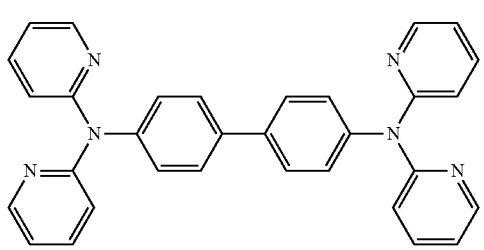

107

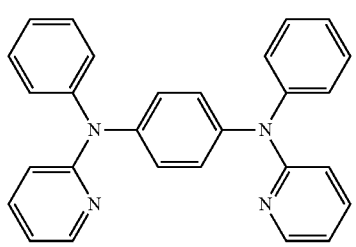

108

109

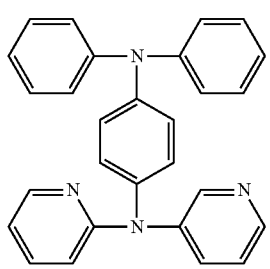

110

The aromatic amine represented by Formulae 101 to 110 may have a substituent so long as the aromatic amine can generate a divalent aromatic amine residue. Examples of the substituent may include the same substituent as the substituent shown as examples in the above description with respect to $Q^1$. When the substituent is present in plurality, they may be the same as or different from each other.

In Formula (33), X' represents an imino group optionally having a substituent, a silylene group optionally having a substituent, an ethenylene group optionally having a substituent, or an ethynylene group. Examples of the substituent that the imino group, the silylene group, or the ethenylene group may have include: a $C_{1-20}$ alkyl group such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a 2-ethylhexyl group, a nonyl group, a decyl group, a 3,7-dimethyloctyl group, and a lauryl group; and a $C_{6-30}$ aryl group such as a phenyl group, a 1-naphthyl group, a 2-naphthyl group, a 1-anthracenyl group, a 2-anthracenyl group, and a 9-anthracenyl group. When the substituent is present in plurality, they may be the same as or different from each other.

Because the ionic polymer is stabilized against air, moisture or heat, X' is preferably an imino group, an ethenylene group, or an ethynylene group.

In view of the electron acceptability and the hole acceptability of the ionic polymer, it is preferable that m33 is 1 and m34 is 0.

In view of the electron acceptability of the ionic polymer, the structural unit represented by Formula (33) is preferably a structural unit represented by Formula (35).

[Chem. 50]

$$-(-Ar^{13}-)- \qquad (35)$$

In Formula (35), $Ar^{13}$ represents a pyridinediyl group optionally having a substituent, a pyrazinediyl group optionally having a substituent, a pyrimidinediyl group optionally having a substituent, a pyridazinediyl group optionally having a substituent, or a triazinediyl group optionally having a substituent.

Examples of the substituent that the pyridinediyl group may have may include the same substituent as the substituent shown as examples in the above description with respect to $Q^1$. When the substituent is present in plurality, they may be the same as or different from each other.

Examples of the substituent that the pyrazinediyl group may have may include the same substituent as the substituent shown as examples in the above description with respect to $Q^1$. When the substituent is present in plurality, they may be the same as or different from each other.

Examples of the substituent that the pyrimidinediyl group may have may include the same substituent as the substituent shown as examples in the above description with respect to $Q^1$. When the substituent is present in plurality, they may be the same as or different from each other.

Examples of the substituent that the pyridazinediyl group may have include the same substituent as the substituent shown as examples in the above description with respect to $Q^1$. When the substituent is present in plurality, they may be the same as or different from each other.

Examples of the substituent that the triazinediyl group may have include the same substituent as the substituent shown as examples in the above description with respect to $Q^1$. When the substituent is present in plurality, they may be the same as or different from each other.

Ratio of Structural Unit

In view of the light-emitting efficiency of the organic EL element, the ratio of the sum of the structural unit represented by Formula (13), the structural unit represented by Formula (15), the structural unit represented by Formula (17), and the structural unit represented by Formula (20) contained in the ionic polymer used in the present invention is more preferably 30% by mole to 100% by mole, based on all structural units contained in the ionic polymer with the terminal structural units excluded.

Terminal Structural Unit

Examples of the terminal structural unit (terminal group) of the ionic polymer used in the present invention may include a hydrogen atom, a methyl group, an ethyl group, a propyl group, an isopropyl group, a butyl group, an isobutyl group, a sec-butyl group, a tert-butyl group, a pentyl group, an isoamyl group, a hexyl group, a cyclohexyl group, a heptyl group, an octyl group, a nonyl group, a decyl group, a lauryl group, a methoxy group, an ethoxy group, a propyloxy group, an isopropyloxy group, a butoxy group, an isobutoxy group, a sec-butoxy group, a tert-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group, a lauryloxy group, a methylthio group, an ethylthio group, a propylthio group, an isopropylthio group, a butylthio group, an isobutylthio group, a sec-butylthio group, a tert-butylthio group, a pentylthio group, a hexylthio group, a cyclohexylthio group, a heptylthio group, an octylthio group, a nonylthio group, a decylthio group, a laurylthio group, a methoxyphenyl group, an ethoxyphenyl group, a propyloxyphenyl group, an isopropyloxyphenyl group, a butoxyphenyl group, an isobutoxyphenyl group, a sec-butoxyphenyl group, a tert-butoxyphenyl group, a pentyloxyphenyl group, a hexyloxyphenyl group, a cyclohexyloxyphenyl group, a heptyloxyphenyl group, an octyloxyphenyl group, a 2-ethylhexyloxyphenyl group, a nonyloxyphenyl group, a decyloxyphenyl group, a 3,7-dimethyloctyloxyphenyl group, a lauryloxyphenyl group, a methylphenyl group, an ethylphenyl group, a dimethylphenyl group, a propylphenyl group, a mesityl group, a methylethylphenyl group, an isopropylphenyl group, a butylphenyl group, an isobutylphenyl group, a tert-butylphenyl group, a pentylphenyl group, an isoamylphenyl group, a hexylphenyl group, a heptylphenyl group, an octylphenyl group, a nonylphenyl group, a decylphenyl group, a dodecylphenyl group, a methylamino group, a dimethylamino group, an ethylamino group, a diethylamino group, a propylamino group, a dipropylamino group, an isopropylamino group, a diisopropylamino group, a butylamino group, an isobutylamino group, a sec-butylamino group, a tert-butylamino group, a pentylamino group, a hexylamino group, a cyclohexylamino group, a heptylamino group, an octylamino group, a 2-ethylhexylamino group, a nonylamino group, a decylamino group, a 3,7-dimethyloctylamino group, a laurylamino group, a cyclopentylamino group, a dicyclopentylamino group, a cyclohexylamino group, a dicyclohexylamino group, a ditrifluoromethylamino group, a phenylamino group, a diphenylamino group, a ($C_1$ to $C_{12}$ alkoxyphenyl)amino group, a di($C_1$ to $C_{12}$ alkoxyphenyl)amino group, a di($C_1$ to $C_{12}$ alkylphenyl)amino group, a 1-naphthylamino group, a 2-naphthylamino group, a pentafluorophenylamino group, a pyridylamino group, a pyridazinylamino group, a pyrimidylamino group, a pyrazinylamino group, a triazinylamino group, a (phenyl-$C_1$ to $C_{12}$ alkyl)amino group, a ($C_1$ to $C_{12}$ alkoxyphenyl-$C_1$ to $C_{12}$ alkyl)amino group, a ($C_1$ to $C_{12}$ alkylphenyl-$C_1$ to $C_{12}$ alkyl)amino group, a di($C_1$ to $C_{12}$ alkoxyphenyl-$C_1$ to $C_{12}$ alkyl)amino group, a di($C_1$ to $C_{12}$ alkylphenyl-$C_1$ to $C_{12}$ alkyl)amino group, a 1-naphthyl-$C_1$ to $C_{12}$ alkylamino group, a 2-naphthyl-$C_1$ to $C_{12}$ alkylamino group, a trimethylsilyl group, a triethylsilyl group, a tripropylsilyl group, a triisopropylsilyl group, an isopropyldimethylsilyl group, an isopropyldiethylsilyl group, a tert-butyldimethylsilyl group, a pentyldimethylsilyl group, a hexyldimethylsilyl group, a heptyldimethylsilyl group, an octyldimethylsilyl group, a 2-ethylhexyldimethylsilyl group, a nonyldimethylsilyl group, a decyldimethylsilyl group, a 3,7-dimethyloctyldimethylsilyl group, a lauryldimethylsilyl group, a (phenyl-$C_1$ to $C_{12}$ alkyl)silyl group, a ($C_1$ to $C_{12}$ alkoxyphenyl-$C_1$ to $C_{12}$ alkyl)silyl group, a ($C_1$ to $C_{12}$ alkylphenyl-$C_1$ to $C_{12}$ alkyl) silyl group, a (1-naphthyl-$C_1$ to $C_{12}$ alkyl)silyl group, a (2-naphthyl-$C_1$ to $C_{12}$ alkyl)silyl group, a (phenyl-$C_1$ to $C_{12}$ alkyl)dimethylsilyl group, a triphenylsilyl group, a tri(p-xylyl)silyl group, a tribenzylsilyl group, a diphenylmethylsilyl group, a tert-butyldiphenylsilyl group, a dimethylphenylsilyl group, a thienyl group, a $C_1$ to $C_{12}$ alkylthienyl group, a pyrrolyl group, a furyl group, a pyridyl group, a $C_1$ to $C_{12}$ alkylpyridyl group, a pyridazinyl group, a pyrimidyl group, a pyrazinyl group, a triazinyl group, a pyrrolidyl group, a piperidyl group, a quinolyl group, an isoquinolyl group, a hydroxy group, a mercapto group, a fluorine atom, a chlorine atom, a bromine atom, and an iodine atom. When the terminal structural unit is present in plurality, they may be the same as or different from each other.

-Characteristics of Ionic Polymer-

The ionic polymer used in the present invention is preferably a conjugated compound. The meaning that the ionic polymer used in the present invention is a conjugated compound is that the ionic polymer contains, in the main chain thereof, a region in which multiple bonds (for example, double bond, triple bond) or unshared electron pairs possessed by a nitrogen atom, an oxygen atom, or the like are linked through a single bond. When the ionic polymer is a conjugated compound, in view of the electron transport property of the conjugated compound, the ionic polymer has a ratio calculated by a formula of {(the number of atoms contained in the region in which multiple bonds or unshared electron pairs possessed by a nitrogen atom, an oxygen atom, or the like are linked through a single bond on the main chain)/(the number of all atoms on the main chain)}×100% of preferably 50% or more, more preferably 60% or more, more preferably 70% or more, more preferably 80% or more, and further preferably 90% or more.

The ionic polymer used in the present invention is preferably a macromolecular compound and more preferably a conjugated macromolecular compound. The macromolecular compound refers to a compound having a number average molecular weight in terms of polystyrene of $1\times10^3$ or more. The meaning that the ionic polymer used in the present invention is a conjugated macromolecular compound is that the ionic polymer is a conjugated compound and also a macromolecular compound.

In view of the film forming property of the ionic polymer used in the present invention by application, the ionic polymer has a number average molecular weight in terms of polystyrene of preferably $1\times10^3$ to $1\times10^8$, more preferably $2\times10^3$ to $1\times10^7$, more preferably $3\times10^3$ to $1\times10^7$, and further preferably $5\times10^3$ to $1\times10^7$. In view of the purity of the ionic polymer, the ionic polymer has a weight average molecular weight in terms of polystyrene of preferably $1\times10^3$ to $5\times10^7$, more preferably $1\times10^3$ to $1\times10^7$, and further preferably $1\times10^3$ to $5\times10^6$. In view of the solubility of the ionic polymer, the ionic polymer has a number average molecular weight in terms of polystyrene of preferably $1\times10^3$ to $5\times10^5$, more preferably $1\times10^3$ to $5\times10^4$, and further preferably $1\times10^3$ to $3\times10^3$. The number average molecular weight and the weight average molecular weight in terms of polystyrene of the ionic polymer used in the present invention can be measured, for example, using gel permeation chromatography (GPC).

In view of the purity of the ionic polymer used in the present invention, the number of all structural units contained in the ionic polymer excluding the terminal structural unit (that is, the degree of polymerization) is preferably 1 or more and 20 or less, more preferably 1 or more and 10 or less, and further preferably 1 or more and 5 or less.

In view of the electron acceptability and the hole acceptability of the ionic polymer used in the present invention, the ionic polymer has an orbital energy of the lowest unoccupied molecular orbital (LUMO) of preferably −5.0 eV or more and −2.0 eV or less and more preferably −4.5 eV or more and −2.0 eV or less. In view of the same, the ionic polymer has an orbital energy of the highest occupied molecular orbital (HOMO) of preferably −6.0 eV or more and −3.0 eV or less and more preferably −5.5 eV or more and −3.0 eV or less, where the orbital energy of HOMO is lower than the orbital energy of LUMO. The orbital energy of the highest occupied molecular orbital (HOMO) of the ionic polymer is obtained by measuring the ionization potential of the ionic polymer and designating the measured ionization potential as the orbital energy of HOMO. On the other hand, the orbital energy of the lowest unoccupied molecular orbital (LUMO) of the ionic polymer is obtained by measuring the energy difference between HOMO and LUMO and calculating the sum of the energy difference and the above measured ionization potential as the orbital energy of LUMO. For measuring the ionization potential, a photoelectron spectrophotometer is used. The energy difference between HOMO and LUMO is obtained from an absorption edge of an absorption spectrum of the ionic polymer measured using an ultraviolet-visible-near infrared spectrophotometer.

It is preferable that the polymer used in the present invention is substantially non-luminescent when the polymer is used for an electroluminescent element. Here, the meaning that a polymer is substantially non-luminescent is as follows. First, an electroluminescent element A having a polymer-containing layer is prepared. On the other hand, an electroluminescent element 2 having no polymer-containing layer is prepared. The electroluminescent element A and the electroluminescent element 2 are different only in that the electroluminescent element A has the polymer-containing layer, while the electroluminescent element 2 has no polymer-containing layer. Next, a forward voltage of 10 V is applied to the electroluminescent element A and the electroluminescent element 2 to measure emission spectra. A wavelength λ giving a maximum peak in the emission spectrum obtained with respect to the electroluminescent element 2 is measured. While assuming the luminescence intensity at the wavelength λ as 1, the emission spectrum obtained with respect to the electroluminescent element 2 is normalized and is integrated relative to the wavelength to calculate a normalized luminescence amount $S_0$. While assuming the luminescence intensity at the wavelength λ as 1, the emission spectrum obtained with respect to the electroluminescent element A is also normalized and is integrated relative to the wavelength to calculate a normalized luminescence amount S. When the value calculated by a formula of $(S-S_0)/S_0 \times 100\%$ is 30% or less, that is, when an increment of the normalized luminescence amount of the electroluminescent element A having the polymer-containing layer from the normalized luminescence amount of the electroluminescent element 2 not having the polymer-containing layer is 30% or less, the used polymer is regarded as substantially non-luminescent. The value calculated by the formula of $(S-S_0)/S_0 \times 100$ is preferably 15% or less and more preferably 10% or less.

Examples of the ionic polymer containing the group represented by Formula (1) and the group represented by Formula (3) may include: an ionic polymer consisting of a group represented by Formula (23); an ionic polymer consisting of the group represented by Formula (23) and one or more group(s) selected from the group consisting of a group remaining after removing two hydrogen atoms from a ring represented by a Formula from 45 to 50, 59, 60, 77, 80, 91, 92, 96, and 101 to 110; an ionic polymer consisting of a group represented by Formula (24); an ionic polymer consisting of the group represented by Formula (24) and one or more group(s) selected from the group consisting of a group remaining after removing two hydrogen atoms from a ring represented by a Formula from 45 to 50, 59, 60, 77, 80, 91, 92, 96, and 101 to 110; an ionic polymer consisting of a group represented by Formula (25); an ionic polymer consisting of the group represented by Formula (25) and one or more group(s) selected from the group consisting of a group remaining after removing two hydrogen atoms from a ring represented by a Formula from 45 to 50, 59, 60, 77, 80, 91, 92, 96, and 101 to 110; an ionic polymer consisting of a group represented by Formula (29); an ionic polymer consisting of the group represented by Formula (29) and one or more group(s) selected from the group consisting of a group remaining after removing two hydrogen atoms from a ring represented by a Formula from 45 to 50, 59, 60, 77, 80, 91, 92, 96, and 101 to 110; an ionic polymer consisting of a group represented by Formula (30); and an ionic polymer consisting of the group represented by Formula (30) and one or more group(s) selected from the group consisting of a group remaining after removing two hydrogen atoms from a group represented by a Formula from 45 to 50, 59, 60, 77, 80, 91, 92, 96, and 101 to 110.

Examples of the ionic polymer containing the group represented by Formula (1) and the group represented by Formula (3) may include the macromolecular compounds below. Among these macromolecular compounds, in macromolecular compounds represented by a formula in which two types of structural unit are delimited by a slash "/," the ratio of the left structural unit is p % by mole and the ratio of the right structural unit is (100−p) % by mole, and these structural units are arranged at random. In the formulae below, n represents the degree of polymerization.

[Chem. 51]

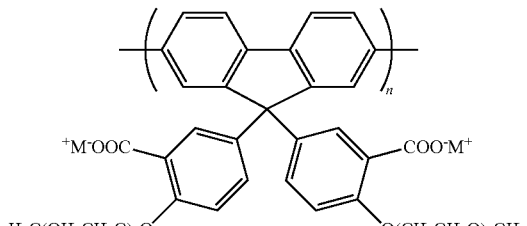 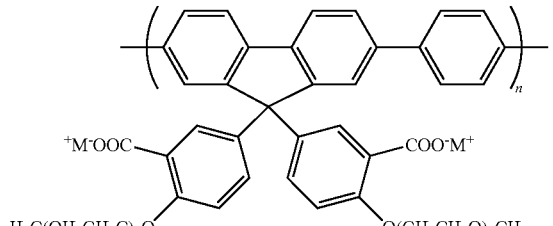

M = Li, Na, K, Cs        M = Li, Na, K, Cs

-continued
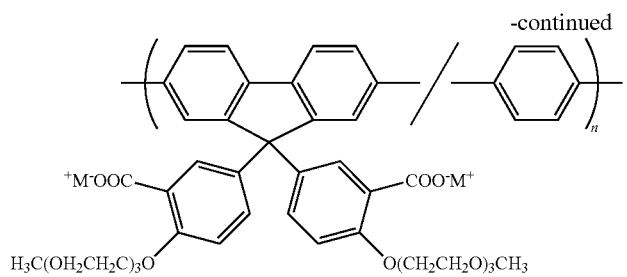
M = Li, Na, K, Cs
(p:100 - p mol %)
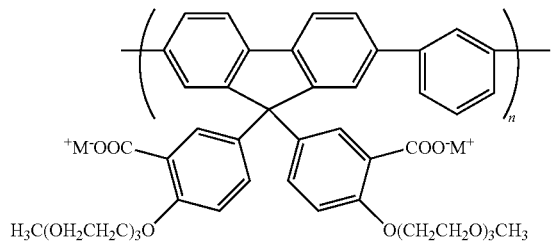
M = Li, Na, K, Cs
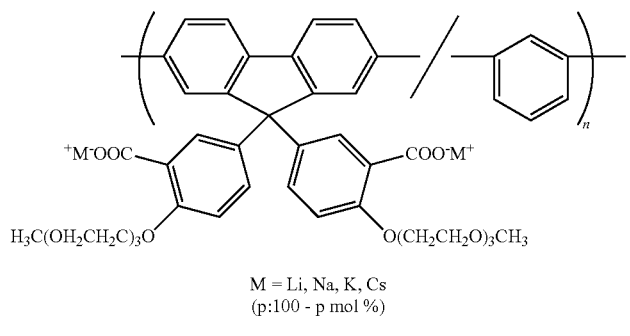
M = Li, Na, K, Cs
(p:100 - p mol %)
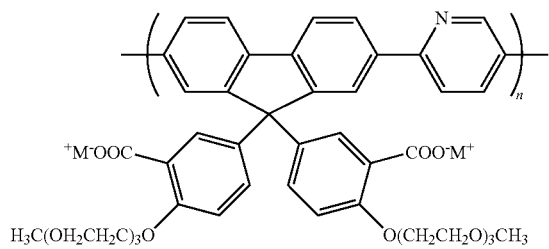
M = Li, Na, K, Cs
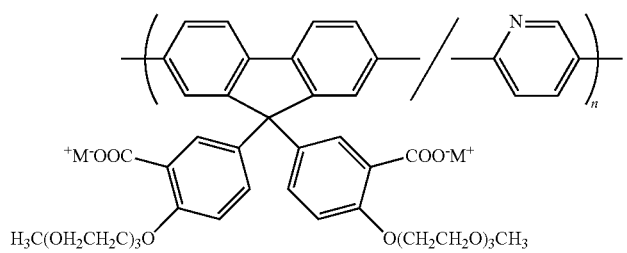
M = Li, Na, K, Cs
(p:100 - p mol %)

-continued
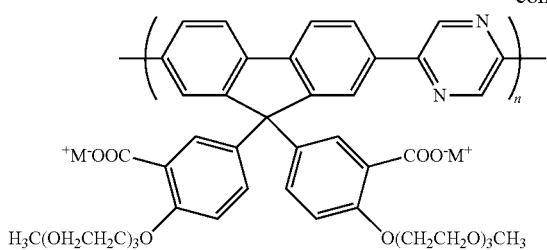
M = Li, Na, K, Cs
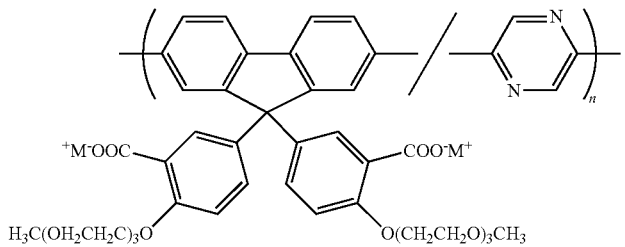
M = Li, Na, K, Cs
(p:100 - p mol %)
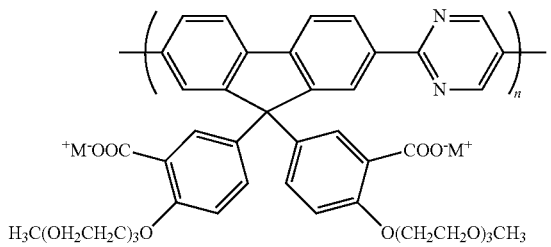
M = Li, Na, K, Cs
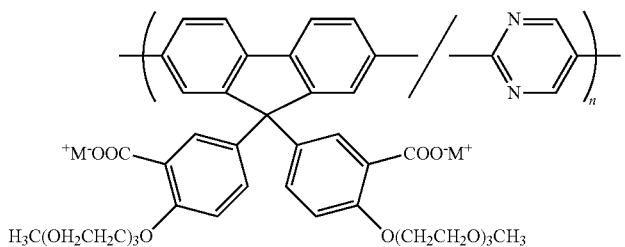
M = Li, Na, K, Cs
(p:100 - p mol %)
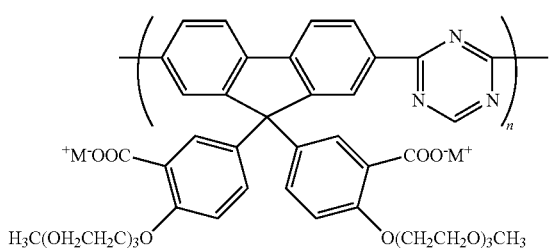
M = Li, Na, K, Cs

[Chem. 52]
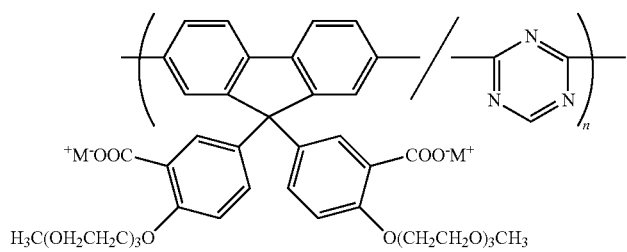
M = Li, Na, K, Cs
(p:100 - p mol %)
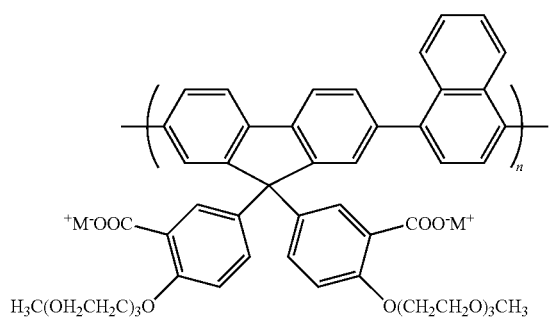
M = Li, Na, K, Cs
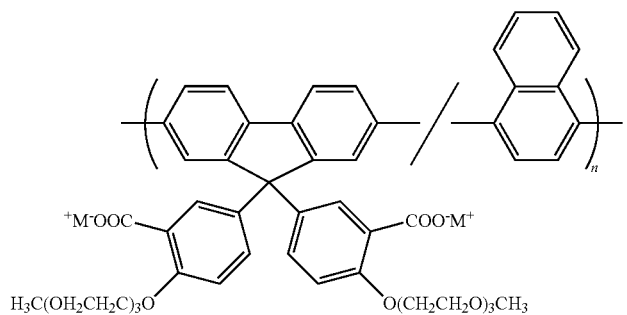
M = Li, Na, K, Cs
(p:100 - p mol %)
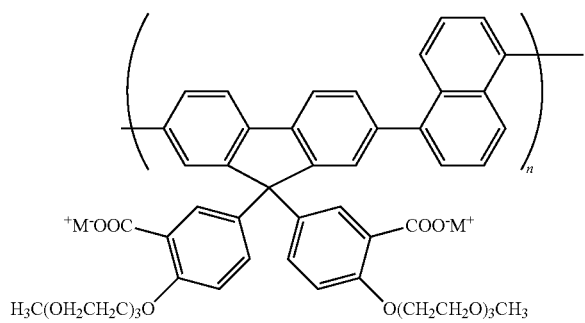
M = Li, Na, K, Cs -continued
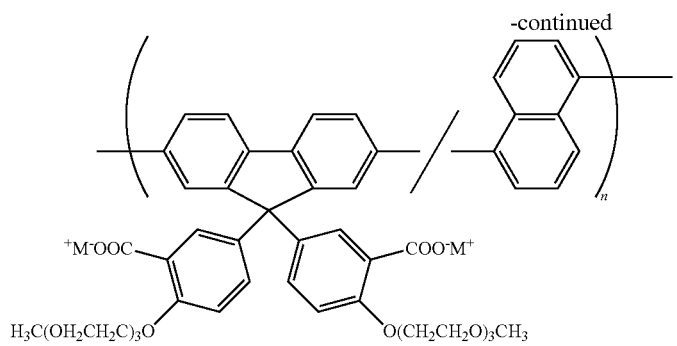
M = Li, Na, K, Cs
(p:100 - p mol %)
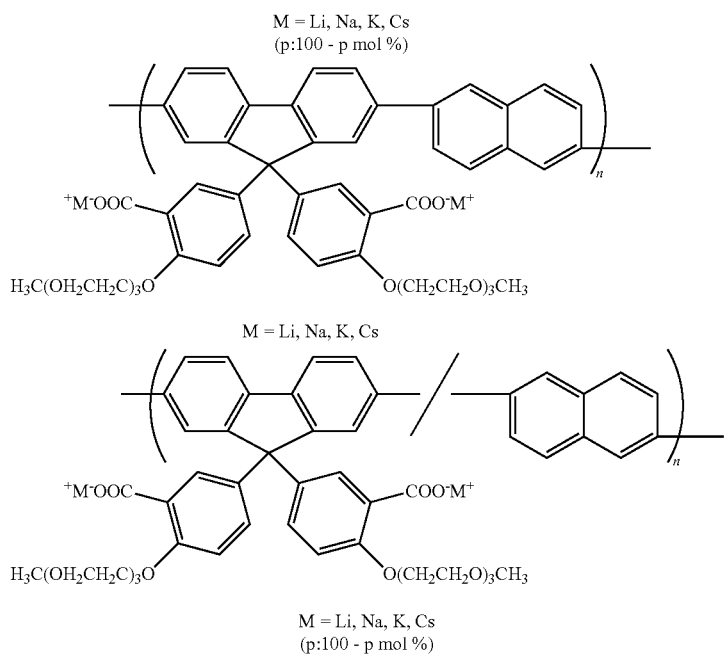
M = Li, Na, K, Cs
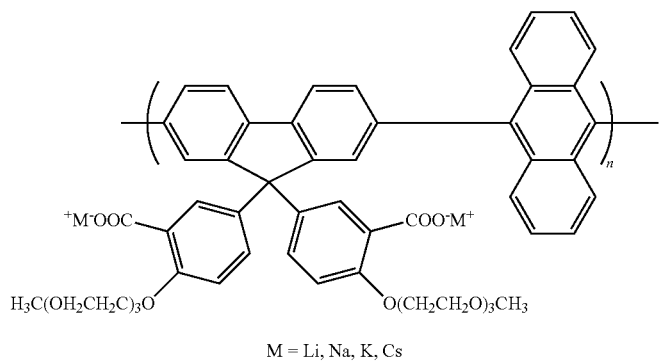
M = Li, Na, K, Cs
(p:100 - p mol %)
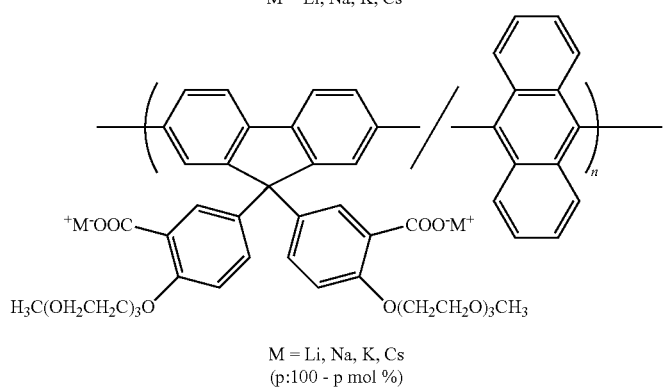
M = Li, Na, K, Cs
M = Li, Na, K, Cs
(p:100 - p mol %)

-continued
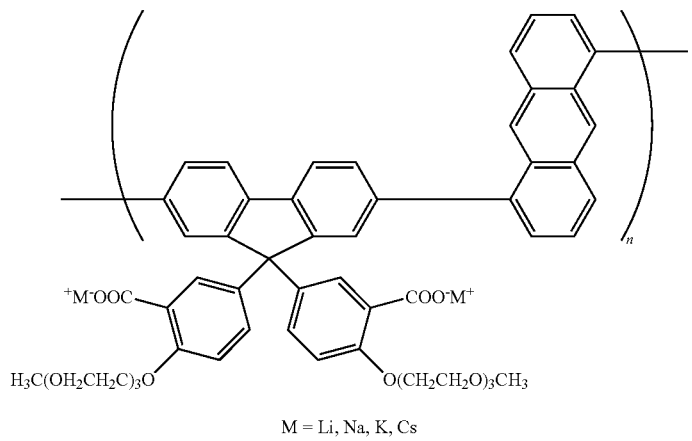
M = Li, Na, K, Cs
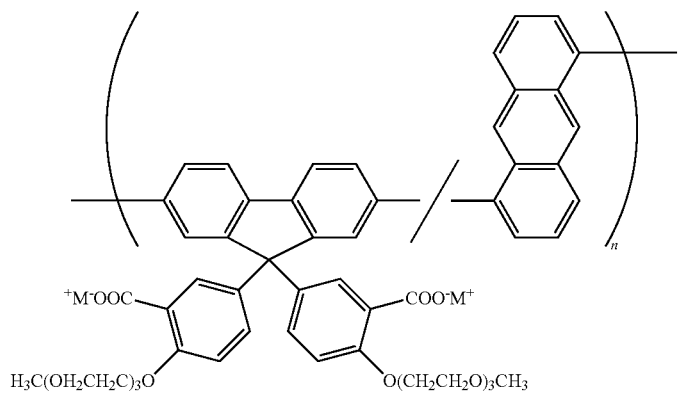
M = Li, Na, K, Cs
(p:100 - p mol %)
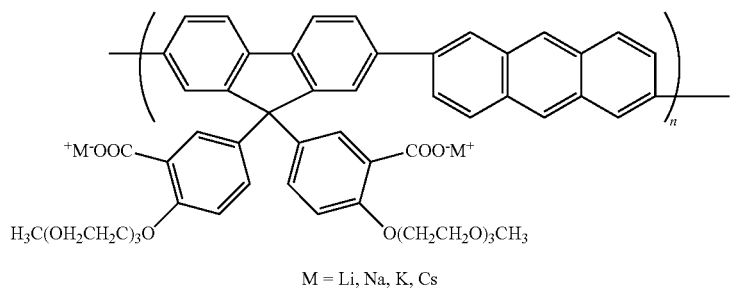
M = Li, Na, K, Cs
[Chem. 53]
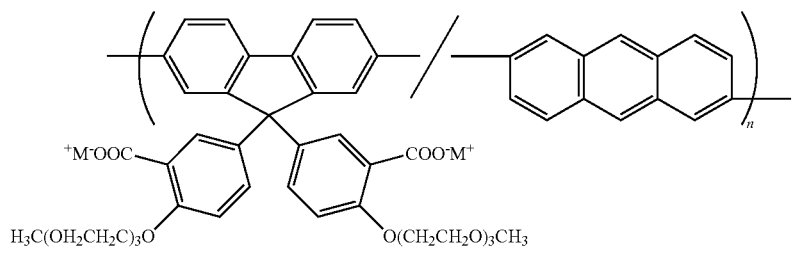
M = Li, Na, K, Cs
(p:100 - p mol %)

-continued
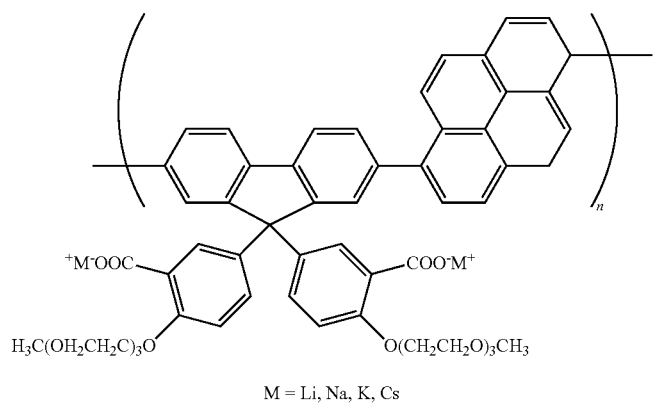
M = Li, Na, K, Cs
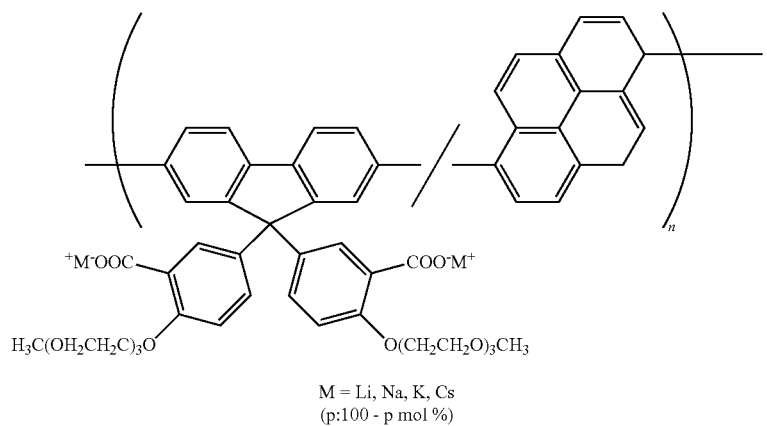
M = Li, Na, K, Cs
(p:100 − p mol %)
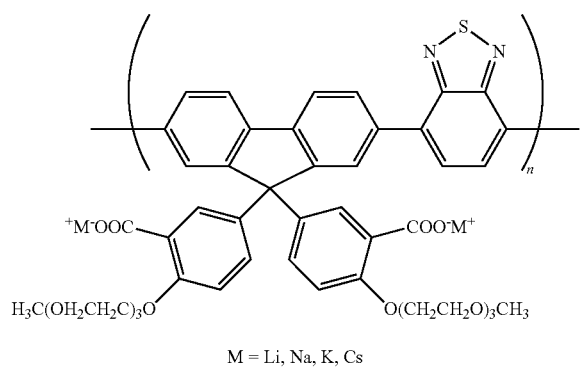
M = Li, Na, K, Cs
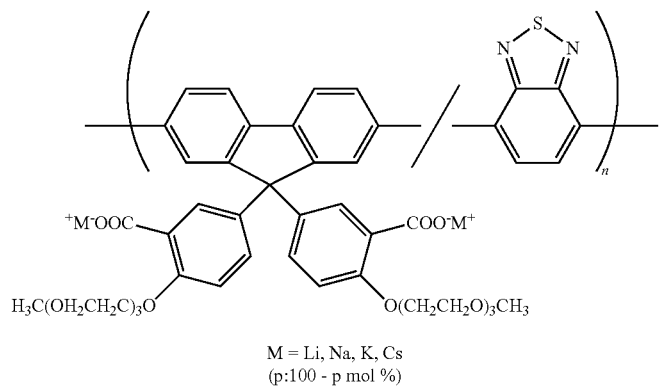
M = Li, Na, K, Cs
(p:100 − p mol %)

-continued
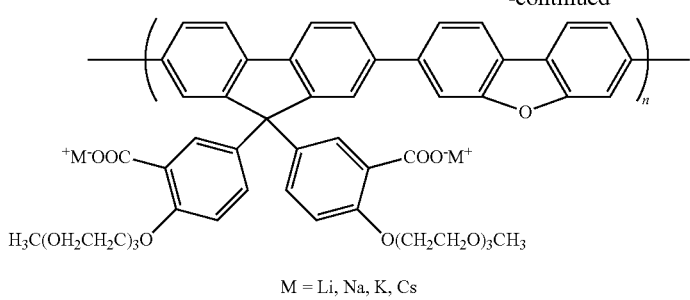
M = Li, Na, K, Cs
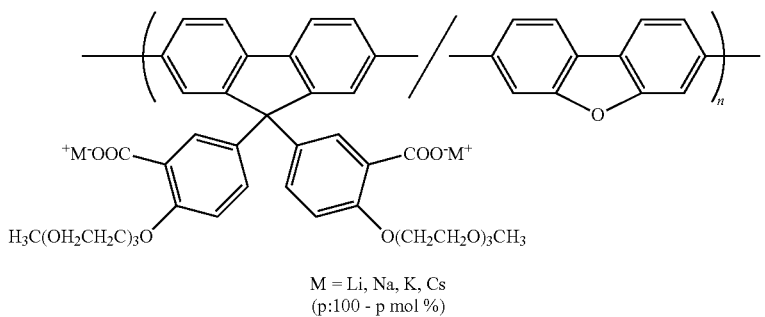
M = Li, Na, K, Cs
(p:100 - p mol %)
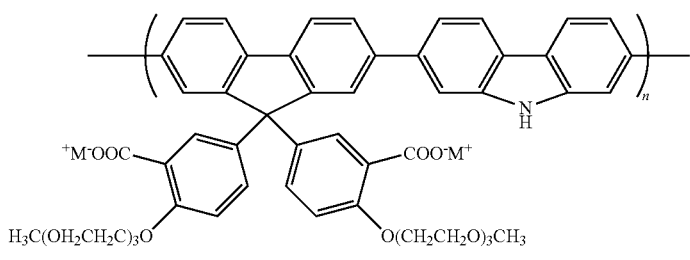
M = Li, Na, K, Cs
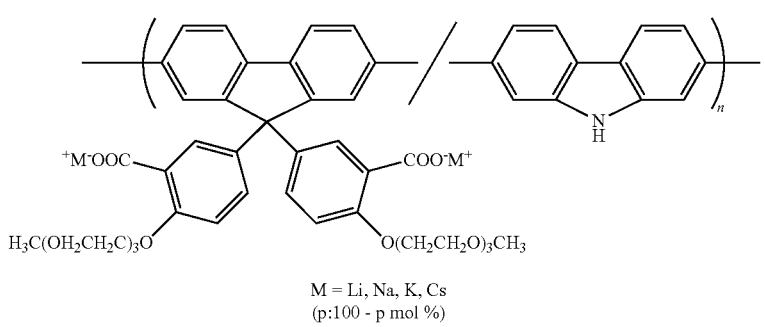
M = Li, Na, K, Cs
(p:100 - p mol %)
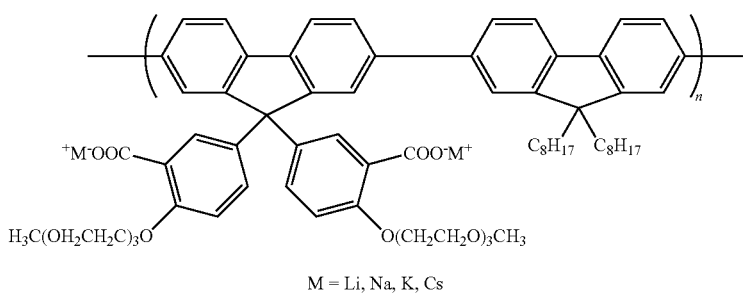
M = Li, Na, K, Cs

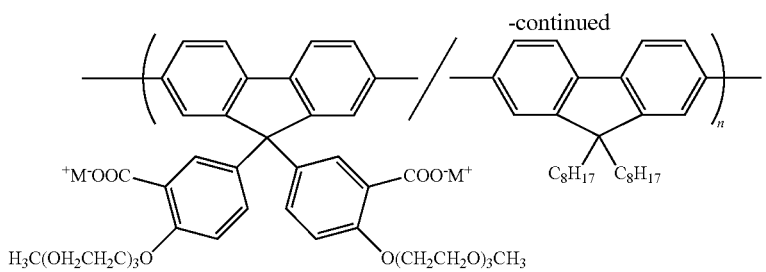
M = Li, Na, K, Cs
(p:100 - p mol %)
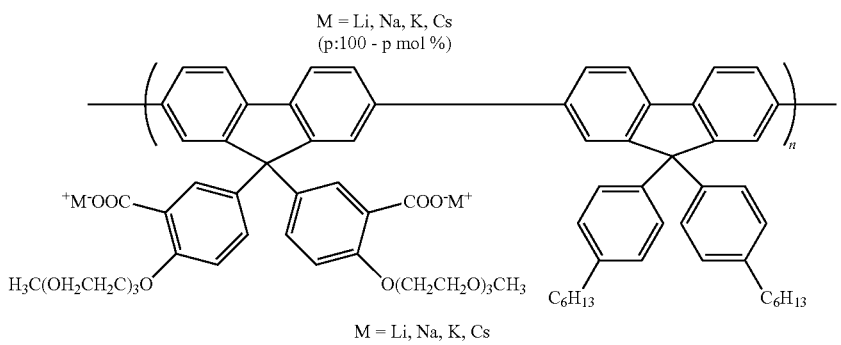
M = Li, Na, K, Cs
[Chem. 54]
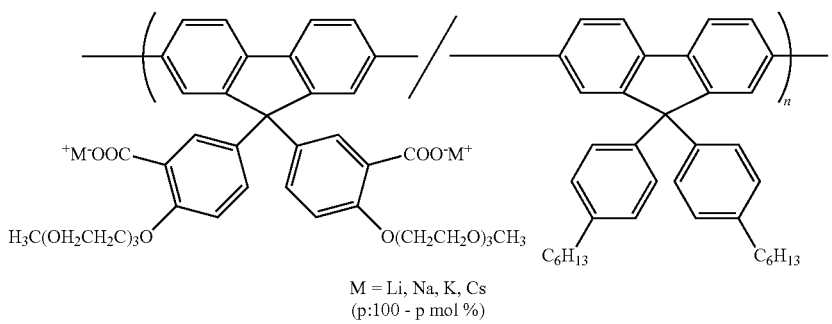
M = Li, Na, K, Cs
(p:100 - p mol %)
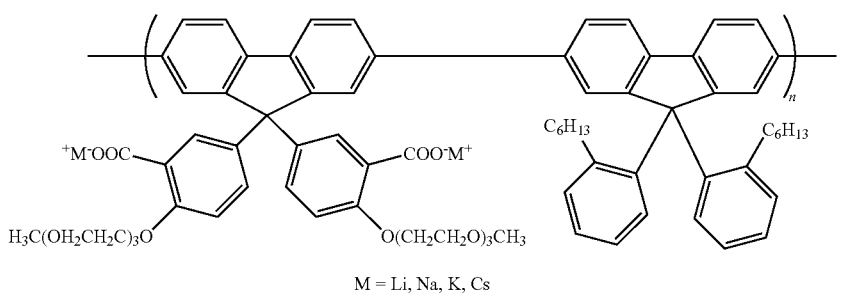
M = Li, Na, K, Cs
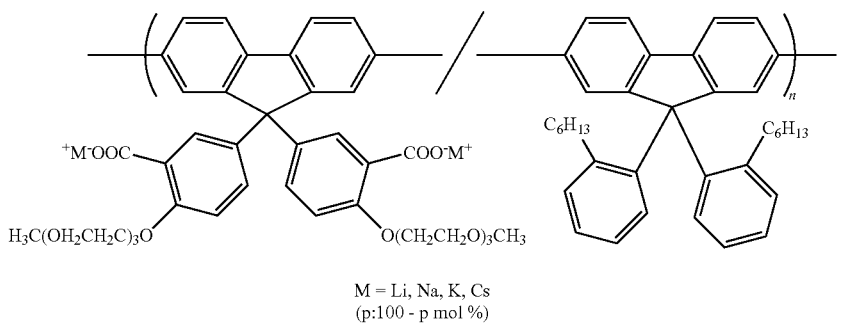
M = Li, Na, K, Cs
(p:100 - p mol %)

-continued
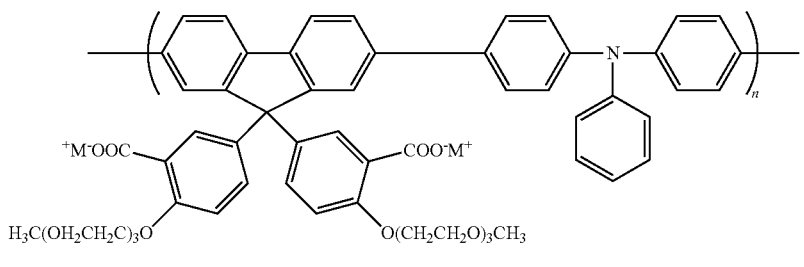
M = Li, Na, K, Cs
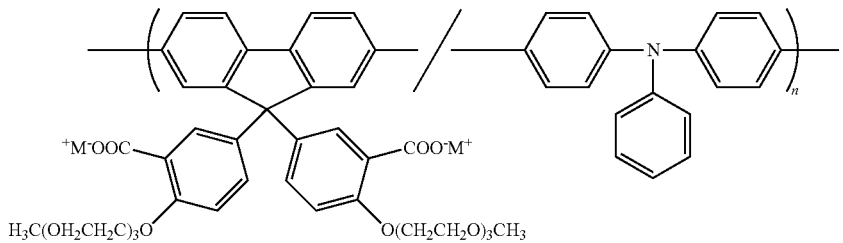
M = Li, Na, K, Cs
(p:100 - p mol %)
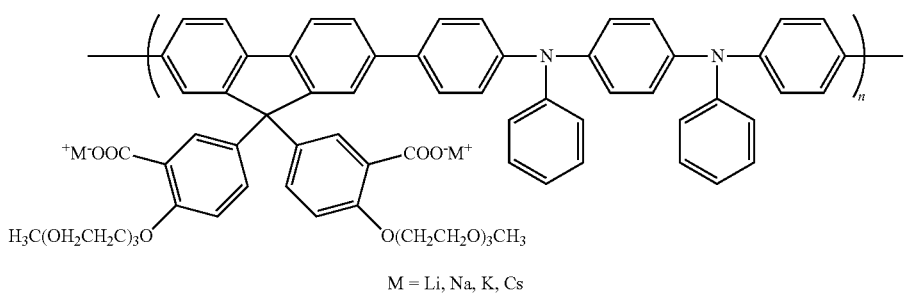
M = Li, Na, K, Cs
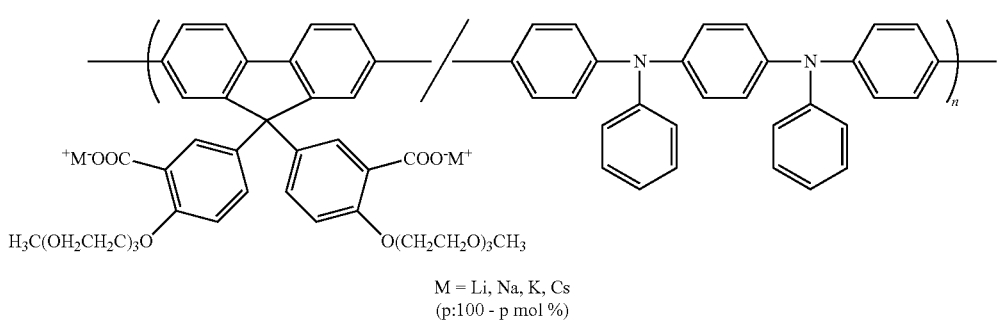
M = Li, Na, K, Cs
(p:100 - p mol %)
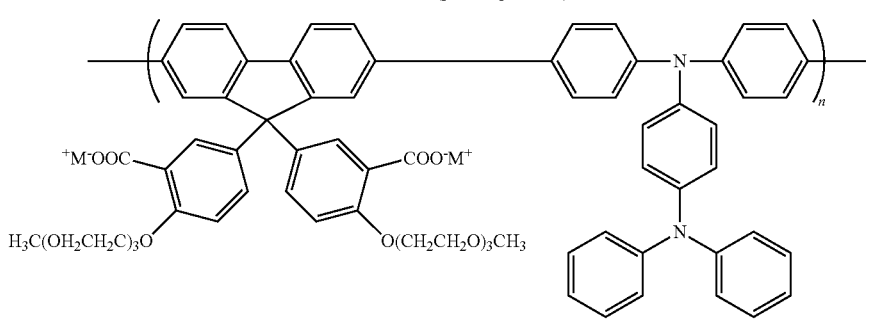
M = Li, Na, K, Cs -continued
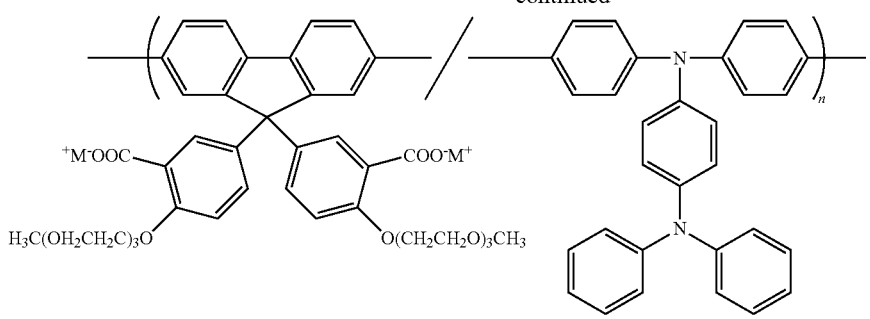
M = Li, Na, K, Cs
(p:100 - p mol %)
[Chem. 55]
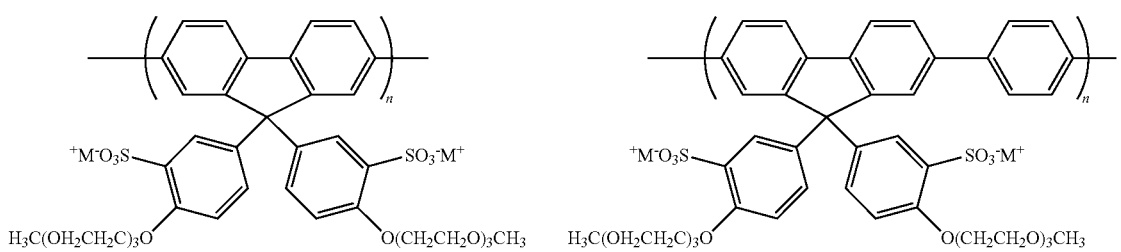
M = Li, Na, K, Cs          M = Li, Na, K, Cs
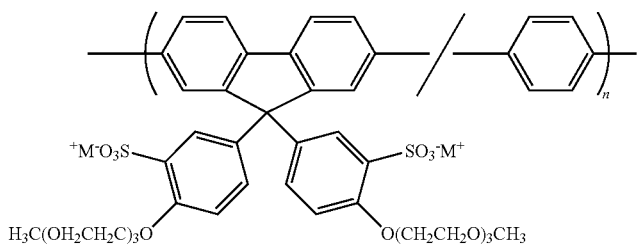
M = Li, Na, K, Cs
(p:100 - p mol %)
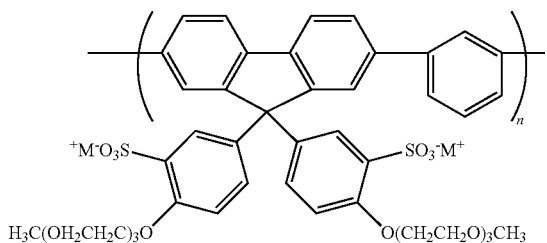
M = Li, Na, K, Cs
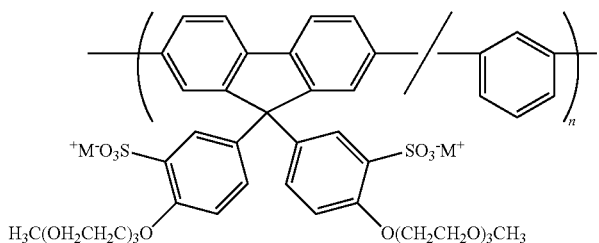
M = Li, Na, K, Cs
(p:100 - p mol %)

-continued
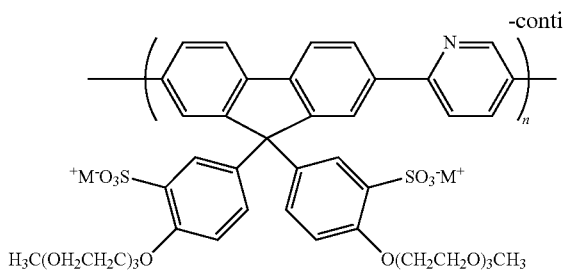
M = Li, Na, K, Cs
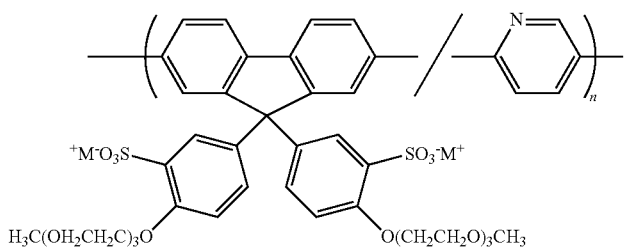
M = Li, Na, K, Cs
(p:100 - p mol %)
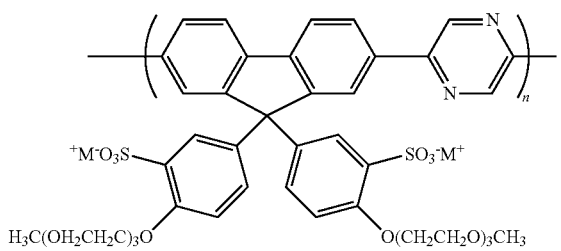
M = Li, Na, K, Cs
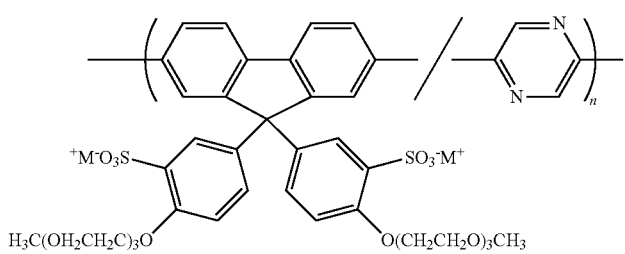
M = Li, Na, K, Cs
(p:100 - p mol %)
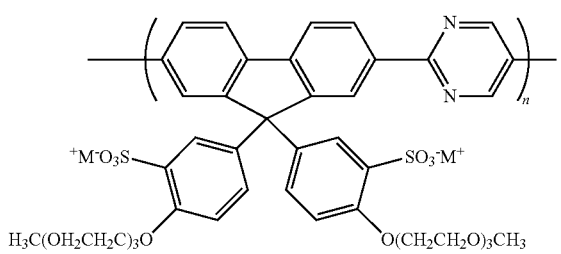
M = Li, Na, K, Cs

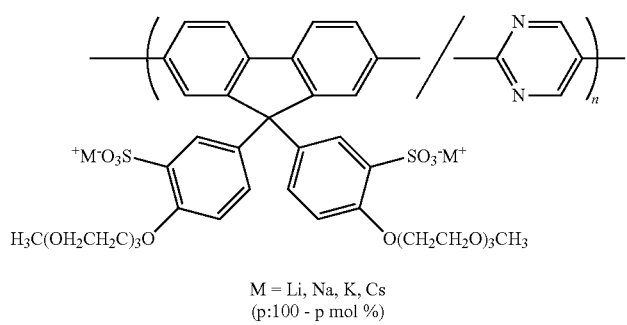
M = Li, Na, K, Cs
(p:100 - p mol %)
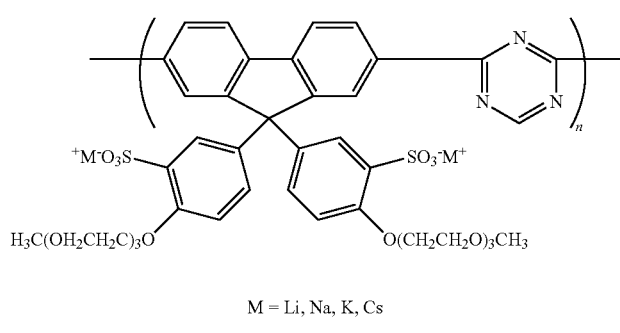
M = Li, Na, K, Cs
[Chem. 56]
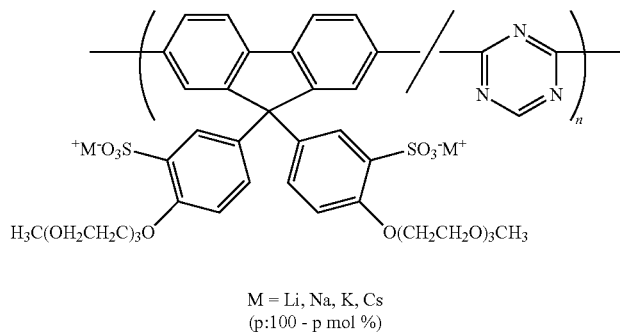
M = Li, Na, K, Cs
(p:100 - p mol %)
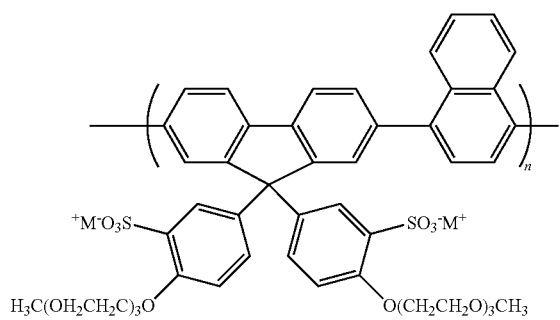
M = Li, Na, K, Cs -continued
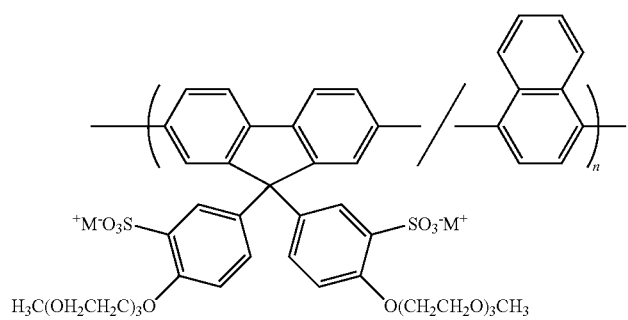
M = Li, Na, K, Cs
(p:100 - p mol %)
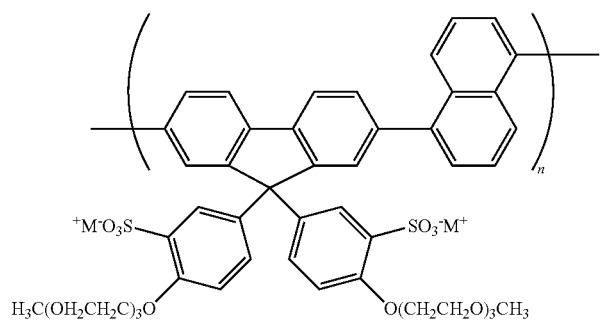
M = Li, Na, K, Cs
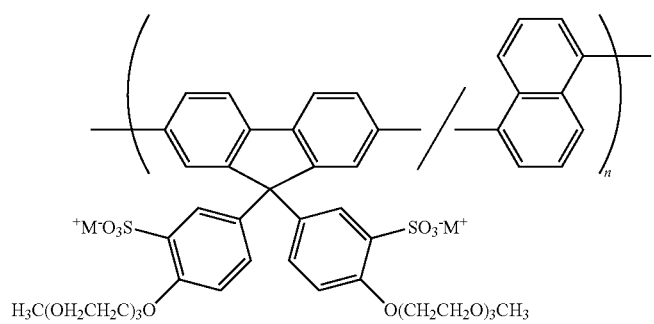
M = Li, Na, K, Cs
(p:100 - p mol %)
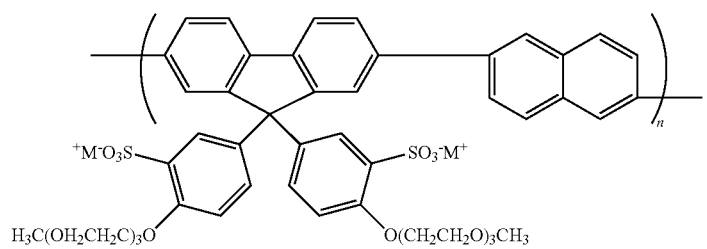
M = Li, Na, K, Cs -continued
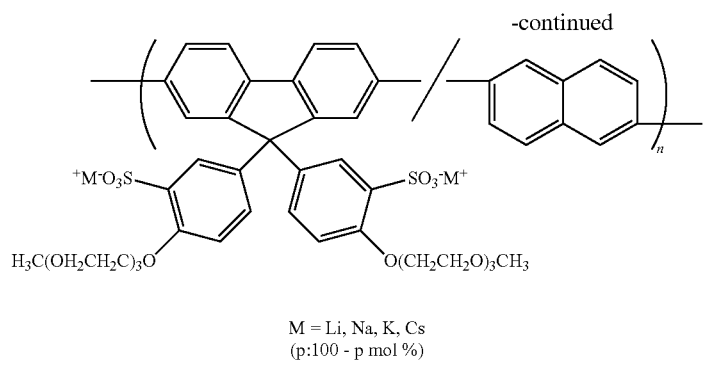
M = Li, Na, K, Cs
(p:100 - p mol %)
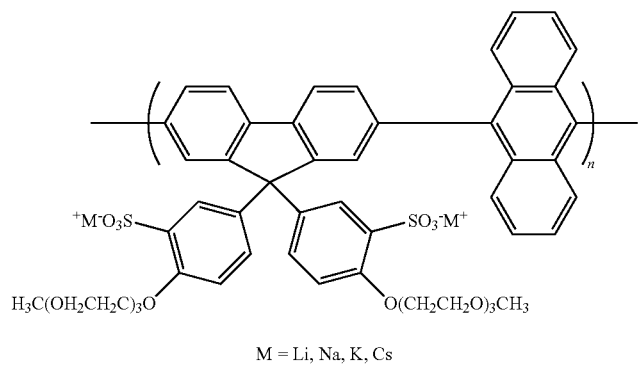
M = Li, Na, K, Cs
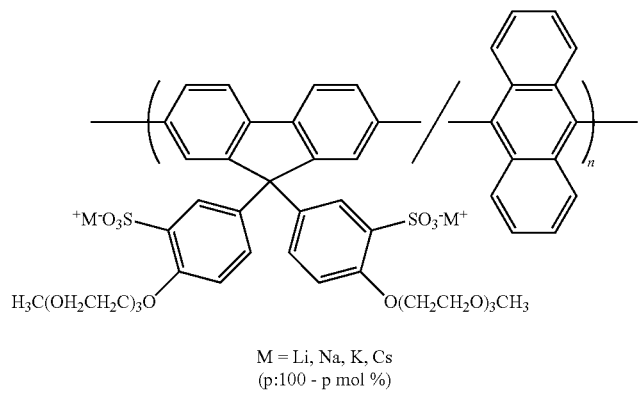
M = Li, Na, K, Cs
(p:100 - p mol %)
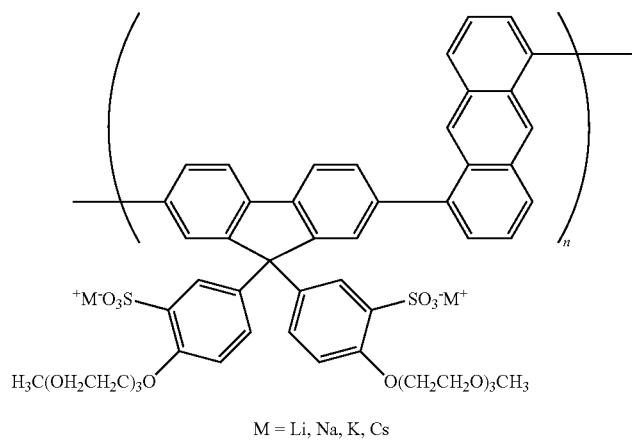
M = Li, Na, K, Cs -continued
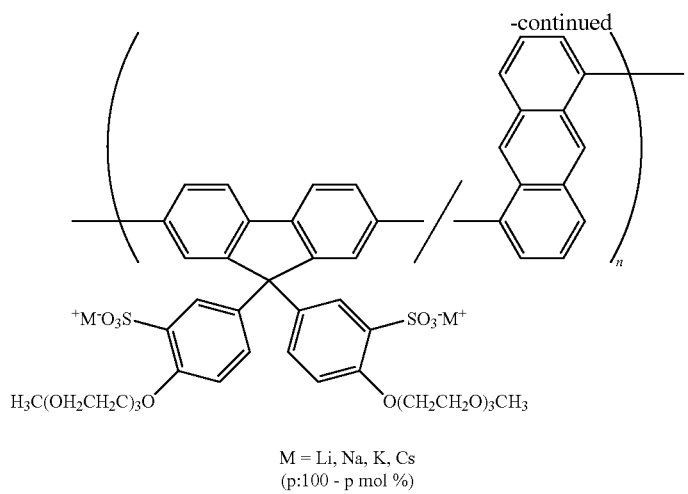
M = Li, Na, K, Cs
(p:100 - p mol %)
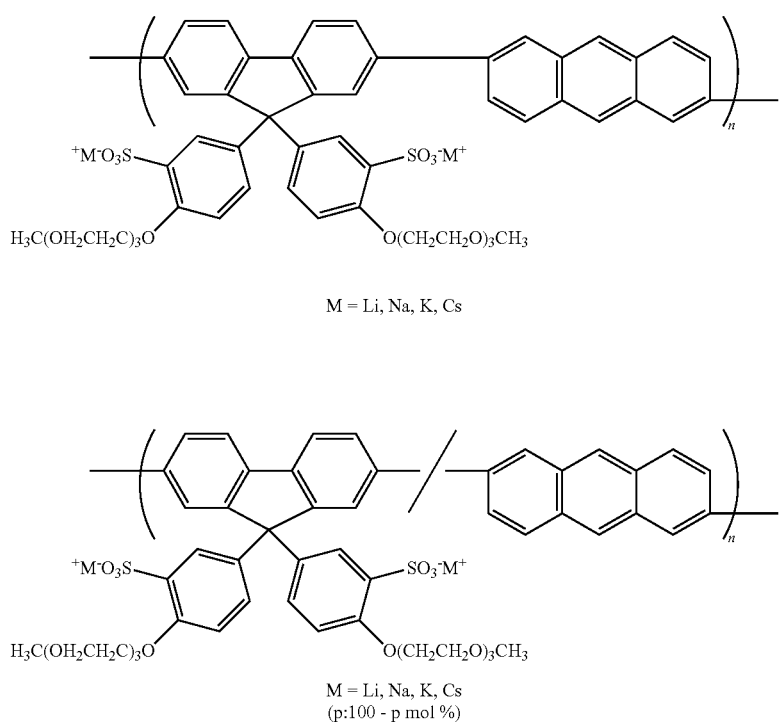
M = Li, Na, K, Cs
M = Li, Na, K, Cs
(p:100 - p mol %)
[Chem. 57]
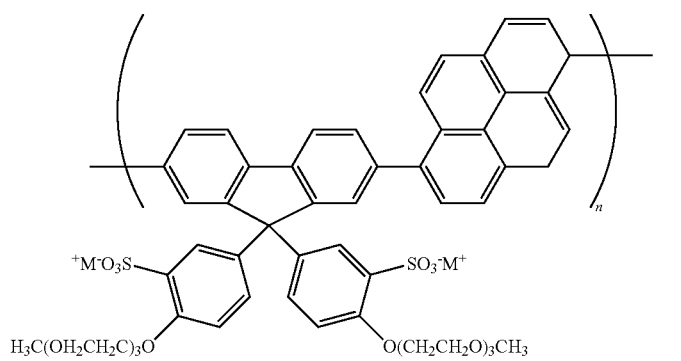
M = Li, Na, K, Cs -continued
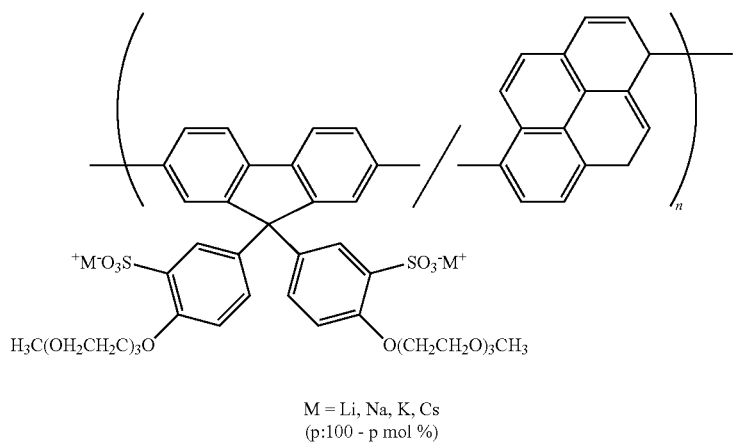
M = Li, Na, K, Cs
(p:100 - p mol %)
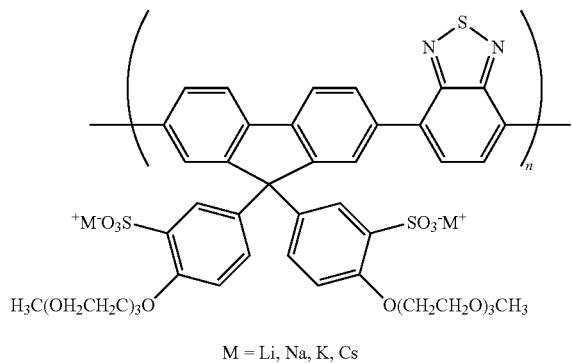
M = Li, Na, K, Cs
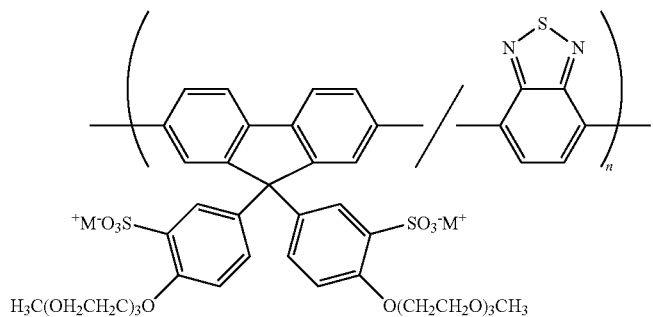
M = Li, Na, K, Cs
(p:100 - p mol %)
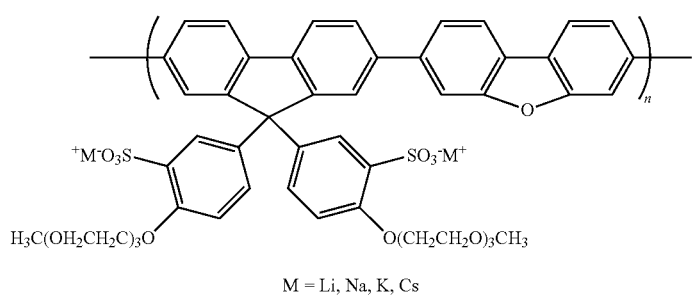
M = Li, Na, K, Cs -continued
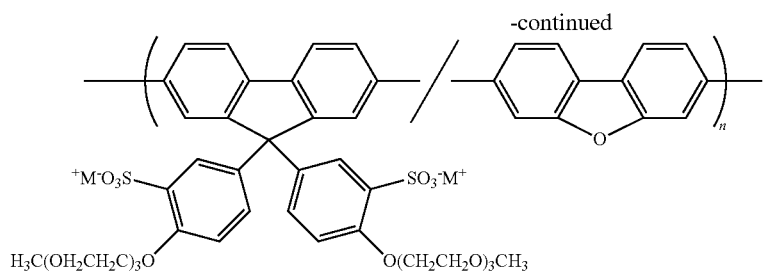
M = Li, Na, K, Cs
(p:100 - p mol %)
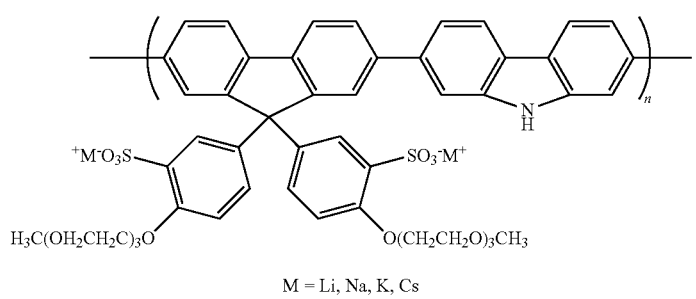
M = Li, Na, K, Cs
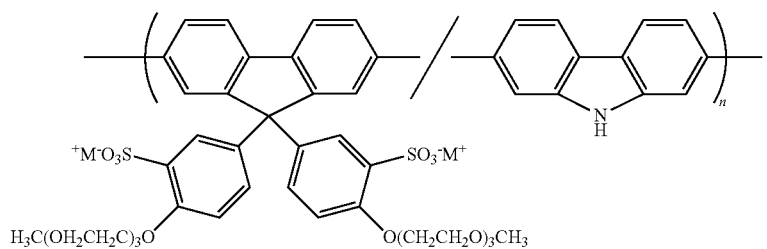
M = Li, Na, K, Cs
(p:100 - p mol %)
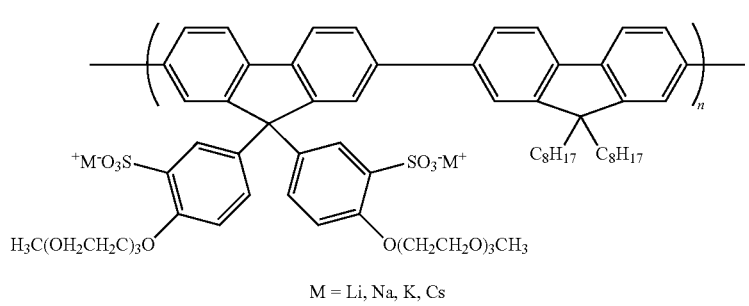
M = Li, Na, K, Cs
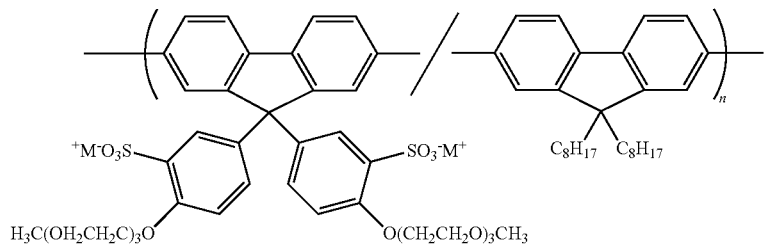
M = Li, Na, K, Cs
(p:100 - p mol %)

-continued
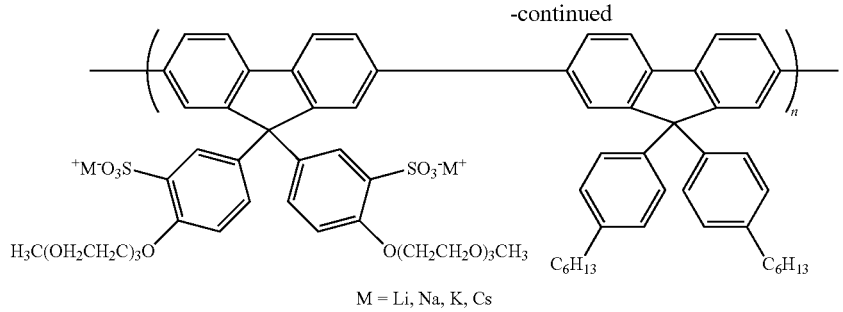
M = Li, Na, K, Cs
[Chem. 58]
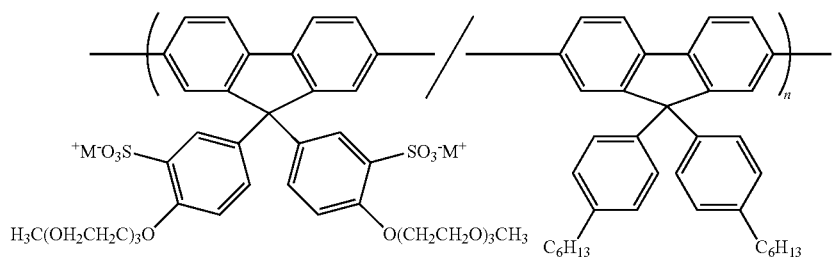
M = Li, Na, K, Cs
(p:100 - p mol %)
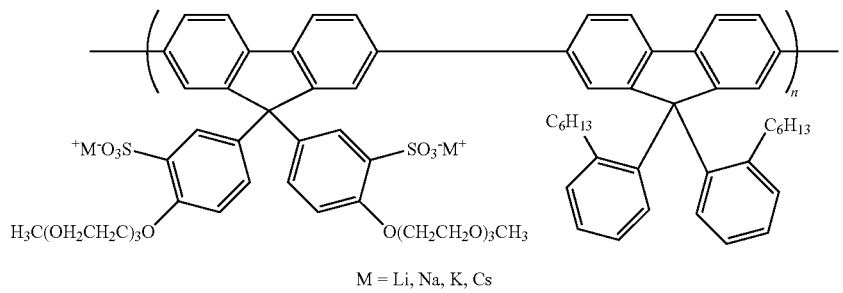
M = Li, Na, K, Cs
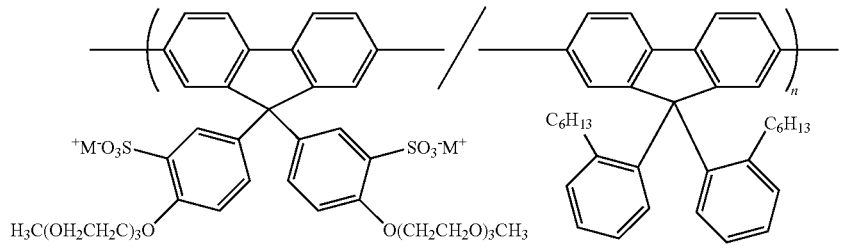
M = Li, Na, K, Cs
(p:100 - p mol %)
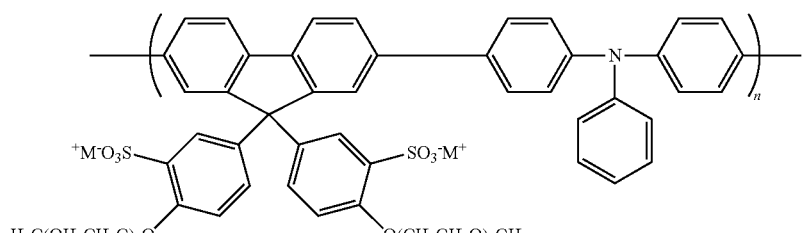
M = Li, Na, K, Cs -continued
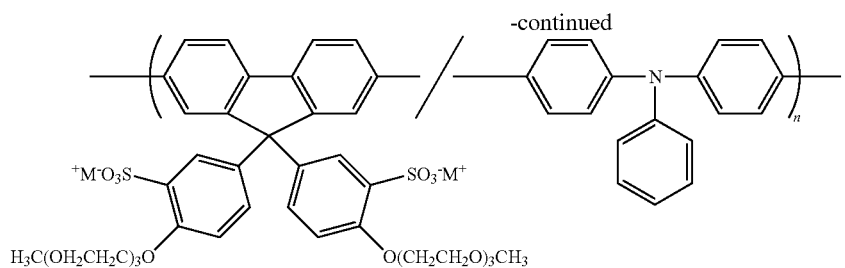
M = Li, Na, K, Cs
(p:100 - p mol %)
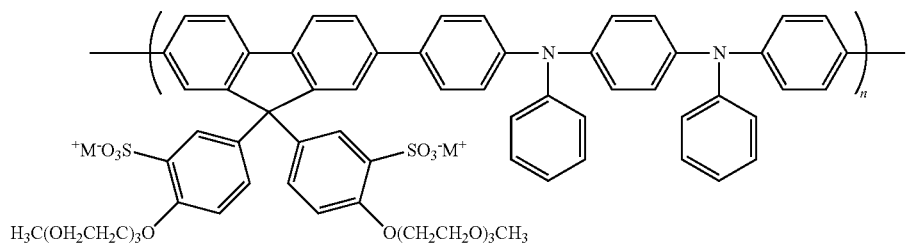
M = Li, Na, K, Cs
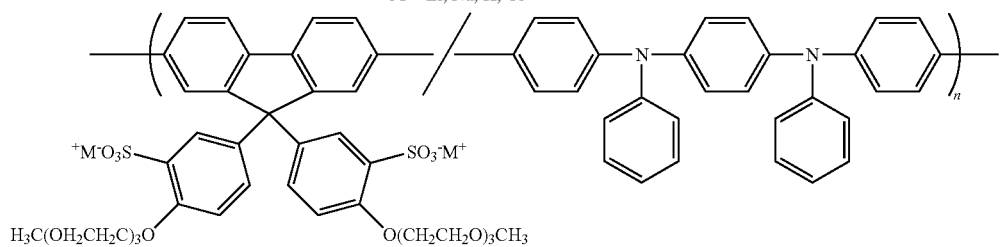
M = Li, Na, K, Cs
(p:100 - p mol %)
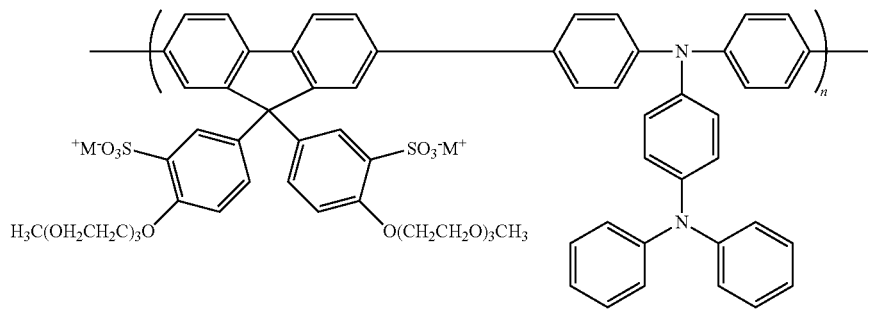
M = Li, Na, K, Cs
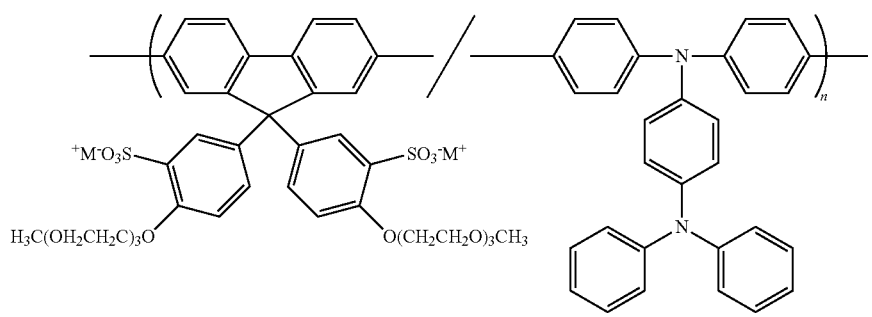
M = Li, Na, K, Cs
(p:100 - p mol %)

In the above formulae, p represents a number of 15 to 100.

Examples of the ionic polymer containing the group represented by Formula (2) and the group represented by Formula (3) may include: an ionic polymer consisting of a group represented by Formula (26); an ionic polymer consisting of the group represented by Formula (26) and one or more group(s) selected from the group consisting of a group remaining after removing two hydrogen atoms from a ring represented by a Formula from 45 to 50, 59, 60, 77, 80, 91, 92, 96, and 101 to 110; an ionic polymer consisting of a group represented by Formula (27); an ionic polymer consisting of the group represented by Formula (27) and one or more group(s) selected from the group consisting of a group remaining after removing two hydrogen atoms from a ring represented by a Formula from 45 to 50, 59, 60, 77, 80, 91, 92, 96, and 101 to 110; an ionic polymer consisting of a group represented by Formula (28); an ionic polymer consisting of the group represented by Formula (28) and one or more group(s) selected from the group consisting of a group remaining after removing two hydrogen atoms from a ring represented by a Formula from 45 to 50, 59, 60, 77, 80, 91, 92, 96, and 101 to 110; an ionic polymer consisting of a group represented by Formula (31); an ionic polymer consisting of the group represented by Formula (31) and one or more group(s) selected from the group consisting of a group remaining after removing two hydrogen atoms from a ring represented by a Formula from 45 to 50, 59, 60, 77, 80, 91, 92, 96, and 101 to 110; an ionic polymer consisting of a group represented by Formula (32); and an ionic polymer consisting of the group represented by Formula (32) and one or more group(s) selected from the group consisting of a group remaining after removing two hydrogen atoms from a ring represented by a Formula from 45 to 50, 59, 60, 77, 80, 91, 92, 96, and 101 to 110.

Examples of the ionic polymer containing the group represented by Formula (2) and the group represented by Formula (3) may include the macromolecular compounds below. Among these macromolecular compounds, in macromolecular compounds represented by a formula in which two types of structural unit are delimited by a slash "/," the ratio of the left structural unit is p % by mole and the ratio of the right structural unit is (100-p) % by mole, and these structural units are arranged at random. In the formulae below, n represents the degree of polymerization.

[Chem. 59]

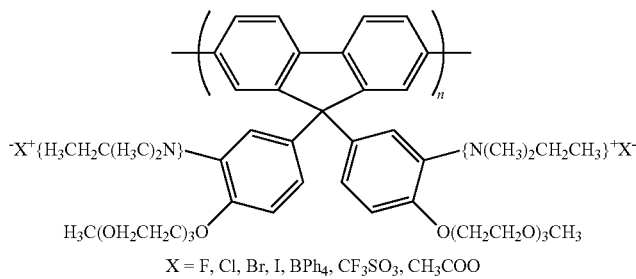

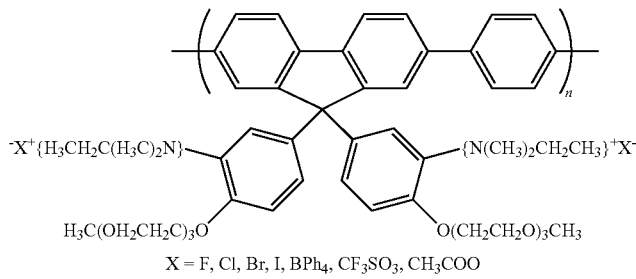

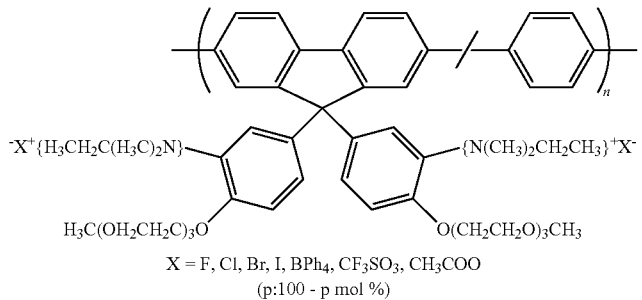

-continued
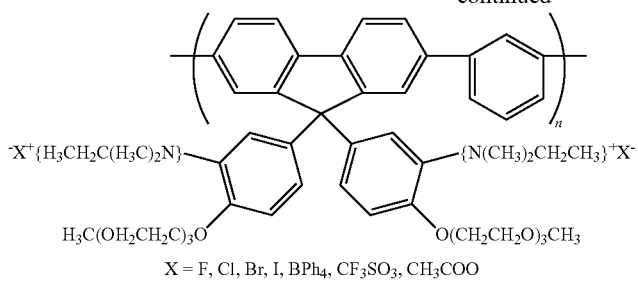
X = F, Cl, Br, I, BPh₄, CF₃SO₃, CH₃COO
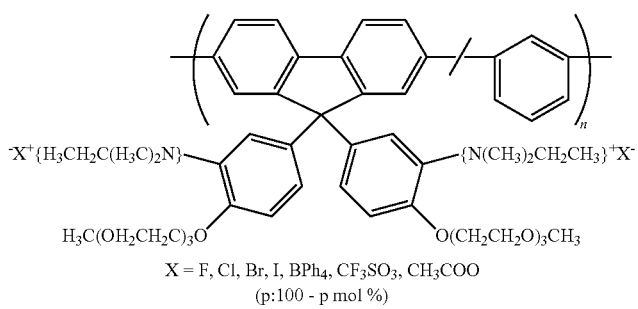
X = F, Cl, Br, I, BPh₄, CF₃SO₃, CH₃COO
(p:100 - p mol %)
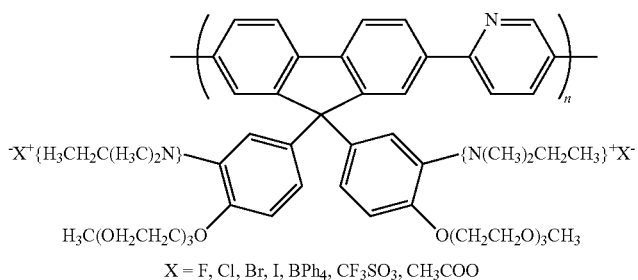
X = F, Cl, Br, I, BPh₄, CF₃SO₃, CH₃COO
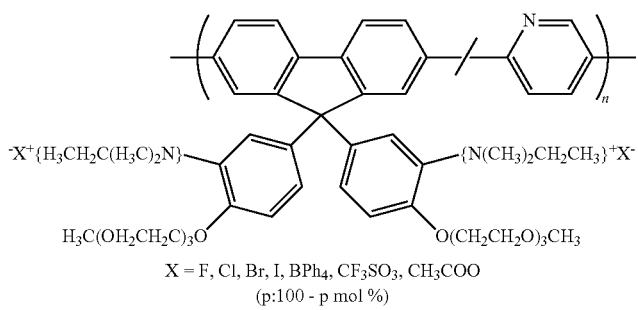
X = F, Cl, Br, I, BPh₄, CF₃SO₃, CH₃COO
(p:100 - p mol %)
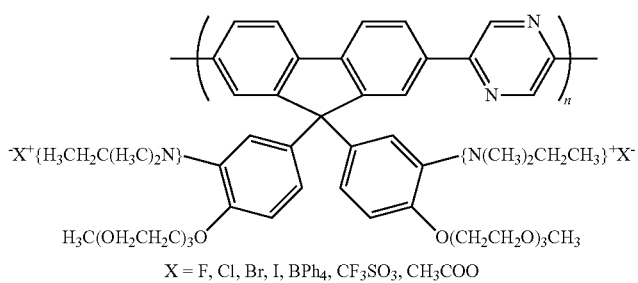
X = F, Cl, Br, I, BPh₄, CF₃SO₃, CH₃COO -continued
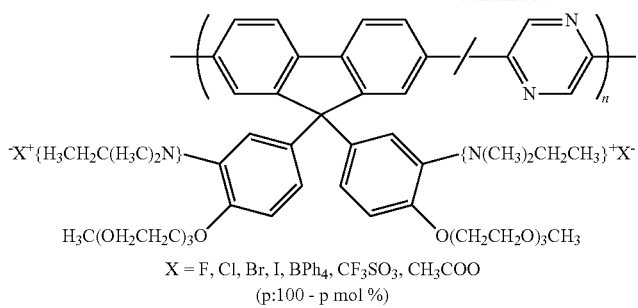
X = F, Cl, Br, I, BPh₄, CF₃SO₃, CH₃COO
(p:100 - p mol %)
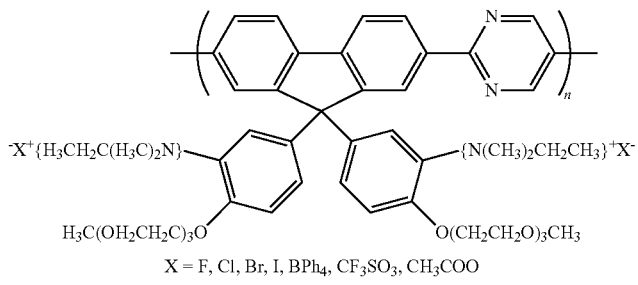
X = F, Cl, Br, I, BPh₄, CF₃SO₃, CH₃COO
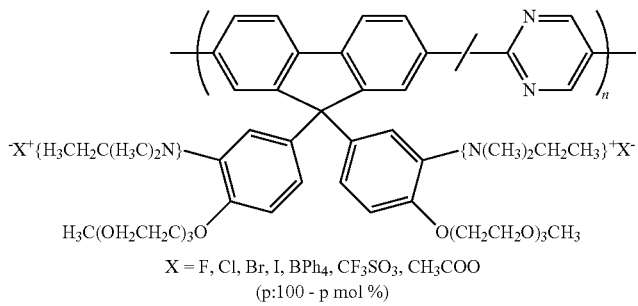
X = F, Cl, Br, I, BPh₄, CF₃SO₃, CH₃COO
(p:100 - p mol %)
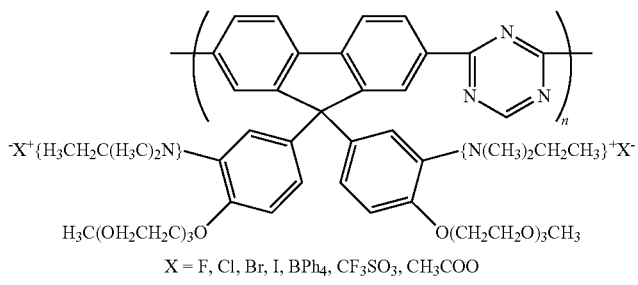
X = F, Cl, Br, I, BPh₄, CF₃SO₃, CH₃COO
[Chem. 60]
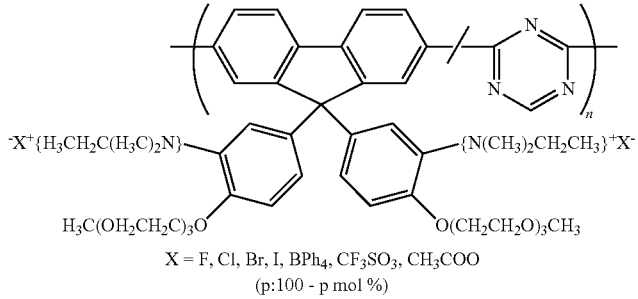
X = F, Cl, Br, I, BPh₄, CF₃SO₃, CH₃COO
(p:100 - p mol %)

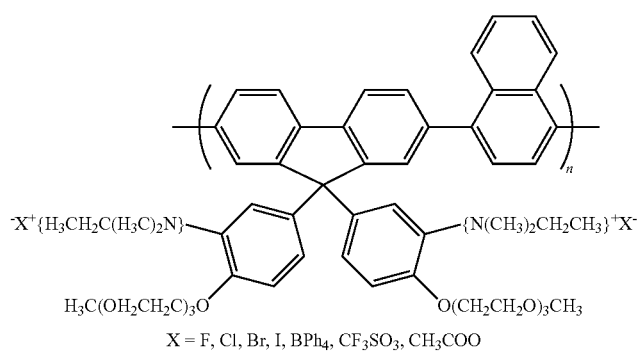
X = F, Cl, Br, I, BPh4, CF3SO3, CH3COO
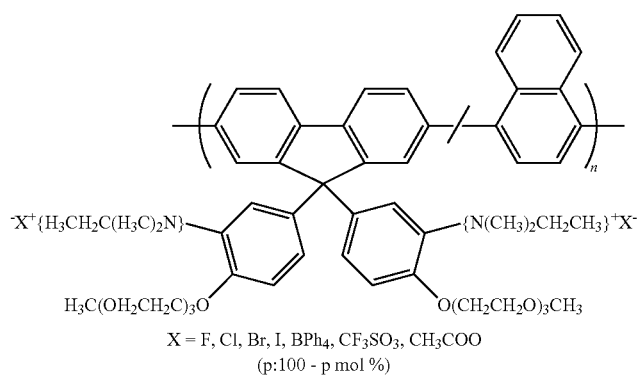
X = F, Cl, Br, I, BPh4, CF3SO3, CH3COO
(p:100 - p mol %)
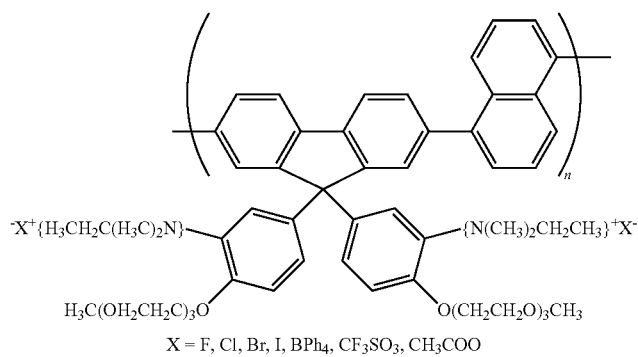
X = F, Cl, Br, I, BPh4, CF3SO3, CH3COO
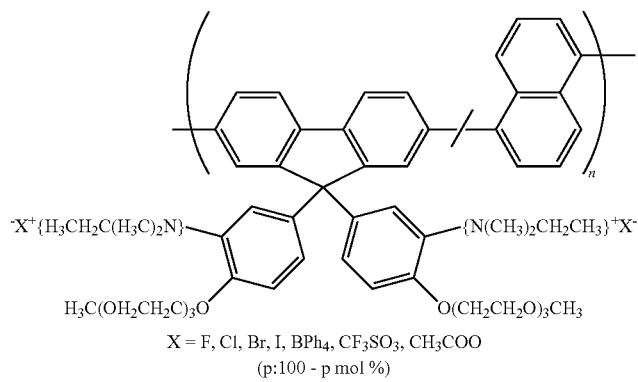
X = F, Cl, Br, I, BPh4, CF3SO3, CH3COO
(p:100 - p mol %)

-continued
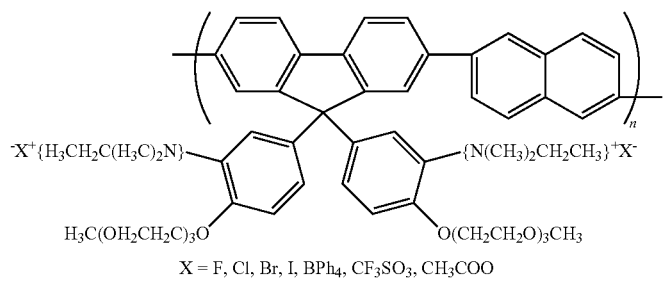
X = F, Cl, Br, I, BPh₄, CF₃SO₃, CH₃COO
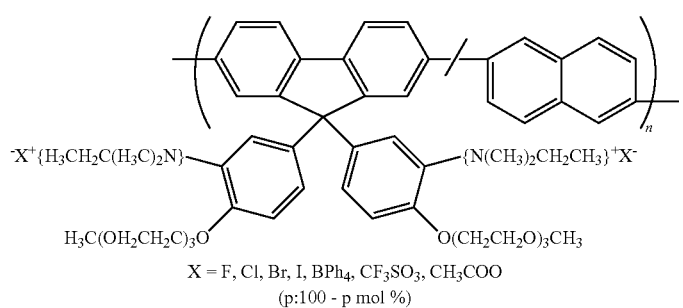
X = F, Cl, Br, I, BPh₄, CF₃SO₃, CH₃COO
(p:100 - p mol %)
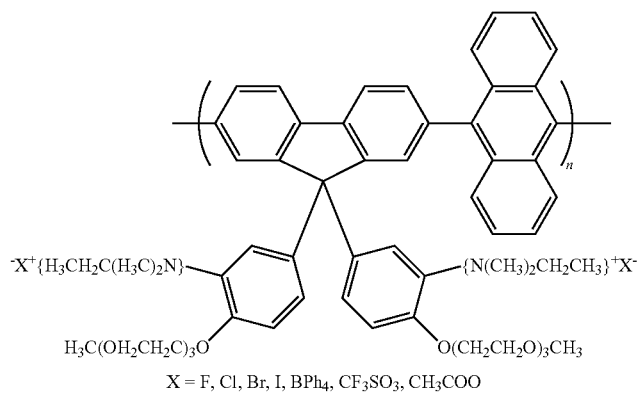
X = F, Cl, Br, I, BPh₄, CF₃SO₃, CH₃COO
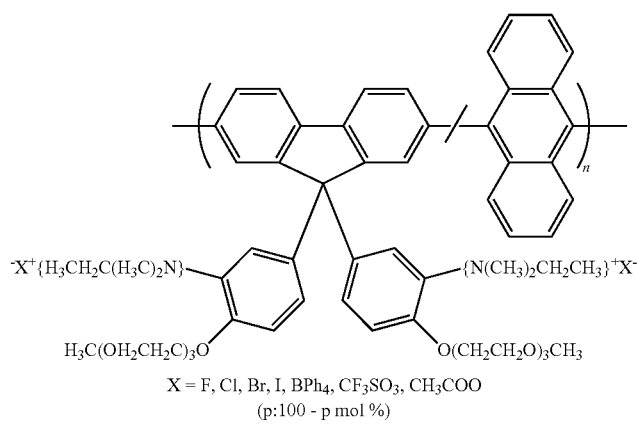
X = F, Cl, Br, I, BPh₄, CF₃SO₃, CH₃COO
(p:100 - p mol %)

-continued
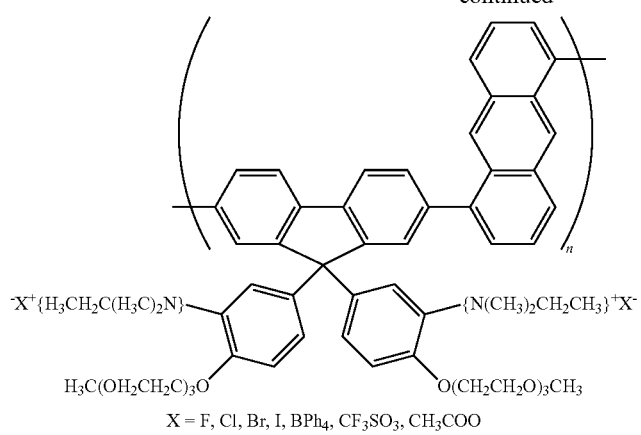
X = F, Cl, Br, I, BPh4, CF3SO3, CH3COO
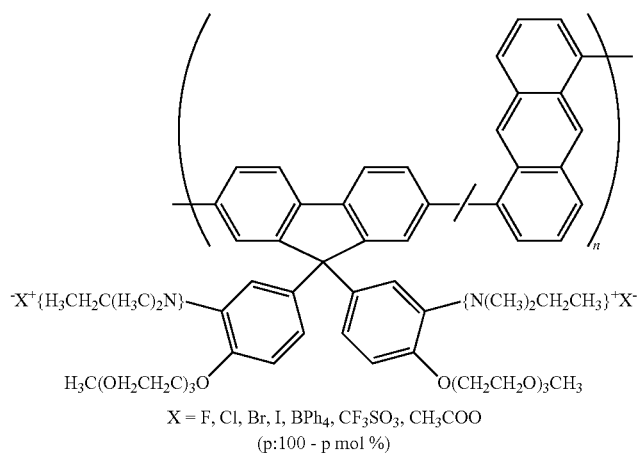
X = F, Cl, Br, I, BPh4, CF3SO3, CH3COO
(p:100 - p mol %)
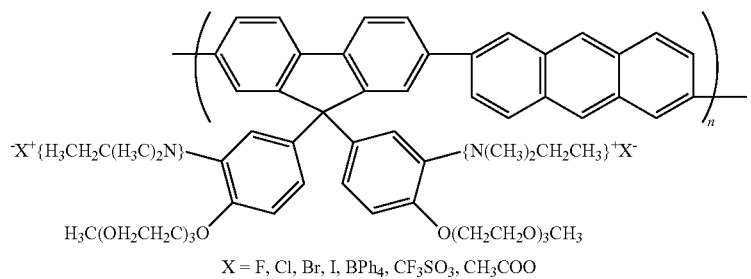
X = F, Cl, Br, I, BPh4, CF3SO3, CH3COO
[Chem. 61]
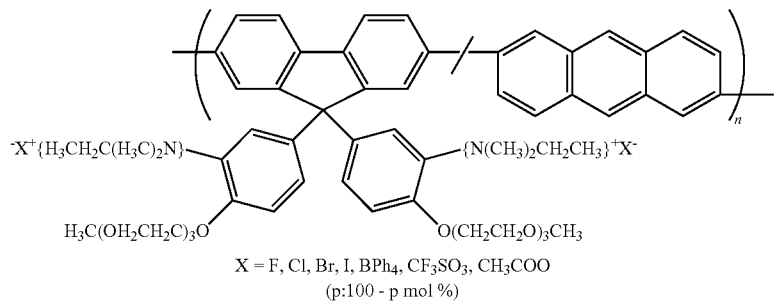
X = F, Cl, Br, I, BPh4, CF3SO3, CH3COO
(p:100 - p mol %)

-continued
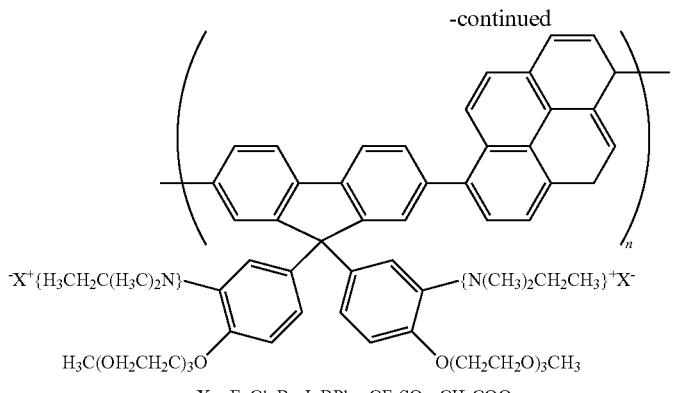
X = F, Cl, Br, I, BPh₄, CF₃SO₃, CH₃COO
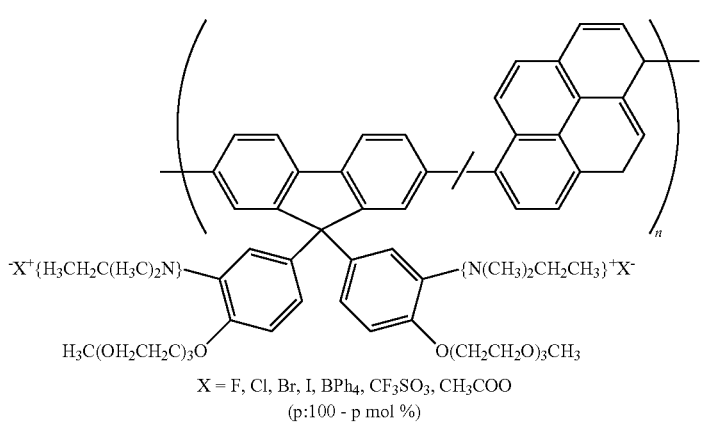
X = F, Cl, Br, I, BPh₄, CF₃SO₃, CH₃COO
(p:100 − p mol %)
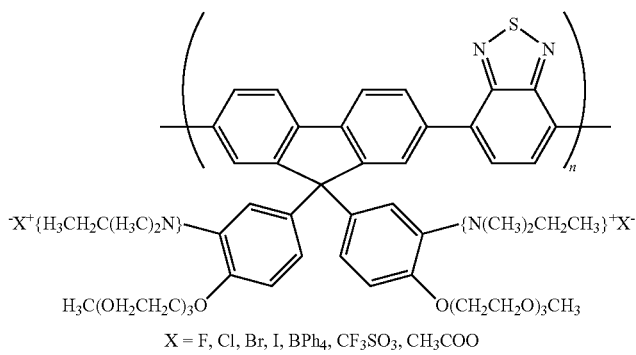
X = F, Cl, Br, I, BPh₄, CF₃SO₃, CH₃COO
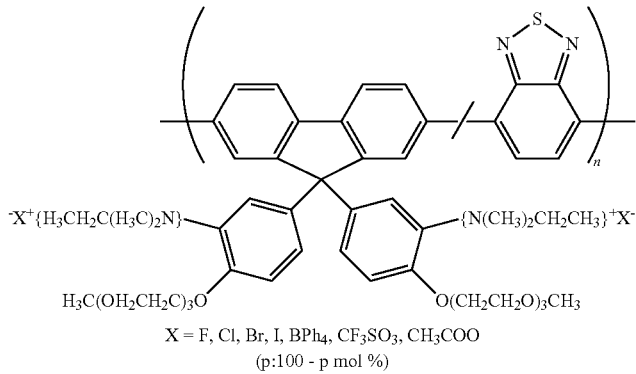
X = F, Cl, Br, I, BPh₄, CF₃SO₃, CH₃COO
(p:100 − p mol %)

-continued
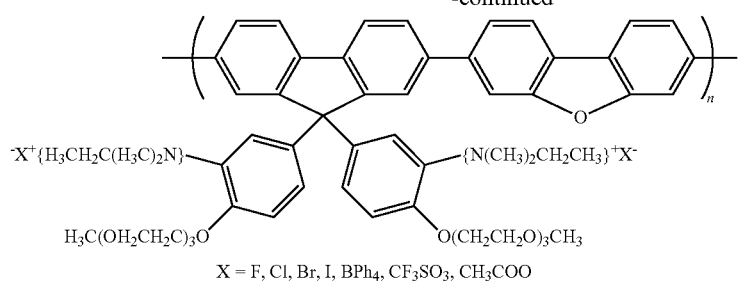
X = F, Cl, Br, I, BPh$_4$, CF$_3$SO$_3$, CH$_3$COO
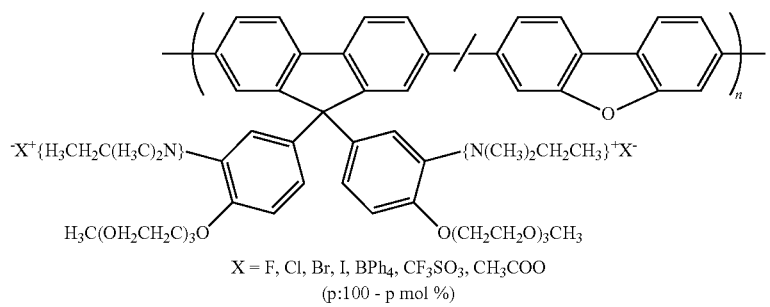
X = F, Cl, Br, I, BPh$_4$, CF$_3$SO$_3$, CH$_3$COO
(p:100 - p mol %)
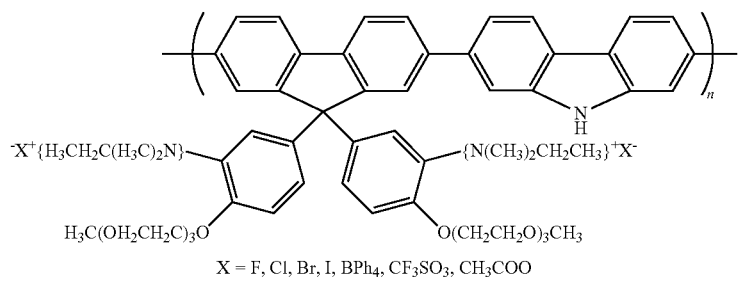
X = F, Cl, Br, I, BPh$_4$, CF$_3$SO$_3$, CH$_3$COO
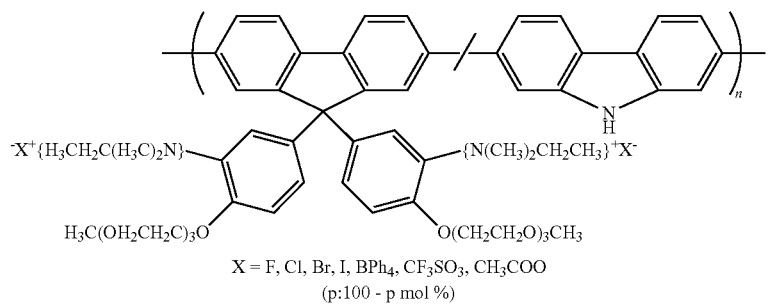
X = F, Cl, Br, I, BPh$_4$, CF$_3$SO$_3$, CH$_3$COO
(p:100 - p mol %)
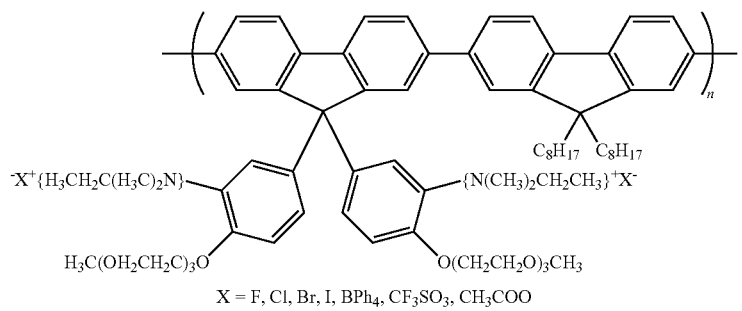
X = F, Cl, Br, I, BPh$_4$, CF$_3$SO$_3$, CH$_3$COO

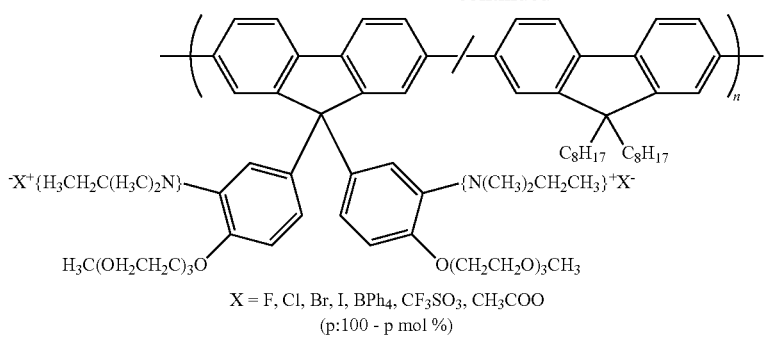
X = F, Cl, Br, I, BPh$_4$, CF$_3$SO$_3$, CH$_3$COO
(p:100 - p mol %)
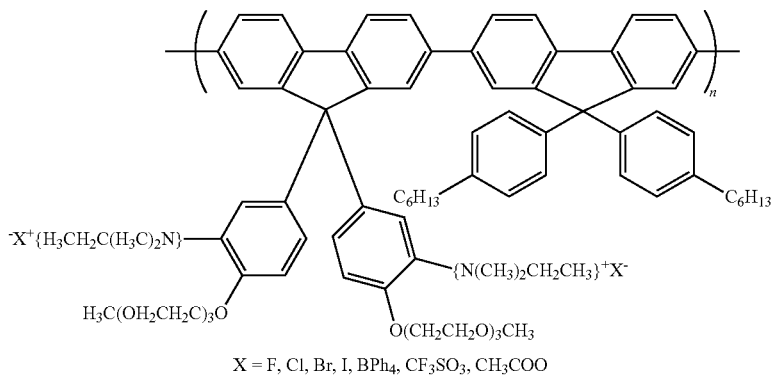
X = F, Cl, Br, I, BPh$_4$, CF$_3$SO$_3$, CH$_3$COO
[Chem. 62]
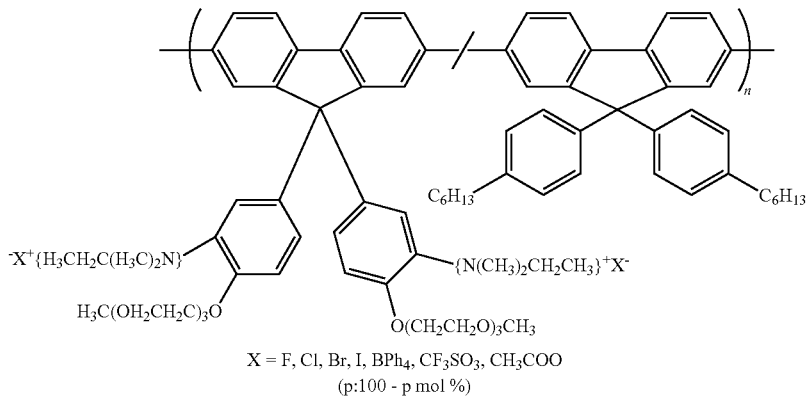
X = F, Cl, Br, I, BPh$_4$, CF$_3$SO$_3$, CH$_3$COO
(p:100 - p mol %)
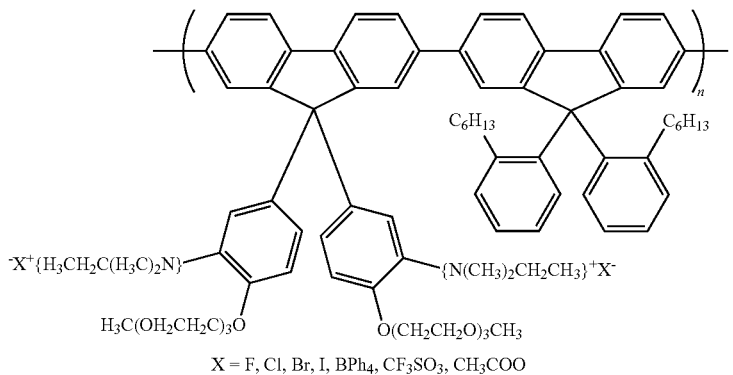
X = F, Cl, Br, I, BPh$_4$, CF$_3$SO$_3$, CH$_3$COO

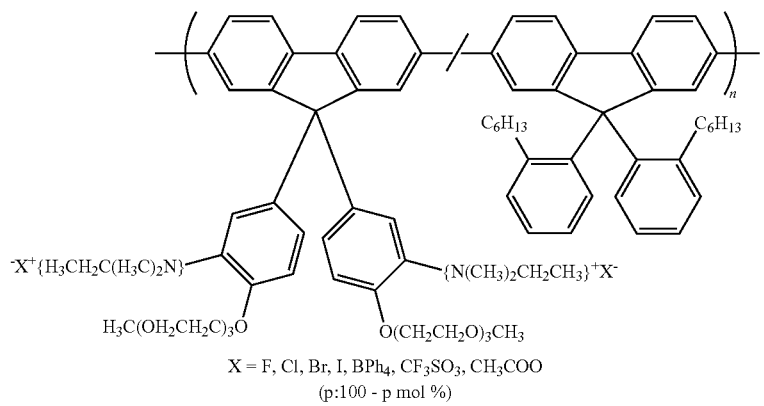
X = F, Cl, Br, I, BPh4, CF3SO3, CH3COO
(p:100 - p mol %)
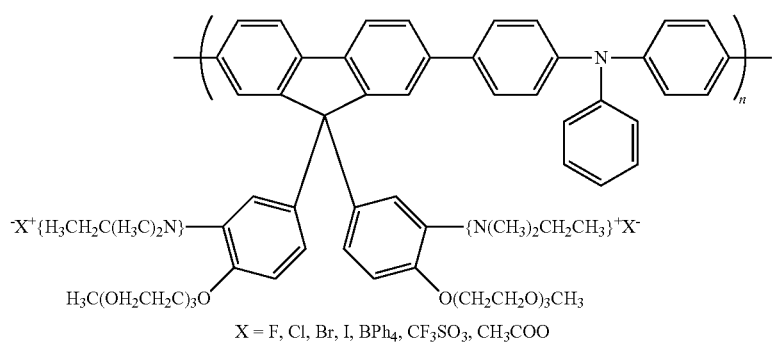
X = F, Cl, Br, I, BPh4, CF3SO3, CH3COO
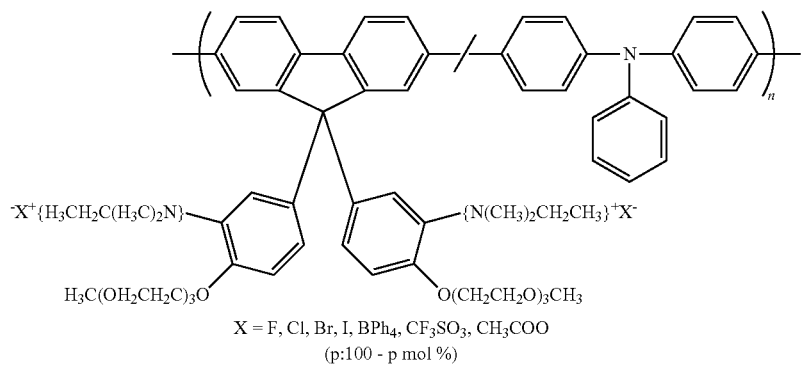
X = F, Cl, Br, I, BPh4, CF3SO3, CH3COO
(p:100 - p mol %)
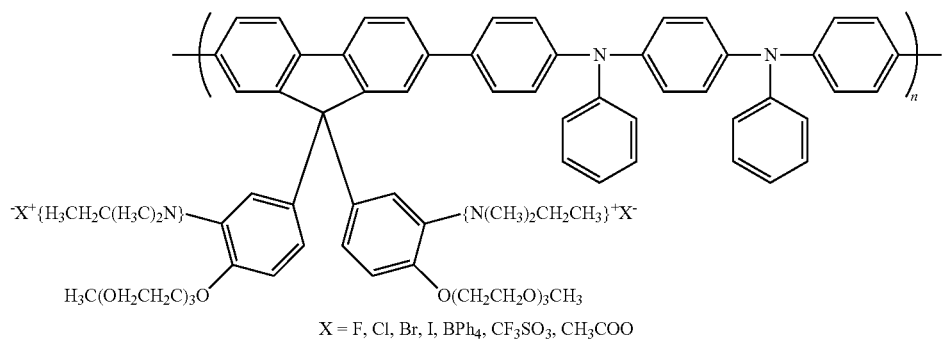
X = F, Cl, Br, I, BPh4, CF3SO3, CH3COO

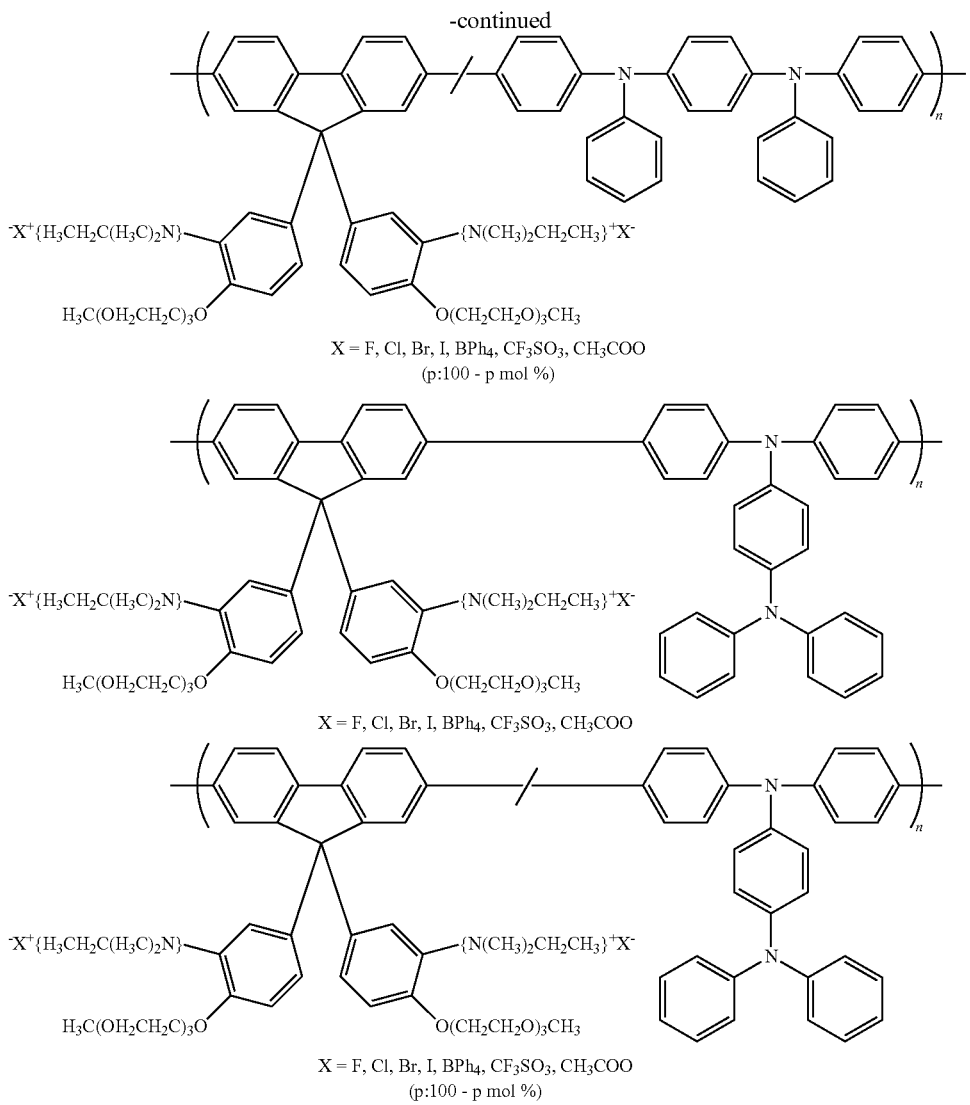

In the above formulae, p represents a number of 15 to 100.

Method for Manufacturing Ionic Polymer

Next, a method for manufacturing the ionic polymer used in the present invention will be described. Examples of a preferred method for manufacturing the ionic polymer used in the present invention may include a method in which a compound represented by General Formula (36) below is employed as one of the raw materials and it is condensation polymerized. Among them, preferred is a method in which at least one type of a compound in which -$A_a$- in General Formula (36) is the structural unit represented by Formula (13), a compound in which -$A_a$- is the structural unit represented by Formula (15), a compound in which -$A_a$- is the structural unit represented by Formula (17), and a compound in which -$A_a$- is the structural unit represented by Formula (20) is employed as an essential raw material and is condensation polymerized.

$$Y^4\text{-}A_a\text{-}Y^5 \qquad (36)$$

(In Formula (36), $A_a$ represents a repeating unit containing one or more type(s) of group selected from the group consisting of the group represented by Formula (1) and the group represented by Formula (2) and one or more type(s) of group represented by Formula (3); and $Y^4$ and $Y^5$ each independently represent a group involved in condensation-polymerization.)

In the ionic polymer used in the present invention, together with the structural unit represented by -$A_a$- in Formula (36), other structural units other than -$A_a$- may be contained. In this case, a compound having two substituents to be involved in condensation-polymerization that becomes the other structural units other than -$A_a$- is used and may be allowed to coexist with the compound represented by Formula (36) to be subjected to condensation-polymerization.

Examples of the compound having two condensation-polymerizable substituents used for introducing the other structural units may include a compound represented by Formula (37). Thus, by condensation-polymerizing the compound represented by Formula (37) in addition to the compound represented by $Y^4$-$A_a$-$Y^5$, an ionic polymer further including a structural unit represented by -$A_b$- used in the present invention can be manufactured.

$$Y^6\text{-}A_b\text{-}Y^7 \qquad (37)$$

(In Formula (37), $A_b$ is the structural unit represented by General Formula (33) or the structural unit represented by General Formula (35); and $Y^6$ and $Y^7$ each independently represent a group involved in condensation-polymerization.)

Examples of such a group involved in condensation-polymerization ($Y^4, Y^5, Y^6$, and $Y^7$) may include a hydrogen atom, a halogen atom, an alkyl sulfonate group, an aryl sulfonate group, an arylalkyl sulfonate group, a boric acid ester residue, a sulfonium methyl group, a phosphonium methyl group, a phosphonate methyl group, a monohalogenated methyl group, —$B(OH)_2$, a formyl group, a cyano group, and a vinyl group.

Examples of the halogen atom capable of being selected as such a group involved in condensation-polymerization may include a fluorine atom, a chlorine atom, a bromine atom, and an iodine atom.

Examples of the alkyl sulfonate group capable of being selected as the group involved in condensation-polymerization may include a methane sulfonate group, an ethane sulfonate group, and a trifluoromethane sulfonate group. Examples of the aryl sulfonate group capable of being selected as the group involved in condensation-polymerization may include a benzene sulfonate group and a p-toluene sulfonate group.

Examples of the arylalkyl sulfonate group capable of being selected as the group involved in condensation-polymerization may include a benzyl sulfonate group.

Examples of the boric acid ester residue capable of being selected as the group involved in condensation-polymerization may include the groups represented by the following formulae.

[Chem. 63]

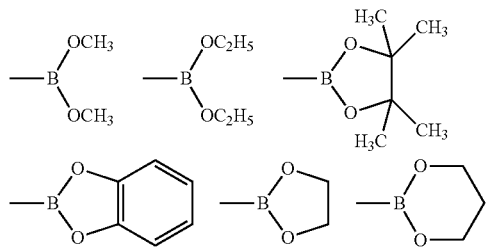

Furthermore, examples of the sulfonium methyl group capable of being selected as the group involved in condensation-polymerization may include a group represented by a formula:

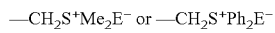

wherein E represents a halogen atom and Ph represents a phenyl group, the same shall apply hereinafter.

Examples of the phosphonium methyl group capable of being selected as the group involved in condensation-polymerization may include a group represented by a formula:

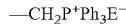

wherein E represents a halogen atom.

Examples of the phosphonate methyl group capable of being selected as the group involved in condensation-polymerization may include a group represented by a formula:

wherein $R^d$ represents an alkyl group, an aryl group, or an arylalkyl group.

Examples of the monohalogenated methyl group capable of being selected as the group involved in condensation-polymerization may include a fluorinated methyl group, a chlorinated methyl group, a brominated methyl group, and an iodinated methyl group.

The group preferred as the group involved in condensation-polymerization varies depending on the type of polymerization reaction. For example, when a zero-valent nickel complex for the Yamamoto coupling reaction or the like is used, examples of the group preferred may include a halogen atom, an alkyl sulfonate group, an aryl sulfonate group, and an arylalkyl sulfonate group. When a nickel catalyst or a palladium catalyst for the Suzuki coupling reaction or the like is used, examples of the group preferred may include an alkyl sulfonate group, a halogen atom, a boric acid ester residue, and —$B(OH)_2$. When an oxidation polymerization is conducted using an oxidant or conducted electrochemically, examples of the group preferred may include a hydrogen atom.

For example, a polymerization method may be employed for manufacturing the ionic polymer used in the present invention including: dissolving a compound (monomer) represented by General Formula (36) or (37) having a plurality of groups involved in condensation-polymerization into an organic solvent, if necessary; and causing the resultant solution to react using an alkali or an appropriate catalyst at a temperature that is a melting point of the organic solvent or higher and a boiling point of the organic solvent or lower. Examples of such a polymerization method may include publicly known methods described in "Organic Reactions, vol. 14, pp. 270-490 (1965), published by John Wiley & Sons, Inc.," "Organic Syntheses, Collective Volume VI, pp. 407-411 (1988), published by John Wiley & Sons, Inc.," "Chemical Review (Chem. Rev.), vol. 95, p. 2457 (1995)," "Journal of Organometallic Chemistry (J. Organomet. Chem.), vol. 576, p. 147 (1999)," and "Macromolecular Chemistry, Macromolecular Symposium (Macromol. Chem., Macromol. Symp.), vol. 12, p. 229 (1987)."

When the ionic polymer used in the present invention is manufactured, a known condensation-polymerization reaction may be employed according to the group involved in condensation-polymerization. Examples of such a polymerization method may include: a method of polymerizing the relevant monomer by the Suzuki coupling reaction; a method of polymerizing the relevant monomer by the Grignard reaction; a method of polymerizing the relevant monomer with a Ni(0) complex; a method of polymerizing the relevant monomer with an oxidant such as $FeCl_3$; a method of polymerizing the relevant monomer by an electrochemical oxidation polymerization; and a method by decomposition of an intermediate polymer having an appropriate leaving group. Among such polymerization reactions, the method of polymerizing by the Suzuki coupling reaction, the method of polymerizing by the Grignard reaction, and the method of polymerizing with a zero-valent nickel complex are preferred because the structure of the obtained ionic polymer is easily controlled.

A preferred embodiment of the method for manufacturing the ionic polymer used in the present invention is a method for manufacturing the ionic polymer including: using a raw material monomer having a group selected from the group consisting of a halogen atom, an alkyl sulfonate group, an aryl sulfonate group, and an arylalkyl sulfonate group as the group involved in condensation-polymerization; and condensation polymerizing the raw material monomer in the presence of a zero-valent nickel complex. Examples of the raw material monomer used for such a method may include a dihalogenated compound, a bis(alkyl sulfonate) compound, a bis(aryl sulfonate) compound, a bis(arylalkyl sulfonate) compound, a halogen-alkyl sulfonate compound, a halogen-aryl sulfonate compound, a halogen-arylalkyl sulfonate compound, an alkyl sulfonate-aryl sulfonate compound, an alkyl sulfonate-arylalkyl sulfonate compound, and an aryl sulfonate-arylalkyl sulfonate compound.

Another preferred embodiment of the method for manufacturing the ionic polymer is a method for manufacturing the ionic polymer including: using a raw material monomer having a group selected from the group consisting of a halogen atom, an alkyl sulfonate group, an aryl sulfonate group, an arylalkyl sulfonate group, $-B(OH)_2$, and a boric acid ester residue as the group involved in condensation-polymerization, in which the ratio between the sum (J) of the number of moles of a halogen atom, an alkyl sulfonate group, an aryl sulfonate group, and an arylalkyl sulfonate group that the whole raw material monomer has and the sum (K) of the number of moles of $-B(OH)_2$ and a boric acid ester residue that the whole raw material monomer has is substantially 1 (usually, K/J is in a range of 0.7 to 1.2); and condensation polymerizing the raw material monomer in the presence of a nickel catalyst or a palladium catalyst.

The organic solvent varies depending on the compounds to be used and the reaction. In order to suppress a side reaction, an organic solvent subjected thoroughly to deoxygenation treatment is generally preferred to be used. When the ionic polymer is manufactured, it is preferable that the reaction is progressed using such an organic solvent in an inert atmosphere. The organic solvent is preferably subjected to a dehydration treatment as well as the deoxygenation treatment, with the proviso that this may not be the case for the reaction in a two-phase system with water such as the Suzuki coupling reaction.

Examples of such an organic solvent may include: a saturated hydrocarbon such as pentane, hexane, heptane, octane, and cyclohexane; an unsaturated hydrocarbon such as benzene, toluene, ethylbenzene, and xylene; a halogenated saturated hydrocarbon such as carbon tetrachloride, chloroform, dichloromethane, chlorobutane, bromobutane, chloropentane, bromopentane, chlorohexane, bromohexane, chlorocyclohexane, and bromocyclohexane; a halogenated unsaturated hydrocarbon such as chlorobenzene, dichlorobenzene, and trichlorobenzene; alcohols such as methanol, ethanol, propanol, isopropanol, butanol, and tert-butyl alcohol; carboxylic acids such as formic acid, acetic acid, and propionic acid; ethers such as dimethyl ether, diethyl ether, methyl tert-butyl ether, tetrahydrofuran, tetrahydropyran, and dioxane; amines such as trimethylamine, triethylamine, N,N,N', N'-tetramethylethylenediamine, and pyridine; and amides such as N,N-dimethylformamide, N,N-dimethylacetamide, N,N-diethylacetamide, and N-methylmorpholine oxide. These organic solvents may be used alone or in combination of two or more types thereof. Among such organic solvents, in view of the reactivity, ethers are more preferred, and tetrahydrofuran and diethyl ether are further preferred. In view of the reaction rate, the organic solvent is preferably toluene or xylene.

Upon manufacturing the ionic polymer, it is preferred that an alkali or an appropriate catalyst is added in order to cause the raw material monomer to react. Such an alkali or a catalyst may be selected according to an employed polymerization method or the like. Such an alkali and a catalyst are preferably those capable of being thoroughly dissolved in the solvent used for the reaction. Examples of the method for mixing the alkali or the catalyst may include a method in which while stirring a reaction solution in an inert atmosphere of argon, nitrogen, or the like, a solution of the alkali or the catalyst is slowly added thereto and a method in which the reaction solution is slowly added to a solution of the alkali or the catalyst.

Regarding the ionic polymer used in the present invention, if a polymerization-active group remains at the position of a terminal group as it is, there is such a probability that the light-emitting characteristics and the life characteristics of the obtained light-emitting element might lower. Then, the terminal group may be protected with a stable group. When the ionic polymer used in the present invention is a conjugated compound, such a stable group protecting the terminal group has preferably a conjugated bond connected with a conjugated structure of the main chain of the ionic polymer. Examples of such a structure may include a structure in which the stable group is bonded with an aryl group or a heterocyclic group through a carbon-carbon bond. Examples of such a stable group for protecting the terminal group may include a substituent such as a monovalent aromatic compound group represented by a structural formula of [Chem. 10] in JP 09-45478 A.

Examples of another preferred method for manufacturing an ionic polymer including a structural unit represented by Formula (1) may include a method in which in a first step, an ionic polymer having no cation is polymerized and in a second step, an ionic polymer containing a cation is manufactured from the former ionic polymer. Examples of the method for polymerizing the ionic polymer having no cation in the first step may include the condensation-polymerization reaction described above. Examples of the reaction in the second step may include a hydrolysis reaction using a metal hydroxide, an alkylammonium hydroxide, or the like.

Examples of another preferred method for manufacturing an ionic polymer including the group represented by Formula (2) may include a method in which in a first step, an ionic polymer having no ion is polymerized and in a second step, an ionic polymer containing an ion is manufactured from the former ionic polymer. Examples of the method for polymerizing the ionic polymer having no ion in the first step may include the condensation-polymerization reaction described above. Examples of the reaction in the second step may include a reaction of converting an amine into a quaternary ammonium salt using a halogenated alkyl and a halogen abstraction reaction with $SbF_5$.

The ionic polymer used in the present invention is excellent in the injection property and the transport property of electric charge, so that the ionic polymer can provide an element emitting light with a high brightness.

Examples of the method for forming a layer including the ionic polymer may include a method for forming a film using a solution containing the ionic polymer.

Examples of a solvent used for the film formation using a solution may include solvents such as alcohols (except water), ethers, esters, nitrile compounds, nitro compounds, halogenated alkyls, halogenated aryls, thiols, sulfides, sulfoxides, thioketones, amides, and carboxylic acids. Among them, preferred are solvents having a solubility parameter of 9.3 or more. Examples of the solvent (each value in parentheses represents the value of solubility parameter of each solvent) may include methanol (12.9), ethanol (11.2), 2-propanol (11.5), 1-butanol (9.9), t-butyl alcohol (10.5), acetonitrile (11.8), 1,2-ethandiol (14.7), N,N-dimethylformamide (11.5), dimethylsulfoxide (12.8), acetic acid (12.4), nitrobenzene (11.1), nitromethane (11.0), 1,2-dichloroethane (9.7), dichloromethane (9.6), chlorobenzene (9.6), bromobenzene (9.9), dioxane (9.8), propylene carbonate (13.3), pyridine (10.4), carbon disulfide (10.0), and a solvent mixture of these solvents. Here, as for the solvent mixture prepared by mixing two types of solvents (solvent 1 and solvent 2), the solubility parameter ($\delta_m$) of the solvent mixture is to be obtained from an equation: $\delta_m = \delta_1 \times \phi_1 + \delta_2 \times \phi_2$ ($\delta_1$ is the solubility parameter of the solvent 1; $\phi_1$ is the volume fraction of the solvent 1; $\delta_2$ is the solubility parameter of the solvent 2; and $\phi_2$ is the volume fraction of the solvent 2).

Because the optimal value of the film thickness of the electron injection layer varies depending on the used ionic polymer, the film thickness may be selected so that the driving voltage and the light-emitting efficiency will be moderate values. The layer needs to be thick enough not to cause a pin hole. Because the driving voltage of the element is lowered, the film thickness is preferably 1 nm to 1 μm, more preferably 2 nm to 500 nm, and further preferably 2 nm to 200 nm. Because the light-emitting layer is protected, the film thickness is preferably 5 nm to 1 μm.

<Cathode>

As the material of the cathode, a material having high electric conductivity is preferred. For an organic EL element in which light is taken out from the anode side, a material having high reflectivity for visible light is preferred as the material for the cathode in order to reflect light from the light-emitting layer to the anode off the cathode. Examples of the material used for the cathode may include gold, silver, platinum, copper, aluminum, manganese, titanium, cobalt, nickel, tungsten, tin, alloys of one or more of the above metals, graphite, and graphite intercalation compounds. Examples of the material used for the cathode may include conductive metallic oxides, conductive resins, and mixtures of resins and conductive fillers. Specific examples of the conductive metallic oxides may include indium oxide, zinc oxide, tin oxide, ITO, and IZO. Examples of the conductive resins may include 3,4-polyethylene dioxythiophene/polystyrene sulfonic acid. For a thin film containing a resin and a conductive filler, a conductive resin may be used for the resin. Examples of the conductive filler may include metallic fine particles and conductive wires. Examples of the material of the conductive filler may include Au, Ag, and Al. The cathode may be a stacked body in which two or more layers are stacked.

The film thickness of the cathode may be designed as appropriate in view of required characteristics, process simplicity, and the like. The film thickness of the cathode is, for example, 10 nm to 10 μm, preferably 20 nm to 1 μm, and more preferably 50 nm to 500 nm.

Examples of a method for manufacturing the cathode may include a vacuum deposition method, a sputtering method, and a laminating method in which a metallic thin film is thermo-compressed. When ink in which a conductive filler and a resin are dispersed in a dispersion medium is used, an application method may be used as a method for manufacturing the cathode.

EXAMPLES

Ionic polymers were manufactured, and organic EL elements were manufactured using the ionic polymers in their electron injection layers.

Reference Example 1

Synthesis of 2,7-dibromo-9,9-bis[3-ethoxycarbonyl-4-[2-[2-(2-methoxyethoxy)ethoxy]ethoxy]phenyl]-fluorene (compound A)

2,7-Dibromo-9-fluorenone (52.5 g), ethyl salicylate (154.8 g), and mercapto acetic acid (1.4 g) were charged into a 300 mL flask, and the flask was purged with nitrogen. Thereto, methanesulfonic acid (630 mL) was added, and the resultant reaction mixture was stirred at 75° C. all night. The reaction mixture was left to be cooled down and was charged into ice water, and the resultant reaction mixture was stirred for 1 hour. A generated solid was filtered and the solid was washed with heated acetonitrile. The washed solid was dissolved in acetone and from the resultant acetone solution, a solid was recrystallized and was filtered. The resultant solid (62.7 g), 2-[2-(2-methoxyethoxy)ethoxy]-p-toluene sulfonate (86.3 g), potassium carbonate (62.6 g), and 18-crown-6 (7.2 g) were dissolved in N,N-dimethylformamide (DMF) (670 mL) and the resultant reaction solution was transferred into a flask and was stirred at 105° C. all night. The resultant reaction mixture was left to be cooled down to room temperature, and was charged into ice water, followed by stirring the resultant reaction mixture for 1 hour. To the reaction solution, chloroform (300 mL) was added to subject the reaction solution to phase-separation extraction, and the resultant solution was concentrated, thus obtaining 2,7-dibromo-9,9-bis[3-ethoxycarbonyl-4-[2-[2-(2-methoxyethoxy)ethoxy]ethoxy]phenyl]-fluorene (compound A) (51.2 g).

[Chem. 64]

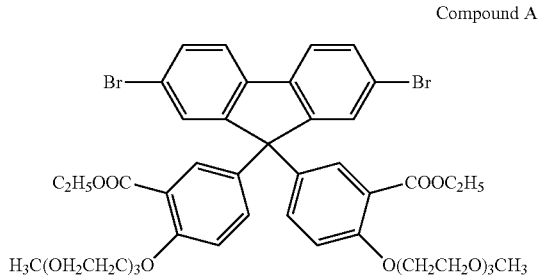

Compound A

Reference Example 2

Synthesis of 2,7-bis(4,4,5,5-tetramethyl-1,3,2-dioxaborolan-2-yl)-9,9-bis[3-ethoxycarbonyl-4-[2-[2-(2-methoxyethoxy)ethoxy]ethoxy]phenyl]-fluorene (compound B)

In a nitrogen atmosphere, the compound A (15 g), bis(pinacolato)diboron (8.9 g), [1,1'-bis(diphenylphosphino)ferrocene]dichloropalladium (II) dichloromethane complex (0.8 g), 1,1'-bis(diphenylphosphino)ferrocene (0.5 g), potassium acetate (9.4 g), and dioxane (400 mL) were mixed, and the resultant reaction mixture was heated to 110° C. and was heated and refluxed for 10 hours. The reaction solution was left to be cooled down and was filtered, and the filtrate was concentrated under reduced pressure. The reaction mixture was washed with methanol three times. The resultant precipitate was dissolved in toluene, and to the resultant solution, an active carbon was added, followed by stirring the resultant mixture. Then, the mixture was filtered, and the filtrate was concentrated under reduced pressure, thus obtaining 2,7-bis(4,4,5,5-tetramethyl-1,3,2-dioxaborolan-2-yl)-9,9-bis[3-ethoxycarbonyl-4-[2-[2-(2-methoxyethoxy)ethoxy]ethoxy]phenyl]-fluorene (compound B) (11.7 g).

[Chem. 65]

Compound B

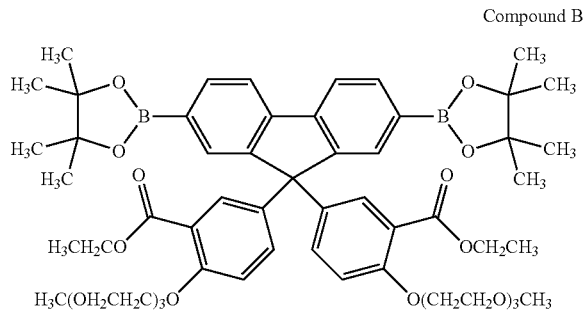

Reference Example 3

Synthesis of poly[9,9-bis[3-ethoxycarbonyl-4-[2-[2-(2-methoxyethoxy)ethoxy]ethoxy]phenyl]-fluorene (polymer A)

In an inert atmosphere, the compound A (0.55 g), the compound B (0.61 g), (triphenylphosphine)palladium (0.01 g), methyltrioctylammonium chloride (manufactured by Aldrich Co.; trade name: Aliquat 336 (registered trademark)) (0.20 g), and toluene (10 mL) were mixed, and the resultant reaction mixture was heated to 105° C. Into the reaction solution, a 2 mol/L sodium carbonate aqueous solution (6 mL) was added dropwise, and the resultant reaction mixture was refluxed for 8 hours. To the reaction solution, 4-tert-butylphenylboronic acid (0.01 g) was added, and the resultant reaction mixture was refluxed for 6 hours. Next, to the reaction mixture, a sodium diethyldithiocarbamate aqueous solution (10 mL, concentration: 0.05 g/mL) was added, and the resultant reaction mixture was stirred for 2 hours. The resultant solution mixture was added dropwise into 300 mL of methanol, and the resultant reaction mixture was stirred for 1 hour. Then, a deposited precipitate was filtered and the precipitate was dried under reduced pressure for 2 hours, followed by dissolving the precipitate in 20 mL of tetrahydrofuran. The resultant reaction solution was added dropwise into a solvent mixture of 120 mL of methanol and 50 mL of a 3% by weight acetic acid aqueous solution, and the resultant reaction mixture was stirred for 1 hour. A deposited precipitate was filtered, and the precipitate was dissolved in 20 mL of tetrahydrofuran. The thus obtained reaction solution was added dropwise into 200 mL of methanol, and the resultant reaction mixture was stirred for 30 minutes. A deposited precipitate was filtered to obtain a solid. The obtained solid was dissolved in tetrahydrofuran, and the resultant solution was passed through an alumina column and a silica gel column to purify the solution. The tetrahydrofuran solution recovered from the column was concentrated, and the concentrate was added dropwise into methanol (200 mL), followed by filtering and drying a deposited solid. The yield of obtained poly[9,9-bis[3-ethoxycarbonyl-4-bis[2-[2-(2-methoxyethoxy)ethoxy]ethoxy]phenyl]-fluorene] (polymer A (BSAFEGP)) was 520 mg.

The number average molecular weight in terms of polystyrene of the polymer A was $5.2 \times 10^4$. The polymer A contains a repeating unit represented by Formula (A).

[Chem. 66]

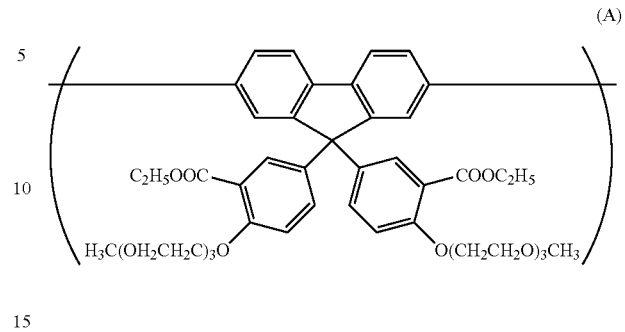

Experiment Example 1

Synthesis of Cesium Salt of Polymer A

The polymer A (200 mg) was charged into a 100 mL flask, and the flask was purged with nitrogen. To the polymer A, tetrahydrofuran (20 mL) and ethanol (20 mL) were added, and the temperature of the resultant reaction mixture was elevated to 55° C. Thereto, an aqueous solution prepared by dissolving cesium hydroxide (200 mg) in water (2 mL) was added, and the resultant reaction mixture was stirred at 55° C. for 6 hours. The reaction mixture was cooled down to room temperature and therefrom, the reaction solvent was distilled off under reduced pressure. A generated solid was washed with water and was dried under reduced pressure, thus obtaining a light yellow solid (150 mg). In an nuclear magnetic resonance (NMR) spectrum of the solid, it was confirmed that a signal ascribed to an ethyl group in an ethyl ester moiety in the polymer A disappeared completely. The obtained cesium salt of the polymer A is called a conjugated macromolecular compound 1. The conjugated macromolecular compound 1 contains a repeating unit represented by Formula (B) ("the ratio of a repeating unit containing one or more group(s) selected from the group consisting of the group represented by Formula (1) and the group represented by Formula (2) and one or more group(s) represented by Formula (3) in all repeating units" and "the ratio of the repeating units represented by Formulae (13), (15), (17), and (20) in all repeating units" are 100% by mole). The orbital energy of HOMO and the orbital energy of LUMO of the conjugated macromolecular compound 1 were −5.5 eV and −2.7 eV, respectively.

[Chem. 67]

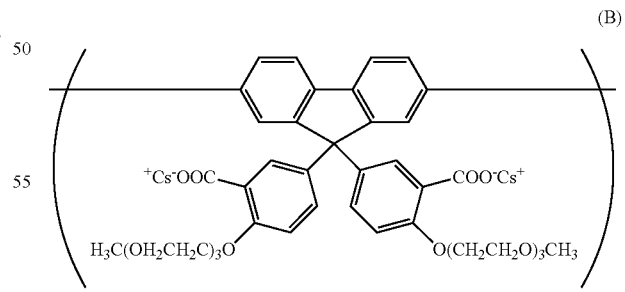

Experiment Example 2

Synthesis of Potassium Salt of Polymer A

The polymer A (200 mg) was charged into a 100 mL flask, and the flask was purged with nitrogen. Tetrahydrofuran (20 mL) and methanol (10 mL) were mixed with the polymer A. To the solution mixture, an aqueous solution prepared by dissolving potassium hydroxide (400 mg) in water (2 mL) was added, and the resultant reaction mixture was stirred at 65° C. for 1 hour. To the reaction solution, 50 mL of methanol was added, and further, the resultant reaction mixture was stirred at 65° C. for 4 hours. The reaction mixture was cooled down to room temperature and therefrom, the reaction solvent was distilled off under reduced pressure. A generated solid was washed with water and was dried under reduced pressure, thus obtaining a light yellow solid (131 mg). In an NMR spectrum of the solid, it was confirmed that a signal ascribed to an ethyl group in an ethyl ester moiety in the polymer A disappeared completely. The obtained potassium salt of the polymer A is called a conjugated macromolecular compound 2. The conjugated macromolecular compound 2 contains a repeating unit represented by Formula (C) ("the ratio of a repeating unit containing one or more group(s) selected from the group consisting of the group represented by Formula (1) and the group represented by Formula (2) and one or more group(s) represented by Formula (3) in all repeating units" and "the ratio of the repeating units represented by Formulae (13), (15), (17), and (20) in all repeating units" are 100% by mole). The orbital energy of HOMO and the orbital energy of LUMO of the conjugated macromolecular compound 2 were −5.5 eV and −2.7 eV, respectively.

[Chem. 68]

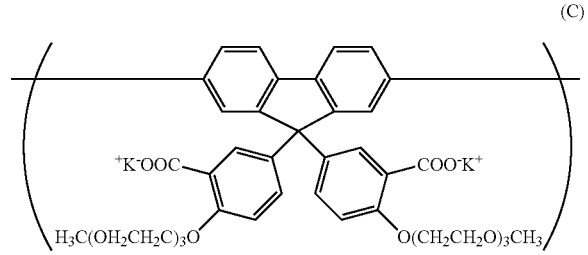

(C)

Experiment Example 3

Synthesis of Sodium Salt of Polymer A

The polymer A (200 mg) was charged into a 100 mL flask, and the flask was purged with nitrogen. Tetrahydrofuran (20 mL) and methanol (10 mL) were mixed with the polymer A. To the resultant solution mixture, an aqueous solution prepared by dissolving sodium hydroxide (260 mg) in water (2 mL) was added, and the resultant reaction mixture was stirred at 65° C. for 1 hour. To the reaction solution, 30 mL of methanol was added, and further, the resultant reaction mixture was stirred at 65° C. for 4 hours. The reaction mixture was cooled down to room temperature, and therefrom, the reaction solvent was distilled off under reduced pressure. A generated solid was washed with water and was dried under reduced pressure, thus obtaining a light yellow solid (123 mg). In an NMR spectrum of the solid, it was confirmed that a signal ascribed to an ethyl group in an ethyl ester moiety in the polymer A disappeared completely. The obtained sodium salt of the polymer A is called a conjugated macromolecular compound 3. The conjugated macromolecular compound 3 contains a repeating unit represented by Formula (D) ("the ratio of a repeating unit containing one or more group(s) selected from the group consisting of the group represented by Formula (1) and the group represented by Formula (2) and one or more group(s) represented by Formula (3) in all repeating units" and "the ratio of the repeating units represented by Formulae (13), (15), (17), and (20) in all repeating units" are 100% by mole). The orbital energy of HOMO and the orbital energy of LUMO of the conjugated macromolecular compound 3 were −5.6 eV and −2.8 eV, respectively.

[Chem. 69]

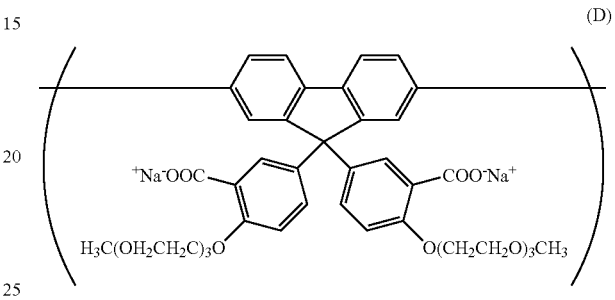

(D)

Experiment Example 4

Synthesis of Ammonium Salt of Polymer A

The polymer A (200 mg) was charged into a 100 mL flask, and the flask was purged with nitrogen. Tetrahydrofuran (20 mL) and methanol (15 mL) were mixed with the polymer A. To the resultant solution mixture, an aqueous solution prepared by dissolving tetramethylammonium hydroxide (50 mg) in water (1 mL) was added, and the resultant reaction mixture was stirred at 65° C. for 6 hours. To the reaction solution, an aqueous solution prepared by dissolving tetramethylammonium hydroxide (50 mg) in water (1 mL) was added, and further, the resultant reaction mixture was stirred at 65° C. for 4 hours. The reaction mixture was cooled down to room temperature, and therefrom, the reaction solvent was distilled off under reduced pressure. A generated solid was washed with water and was dried under reduced pressure, thus obtaining a light yellow solid (150 mg). In an NMR spectrum of the solid, it was confirmed that a signal ascribed to an ethyl group in an ethyl ester moiety in the polymer A disappeared by 90%. The obtained ammonium salt of the polymer A is called a conjugated macromolecular compound 4. The conjugated macromolecular compound 4 contains a repeating unit represented by Formula (E) ("the ratio of a repeating unit containing one or more group(s) selected from the group consisting of the group represented by Formula (1) and the group represented by Formula (2) and one or more group(s) represented by Formula (3) in all repeating units" and "the ratio of the repeating units represented by Formulae (13), (15), (17), and (20) in all repeating units" are 90% by mole). The orbital energy of HOMO and the orbital energy of LUMO of the conjugated macromolecular compound 4 were −5.6 eV and −2.8 eV, respectively.

[Chem. 70]

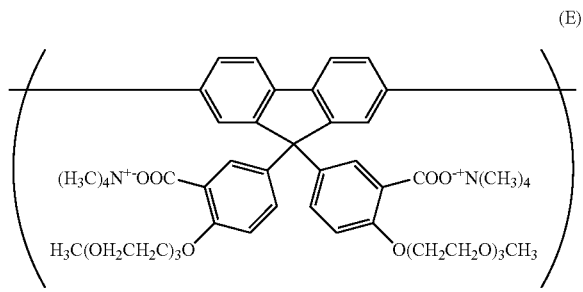

(E)

[Chem. 71]

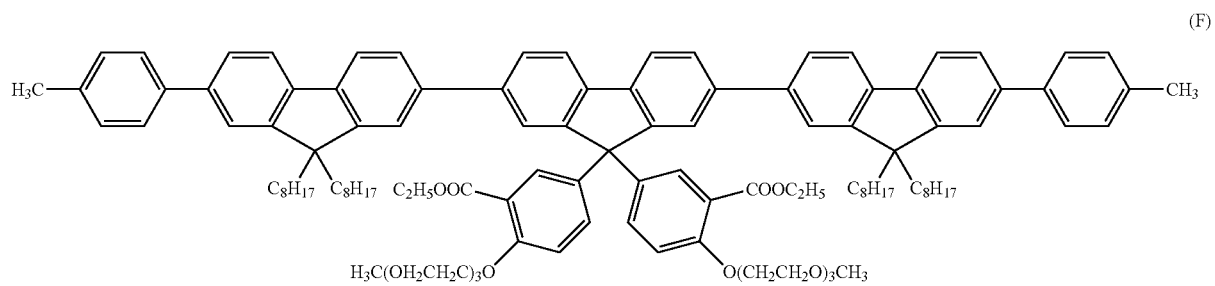

(F)

aqueous solution was added. The resultant reaction mixture was stirred for 30 minutes, and therefrom, the organic solvent was removed. The resultant residue was passed through an alumina column (eluent: hexane:ethyl acetate=1:1, v/v) to purify the residue. A deposited precipitate was filtered, and the precipitate was dried under reduced pressure for 12 hours, thus obtaining 524 mg of 2,7-bis[7-(4-methylphenyl)-9,9-dioctylfluoren-2-yl]-9,9-bis[3-ethoxycarbonyl-4-[2-[2-(2-methoxyethoxy)ethoxy]ethoxy]phenyl]-fluorene (polymer B).

The number average molecular weight in terms of polystyrene of the polymer B was $2.0 \times 10^3$. The polymer B is represented by Formula (F).

Reference Example 4

Synthesis of 2,7-bis[7-(4-methylphenyl)-9,9-dioctylfluoren-2-yl]-9,9-bis[3-ethoxycarbonyl-4-[2-[2-(2-methoxyethoxy)ethoxy]ethoxy]phenyl]-fluorene (polymer B)

In an inert atmosphere, the compound A (0.52 g), 2,7-bis (1,3,2-dioxaborolan-2-yl)-9,9-dioctylfluorene (1.29 g), (triphenylphosphine)palladium (0.0087 g), methyltrioctylammonium chloride (manufactured by Aldrich Co.; trade name: Aliquat 336 (registered trademark)) (0.20 g), toluene (10 mL), and a 2 mol/L sodium carbonate aqueous solution (10 mL) were mixed, and the resultant reaction mixture was heated to 80° C. The reaction solution was subjected to a reaction for 3.5 hours. Then, to the reaction mixture, p-bromotoluene (0.68 g) was added, and the resultant reaction mixture was further subjected to a reaction for 2.5 hours. After the completion of the reaction, the reaction solution was cooled down to room temperature, and to the reaction mixture, ethyl acetate 50 mL/distilled water 50 mL was added, followed by removing the aqueous phase. Next, to the reaction mixture, 50 mL of distilled water was added again, and the aqueous phase was removed. Subsequently, to the reaction mixture, magnesium sulfate as a drying agent was added, and insoluble matters were filtered, followed by removing the organic solvent. Then, the resultant residue was dissolved in 10 mL of tetrahydrofuran (THF) again, and to the resultant solution, 2 mL of saturated sodium diethyldithiocarbamate Experiment Example 5

Synthesis of Cesium Salt of Polymer B

The polymer B (262 mg) was charged into a 100 mL flask, and the flask was purged with argon. Thereto, tetrahydrofuran (10 mL) and methanol (15 mL) were added, and the temperature of the resultant reaction mixture was elevated to 55° C. Thereto, an aqueous solution prepared by dissolving cesium hydroxide (341 mg) in water (1 mL) was added, and the resultant reaction mixture was stirred at 55° C. for 5 hours. The resultant mixture was cooled down to room temperature, and therefrom, the reaction solvent was distilled off under reduced pressure. A generated solid was washed with water and was dried under reduced pressure, thus obtaining a light yellow solid (250 mg). In an NMR spectrum of the solid, it was confirmed that a signal ascribed to an ethyl group in an ethyl ester moiety disappeared completely. The obtained cesium salt of the polymer B is called a conjugated macromolecular compound 5. The conjugated macromolecular compound 5 is represented by Formula (G) ("the ratio of a repeating unit containing one or more group(s) selected from the group consisting of the group represented by Formula (1) and the group represented by Formula (2) and one or more group(s) represented by Formula (3) in all repeating units" and "the ratio of the repeating units represented by Formulae (13), (15), (17), and (20) in all repeating units" are 33.3% by mole by rounding off to one decimal place). The orbital energy of HOMO and the orbital energy of LUMO of the conjugated macromolecular compound 5 were −5.6 eV and −2.6 eV, respectively.

[Chem. 72]

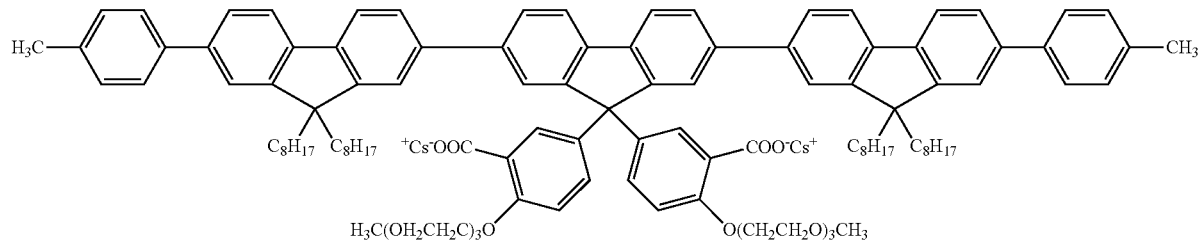

(G)

Reference Example 5

Synthesis of Polymer C

In an inert atmosphere, the compound A (0.40 g), the compound B (0.49 g), N,N'-bis(4-bromophenyl)-N,N'-bis(4-tert-butyl-2,6-dimethylphenyl)-1,4-phenylenediamine (35 mg), (triphenylphosphine)palladium (8 mg), methyltrioctylammonium chloride (manufactured by Aldrich Co.; trade name: Aliquat 336 (registered trademark)) (0.20 g), and toluene (10 mL) were mixed, and the resultant reaction mixture was heated to 105° C. Into the reaction solution, a 2 mol/L sodium carbonate aqueous solution (6 mL) was added dropwise, and the resultant reaction mixture was refluxed for 8 hours. To the reaction solution, phenylboronic acid (0.01 g) was added, and the resultant reaction mixture was refluxed for 6 hours. Next, to the reaction mixture, a sodium diethyldithiocarbamate aqueous solution (10 mL, concentration: 0.05 g/mL) was added, and the resultant reaction mixture was stirred for 2 hours. The solution mixture was added dropwise into 300 mL of methanol, and the resultant reaction mixture was stirred for 1 hour. Next, a deposited precipitate was filtered, and the precipitate was dried under reduced pressure for 2 hours, followed by dissolving the precipitate in 20 mL of tetrahydrofuran. The resultant reaction solution was added dropwise into a solvent mixture of 120 mL of methanol and 50 mL of a 3% by weight acetic acid aqueous solution, and the resultant reaction mixture was stirred for 1 hour. Next, a deposited precipitate was filtered, and the precipitate was dissolved in 20 mL of tetrahydrofuran. The thus obtained reaction solution was added dropwise into 200 mL of methanol, and the resultant reaction mixture was stirred for 30 minutes. A deposited precipitate was filtered, thus obtaining a solid. The obtained solid was dissolved in tetrahydrofuran, and the resultant solution was passed through an alumina column and a silica gel column to purify the solution. The tetrahydrofuran solution recovered from the column was concentrated and was added dropwise into methanol (200 mL), followed by filtering and drying a deposited solid. The yield of the obtained polymer C was 526 mg.

The number average molecular weight in terms of polystyrene of the polymer C was $3.6 \times 10^4$. The polymer C contains a repeating unit represented by Formula (H).

N,N'-bis(4-bromophenyl)-N,N'-bis(4-t-butyl-2,6-dimethylphenyl)-1,4-phenylenediamine can be synthesized, for example, by the method described in Japanese Patent Application Laid-open No. 2008-74917.

[Chem. 73]

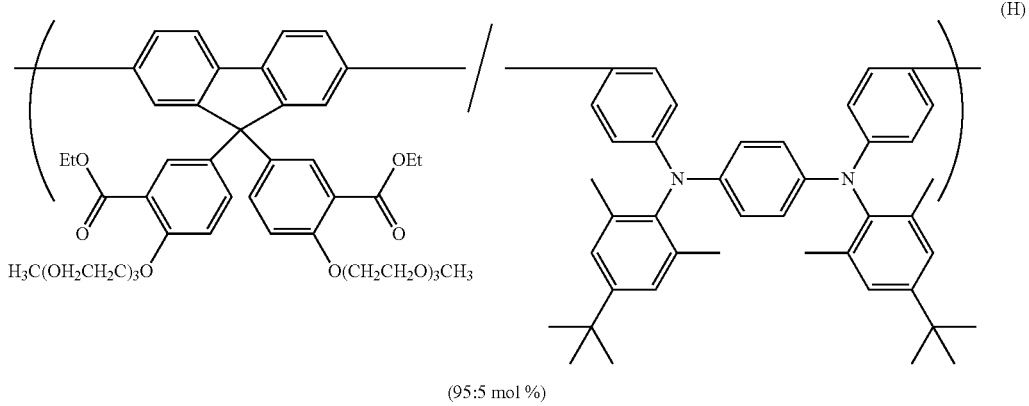

(H)

(95:5 mol %)

Experiment Example 6

Synthesis of Cesium Salt of Polymer C

The polymer C (200 mg) was charged into a 100 mL flask, and the flask was purged with nitrogen. Tetrahydrofuran (20 mL) and methanol (20 mL) were added, and the resultant reaction mixture was mixed. To the solution mixture, an aqueous solution prepared by dissolving cesium hydroxide (200 mg) in water (2 mL) was added, and the resultant reaction mixture was stirred at 65° C. for 1 hour. To the reaction solution, 30 mL of methanol was added, and further, the resultant reaction mixture was stirred at 65° C. for 4 hours. The reaction mixture was cooled down to room temperature, and therefrom, the reaction solvent was distilled off under reduced pressure. A generated solid was washed with water and was dried under reduced pressure, thus obtaining a light yellow solid (150 mg). In an NMR spectrum of the solid, it was confirmed that a signal ascribed to an ethyl group in an ethyl ester moiety in the polymer C disappeared completely. The obtained cesium salt of the polymer C is called a conjugated macromolecular compound 6. The conjugated macromolecular compound 6 contains a repeating unit represented by Formula (I) ("the ratio of a repeating unit containing one or more group(s) selected from the group consisting of the group represented by Formula (1) and the group represented by Formula (2) and one or more group(s) represented by Formula (3) in all repeating units" and "the ratio of the repeating units represented by Formulae (13), (15), (17), and (20) in all repeating units" are 95% by mole). The orbital energy of HOMO and the orbital energy of LUMO of the conjugated macromolecular compound 6 were −5.3 eV and −2.6 eV, respectively.

wise, and the resultant reaction mixture was refluxed for 2 hours. To the reaction solution, phenylboronic acid (0.004 g) was added, and the resultant reaction mixture was refluxed for 6 hours. Next, a sodium diethyldithiocarbamate aqueous solution (10 mL, concentration: 0.05 g/mL) was added, and the resultant reaction mixture was stirred for 2 hours. The solution mixture was added dropwise into 300 mL of methanol, and the resultant reaction mixture was stirred for 1 hour. Next, a deposited precipitate was filtered, and the precipitate was dried under reduced pressure for 2 hours, followed by dissolving the precipitate in 20 mL of tetrahydrofuran. The resultant reaction solution was added dropwise into a solvent mixture of 120 mL of methanol and 50 mL of a 3% by weight acetic acid aqueous solution, and the resultant reaction mixture was stirred for 1 hour. A deposited precipitate was filtered, and the precipitate was dissolved in 20 mL of tetrahydrofuran. The thus obtained reaction solution was added dropwise into 200 mL of methanol, and the resultant reaction mixture was stirred for 30 minutes. A deposited precipitate was filtered, thus obtaining a solid. The obtained solid was dissolved in tetrahydrofuran, and the resultant solution was passed through an alumina column and a silica gel column to

[Chem. 74]

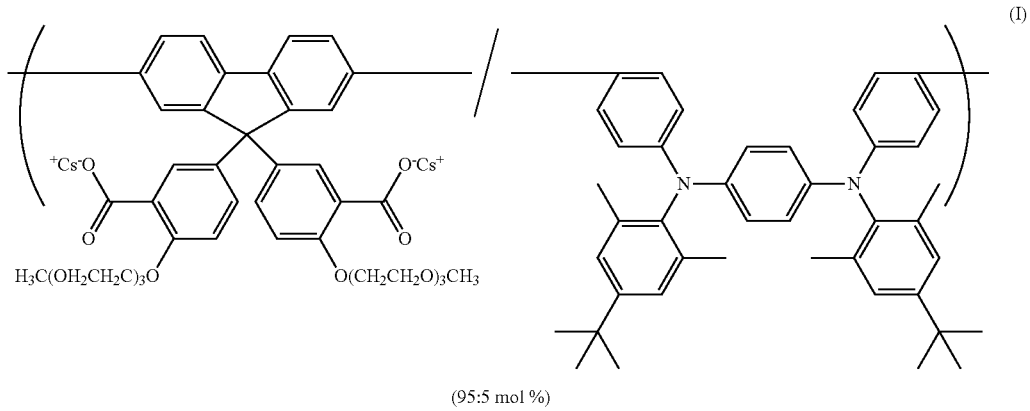

(95:5 mol %)

Reference Example 6

Synthesis of Polymer D

In an inert atmosphere, the compound A (0.55 g), the compound B (0.67 g), N,N'-bis(4-bromophenyl)-N,N'-bis(4-tert-butyl-2,6-dimethylphenyl)-1,4-phenylenediamine (0.038 g), 3,7-dibromo-N-(4-n-butylphenyl)phenoxazine 0.009 g, (triphenylphosphine)palladium (0.01 g), methyltrioctylammonium chloride (manufactured by Aldrich Co.; trade name: Aliquat 336 (registered trademark)) (0.20 g), and toluene (10 mL) were mixed, and the resultant reaction mixture was heated to 105° C. Into the reaction solution, a 2 mol/L sodium carbonate aqueous solution (6 mL) was added droppurify the solution. The tetrahydrofuran solution recovered from the column was concentrated, and the concentrated tetrahydrofuran solution was added dropwise into methanol (200 mL), followed by filtering and drying a deposited solid. The yield of the obtained polymer D was 590 mg.

The number average molecular weight in terms of polystyrene of the polymer D was $2.7 \times 10^4$. The polymer D contains a repeating unit represented by Formula (J).

3,7-Dibromo-N-(4-n-butylphenyl)phenoxazine was synthesized based on the method described in JP 2007-70620 A (or with reference to the method described in JP 2004-137456 A).

[Chem. 75]

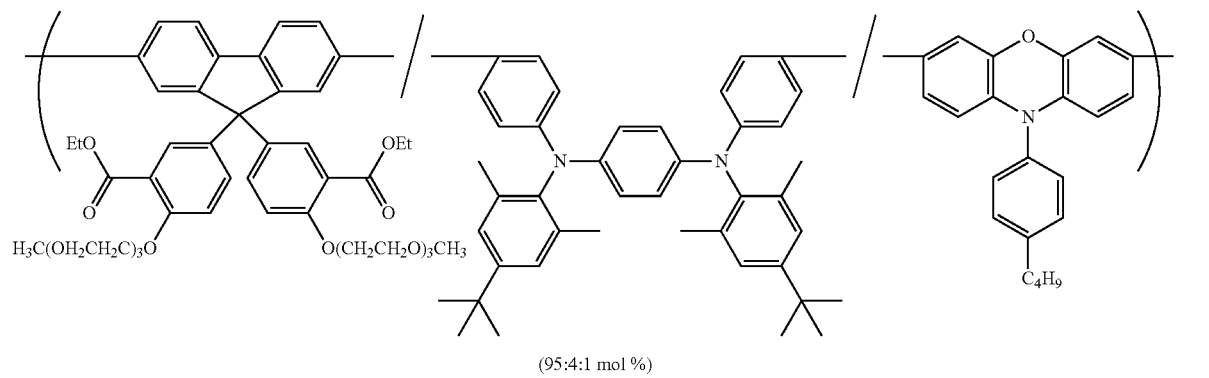

(J)

(95:4:1 mol %)

Experiment Example 7

Synthesis of Cesium Salt of Polymer D

The polymer D (200 mg) was charged into a 100 mL flask, and the flask was purged with nitrogen. Tetrahydrofuran (15 mL) and methanol (10 mL) were mixed with the polymer D. To the solution mixture, an aqueous solution prepared by dissolving cesium hydroxide (360 mg) in water (2 mL) was added, and the resultant reaction mixture was stirred at 65° C. for 3 hours. To the reaction solution, 10 mL of methanol was added, and further, the resultant reaction mixture was stirred at 65° C. for 4 hours. The reaction mixture was cooled down to room temperature, and therefrom, the reaction solvent was distilled off under reduced pressure. A generated solid was washed with water and was dried under reduced pressure, thus obtaining a light yellow solid (210 mg). In an NMR spectrum of the solid, it was confirmed that a signal ascribed to an ethyl group in an ethyl ester moiety in the polymer D disappeared completely. The obtained cesium salt of the polymer D is called a conjugated macromolecular compound 7. The conjugated macromolecular compound 7 contains a repeating unit represented by Formula (K) ("the ratio of a repeating unit containing one or more group(s) selected from the group consisting of the group represented by Formula (1) and the group represented by Formula (2) and one or more group(s) represented by Formula (3) in all repeating units" and "the ratio of the repeating units represented by Formulae (13), (15), (17), and (20) in all repeating units" are 90% by mole). The orbital energy of HOMO and the orbital energy of LUMO of the conjugated macromolecular compound 7 were −5.3 eV and −2.4 eV, respectively.

[Chem. 76]

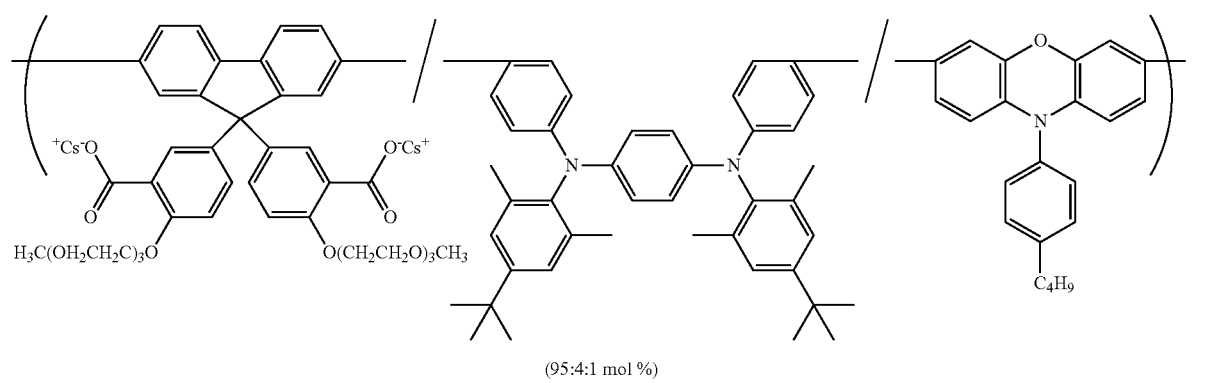

(K)

(95:4:1 mol %)

Reference Example 7

Synthesis of Polymer E

In an inert atmosphere, the compound A (0.37 g), the compound B (0.82 g), 1,3-dibromobenzene (0.09 g), (triphenylphosphine)palladium (0.01 g), methyltrioctylammonium chloride (manufactured by Aldrich Co.; trade name: Aliquat 336 (registered trademark)) (0.20 g), and toluene (10 mL) were mixed, and the resultant reaction mixture was heated to 105° C. Into the reaction solution, a 2 mol/L sodium carbonate aqueous solution (6 mL) was added dropwise, and the resultant reaction mixture was refluxed for 7 hours. To the reaction solution, phenylboronic acid (0.002 g) was added, and the resultant reaction mixture was refluxed for 10 hours. Next, a sodium diethyldithiocarbamate aqueous solution (10 mL, concentration: 0.05 g/mL) was added, and the resultant reaction mixture was stirred for 1 hour. The resultant solution mixture was added dropwise into 300 mL of methanol, and the resultant reaction mixture was stirred for 1 hour. A deposited precipitate was filtered, and the precipitate was dried under reduced pressure for 2 hours, followed by dissolving the precipitate in 20 mL of tetrahydrofuran. The resultant reaction solution was added dropwise into a solvent mixture of 120 mL of methanol and 50 mL of a 3% by weight acetic acid aqueous solution, and the resultant reaction mixture was stirred for 1 hour. A deposited precipitate was filtered, and the precipitate was dissolved in 20 mL of tetrahydrofuran. The thus obtained reaction solution was added dropwise into 200 mL of methanol, and the resultant reaction mixture was stirred for 30 minutes. A deposited precipitate was filtered, thus obtaining a solid. The obtained solid was dissolved in tetrahydrofuran, and the resultant solution was passed through an alumina column and a silica gel column to purify the solution. The tetrahydrofuran solution recovered from the column was concentrated, and the concentrate was added dropwise into methanol (200 mL), followed by filtering and drying a deposited solid. The yield of the obtained polymer E was 293 mg.

The number average molecular weight in terms of polystyrene of the polymer E was 1.8×10$^4$. The polymer E contains a repeating unit represented by Formula (L).

[Chem. 77]

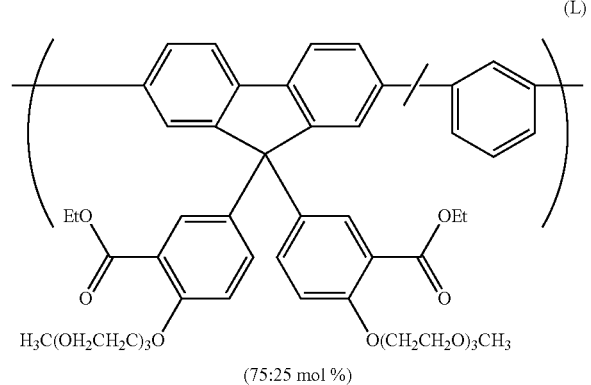

(L)

(75:25 mol %)

Experiment Example 8

Synthesis of Cesium Salt of Polymer E

The polymer E (200 mg) was charged into a 100 mL flask, and the flask was purged with nitrogen. Tetrahydrofuran (10 mL) and methanol (5 mL) were mixed with the polymer E. To the resultant solution mixture, an aqueous solution prepared by dissolving cesium hydroxide (200 mg) in water (2 mL) was added, and the resultant reaction mixture was stirred at 65° C. for 2 hours. To the reaction solution, 10 mL of methanol was added, and further, the resultant reaction mixture was stirred at 65° C. for 5 hours. The reaction mixture was cooled down to room temperature, and therefrom, the reaction solvent was distilled off under reduced pressure. A generated solid was washed with water and was dried under reduced pressure, thus obtaining a light yellow solid (170 mg). In an NMR spectrum of the solid, it was confirmed that a signal ascribed to an ethyl group in an ethyl ester moiety in the polymer E disappeared completely. The obtained cesium salt of the polymer E is called a conjugated macromolecular compound 8. The conjugated macromolecular compound 8 contains a repeating unit represented by Formula (M) ("the ratio of a repeating unit containing one or more group(s) selected from the group consisting of the group represented by Formula (1) and the group represented by Formula (2) and one or more group(s) represented by Formula (3) in all repeating units" and "the ratio of the repeating units represented by Formulae (13), (15), (17), and (20) in all repeating units" are 75% by mole). The orbital energy of HOMO and the orbital energy of LUMO of the conjugated macromolecular compound 8 were −5.6 eV and −2.6 eV, respectively.

[Chem. 78]

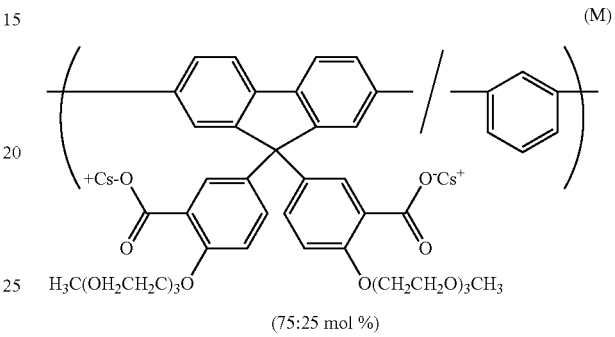

(M)

(75:25 mol %)

Reference Example 8

Synthesis of Polymer F

In an inert atmosphere, the compound B (1.01 g), 1,4-dibromo-2,3,5,6-tetrafluorobenzene (0.30 g), (triphenylphosphine)palladium (0.02 g), methyltrioctylammonium chloride (manufactured by Aldrich Co.; trade name: Aliquat 336 (registered trademark)) (0.20 g), and toluene (10 mL) were mixed, and the resultant reaction mixture was heated to 105° C. Into the reaction solution, a 2 mol/L sodium carbonate aqueous solution (6 mL) was added dropwise, and the resultant reaction mixture was refluxed for 4 hours. To the reaction solution, phenylboronic acid (0.002 g) was added, and the resultant reaction mixture was refluxed for 4 hours. Next, a sodium diethyldithiocarbamate aqueous solution (10 mL, concentration: 0.05 g/mL) was added, and the resultant reaction mixture was stirred for 1 hour. The resultant solution mixture was added dropwise into 300 mL of methanol, and the resultant reaction mixture was stirred for 1 hour. A deposited precipitate was filtered, and the precipitate was dried under reduced pressure for 2 hours, followed by dissolving the precipitate in 20 mL of tetrahydrofuran. The resultant reaction solution was added dropwise into a solvent mixture of 120 mL of methanol and 50 mL of a 3% by weight acetic acid aqueous solution, and the resultant reaction mixture was stirred for 1 hour. A deposited precipitate was filtered, and the precipitate was dissolved in 20 mL of tetrahydrofuran. The thus obtained reaction solution was added dropwise into 200 mL of methanol, and the resultant reaction mixture was stirred for 30 minutes. A deposited precipitate was filtered, thus obtaining a solid. The obtained solid was dissolved in a solvent mixture of tetrahydrofuran/ethyl acetate (1/1 (volume ratio)), and the resultant solution was passed through an alumina column and a silica gel column to purify the solution. The tetrahydrofuran solution recovered from the column was concentrated and was added dropwise into methanol (200 mL), followed by filtering and drying a deposited solid. The yield of the obtained polymer E was 343 mg.

The number average molecular weight in terms of polystyrene of the polymer F was $6.0 \times 10^4$. The polymer F contains a repeating unit represented by Formula (N).

[Chem. 79]

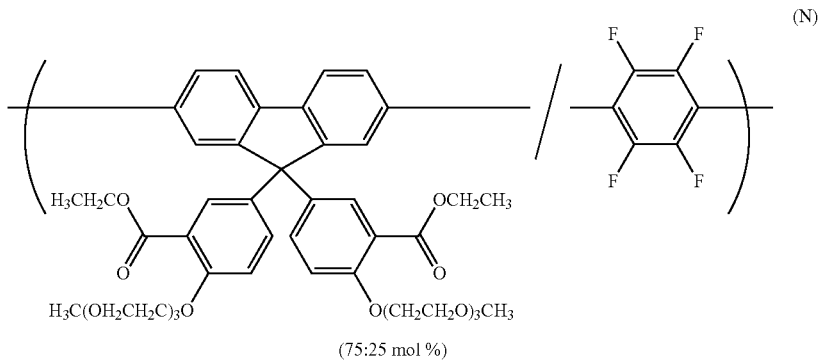

(75:25 mol %)

Experiment Example 9

Synthesis of Cesium Salt of Polymer F

The polymer F (150 mg) was charged into a 100 mL flask, and the flask was purged with nitrogen. Tetrahydrofuran (10 mL) and methanol (5 mL) were mixed with the polymer F. To the solution mixture, an aqueous solution prepared by dissolving cesium hydroxide (260 mg) in water (2 mL) was added, and the resultant reaction mixture was stirred at 65° C. for 2 hours. To the reaction solution, 10 mL of methanol was added, and further, the resultant reaction mixture was stirred at 65° C. for 5 hours. The reaction mixture was cooled down to room temperature, and therefrom, the reaction solvent was distilled off under reduced pressure. A generated solid was washed with water and was dried under reduced pressure, thus obtaining a light yellow solid (130 mg). In an NMR spectrum of the solid, it was confirmed that a signal ascribed to an ethyl group in an ethyl ester moiety in the polymer E disappeared completely. The obtained cesium salt of the polymer F is called a conjugated macromolecular compound 9. The conjugated macromolecular compound 9 contains a repeating unit represented by Formula (O) ("the ratio of a repeating unit containing one or more group(s) selected from the group consisting of the group represented by Formula (1) and the group represented by Formula (2) and one or more group(s) represented by Formula (3) in all repeating units" and "the ratio of the repeating units represented by Formulae (13), (15), (17), and (20) in all repeating units" are 75% by mole). The orbital energy of HOMO and the orbital energy of LUMO of the conjugated macromolecular compound 1 were −5.9 eV and −2.8 eV, respectively.

[Chem. 80]

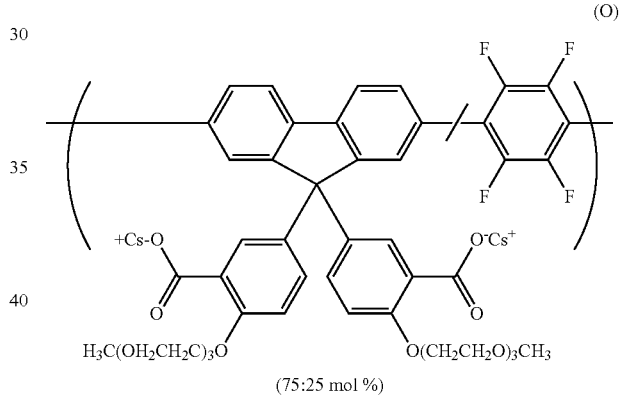

(75:25 mol %)

Reference Example 9

In an inert atmosphere, 2-[2-(2-methoxyethoxy)ethoxy]-p-toluene sulfonate (11.0 g), triethylene glycol (30.0 g), and potassium hydroxide (3.3 g) were mixed, and the resultant reaction mixture was heated and stirred at 100° C. for 18 hours. The reaction solution was left to be cooled down, was charged into water (100 mL), and was subjected to phase-separation extraction with chloroform, followed by concentrating the solution. The concentrated solution was subjected to the Kugelrohr distillation (10 mmTorr, 180° C.), thus obtaining 2-(2-(2-(2-(2-methoxyethoxy)-ethoxy)-ethoxy)-ethoxy) ethanol (6.1 g).

Reference Example 10

In an inert atmosphere, 2-(2-(2-(2-(2-methoxyethoxy)-ethoxy)-ethoxy)-ethoxy) ethanol (8.0 g), sodium hydroxide (1.4 g), distilled water (2 mL), and tetrahydrofuran (2 mL) were mixed, and the resultant reaction mixture was ice-cooled. Into the solution mixture, a solution of p-tosyl chloride (5.5 g) in tetrahydrofuran (6.4 mL) was added dropwise over 30 minutes, and thereafter, the temperature of the reaction solution was elevated to room temperature, followed by stirring the reaction solution for 15 hours. To the reaction solution, distilled water (50 mL) was added, and the resultant reaction solution was neutralized with a 6 mol/L sulfuric acid, followed by subjecting the reaction solution to phase-separation extraction with chloroform. The solution was concentrated, thus obtaining 2-(2-(2-(2-(2-(2-methoxyethoxy)-ethoxy)-ethoxy)-ethoxy)-ethoxy) p-toluene sulfonate (11.8 g).

Reference Example 11

Synthesis of 2,7-dibromo-9,9-bis[3-ethoxycarbonyl-4-[2-(2-(2-(2-(2-(2-methoxyethoxy)-ethoxy)-ethoxy)-ethoxy)-ethoxy)ethoxy]phenyl]-fluorene (compound C)

2,7-Dibromo-9-fluorenone (127.2 g), ethyl salicylate (375.2 g), and mercaptoacetic acid (3.5 g) were charged into a 300 mL flask, and the flask was purged with nitrogen. Thereto, methanesulfonic acid (1,420 mL) was added, and the resultant reaction mixture was stirred at 75° C. all night. The reaction mixture was left to be cooled down and was charged into ice water, and the resultant reaction mixture was stirred for 1 hour. A generated solid was filtered, and the solid was washed with heated acetonitrile. The washed solid was dissolved in acetone, and from the resultant acetone solution, a solid was recrystallized and was filtered, thus obtaining a solid (167.8 g). The obtained solid (5 g), 2-(2-(2-(2-(2-(2-methoxyethoxy)-ethoxy)-ethoxy)-ethoxy)-ethoxy) p-toluene sulfonate (10.4 g), potassium carbonate (5.3 g), and 18-crown-6 (0.6 g) were dissolved in N,N-dimethylformamide (DMF) (100 mL), and the resultant reaction solution was transferred into a flask and was stirred at 105° C. for 4 hours. The resultant reaction mixture was left to be cooled down to room temperature and was charged into ice water, and the resultant reaction mixture was stirred for 1 hour. To the reaction solution, chloroform (300 mL) was added to subject the resultant reaction mixture to phase-separation extraction, and the resultant solution was concentrated. The concentrate was dissolved in ethyl acetate, and the resultant solution was passed through an alumina column, followed by concentrating the solution, thus obtaining 2,7-dibromo-9,9-bis[3-ethoxycarbonyl-4-[2-(2-(2-(2-(2-(2-methoxyethoxy)-ethoxy)-ethoxy)-ethoxy)-ethoxy]phenyl]-fluorene (compound C) (4.5 g).

[Chem. 81]

Compound C

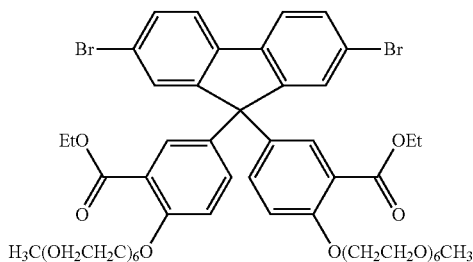

Reference Example 12

Synthesis of Polymer G

In an inert atmosphere, the compound C (1.0 g), 4-t-butylphenyl bromide (0.9 mg), 2,2'-bipyridine (0.3 g), and dehydrated tetrahydrofuran (50 mL) were charged into a 200 mL flask and were mixed. The temperature of the resultant reaction mixture was elevated to 55° C., and thereto, bis(1,5-cyclooctadiene)nickel (0.6 g) was added, followed by stirring the resultant reaction mixture at 55° C. for 5 hours. The reaction mixture was cooled down to room temperature, and the reaction solution was added dropwise into a solution mixture of methanol (200 mL) and a 1N diluted hydrochloric acid (200 mL). A generated precipitate was collected by filtering and was re-dissolved in tetrahydrofuran. The resultant reaction solution was added dropwise into a solution mixture of methanol (200 mL) and a 15% ammonia water (100 mL), and a generated precipitate was collected by filtering. The precipitate was re-dissolved in tetrahydrofuran, and the resultant reaction solution was added dropwise into a solution mixture of methanol (200 mL) and water (100 mL), followed by collecting a generated precipitate by filtering. The collected precipitate was dried under reduced pressure, thus obtaining a polymer G (360 mg).

The number average molecular weight in terms of polystyrene of the polymer G was $6.0 \times 10^4$. The polymer G contains a repeating unit represented by Formula (P).

[Chem. 82]

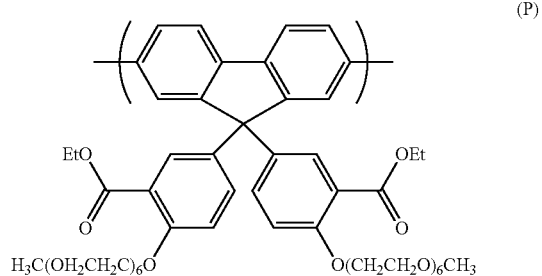

(P)

Experiment Example 10

Synthesis of Cesium Salt of Polymer G

The polymer G (150 mg) was charged into a 100 mL flask, and the flask was purged with nitrogen. Tetrahydrofuran (15 mL) and methanol (5 mL) were mixed with the polymer G. To the resultant solution mixture, an aqueous solution prepared by dissolving cesium hydroxide (170 mg) in water (2 mL) was added, and the resultant reaction mixture was stirred at 65° C. for 6 hours. The reaction mixture was cooled down to room temperature, and therefrom, the reaction solvent was distilled off under reduced pressure. A generated solid was washed with water and was dried under reduced pressure, thus obtaining a light yellow solid (95 mg). In an NMR spectrum of the solid, it was confirmed that a signal ascribed to an ethyl group in an ethyl ester moiety in the polymer G disappeared completely. The obtained cesium salt of the polymer G is called a conjugated macromolecular compound 10. The conjugated macromolecular compound 10 contains a repeating unit represented by Formula (Q) ("the ratio of a repeating unit containing one or more group(s) selected from the group consisting of the group represented by Formula (1) and the group represented by Formula (2) and one or more group(s) represented by Formula (3) in all repeating units" and "the ratio of the repeating units represented by Formulae (13), (15), (17), and (20) in all repeating units" are 100% by mole). The orbital energy of HOMO and the orbital energy of LUMO of the conjugated macromolecular compound 10 were −5.7 eV and −2.9 eV, respectively.

[Chem. 83]

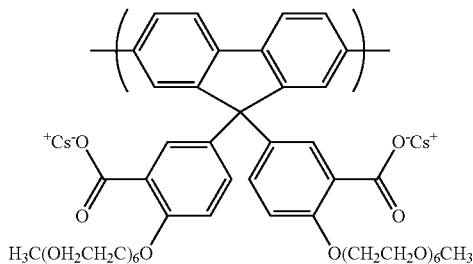

(Q)

Reference Example 13

Synthesis of 1,3-dibromo-5-ethoxycarbonyl-6-[2-[2-(2-methoxyethoxy)ethoxy]ethoxy]benzene In an inert atmosphere, 3,5-dibromosalicylic acid (20 g), ethanol (17 mL), concentrated sulfuric acid (1.5 mL), and toluene (7 mL) were mixed, and the resultant reaction mixture was heated and stirred at 130° C. for 20 hours. The reaction mixture was left to be cooled down, and the reaction solution was charged into ice water (100 mL). The resultant reaction mixture was subjected to phase-separation extraction with chloroform, and the solution was concentrated. The resultant solid was dissolved in isopropanol, and the resultant reaction solution was added dropwise into distilled water. A resultant deposit was filtered, thus obtaining a solid (18 g). In an inert atmosphere, the obtained solid (1 g), 2-[2-(2-methoxyethoxy)ethoxy]-p-toluene sulfonate (1.5 g), potassium carbonate (0.7 g), and DMF (15 mL) were mixed, and the resultant reaction mixture was heated and stirred at 100° C. for 4 hours. The reaction mixture was left to be cooled down, and thereto, chloroform was added to subject the resultant reaction mixture to phase-separation extraction. The solution was concentrated. The concentrate was dissolved in chloroform, and the resultant solution was passed through a silica gel column to purify the solution. The solution was concentrated, thus obtaining 1,3-dibromo-5-ethoxycarbonyl-6-[2-[2-(2-methoxyethoxy)ethoxy]ethoxy]benzene (1.0 g).

Reference Example 14

Synthesis of Polymer H

In an inert atmosphere, the compound A (0.2 g), the compound B (0.5 g), 1,3-dibromo-5-ethoxycarbonyl-6-[2-[2-(2-methoxyethoxy)ethoxy]ethoxy]benzene (0.1 g), (triphenylphosphine)palladium (30 mg), tetrabutylammonium bromide (4 mg), and toluene (19 mL) were mixed, and the resultant reaction mixture was heated to 105° C. Into the reaction solution, a 2 mol/L sodium carbonate aqueous solution (5 mL) was added dropwise, and the resultant reaction mixture was refluxed for 5 hours. To the reaction solution, phenylboronic acid (6 mg) was added, and the resultant reaction mixture was refluxed for 14 hours. Next, to the reaction mixture, a sodium diethyldithiocarbamate aqueous solution (10 mL, concentration: 0.05 g/mL) was added, and the resultant reaction mixture was stirred for 2 hours. The aqueous phase was removed, and the organic phase was washed with distilled water and was concentrated, thus obtaining a solid. The obtained solid was dissolved in chloroform, and the resultant solution was passed through an alumina column and a silica gel column to purify the solution. The eluate from the column was concentrated and dried. The yield of the obtained polymer H was 0.44 g.

The number average molecular weight in terms of polystyrene of the polymer H was $3.6 \times 10^4$. The polymer H contains a repeating unit represented by Formula (R).

[Chem. 84]

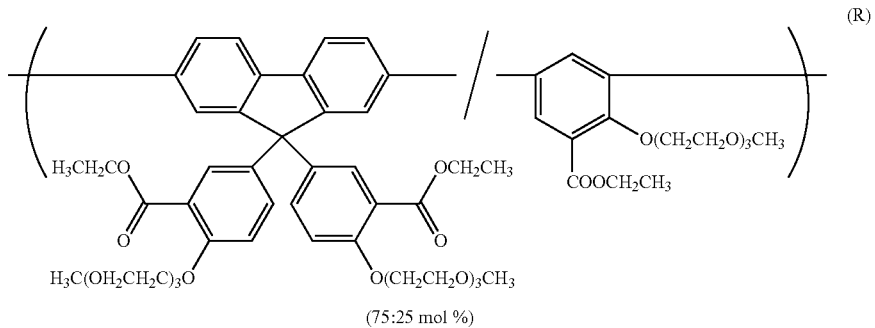

(R)

(75:25 mol %)

Experiment Example 11

Synthesis of Cesium Salt of Polymer H

The polymer H (200 mg) was charged into a 100 mL flask, and the flask was purged with nitrogen. Thereto, tetrahydrofuran (14 mL) and methanol (7 mL) were added, and the resultant reaction mixture was mixed. To the solution mixture, an aqueous solution prepared by dissolving cesium hydroxide (90 mg) in water (1 mL) was added, and the resultant reaction mixture was stirred at 65° C. for 1 hour. To the reaction solution, 5 mL of methanol was added and further, the resultant reaction mixture was stirred at 65° C. for 4 hours. The reaction mixture was cooled down to room temperature, and therefrom, the reaction solvent was distilled off under reduced pressure. A generated solid was washed with water and was dried under reduced pressure, thus obtaining a light yellow solid (190 mg). In an NMR spectrum of the solid, it was confirmed that a signal ascribed to an ethyl group in an ethyl ester moiety in the polymer H disappeared completely. The obtained cesium salt of the polymer H is called a conjugated macromolecular compound 11. The conjugated macromolecular compound 11 contains a repeating unit represented by Formula (S) ("the ratio of a repeating unit containing one or more group(s) selected from the group consisting of the group represented by Formula (1) and the group represented by Formula (2) and one or more group(s) represented by Formula (3) in all repeating units" and "the ratio of the repeating units represented by Formulae (13), (15), (17), and (20) in all repeating units" are 100% by mole). The orbital energy of HOMO and the orbital energy of LUMO of the conjugated macromolecular compound 11 were −5.6 eV and −2.8 eV, respectively.

ration extraction, and the resultant solution was concentrated. The concentrate was dissolved in a solvent mixture of chloroform/methanol (50/1 (volume ratio)), and the resultant solution was passed through a silica gel column to purify the solution. The solution passed through the column was concentrated, thus obtaining 2,7-dibromo-9,9-bis[3,4-bis[2-[2-(2-methoxyethoxy)ethoxy]ethoxy]-5-methoxycarbonylphenyl]fluorene (compound D) (20.5 g).

Reference Example 16

Synthesis of 2,7-bis[7-(4-methylphenyl)-9,9-dioctylfluoren-2-yl]-9,9-bis[5-methoxycarbonyl-3,4-bis[2-[2-(2-methoxyethoxy)ethoxy]ethoxy]phenyl]-fluorene (polymer I)

In an inert atmosphere, the compound D (0.70 g), 2-(4,4,5,5-tetramethyl-1,2,3-dioxaboran-2-yl)-9,9-dioctyl fluorene

[Chem. 85]

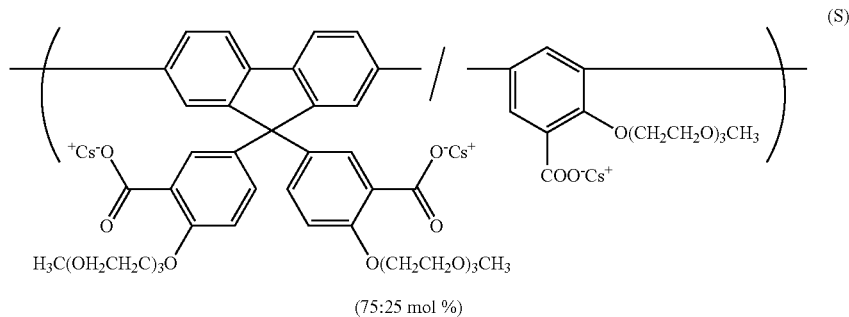

(75:25 mol %)

Reference Example 15

Synthesis of 2,7-dibromo-9,9-bis[3,4-bis[2-[2-(2-methoxyethoxy)ethoxy]ethoxy]-5-methoxycarbonylphenyl]fluorene (compound D)

2,7-Dibromo-9-fluorenone (34.1 g), methyl 2,3-dihydroxybenzoate (101.3 g), and mercaptoacetic acid (1.4 g) were charged into a 500 mL flask, and the flask was purged with nitrogen. Thereto, methanesulfonic acid (350 mL) was added, and the resultant reaction mixture was stirred at 90° C. for 19 hours. The reaction mixture was left to be cooled down and was charged into ice water, and the resultant reaction mixture was stirred for 1 hour. A generated solid was filtered, and the solid was washed with heated acetonitrile. The washed solid was dissolved in acetone, and from the resultant acetone solution, a solid was recrystallized and was filtered. Thus obtained solid (16.3 g), 2-[2-(2-methoxyethoxy)ethoxy]-p-toluene sulfonate (60.3 g), potassium carbonate (48.6 g), and 18-crown-6 (2.4 g) were dissolved in N,N-dimethylformamide (DMF) (500 mL), and the resultant reaction solution was transferred into a flask and was stirred at 110° C. for 15 hours. The resultant reaction mixture was left to be cooled down to room temperature and was charged into ice water, and the resultant reaction mixture was stirred for 1 hour. To the reaction solution, ethyl acetate (300 mL) was added to subject the resultant reaction mixture to phase-separation extraction, and (0.62 g), (triphenylphosphine)palladium (0.019 g), dioxane (40 mL), water (6 mL), and a potassium carbonate aqueous solution (1.38 g) were mixed, and the resultant reaction mixture was heated to 80° C. The reaction solution was subjected to a reaction for 1 hour. After the completion of the reaction, to the reaction mixture, 5 mL of saturated sodium diethyldithiocarbamate aqueous solution was added. The resultant reaction mixture was stirred for 30 minutes, and therefrom, the organic solvent was removed. The resultant solid was passed through an alumina column (eluent:hexane:ethyl acetate=1:1 (volume ratio)) to purify the solution. The resultant solution was concentrated, thus obtaining 660 mg of 2,7-bis[7-(4-methylphenyl)-9,9-dioctylfluoren-2-yl]-9,9-bis[5-methoxycarbonyl-3,4-bis[2-[2-(2-methoxyethoxy)ethoxy]ethoxy]phenyl]-fluorene (polymer I).

The number average molecular weight in terms of polystyrene of the polymer I was $2.0 \times 10^3$. The polymer I is represented by Formula (T). 2-(4,4,5,5-tetramethyl-1,2,3-dioxaboran-2-yl)-9,9-dioctyl fluorene can be synthesized, for example, by a method described in "The Journal of Physical Chemistry B 2000, 104, 9118-9125."

[Chem. 86]

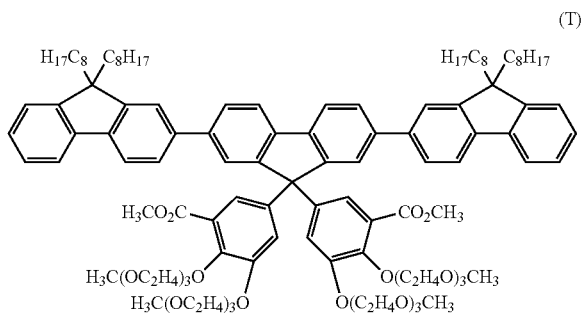

(T)

Experiment Example 12

Synthesis of Cesium Salt of Polymer I

The polymer I (236 mg) was charged into a 100 mL flask, and the flask was purged with argon. Thereto, tetrahydrofuran (20 mL) and methanol (10 mL) were added, and the temperature of the resultant reaction mixture was elevated to 65° C. Thereto, an aqueous solution prepared by dissolving cesium hydroxide (240 mg) in water (2 mL) was added, and the resultant reaction mixture was stirred at 65° C. for 7 hours. The resultant reaction mixture was cooled down to room temperature, and therefrom, the reaction solvent was distilled off under reduced pressure. A generated solid was washed with water and was dried under reduced pressure, thus obtaining a light yellow solid (190 mg). In an NMR spectrum of the solid, it was confirmed that a signal ascribed to an ethyl group in the ethyl ester moiety disappeared completely. The obtained cesium salt of the polymer I is called a conjugated macromolecular compound 12. The conjugated macromolecular compound 12 is represented by Formula (U) ("the ratio of a repeating unit containing one or more group(s) selected from the group consisting of the group represented by Formula (1) and the group represented by Formula (2) and one or more group(s) represented by Formula (3) in all repeating units" and "the ratio of the repeating units represented by Formulae (13), (15), (17), and (20) in all repeating units" are 33.3% by mole by rounding off to one decimal place). The orbital energy of HOMO and the orbital energy of LUMO of the conjugated macromolecular compound 12 were −5.6 eV and −2.8 eV, respectively.

[Chem. 87]

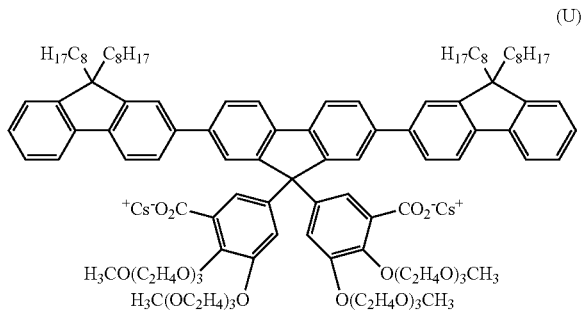

(U)

Reference Example 17

Synthesis of Compound E

In a nitrogen atmosphere, 2,7-dibromo-9-fluorenone (92.0 g, 272 mmol) and diethyl ether (3.7 L) were mixed, and the resultant reaction mixture was cooled down to 0° C. Into the reaction mixture, a 1 mol/L methylmagnesium iodide-diethyl ether solution (0.5 L, 545 mmol) was added dropwise, and the resultant reaction mixture was stirred for 3 hours. To the reaction mixture, an ammonium chloride aqueous solution was added, and the aqueous phase was removed. The organic phase was dried over sodium sulfate anhydride and was concentrated under reduced pressure. The resultant crude product was purified by silica gel column chromatography, thus obtaining a compound E (92.81 g, 262 mmol, yield: 96%) represented by the formula below.

[Chem. 88]

Compound E

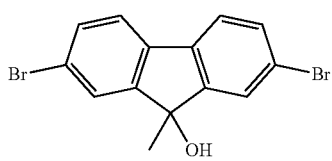

Synthesis of Compound F

In a nitrogen atmosphere, the compound E (83.0 g, 234 mmol), p-toluenesulfonic acid monohydrate (4.49 g, 23.6 mmol), and chloroform (2.5 L) were mixed and refluxed for 1 hour. To the reaction mixture, an ammonium chloride aqueous solution was added, and the aqueous phase was removed. The organic phase was dried over sodium sulfate anhydride and was concentrated under reduced pressure, thus obtaining a compound F (73.6 g, 219 mmol, yield: 93%) represented by the formula below.

[Chem. 89]

Compound F

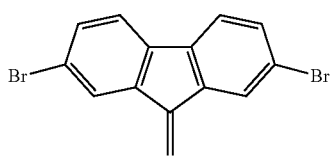

Synthesis of Compound G

In a nitrogen atmosphere, the compound F (70.0 g, 208 mmol), ethyl salicylate (104 g, 625 mmol), mercaptoacetic acid (4.20 g, 45.6 mmol), and methanesulfonic acid (1214 g) were mixed and stirred at 70° C. for 8 hours. The resultant reaction mixture was added dropwise into ice water, and a deposited solid was filtered to be recovered, followed by washing the solid with methanol. The resultant crude product was purified by silica gel column chromatography, thus obtaining a compound G (52.14 g, 104 mmol, yield: 50%) represented by the formula below.

[Chem. 90]

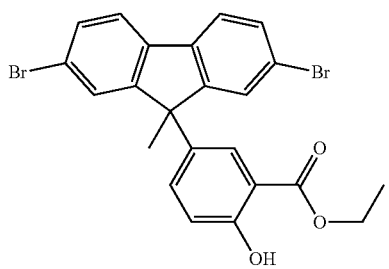

Compound G

Synthesis of Compound H

In a nitrogen atmosphere, the compound G (41.2 g, 82.0 mmol), 2-[2-(2-methoxyethoxy)ethoxy]-ethyl-p-toluene sulfonate (75.8 g, 238 mmol), dimethylformamide (214 g), potassium carbonate (54.4 g, 394 mmol), and 18-crown-6 (4.68 g, 18 mmol) were mixed and stirred at 105° C. for 2 hours. The resultant reaction mixture was charged into water, and the reaction mixture was extracted with ethyl acetate. The resultant organic phase was dried over sodium sulfate anhydride and was concentrated under reduced pressure. The resultant crude product was purified by silica gel column chromatography, thus obtaining a compound H (40.2 g, 62.0 mmol, yield: 76%) represented by the formula below. A result of $^1$H NMR conducted for the obtained compound H is shown below.

$^1$H NMR (400 MHz, CDCl$_3$, rt)

δ (ppm) 1.37 (3H), 1.84 (3H), 3.36 (3H), 3.53 (2H), 3.58-3.79 (6H), 3.73 (2H), 4.12 (2H), 4.34 (2H), 6.80 (1H), 6.90 (1H), 7.28 (2H), 7.48 (2H), 7.58 (2H), 7.70 (1H).

[Chem. 91]

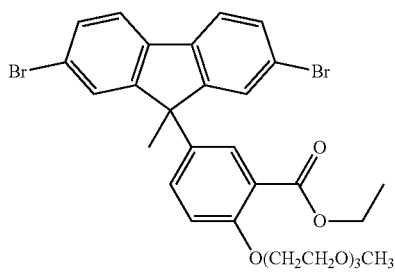

Compound H

Synthesis of Compound I

In a nitrogen atmosphere, the compound H (28.4 g, 43.8 mmol), bis(pinacolato)diboron (24.30 g, 95.7 mol), [1,1'-bis(diphenylphosphino)ferrocene]palladium (II) dichloride dichloromethane adduct (0.35 g, 0.4 mmol), 1,1'-bis(diphenylphosphino)ferrocene (0.24 g, 0.4 mmol), potassium acetate (25.60 g, 260 mmol), and 1,4-dioxane (480 mL) were mixed and stirred at 120° C. for 17 hours. The resultant reaction mixture was filtered and was washed with ethyl acetate. The resultant filtrate was concentrated under reduced pressure, was purified by silica gel column chromatography, and next was recrystallized to be purified, thus obtaining a compound I (18.22 g, 24.5 mmol, yield: 56%) represented by the formula below. A result of $^1$H NMR conducted for the obtained compound I is shown below.

$^1$H NMR (400 MHz, CDCl$_3$, rt)

δ (ppm) 1.30-1.47 (27H), 1.88 (3H), 3.35 (3H), 3.53 (2H), 3.60-3.69 (4H), 3.73 (2H), 3.84 (2H), 4.10 (2H), 4.34 (2H), 6.74 (1H), 6.87 (1H), 7.58 (2H), 7.72-7.89 (5H).

[Chem. 92]

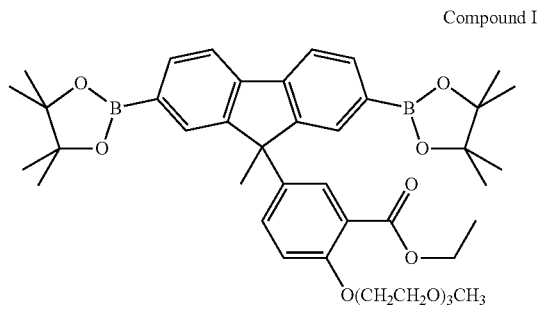

Compound I

Synthesis of Polymer J

In an argon atmosphere, the compound H (0.47 g), the compound I (0.48 g), dichlorobis(triphenylphosphine) palladium (0.6 mg), tetrabutylammonium bromide (6 mg), toluene (6 mL), and a 2 mol/L sodium carbonate aqueous solution (2 mL) were mixed and stirred at 105° C. for 6 hours. Next, phenylboronic acid (35 mg) was added, and the resultant reaction mixture was stirred at 105° C. for 14 hours. To the reaction mixture, sodium diethyldithiocarbamate trihydrate (0.65 g) and water (13 mL) were added, and the resultant reaction mixture was stirred at 80° C. for 2 hours. The resultant reaction mixture was added dropwise into methanol, and the deposit was filtered to be recovered, followed by drying the recovered deposit. The resultant solid was dissolved in chloroform and was purified by alumina column chromatography and silica gel column chromatography. The resultant eluate was added dropwise into methanol, and the deposit was filtered to be recovered. The recovered deposit was dried, thus obtaining a polymer J (0.57 g).

The number average molecular weight in terms of polystyrene of the polymer J was 2.0×10$^4$. The polymer J contains a structural unit represented by Formula (V).

[Chem. 93]

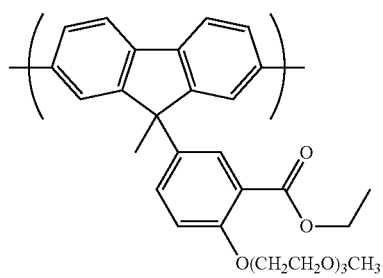

(V)

Experiment Example 13

Synthesis of Cesium Salt of Polymer J

In an argon atmosphere, the polymer J (0.20 g), THF (18 mL), methanol (9 mL), cesium hydroxide monohydrate (97 mg), and water (1 mL) were mixed and stirred at 65° C. for 2 hours. Next, methanol (52 mL) was added, and the resultant reaction mixture was stirred at 65° C. for 6 hours. The reaction mixture was concentrated and dried. To the resultant solid, methanol was added, and the resultant reaction mixture was filtered, followed by dropping the filtrate into isopropanol. The solid was filtered to be recovered and was dried, thus obtaining the cesium salt of the polymer J (0.20 g). The obtained cesium salt of the polymer J is called a conjugated macromolecular compound 13. The conjugated macromolecular compound 13 contains a structural unit represented by Formula (W).

[Chem. 94]

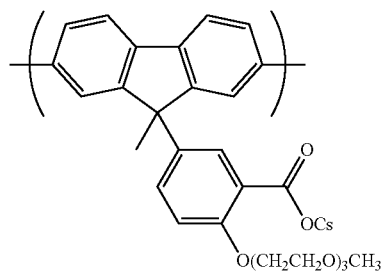

(W)

The orbital energy of HOMO and the orbital energy of LUMO of the conjugated macromolecular compound 13 were −5.51 eV and −2.64 eV, respectively.

Reference Example 18

Synthesis of Compound J

In a nitrogen stream, 2,7-dibromo-9,9-bis(3,4-dihydroxy)-fluorene (138.4 g), 2-[2-(2-methoxyethoxy)ethoxy]-ethyl-p-toluene sulfonate (408.6 g), potassium carbonate (358.5 g), and acetonitrile (2.5 L) were mixed, and the resultant reaction mixture was heated and refluxed for 3 hours. The reaction mixture was left to be cooled down and was filtered. The resultant filtrate was concentrated under reduced pressure and was purified by silica gel column chromatography, thus obtaining a compound J (109.4 g) represented by the formula below.

[Chem. 95]

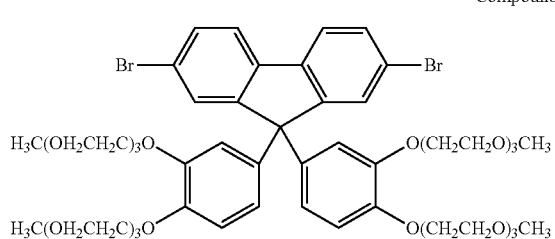

Compound J

Synthesis of Compound K

In a nitrogen atmosphere, the compound J (101.2 g), bis(pinacolato)diboron (53.1 g), [1,1'-bis(diphenylphosphino)ferrocene]dichloropalladium (II) dichloromethane complex (3.7 g), 1,1'-bis(diphenylphosphino)ferrocene (5.4 g), potassium acetate (90.6 g), and dioxane (900 mL) were mixed, and the resultant reaction mixture was heated to 110° C. and was heated and refluxed for 8 hours. The reaction solution was left to be cooled down and was filtered. The resultant filtrate was concentrated under reduced pressure and was purified by silica gel column chromatography, thus obtaining a compound K (51.4 g).

[Chem. 96]

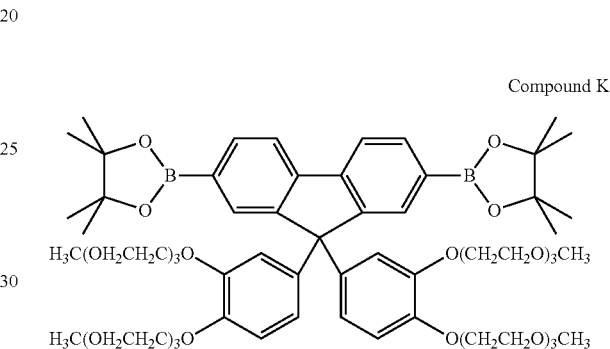

Compound K

Synthesis of Polymer K

The compound K (0.715 g), the compound J (0.426 g), aliquot 336 (6.60 mg), bis(triphenylphosphine)dichloropalladium (0.460 mg), a 2 mol/L sodium carbonate aqueous solution (10 mL), and toluene (20 mL) were mixed, and the resultant reaction mixture was stirred at 105° C. To the resultant reaction mixture, toluene (20 mL) was added and the reaction mixture was further stirred at 105° C. for 5 hours. Next, phenylboronic acid (32 mg) was added thereto, and the resultant reaction mixture was stirred at 105° C. for 6 hours. Subsequently, to the reaction mixture, sodium diethyldithiocarbamate trihydrate (0.72 g) and water (14 mL) were added, and the resultant reaction mixture was stirred at 80° C. for 2 hours. The resultant reaction mixture was added dropwise into methanol, and the deposit was filtered to be recovered, followed by drying the recovered deposit. The resultant solid was dissolved in chloroform and was purified by alumina column chromatography and silica gel column chromatography. The resultant eluate was concentrated and dried. The concentrate was dissolved in toluene, and the resultant solution was added dropwise into methanol. The resultant deposit was filtered to be recovered. The recovered deposit was dried, thus obtaining a polymer K (0.55 g).

The number average molecular weight in terms of polystyrene of the polymer K was $2.3 \times 10^4$. The polymer K contains a structural unit represented by Formula (X).

[Chem. 97]

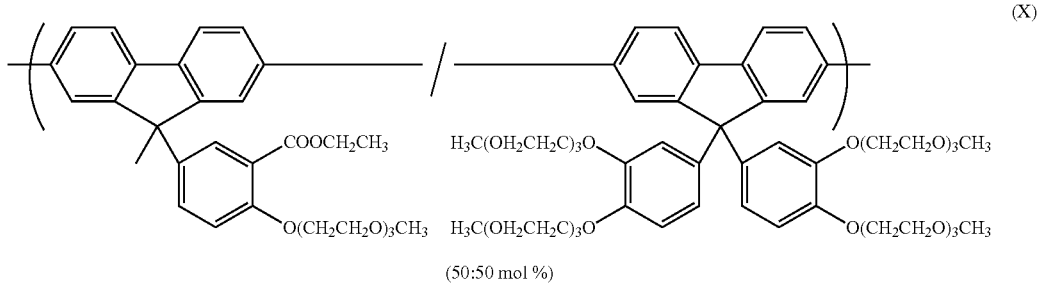

(50:50 mol %)

Experiment Example 14

Synthesis of Cesium Salt of Polymer K

In an argon atmosphere, the polymer K (0.15 g), THF (20 mL), methanol (10 mL), cesium hydroxide monohydrate (103 mg), and water (1 mL) were mixed and stirred at 65° C. for 2 hours. Next, methanol (20 mL) was added to the resultant mixture, and the resultant reaction mixture was stirred at 65° C. for 2 hours. The reaction mixture was concentrated and dried. To the resultant solid, methanol was added, and the resultant reaction mixture was filtered. The resultant filtrate was concentrated and was dried. The resultant solid was washed with water and was dried, thus obtaining the cesium salt of the polymer K (0.14 g). The obtained cesium salt of the polymer K is called a conjugated macromolecular compound 14. The conjugated macromolecular compound 14 contains a structural unit represented by Formula (Y).

[Chem. 98]

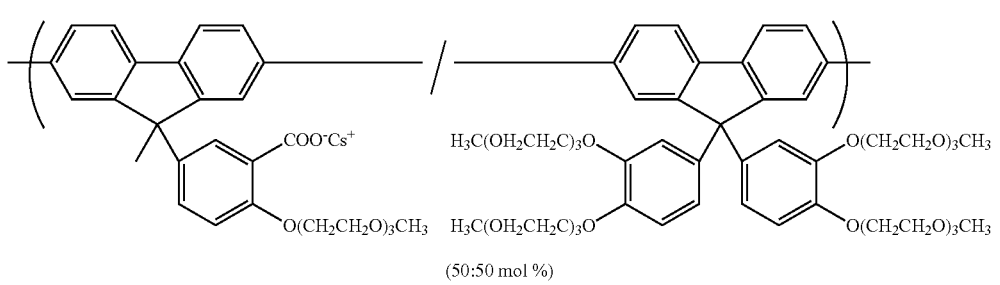

(50:50 mol %)

The orbital energy of HOMO and the orbital energy of LUMO of the conjugated macromolecular compound 14 were −5.56 eV and −2.67 eV, respectively.

Reference Example 19

Synthesis of Compound L

In a nitrogen atmosphere, 5-bromo-2-hydroxybenzoic acid (92.85 g), ethanol (1,140 mL), and concentrated sulfuric acid (45 mL) were mixed, and the mixture was refluxed for 48 hours and concentrated under reduced pressure. To the resultant concentrate, ethyl acetate (1,000 mL) was added. The resultant organic phase was washed with water and a 10% by weight sodium carbonate aqueous solution. The resultant organic phase was dried over sodium sulfate anhydride and was concentrated under reduced pressure. The resultant crude product was purified by silica gel column chromatography, thus obtaining a compound L (95.38 g, yield: 91%) represented by the formula below.

[Chem. 99]

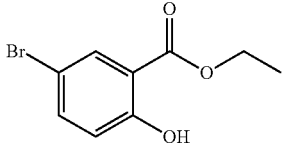

Compound L

Synthesis of Compound M

In a nitrogen atmosphere, the compound L (95.0 g), bis (pinacolato)diboron (108.5 g), [1,1'-bis(diphenylphosphino) ferrocene]palladium (II) dichloride dichloromethane adduct (3.3 g), 1,1'-bis(diphenylphosphino)ferrocene (2.2 g), potassium acetate (117.2 g), and 1,4-dioxane (1.3 L) were mixed and stirred at 105° C. for 22 hours. The reaction mixture was filtered and was washed with dioxane and toluene. The filtrate was concentrated under reduced pressure, and thereto, ethyl acetate was added. The resultant reaction mixture was washed with saturated saline, and the resultant organic phase was dried over sodium sulfate anhydride and was concentrated under reduced pressure. The resultant crude product was puri fied by silica gel column chromatography, thus obtaining a compound M (90.1 g, 308 mmol) represented by the formula below.

[Chem. 100]

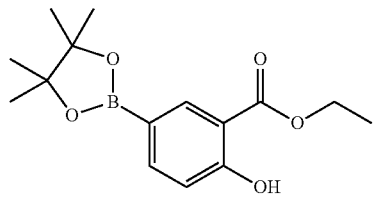

Compound M

Synthesis of Compound N

In a nitrogen atmosphere, 1,5-dihydroxynaphthalene (15.0 g), triethylamine (28.5 g), and chloroform (150 mL) were mixed, and the resultant reaction mixture was cooled down to 0° C. Into the reaction mixture, trifluoromethanesulfonic acid anhydride (68.7 g) was added dropwise, and the resultant reaction mixture was stirred for 1 hour. To the reaction mixture, water and chloroform were added, and the aqueous phase was removed. The organic phase was washed with water, was dried over sodium sulfate anhydride, and was concentrated under reduced pressure. The resultant solid was recrystallized to be purified, thus obtaining a compound N (31.46 g) represented by the formula below. In the formula below, Tf represents a trifluoromethylsulfonyl group.

[Chem. 101]

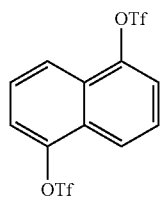

Compound N

Synthesis of Compound O

In a nitrogen atmosphere, the compound N (16.90 g), the compound M (23.30 g), tetrakis(triphenylphosphine)palladium (0) (4.60 g), potassium phosphate (42.30 g), and 1,2-dimethoxyethane (340 mL) were mixed, and the resultant reaction mixture was stirred at 80° C. for 14 hours. The resultant reaction mixture was filtered, and was washed with chloroform and methanol. The filtrate was concentrated under reduced pressure and was purified by silica gel column chromatography, thus obtaining a compound O (8.85 g) represented by the formula below.

[Chem. 102]

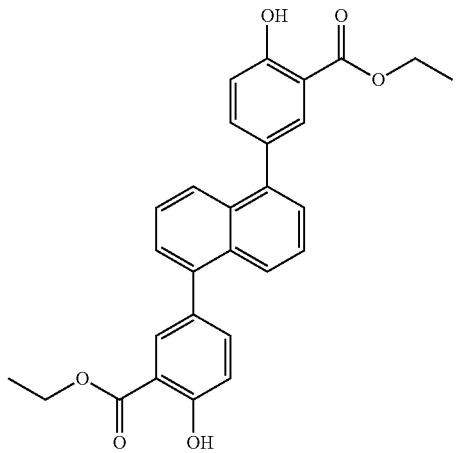

Compound O

Synthesis of Compound P

In a nitrogen atmosphere, the compound O (8.80 g), 2-[2-(2-methoxyethoxy)ethoxy]-ethyl-p-toluene sulfonate (12.52 g), dimethylformamide (380 mL), potassium carbonate (13.32 g), and 18-crown-6 (1.02 g) were mixed and stirred at 100° C. for 23 hours. The resultant reaction mixture was charged into water, and the resultant reaction mixture was extracted with ethyl acetate. The resultant organic phase was washed with a sodium chloride aqueous solution, was dried over sodium sulfate anhydride, and was concentrated under reduced pressure. The resultant crude product was purified by silica gel column chromatography, thus obtaining a compound P (7.38 g) represented by the formula below.

[Chem. 103]

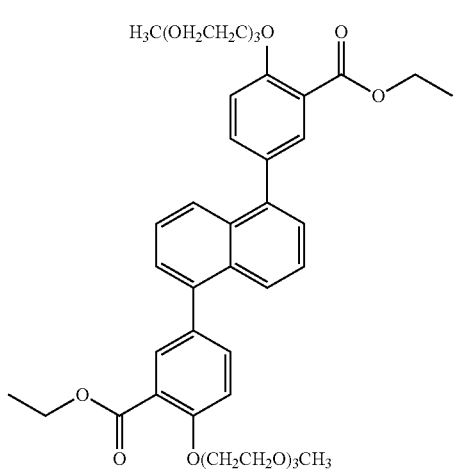

Compound P

Synthesis of Compound Q

In a nitrogen atmosphere, the compound P (5.53 g), bis(pinacolato)diboron (11.25 g), (1,5-cyclooctadiene)(methoxy) iridium (I) dimer (0.15 g, manufactured by Sigma-Aldrich Co.), 4,4'-di-tert-butyl-2,2'-dipyridyl (0.12 g, manufactured by Sigma-Aldrich Co.), and 1,4-dioxane (300 mL) were mixed, and the resultant reaction mixture was stirred at 110° C. for 19 hours. The reaction mixture was concentrated under reduced pressure. The resultant crude product was purified by silica gel column chromatography and next, was purified by recrystallization, thus obtaining a compound Q (5.81 g) represented by the formula below. A result of $^1$H NMR conducted for the obtained compound Q is shown below.

$^1$H NMR (400 MHz, CDCl$_3$, rt)

δ (ppm) 1.27-1.41 (30H), 3.39 (6H), 3.57 (4H), 3.66-3.75 (8H), 3.83 (4H), 3.99 (4H), 4.27-4.42 (8H), 7.13 (2H), 7.60 (2H), 7.76 (2H), 7.93 (2H), 8.30 (2H).

[Chem. 104]

Compound Q

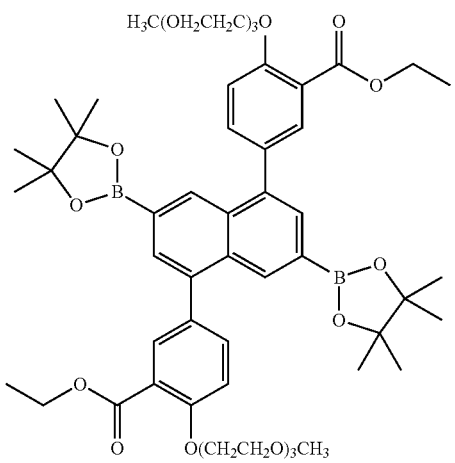

Synthesis of Polymer L

In an argon atmosphere, the compound J (0.53 g), the compound Q (0.43 g), dichlorobis(triphenylphosphine)palladium (0.3 mg), Aliquat 336 (5 mg, manufactured by Sigma-Aldrich Co.), toluene (12 mL), and a 2 mol/L sodium carbonate aqueous solution (1 mL) were mixed and stirred at 105° C. for 9 hours. Phenylboronic acid (23 mg) was added to the resultant reaction mixture, and the resultant reaction mixture was stirred at 105° C. for 14 hours. To the reaction mixture, sodium diethyldithiocarbamate trihydrate (0.40 g) and water (8 mL) were added, and the resultant reaction mixture was stirred at 80° C. for 2 hours. The resultant reaction mixture was added dropwise into methanol, and the resultant deposit was filtered to be recovered and was dried. The resultant solid was dissolved in chloroform and was purified by alumina column chromatography and silica gel column chromatography, followed by dropping the resultant eluate into methanol. The deposit was filtered to be recovered and was dried, thus obtaining a polymer L (0.56 g).

The number average molecular weight in terms of polystyrene of the polymer L was 3.4×10$^4$. The polymer L contains a structural unit represented by Formula (Z) below.

[Chem. 105]

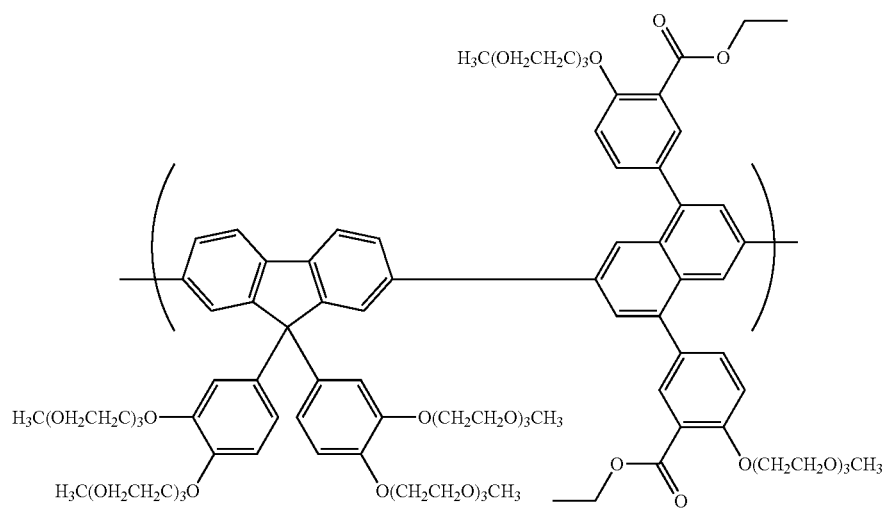

Experiment Example 15

Synthesis of Cesium Salt of Polymer L

In an argon atmosphere, the polymer L (0.25 g), THF (13 mL), methanol (6 mL), cesium hydroxide monohydrate (69 mg), and water (1 mL) were mixed and stirred at 65° C. for 6 hours. The resultant reaction mixture was concentrated, and the concentrate was added dropwise into isopropanol, followed by filtering the resultant solid to be recovered and drying the recovered solid. To the resultant solid, methanol was added, and the resultant reaction mixture was filtered. The resultant filtrate was added dropwise into isopropanol, and the deposited solid was filtered to be recovered, followed by drying the recovered solid, thus obtaining the cesium salt of the polymer L (0.19 g). The obtained cesium salt of the polymer L is called a conjugated macromolecular compound 15. The conjugated macromolecular compound 15 contains a structural unit represented by Formula (AA).

[Chem. 106]

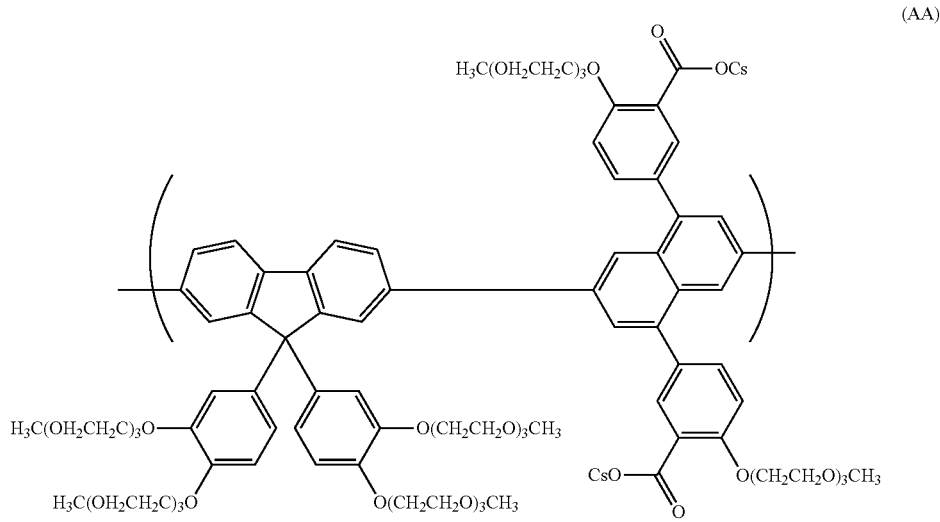

(AA)

The orbital energy of HOMO and the orbital energy of LUMO of the conjugated macromolecular compound 15 were −5.50 eV and −2.65 eV, respectively.

Experiment Example 16

Methanol and the conjugated macromolecular compound 1 were mixed to obtain a composition containing 0.2% by weight of the conjugated macromolecular compound 1. Onto an ITO cathode (film thickness: 45 nm) that was prepared by forming a film and patterning on the surface of a glass substrate, the composition was applied in air by the spin coating method, thus obtaining an applied film having a film thickness of 10 nm. The substrate having the applied film provided thereon was heated in an inert atmosphere (nitrogen atmosphere) under normal atmospheric pressure at 130° C. for 10 minutes to evaporate the solvent, and then the substrate was naturally cooled down to room temperature, thus obtaining the substrate on which an electron injection layer containing the conjugated macromolecular compound 1 was formed.

Next, a light-emitting macromolecular material (manufactured by Summation Co., Ltd.; "Lumation BP361") and xylene were mixed to obtain a composition for forming a light-emitting layer containing 1.4% by weight of a light-emitting macromolecular material. Onto the electron injection layer containing the thus obtained conjugated macromolecular compound 1, the composition for forming a light-emitting layer was applied in air by the spin coating method, thus obtaining an applied film having a film thickness of 80 nm. The substrate on which this applied film was provided was heated in an inert atmosphere (nitrogen atmosphere) at 130° C. for 15 minutes under normal atmospheric pressure to evaporate the solvent, and then the substrate was naturally cooled down to room temperature, thus obtaining the substrate on which a light-emitting layer was formed.

Next, onto the thus obtained light-emitting layer, a hole injection material solution was applied in air by the spin coating method, thus obtaining an applied film having a film thickness of 60 nm. The substrate on which this applied film was provided was heated in an inert atmosphere (nitrogen atmosphere) at 130° C. for 15 minutes under normal atmospheric pressure to evaporate the solvent, and then the substrate was naturally cooled down to room temperature, thus obtaining the substrate on which a hole injection layer was formed. For the hole injection material solution, a PEDOT:PSS solution (poly(3,4-ethylenedioxythiophene)-polystyrenesulfonic acid) (manufactured by Starck-V Tech Ltd.; trade name: "Baytron") was used.

The thus obtained substrate on which the hole injection layer was formed was inserted into a vacuum apparatus, and on the hole injection layer, an Au film was formed in a thickness of 80 nm by a vacuum deposition method to form an anode, thus manufacturing a stacked structure 1.

The thus obtained stacked structure 1 was taken out of the vacuum apparatus and was sealed with a sealing glass through a two-fluid mixing type epoxy resin in an inert gas atmosphere (nitrogen atmosphere), thus obtaining the organic EL element 1.

To the thus-obtained organic EL element 1, a forward voltage of 10 V was applied to measure the light-emitting brightness and the light-emitting efficiency. The measurement results are shown in Table 1.

TABLE 1

|  | Light-emitting brightness (cd/cm$^2$) | Light-emitting efficiency (cd/A) |
|---|---|---|
| Organic EL element 1 | 3580 | 3.1 |

Experiment Example 17

<Manufacture of Dual-Sided Emission-Type Organic EL Element>

By the same operation as in Experiment Example 16 except that the film thickness of Au was changed to 20 nm, a dual-sided emission type organic EL element 2 was obtained.

To the dual-sided emission type organic EL element 2, a forward voltage of 15 V was applied to measure the light-emitting brightness and the light-emitting efficiency. The measurement results are shown in Table 2.

TABLE 2

|  | Light-emitting brightness (cd/cm$^2$) | Light-emitting efficiency (cd/A) |
|---|---|---|
| Organic EL element 2 | Upper surface side: 1091<br>Lower surface side: 5341 | Upper surface side: 0.3<br>Lower surface side: 1.1 |

As shown in Tables 1 and 2, it was confirmed that an organic EL element in which the electron injection layer was made by forming a film with the ionic polymer in air by an application method could emit light.

<Manufacture of Organic EL Element>

Example 1

A glass substrate on which an ITO thin film was formed was prepared. The ITO thin film was formed by the sputtering method, having a thickness of 50 nm and corresponding to an anode. Onto the ITO thin film, a suspension of the macromolecular compound A was applied by the spin coating method to form an applied film for a hole injection layer having a film thickness of 60 nm. The thin film was dried on a hot plate at 170° C. for 15 minutes to form a hole injection layer. The hole injection layer was formed in an air atmosphere.

Next, the macromolecular compound B was dissolved in xylene in a concentration of 0.8% by weight to obtain a xylene solution of the macromolecular compound B. This xylene solution was applied onto the hole injection layer in air by the spin coating method, thus obtaining an applied film for a hole transport layer having a film thickness of 20 nm. Then, being retained in a nitrogen atmosphere where the oxygen concentration and the water concentration were each controlled to 10 ppm or less in the volume proportion at 180° C. for 60 minutes, the applied film was dried, thus obtaining a hole transport layer.

Next, the macromolecular compound C was dissolved in xylene in a concentration of 1.3% by weight to obtain a xylene solution of the macromolecular compound C. This xylene solution was applied onto the hole transport layer in air by the spin coating method, thus obtaining an applied film for a light-emitting layer having a thickness of 80 nm. Then, being retained in a nitrogen atmosphere under approximately normal atmospheric pressure where the oxygen concentration and the water concentration were each controlled to 10 ppm or less in the volume proportion at 170° C. for 10 minutes, the applied film was dried, thus obtaining a light-emitting layer.

Next, the conjugated macromolecular compound 1 was dissolved in methanol in a concentration of 0.2% by weight to obtain a methanol solution of the conjugated macromolecular compound 1. This methanol solution was applied onto the light-emitting layer in air by the spin coating method, thus obtaining an applied film for an electron injection layer having a film thickness of 6 nm. Then, by being retained in an air atmosphere at 130° C. for 10 minutes, the applied film was heated (the first heating).

The partially finished organic EL element after being subjected to the first heating was stored in air at room temperature for 90 minutes. Thereafter, being retained in an air atmosphere at 130° C. for 10 minutes, the applied film was heated (the second heating), thus obtaining an electron injection layer.

Subsequently, in a reduced-pressure state of $1.0 \times 10^{-4}$ Pa or less, aluminum was deposited in a thickness of about 100 nm as a cathode. After deposition, a glass substrate was laminated thereon thorough an adhesive member to provide sealing, thus manufacturing an organic EL element.

Example 2

In Example 2, an organic EL element was formed in a similar manner as Example 1 except that only the second heating condition was changed. In order to omit a redundant description, only the second heating condition will be described below.

The second heating was conducted by retaining in a nitrogen atmosphere under approximately normal atmospheric pressure where the oxygen concentration and the water concentration were each controlled to 10 ppm or less in the volume proportion at 130° C. for 10 minutes.

Example 3

In Example 3, an organic EL element was formed in a similar manner as Example 1 except that only the first heating condition was changed. In order to omit a redundant description, only the first heating condition will be described below.

The first heating was conducted by retaining in a nitrogen atmosphere under approximately normal atmospheric pressure where the oxygen concentration and the water concentration were each controlled to 10 ppm or less in the volume proportion at 130° C. for 10 minutes.

Example 4

In Example 4, an organic EL element was formed in a similar manner as Example 1 except that only the first heating condition and the second heating condition were changed. In order to omit a redundant description, only the first heating condition and the second heating condition will be described below.

The first heating was conducted by retaining in a nitrogen atmosphere under approximately normal atmospheric pressure where the oxygen concentration and the water concentration were each controlled to 10 ppm or less in the volume proportion at 130° C. for 10 minutes.

The second heating was conducted by retaining in a nitrogen atmosphere under approximately normal atmospheric pressure where the oxygen concentration and the water concentration were each controlled to 10 ppm or less in the volume proportion at 130° C. for 10 minutes.

Comparative Example 1

In Comparative Example 1, an organic EL element was formed in a similar manner as Example 1 except that the second heating was omitted. In other words, the first heating was conducted, followed by storing in air for 90 minutes, thus forming a cathode without conducting the second heating.

[Measurement of Half-Life of Brightness]

The half-life of brightness of the organic EL elements manufactured in Examples 1 to 4 and Comparative Example 1 was measured. Specifically, the time until the brightness became 50% of an initial brightness (half-life of brightness: LT50) when the organic EL elements were driven at constant current was measured. The initial brightness when the constant current driving is initiated was set to be 5,000 cd/m$^2$. The life ratio of the organic EL elements was calculated on the basis that the half-life of the brightness of the organic EL element manufactured in Comparative Example 1 was assumed to be 1.0. The measurement result is shown in Table 3.

TABLE 3

|  | First heating | Second heating | Life(LT50) ratio |
|---|---|---|---|
| Example 1 | In air atmosphere | In air atmosphere | 1.5 |
| Example 2 | In air atmosphere | In nitrogen atmosphere | 1.5 |
| Example 3 | In nitrogen atmosphere | In air atmosphere | 1.5 |
| Example 4 | In nitrogen atmosphere | In nitrogen atmosphere | 1.4 |
| Comparative Example 1 | In nitrogen atmosphere | — | 1.0 |

As shown in Table 3, by conducting the second hating, the half-life of brightness improved 1.5 times or 1.4 times as compared to the case where the second heating was not conducted. Furthermore, it was confirmed that even when the first heating and/or the second heating were conducted in air atmosphere, the half-life of brightness improved to the same extent as the case where the first heating and/or the second heating were conducted in the nitrogen atmosphere.

Example 5

A glass substrate on which an ITO thin film was formed was prepared. The ITO thin film was formed by the sputtering method, having a thickness of 50 nm and corresponding to an anode. Onto the ITO thin film, a suspension of the macromolecular compound A was applied by the spin coating method to form an applied film for a hole injection layer having a film thickness of 60 nm. The thin film was dried on a hot plate at 170° C. for 15 minutes to form a hole injection layer. The hole injection layer was formed in an air atmosphere.

Next, the macromolecular compound B was dissolved in xylene in a concentration of 0.8% by weight to obtain a xylene solution of the macromolecular compound B. This xylene solution was applied onto the hole injection layer in air by the spin coating method, thus obtaining an applied film for a hole transport layer having a film thickness of 20 nm. Then, being retained in a nitrogen atmosphere where the oxygen concentration and the water concentration were each controlled to 10 ppm or less in the volume proportion at 180° C. for 60 minutes, the applied film was dried, thus obtaining a hole transport layer.

Next, the macromolecular compound C was dissolved in xylene in a concentration of 1.3% by weight to obtain a xylene solution of the macromolecular compound C. This xylene solution was applied onto the hole transport layer in air by the spin coating method, thus obtaining an applied film for a light-emitting layer having a thickness of 80 nm. Then, being retained in a nitrogen atmosphere under approximately normal atmospheric pressure where the oxygen concentration and the water concentration were each controlled to 10 ppm or less in the volume proportion at 170° C. for 10 minutes, the applied film was dried, thus obtaining a light-emitting layer.

Next, the conjugated macromolecular compound 13 was dissolved in methanol in a concentration of 0.2% by weight to obtain a methanol solution of the conjugated macromolecular compound 13. This methanol solution was applied onto the light-emitting layer in air by the spin coating method, thus obtaining an applied film for an electron injection layer having a film thickness of 6 nm. Then, by being retained in an air atmosphere at 130° C. for 10 minutes, the applied film was heated (the first heating).

The partially finished organic EL element after being subjected to the first heating was stored in air at room temperature for 90 minutes. Thereafter, being retained in an air atmosphere at 130° C. for 10 minutes, the applied film was heated (the second heating), thus obtaining an electron injection layer.

Subsequently, in a reduced-pressure state of $1.0 \times 10^{-4}$ Pa or less, aluminum was deposited in a thickness of about 100 nm as a cathode. After deposition, a glass substrate was laminated thereon thorough an adhesive member to provide sealing, thus manufacturing an organic EL element.

Example 6

In Example 6, an organic EL element was formed in a similar manner as Example 5 except that only the second heating condition was changed. In order to omit a redundant description, only the second heating condition will be described below.

The second heating was conducted by retaining in a nitrogen atmosphere under approximately normal atmospheric pressure where the oxygen concentration and the water concentration were each controlled to 10 ppm or less in the volume proportion at 130° C. for 10 minutes.

Example 7

In Example 7, an organic EL element was formed in a similar manner as Example 5 except that only the first heating condition was changed. In order to omit a redundant description, only the first heating condition will be described below.

The first heating was conducted by retaining in a nitrogen atmosphere under approximately normal atmospheric pressure where the oxygen concentration and the water concentration were each controlled to 10 ppm or less in the volume proportion at 130° C. for 10 minutes.

Example 8

In Example 8, an organic EL element was formed in a similar manner as Example 5 except that only the first heating condition and the second heating condition were changed. In order to omit a redundant description, only the first heating condition and the second heating condition will be described below.

The first heating was conducted by retaining in a nitrogen atmosphere under approximately normal atmospheric pressure where the oxygen concentration and the water concentration were each controlled to 10 ppm or less in the volume proportion at 130° C. for 10 minutes.

The second heating was conducted by retaining in a nitrogen atmosphere under approximately normal atmospheric pressure where the oxygen concentration and the water concentration were each controlled to 10 ppm or less in the volume proportion at 130° C. for 10 minutes.

Comparative Example 2

In Comparative Example 2, an organic EL element was formed in a similar manner as Example 5 except that the second heating was omitted. In other words, the first heating was conducted, followed by storing in air for 90 minutes, thus forming a cathode without conducting the second heating.

[Measurement of Half-Life of Brightness]

The half-life of brightness of the organic EL elements manufactured in Examples 5 to 8 and Comparative Example 2 was measured. Specifically, the time until the brightness became 50% of an initial brightness (half-life of brightness: LT50) when the organic EL elements were driven at constant current was measured. The initial brightness when the constant current driving is initiated was set to be 5,000 cd/m². The life ratio of the organic EL elements was calculated on the basis that the half-life of the brightness of the organic EL element manufactured in Comparative Example 2 was assumed to be 1.0. The measurement result is shown in Table 4.

TABLE 4

|  | First heating | Second heating | Life (LT50) ratio |
|---|---|---|---|
| Example 5 | In air atmosphere | In air atmosphere | 1.3 |
| Example 6 | In air atmosphere | In nitrogen atmosphere | 1.3 |
| Example 7 | In nitrogen atmosphere | In air atmosphere | 1.2 |
| Example 8 | In nitrogen atmosphere | In nitrogen atmosphere | 1.4 |
| Comparative Example 2 | In nitrogen atmosphere | — | 1.0 |

As shown in Table 4, by conducting the second hating, the half-life of brightness improved 1.2 times to 1.4 times as compared to the case where the second heating was not conducted. Furthermore, it was confirmed that even when the first heating and/or the second heating were conducted in an air atmosphere, the half-life of brightness improved to the same extent as the case where the first heating and/or the second heating were conducted in the nitrogen atmosphere.

The invention claimed is:

1. A method for manufacturing an organic electroluminescent element comprising, in the following order, an anode, a light-emitting layer, an electron injection layer, and a cathode, the method comprising the steps of:
    (A) forming the anode;
    (B) forming the light-emitting layer;
    (C) forming the electron injection layer; and
    (D) forming the cathode,
    wherein the step (C) comprises (i) applying an application liquid comprising an ionic polymer to form a thin film, (ii) heating the thin film formed, (iii) storing a partially finished organic electroluminescent element obtained in (ii), and thereafter, (iv) heating the thin film again.

2. The method for manufacturing an organic electroluminescent element according to claim 1, wherein, in the step (C), at least one of the two heatings (ii) and (iv) is conducted in an atmosphere in which the volume proportion of nitrogen is 90% or less.

3. The method for manufacturing an organic electroluminescent element according to claim 1, wherein, in the step (C), at least one of the two heatings (ii) and (iv) is conducted in an atmosphere in which the volume proportion of nitrogen is 90% or less and the volume proportion of oxygen is from 10% to 30%.

4. The method for manufacturing an organic electroluminescent element according to claim 1, wherein, in the step (C), the storing in (iii) is conducted in an atmosphere in which the volume proportion of nitrogen is 90% or less.

* * * * *